US010340005B2

(12) United States Patent
Bertin

(10) Patent No.: US 10,340,005 B2
(45) **Date of Patent: *Jul. 2, 2019**

(54) RESISTIVE CHANGE ELEMENT ARRAYS WITH IN SITU INITIALIZATION

(71) Applicant: Nantero, Inc., Woburn, MA (US)

(72) Inventor: Claude L. Bertin, Venice, FL (US)

(73) Assignee: Nantero, Inc., Woburn, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/726,066

(22) Filed: Oct. 5, 2017

(65) Prior Publication Data

US 2018/0033483 A1 Feb. 1, 2018

Related U.S. Application Data

(63) Continuation-in-part of application No. 15/676,064, filed on Aug. 14, 2017, which is a (Continued)

(51) Int. Cl.
*G11C 11/00* (2006.01)
*G11C 13/00* (2006.01)
(Continued)

(52) U.S. Cl.
CPC .......... *G11C 13/0069* (2013.01); *B82Y 10/00* (2013.01); *G11C 13/0002* (2013.01);
(Continued)

(58) Field of Classification Search
CPC ............ G11C 13/0069; G11C 13/0004; G11C 13/0007; G11C 13/004; G11C 13/0061;
(Continued)

(56) References Cited

U.S. PATENT DOCUMENTS 6,480,438 B1 11/2002 Park
7,075,817 B2 7/2006 Rinerson et al.
(Continued)

FOREIGN PATENT DOCUMENTS

| | | | |
|---|---|---|---|
| EP | 1489621 | A1 | 12/2004 |
| JP | 2008065953 | A | 3/2008 |
| WO | WO2004114315 | A1 | 12/2004 |

OTHER PUBLICATIONS

U.S. Appl. No. 15/676,064, filed Aug. 2017, Bertin; Claude L.*
(Continued)

*Primary Examiner* — Pho M Luu
(74) *Attorney, Agent, or Firm* — Nantero, Inc.

(57) ABSTRACT

A high-speed memory circuit architecture for arrays of resistive change elements is disclosed. An array of resistive change elements is organized into rows and columns, with each column serviced by a word line and each row serviced by two bit lines. Each row of resistive change elements includes a pair of reference elements and a sense amplifier. The reference elements are resistive components with electrical resistance values between the resistance corresponding to a SET condition and the resistance corresponding to a RESET condition within the resistive change elements being used in the array. A high speed READ operation is performed by discharging one of a row's bit lines through a resistive change element selected by a word line and simultaneously discharging the other of the row's bit lines through of the reference elements and comparing the rate of discharge on the two lines using the row's sense amplifier. Storage state data are transmitted to an output data bus as high speed synchronized data pulses. High speed data is received from an external synchronized data bus and stored by a PROGRAM operation within resistive change elements in a memory array configuration.

20 Claims, 87 Drawing Sheets

Related U.S. Application Data continuation-in-part of application No. 15/191,277, filed on Jun. 23, 2016, now Pat. No. 9,852,793, which is a continuation of application No. 14/812,173, filed on Jul. 29, 2015, now Pat. No. 9,412,447.

(51) Int. Cl.

| | |
|---|---|
| ***H03K 19/177*** | (2006.01) |
| ***G11C 29/02*** | (2006.01) |
| ***G11C 23/00*** | (2006.01) |
| ***G11C 13/02*** | (2006.01) |
| ***B82Y 10/00*** | (2011.01) |
| *G11C 7/14* | (2006.01) |

(52) U.S. Cl.

CPC ........ *G11C 13/004* (2013.01); *G11C 13/0004* (2013.01); *G11C 13/0007* (2013.01); *G11C 13/0061* (2013.01); *G11C 13/025* (2013.01); *G11C 23/00* (2013.01); *G11C 29/02* (2013.01); *G11C 29/021* (2013.01); *G11C 29/023* (2013.01); *G11C 29/028* (2013.01); *H03K 19/1776* (2013.01); *H03K 19/1778* (2013.01); *H03K 19/17728* (2013.01); *H03K 19/17736* (2013.01); *H03K 19/17796* (2013.01); *G11C 7/14* (2013.01); *G11C 2013/0042* (2013.01); *G11C 2013/0054* (2013.01); *G11C 2213/35* (2013.01); *G11C 2213/82* (2013.01); *Y10S 977/94* (2013.01)

(58) Field of Classification Search

CPC ..... G11C 13/025; G11C 29/02; G11C 29/021; G11C 29/023; G11C 29/028

See application file for complete search history.

(56) References Cited

U.S. PATENT DOCUMENTS

| | | | | |
|---|---|---|---|---|
| 7,719,902 | B2 | 5/2010 | Dong et al. | |
| 8,023,320 | B2 | 9/2011 | Kim et al. | |
| 8,027,209 | B2 | 9/2011 | Yan et al. | |
| 8,183,665 | B2 | 5/2012 | Bertin et al. | |
| 8,580,586 | B2 | 11/2013 | Bertin et al. | |
| 8,854,873 | B1 | 10/2014 | Hollmer et al. | |
| 9,263,126 | B1 * | 2/2016 | Viviani | G11C 13/004 |
| 9,299,430 | B1 * | 3/2016 | Bertin | G11C 13/0069 |
| 9,390,790 | B2 | 7/2016 | Bertin et al. | |
| 9,412,447 | B1 * | 8/2016 | Bertin | B82Y 10/00 |
| 9,852,793 | B2 * | 12/2017 | Bertin | B82Y 10/00 |
| 2002/0136047 | A1 | 9/2002 | Scheuerlein | |
| 2007/0147102 | A1 | 6/2007 | Roehr | |
| 2009/0021976 | A1 | 1/2009 | Liaw et al. | |
| 2009/0027977 | A1 | 1/2009 | Rinerson et al. | |
| 2009/0122592 | A1 | 5/2009 | Tokiwa et al. | |
| 2010/0073992 | A1 | 3/2010 | Ueda | |
| 2010/0135085 | A1 | 6/2010 | Breitwisch et al. | |
| 2013/0051114 | A1 | 2/2013 | Kim et al. | |
| 2013/0170283 | A1 | 7/2013 | Lan et al. | |
| 2014/0254242 | A1 | 9/2014 | Siau | |

OTHER PUBLICATIONS

U.S. Appl. No. 15/676,064 dated Aug. 2017, Claude L. Bertin.*

EPO Extended Search Report, Application No. 16181948.7, dated Dec. 22, 2016, 9 pgs.

* cited by examiner

| | RESET | SET | READ |
|---|---|---|---|
| WL[0] | $V_{PP}$ | $V_{PP}$ | $V_{PP}$ |
| BL[0] | $V_{RST}$ | 0V | 0V |
| SL[0] | 0V | $V_{SET}$ | $V_{RD}$ |
| WL[1:y] | 0V | 0V | 0V |
| BL[1:x] | Z | Z | Z |
| SL[1:x] | Z | Z | Z |

| Function # | Function Name | Read Operation | Write Operation |
|---|---|---|---|
| 410 | Memory Array | Active; $V_{DD}$ | Active; $V_{HI}$ |
| 412 | Reference Resistors | Active; $V_{DD}$ | Inactive |
| 420 | Equilibration; Isolation | Active;* $V_{DD}$ | Active;* $V_{HI}$ |
| 430 | Sense Amplifier / Latch | Active; $V_{DD}$ | Active; $V_{HI}$ |
| 440 | Data Bus Bi-directional Control | Active; $V_{DD}$ | Active; $V_{HI}$ |

*Isolation devices are turned ON connecting sense amplifier/latch 630 and memory array 610

| Function # | Function Name | Read Operation | Write Operation |
|---|---|---|---|
| 610 | Memory Array | Active; $V_{DD}$ | Active; $V_{HI}$ |
| 612 | Reference Resistors | Active; $V_{DD}$ | Inactive |
| 615 | Write Select | Inactive | Active; $V_{HI}$ |
| 620 | Equilibration; Isolation | Active;* $V_{DD}$ | Inactive+ |
| 625 | Voltage Shifter | Inactive | Active; $V_{HI}$ |
| 630 | Sense Amplifier / Latch | Active; $V_{DD}$ | Active; $V_{DD}$ |
| 640 | Data Bus Bi-directional Control | Active; $V_{DD}$ | Active; $V_{DD}$ |

* Isolation devices are turned ON connecting sense amplifier/latch 630 and memory array 610

\+ Isolation devices are turned OFF disconnecting sense amplifier/latch 630 and memory array 610

| NRAM Memory Operations | | | |
|---|---|---|---|
| **Func-tion #** | **Function Name** | **Read Operation** | **Write Operation** |
| 1110 (610) | Memory Array | Active; VDD | Active; VHI |
| 1112 (612) | Reference Resistors | Active; VDD | Inactive |
| 1115 (615) | Write Select | Inactive | Active; VHI |
| 1120 (620) | Isolation Equilibration | Active Active | Inactive Inactive |
| 1125 (625) | Voltage Shifter | Inactive | Active; VHI |
| 1130 (630) | Sense Amplifier/ Latch | Active; VDD | Active; VDD |
| 1140 (640) | Data Bus Bi-directional Control | Active; VDD | Active; VDD |

| Access Time | | Signal for $V_0 = V_{DD}/2 = 0.75$ V. | | | Signal for $V_0 = V_{DD}/2 = 0.50$ V. | | |
|---|---|---|---|---|---|---|---|
| Access Time (mV) | Signal Develo-ment (mV) | ΔV for $R_{LO}$ (mV) | ΔV for $R_{HI}$ (mV) | SA/Latch Sensi-tivity (mV) | ΔV for $R_{LO}$ (mV) | ΔV for $R_{HI}$ (mV) | SA/Latch Sensi-tivity (mV) |
| 5 | 4 | -37.5 | 33 | <= 33 | -25 | 22 | <= 22 |
| 6 | 5 | -43.5 | 40.5 | <= 40 | -29 | 27 | <= 27 |
| 7 | 6 | -52.5 | 45 | <= 45 | -35 | 30 | <= 30 |

| | Access Time | | Signal for $V_0 = V_{DD}/2 = 0.75$ V. | | | | Signal for $V_0 = V_{DD}/2 = 0.50$ V. | | | |
|---|---|---|---|---|---|---|---|---|---|---|
| Access Time (ns) | Signal Develop-ment (ns) | CL Clock Cycles | $V_{BL}$ for $R_{LO}$ (mV) | $V_{BL}$ for $R_{HI}$ (mV) | $V_{REF}$ (mV) | SA/Latch Input Signal (mV) | $V_{BL}$ for $R_{LO}$ (mV) | $V_{BL}$ for $R_{HI}$ (mV) | $V_{REF}$ (mV) | SA/Latch Input Signal (mV) |
| 5 | 4 | 2 | 660 | 775 | 717 | =+- 57.5 | 440 | 500 | 470 | =+- 30 |
| 12.5 | 11.5 | 3 | 549 | 738 | 643.5 | =+- 94.5 | 366 | 492 | 429 | =+- 63 |
| 20 | 19 | 4 | 455 | 732 | 593 | =+-139 | 303 | 488 | 395 | =+- 92 |

| Item | Operating Conditions |
|---|---|
| 140 nm 4 Mb NRAM | 140 nm CMOS technology & overlying CNT switches |
| CNT Switch Fast Write Operations | SET / RESET<br>Bipolar: 5 ns / 5 ns<br>Unipolar: *10 μs* / 5 ns |
| Read Time (Non-Destructive Read) | 5 ns |
| Write Voltages & Currents | 1-1.5 V. SET; 2-2.5 V. RESET<br><10-20 μA |
| Read Voltage | 0.5-1V |
| Operation Reliability | -65°C to 165°C |
| Data Retention | >1,000y @ 85C (5eV)<br>>10y @ 300C (5eV) |
| Read Disturb | > $10^{16}$ reads |
| Endurance | >$10^{12}$ cycles |

FIG. 27

Cell # 1 = 3F x 7F = 21 $F^2$

Cell # 2 = 3F x 4F = 12 $F^2$

2 Cells = 3F x 6F = 18 $F^2$; Cell # 3 = 9 $F^2$

Cell # 5 = 3F x 2F = 6 $F^2$

3400

<table>
<tr><th>Cell<br>#<br>FIG.<br>(No.)</th><th>Folded<br>Array<br>SL || BL<br>2BLs/SL</th><th>Open<br>Array<br>SL || BL<br>1BL/SL</th><th>Open<br>Array<br>SL || BL<br>2BLs/SL</th><th>Open<br>Array<br>SL|| BL<br>4BLs/SL</th><th>Open<br>Array<br>SL || WL<br>All BLs/SL</th></tr>
<tr><td>1<br>(28)</td><td>21 $F^2$</td><td></td><td></td><td></td><td></td></tr>
<tr><td>2<br>(29)</td><td></td><td>12 $F^2$</td><td></td><td></td><td></td></tr>
<tr><td>3<br>(30)</td><td></td><td></td><td>9 $F^2$</td><td></td><td></td></tr>
<tr><td>4<br>(31)</td><td></td><td></td><td></td><td>8.25 $F^2$</td><td></td></tr>
<tr><td>5<br>(32)</td><td></td><td></td><td></td><td></td><td>6 $F^2$</td></tr>
</table>

Note: All BLs are Orthogonal to WLs

<table>
<tr><th rowspan="2">Cell #<br>FIG.<br>(No.)</th><th rowspan="2">Cell<br>Area</th><th colspan="2">Array Architectures</th><th colspan="3">Memory Modes of Operation</th><th rowspan="2">Open Array<br>Architecture<br>Schematic<br>Designations</th></tr>
<tr><th>Select<br>Lines (SL)</th><th>Reference<br>Lines (RL)</th><th>RESET before<br>end of READ</th><th>READ/WRITE<br>R-M-W<br>Page Mode</th><th>RESET before<br>WRITE</th></tr>
<tr><td>2<br>(29)</td><td>12 $F^2$</td><td>1 SL/1 BL<br>SLs || BLs</td><td>• # RLs = # BLs<br>• 1RL; $R_{REF}$<br>• 1 RL; $V_{REF}$<br>• 1RL; Prog. $V_{REF}$ & Sig. Dev. Time</td><td>Y<br>Y<br>Y<br>Y</td><td></td><td></td><td>Sixth_v1<br>Sixth_v2/3<br>Sixth_v4<br>Sixth_v5<br>(FIGs: 35, 37, 38, 39)</td></tr>
<tr><td>2<br>(29)</td><td>12 $F^2$</td><td>1 SL/1 BL<br>SLs || BLs</td><td>• # RLs = # BLs<br>• 1RL; $R_{REF}$<br>• 1 RL; $V_{REF}$<br>• 1RL; Prog. $V_{REF}$ & Sig. Dev. Time</td><td></td><td>Y<br>Y<br>Y<br>Y</td><td></td><td>Seventh_v1<br>Seventh_v3<br>Seventh_v4<br>Seventh_v5<br>(FIGs: 40, 43, 45)</td></tr>
<tr><td>3<br>(30)</td><td>9 $F^2$</td><td>1 SL/2 BLs<br>SLs || BLs</td><td>• # RLs = # BLs<br>• 1RL; $R_{REF}$<br>• 1 RL; $V_{REF}$<br>• 1RL; Prog. $V_{REF}$ & Sig. Dev. Time</td><td>Y<br>Y<br>Y<br>Y</td><td></td><td></td><td>First<br>Second, Third<br>Fourth,<br>Fifth<br>(FIGs: 11,16, 19, 20)</td></tr>
<tr><td>5<br>(32)</td><td>6 $F^2$</td><td>1 SL/1 WL<br>SLs || WLs</td><td>• # RLs = # BLs<br>• 1RL; $R_{REF}$<br>• 1 RL; $V_{REF}$<br>• 1RL; Prog. $V_{REF}$ & Sig. Dev. Time</td><td></td><td></td><td>Y<br>Y<br>Y<br>Y</td><td>Eighth_v1<br>Eighth_v3<br>Eighth_v4<br>Eighth_v5<br>(FIGs: 47, 51, 53)</td></tr>
</table>

| L | W/L = 1 | W/L = 1.5 | W/L = 2 |
|---|---|---|---|
| 1F | W = 1F<br>**6F²**<br>------ | W = 1.5F<br>**7.5F²**<br>**25%** | W = 2F<br>**9F²**<br>**50%** |
| 1.5F | W = 1.5F<br>**8.75F²**<br>**46%** | W = 2.25F<br>**11.4F²**<br>**90%** | W = 3F<br>**14F²** |
| 2F | W = 2F<br>**12F²**<br>**100%** | W = 3F<br>**16F²** | W = 4F<br>**20F²**<br>**233%** |

Higher Current

Higher Voltage

Higher Current & Voltage

FIG. 56

Cell # 5 = 3F x 2F = 6 $F^2$

Cell # 5 = 3F x 2F = 6 $F^2$

RESISTIVE CHANGE ELEMENT ARRAYS WITH IN SITU INITIALIZATION

This application is a continuation-in-part of U.S. patent application Ser. No. 15/676,064, filed Aug. 14, 2017 and entitled "DDR Compatible Open Array Architectures for Resistive Change Element Arrays" which is a continuation-in-part of U.S. Pat. No. 9,852,793, filed Jun. 23, 2016 and entitled "Methods for Programming and Accessing DDR Compatible Resistive Change Element Arrays," which is a continuation of U.S. Pat. No. 9,412,447, filed on Jul. 29, 2015, entitled "DDR Compatible Memory Circuit Architecture for Resistive Change Element Arrays."

CROSS-REFERENCE TO RELATED APPLICATIONS

This application is related to the following U.S. patents, which are assigned to the assignee of the present application, and are hereby incorporated by reference in their entirety:

U.S. Pat. No. 6,835,591, filed on Apr. 23, 2002, entitled Methods of Nanotube Films and Articles;

U.S. Pat. No. 7,335,395, filed on Jan. 13, 2003, entitled Methods of Using Pre-Formed Nanotubes to Make Carbon Nanotube Films, Layers, Fabrics, Ribbons, Elements, and Articles;

U.S. Pat. No. 6,706,402, filed on Mar. 16, 2004, entitled Nanotube Films and Articles;

U.S. Pat. No. 7,115,901, filed on Jun. 9, 2004, entitled Non-Volatile Electromechanical Field Effect Devices and Circuits Using Same and Methods of Forming Same; and U.S. Pat. No. 7,365,632, filed on Sep. 20, 2005, entitled Resistive Elements Using Carbon Nanotubes.

U.S. Pat. No. 7,781,862, filed on Nov. 15, 2005, entitled Two-Terminal Nanotube Devices and Systems and Methods of Making Same;

U.S. Pat. No. 7,479,654, filed on Nov. 15, 2005, entitled Memory Arrays Using Nanotube Articles with Reprogrammable Resistance;

U.S. Pat. No. 8,008,745, filed on Aug. 8, 2007, entitled Latch Circuits and Operation Circuits Having Scalable Nonvolatile Nanotube Switches as Electronic Fuse Replacement Elements;

U.S. Pat. No. 8,217,490, filed on Aug. 8, 2008, entitled Nonvolatile Nanotube Diodes and Nonvolatile Nanotube Blocks and Systems Using Same and Methods of Making Same;

U.S. Pat. No. 7,852,114, filed on Aug. 6, 2009, entitled Nonvolatile Nanotube Programmable Logic Devices and a Nonvolatile Nanotube Field Programmable Gate Array using Same;

U.S. Pat. No. 8,351,239, filed on Oct. 23, 2009, entitled Dynamic Sense Current Supply Circuit and Associated Method for Reading and Characterizing a Resistive Memory Array; and U.S. Pat. No. 8,000,127, filed on Nov. 13, 2009, entitled Method for Resetting a Resistive Change Memory Element.

This application is related to the following U.S. patent applications, which are assigned to the assignee of the application, and are hereby incorporated by reference in their entirety:

U.S. patent application Ser. No. 12/536,803, filed on Aug. 6, 2009, entitled Nonvolatile Nanotube Programmable Logic Devices and a Nonvolatile Nanotube Field Programmable Gate Array Using Same; and U.S. patent application Ser. No. 12/873,946, filed on Sep. 1, 2010, entitled A Method for Adjusting a Resistive Change Element Using a Reference.

TECHNICAL FIELD

The present disclosure relates generally to circuit architecture for resistive change element memory arrays, and, more specifically, to such architectures that include elements for in situ initialization of resistive change elements within the array.

BACKGROUND OF THE INVENTION

Any discussion of the related art throughout this specification should in no way be considered as an admission that such art is widely known or forms part of the common general knowledge in the field.

Resistive change devices and arrays, often referred to as resistance RAMs by those skilled in the art, are well known in the semiconductor and electronics industry. Such devices and arrays, for example, include, but are not limited to, phase change memory, solid electrolyte memory, metal oxide resistance memory, and carbon nanotube memory such as NRAM™.

Resistive change devices and arrays store information by adjusting a resistive change element, typically comprising some material that can be adjusted between a number of non-volatile resistive states in response to some applied stimuli, within each individual array cell between two or more resistive states. For example, each resistive state within a resistive change element cell can correspond to a data value which can be programmed and read back by supporting circuitry within the device or array.

For example, a resistive change element might be arranged to switch between two resistive states: a high resistive state (which might correspond to a logic "0") and a low resistive state (which might correspond to a logic "1"). In this way, a resistive change element can be used to store one binary digit (bit) of data.

Or, as another example, a resistive change element might be arranged to switch between four resistive states, so as to store two bits of data. Or a resistive change element might be arranged to switch between eight resistive states, so as to store four bits of data. Or a resistive change element might be arranged to switch between $2^n$ resistive states, so as to store n bits of data.

Within the current state of the art, there is an increasing need to implement resistive change memory arrays into architectures compatible with existing technology. In this way, the advantages of resistive change memory can be realized in circuits and systems using conventional silicon based microprocessors, microcontrollers, FPGAs, and the like. For example, a number of circuit architectures (such as, but not limited to, those taught by the incorporated references) have been introduced that provide resistive change memory arrays and architectures that are compatible with existing non-volatile flash memory architectures. As the popularity and cost and design advantages of resistive change element memories increases, there is a growing need to provide higher speed and lower power circuit architectures for resistive change memory arrays to further increase the versatility of resistive change memory technology. To this end, it would be advantageous to provide a DDR compatible architecture for a resistive change element memory array.

SUMMARY OF THE INVENTION

The present disclosure relates to circuit architectures for arrays of resistive change elements and, more specifically, to such architectures with digital chip interfaces that are similar to the speed and power requirements of conventional double data rate (DDR) architectures.

In particular, the present disclosure provides a resistive change element memory array. This resistive change element array comprises a plurality of word lines, a plurality of bit lines, a plurality of select lines, and a plurality of memory cells.

The memory cells within the resistive change array each comprise a resistive change element having a first terminal and a second terminal. The first terminal of the resistive change element is in electrical communication with a select line, and the resistive change element is capable of being switched between at least two non-volatile resistance values wherein a first resistance value corresponds to a first informational state and a second resistance value corresponds to a second informational state. The memory cells within the array also each comprise a selection device. These selection devices are each responsive to a control signal on a word line, and each selection device selectively provides a conductive path between a bit line and the second terminal of the resistive change element with its memory cell.

The resistive change element array also comprises a plurality of reference elements. These reference elements each comprise a resistive reference element having a first terminal and a second terminal. The first terminal of each resistive reference element being in electrical communication with a bit line, and wherein each resistive reference element has an electrical resistance selected to fall between the resistance corresponding to a first informational state in the resistive change elements and the resistance value corresponding to a second informational state within the resistive change elements. The resistive change element array also comprises a selection device responsive to a control signal on a word line. These selection devices selectively provide a conductive path between a bit line and the second terminal of the resistive reference element within its memory cell.

The resistive change element array also comprises a plurality of sense amplifiers. Each of these sense amplifiers is responsive to at least one bit line electrically coupled to a resistive change element and at least one bit line electrically coupled to a resistive reference element. At least one of said plurality of sense amplifiers can be used to compare the rate of discharge on a bit line electrically coupled to a resistive change element that has been selected by a word line and the rate of discharge on a bit line electrically coupled to a resistive reference element selected by a word line, and that comparison is used to READ the informational state of a selected memory cell.

The present disclosure also provides a method for reading the informational state of a resistive change element. The method comprises providing a resistive change element, wherein the resistive change element is capable of being switched between at least two non-volatile resistance values with a first resistance value corresponding to a first informational state and a second resistance value corresponding to a second informational state. The method further comprises providing a resistive reference element, wherein the resistive reference element has an electrical resistance selected to fall between the resistance corresponding to a first informational state in the resistive change elements and the resistance value corresponding to a second informational state within the resistive change elements. The method further comprises discharging a voltage through both the resistive change element and the resistive reference element. The method further comprises comparing the rate of discharge through said resistive change element to the rate of discharge through said resistive reference element. Within this method, a greater rate of discharge through said resistive change element corresponds to a first informational state being stored within the resistive change element and a greater rate of discharge through the resistive reference element corresponds to a second informational state being stored within the resistive change element.

According to one aspect of the present disclosure a resistive change element is a two-terminal nanotube switching element comprising a nanotube fabric.

According to another aspect of the present disclosure a resistive change element is a metal oxide memory element.

According to another aspect of the present disclosure a resistive change element is a phase change memory element.

According to another aspect of the present disclosure a resistive change memory array compatible with a double data rate (DDR) memory architecture is provided.

Other features and advantages of the present disclosure will become apparent from the following description of the invention which is provided below in relation to the accompanying drawings.

BRIEF DESCRIPTION OF THE DRAWINGS

FIG. 3B is table detailing READ and programming voltages required for adjusting or inspecting CELL00 of the array architecture illustrated in FIG. 3A.

FIG. 4A is table listing the different sections of a first DDR compatible NRAM architecture (as detailed in FIG. 4B) according to the methods of the present disclosure.

FIG. 6A is table listing the different sections of a second DDR compatible NRAM architecture (as detailed in FIG. 6B) according to the methods of the present disclosure.

FIG. 12 is a table listing the different sections of an DDR NRAM open architecture configuration.

FIG. 13C is a table showing signal voltage inputs to SA/latches for several signal development times and power supply voltages of 1.5 and 1.0 volts.

FIG. 22 is a table of signal development time and sense amplifier/latch timing as a function of column latency clock cycles.

FIG. 27 is a table showing the operating conditions of a four megabit NRAM using the nonvolatile memory cells illustrated in FIGS. 26A, 26B, and 26C.

FIG. 34 is a table of cell area (footprint) for cells illustrated in FIGS. 28, 29, 30, 31, and 32.

FIG. 55 is a table summarizing cells, array architectures, open architecture designations, and memory modes of operation.

FIG. 56 is a table showing the FIG. 32 cell operating at a low voltage and current, and the growth in cell area (footprint) as a function of increasing voltage, increasing current, or both increasing voltage and increasing current.

DETAILED DESCRIPTION

Figure 1:
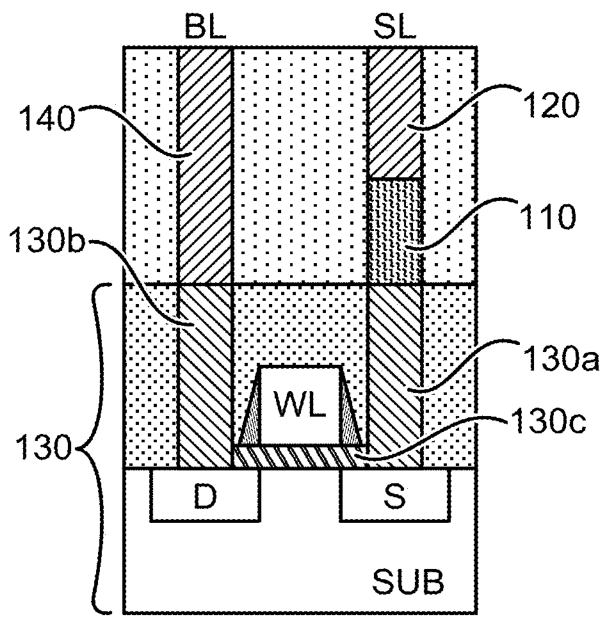
FIG. 1 illustrates an exemplary layout of a vertically oriented resistive change cell.

The present disclosure relates to advanced circuit architectures for arrays of resistive change elements. More specifically, the present disclosure teaches memory array architectures for resistive change elements with digital chip interfaces that are similar to a double data rate (DDR) interface. DDR interfaces may be used in DRAMs, SRAMs, NRAM™s and other volatile and nonvolatile type memories. While memory cells built using resistive change memory elements offer numerous advantages over those comprising conventional silicon based memory devices, timing and power requirements for programming and reading resistive change memory elements can represent limitations within certain applications. The circuit architecture of the present disclosure provides a memory array that can be rapidly accessed (READ) and requires relatively low power for reading and programming operations thereby overcoming these limitations.

Within the circuit architecture of the present disclosure, a plurality of resistive change elements is arranged into an array of rows and columns Each column of resistive change elements is accessed via a word line, and each row of resistive change elements is responsive to a pair of bits lines and a select line. It should be noted that word lines and bit lines in some schematics are shown a columns (vertical "y" orientation) and rows (horizontal "x" orientation), respectively, for reasons illustrative convenience. However, word and bit lines may also be shown with row horizontal "x" and column vertical "y" orientations, respectively. The resistive change elements within each row are arranged in a folded bit line arrangement for purposes of common capacitive coupled noise rejection by the differential sense amplifier/latch connected to the bit line pairs (explained in more detail below with respect to FIGS. 4B and 5B). During a READ operation, this folded bit line arrangement allows a first bit line to discharge through the resistive change element within a selected cell while a second bit line discharges simultaneously through a reference element. A sense amplifier/latch compares the discharge rates of both bit lines (that is, the selected cell's bit line and the reference element's bit line) and temporarily stores the data value of the selected cell. This data value can then be READ out of the array through a decoding and buffering element at a desired clock cycle. While resistive change elements are non-volatile, and therefore READ operations are typically non-destructive (that is, reading or sensing the informational state of a resistive change element does not alter or disturb the state stored in that element) the circuit architecture of the present disclosure also provides a method for resetting (a RESET WRITE operation) resistive change elements in a selected sub-array during the READ out cycle for higher speed and lower power operation. This resetting operation can be used, as desired, to provide additional flexibility in achieving compatibility with a conventional DDR reading cycle. This RESET operation at the end of the READ cycle is used primarily in a page mode operation in which a page of memory data is READ followed by a page of new data written in its place. The terms program and WRITE are used interchangeably in this application.

Resistive change cells store information through the use of a resistive change element within the cell. Responsive to electrical stimuli, a resistive change element can be adjusted between at least two non-volatile resistive states. Typically, two resistive states are used: a low resistive state (corresponding, typically, to a logic '1,' a SET state) and a high resistive state (corresponding, typically, to a logic '0,' a RESET state). In this way, the resistance value of the resistive change element within the resistive change element cell can be used to a store a bit of information (functioning, for example, as a 1-bit memory element). According to other aspects of the present disclosure, more than two resistive states may be used, allowing a single cell to store more than one bit of information. For example, a resistive change memory cell might adjust its resistive change element between four non-volatile resistive states, allowing for the storage of two bits of information in a single cell.

Within the present disclosure the term "programming" is used to describe an operation wherein a resistive change element is adjusted from an initial resistive state to a new desired resistive state. Such programming operations can include a SET operation, wherein a resistive change element is adjusted from a relatively high resistive state (e.g., on the order of 2 MΩ) to a relatively low resistive state (e.g., on the order of 100 kΩ). Such programming operations (as defined by the present disclosure) can also include a RESET operation, wherein a resistive change element is adjusted from a relatively low resistive state (e.g., on the order of 100 kΩ) to a relatively high resistive state (e.g., on the order of 2 MΩ). Additionally, a "READ" operation, as defined by the present disclosure, is used to describe an operation wherein the resistive state of a resistive change element is determined without significantly altering the stored resistive state. Within certain embodiments of the present disclosure these resistive states (that is, both the initial resistive states and the new desired resistive states) are non-volatile.

Resistive change elements include, but are not limited to, two-terminal nanotube switching elements, phase change memory cells, and metal oxide memory cells. For example, U.S. Pat. Nos. 7,781,862 and 8,013,363 teach non-volatile two-terminal nanotube switches comprising nanotube fabric layers. As described in those patents, responsive to electrical stimuli a nanotube fabric layer can be adjusted or switched among a plurality of non-volatile resistive states, and these non-volatile resistive states can be used to reference informational (logic) states. In this way, resistive change elements (and arrays thereof) are well suited for use as non-volatile memory devices for storing digital data (storing logic values as resistive states) within electronic devices (such as, but not limited to, cell phones, digital cameras, solid state hard drives, and computers). However, the use of resistive change elements is not limited to memory applications. Indeed, arrays of resistive change elements as well as the advanced architectures taught by the present disclosure could also be used within logic devices or within analog circuitry.

FIG. 1 illustrates the layout of an exemplary resistive change cell that includes a vertically oriented resistive change element (such a structure is sometimes termed a 3D cell by those skilled in the art). A typical FET device 130 is formed within a first device layer, including a drain D, a source S, and a gate structure 130*c*. The structure and fabrication of such an FET device 130 will be well known to those skilled in the art.

A resistive change element 110 is formed in a second device layer. Conductive structure 130*a* electrically couples a first end of resistive change element 110 with the source terminal of FET device 130. Conductive structure 120 electrically couples a second end of resistive change element 110 with an array source line SL outside the resistive change cell. Conductive structures 130*b* and 140 electrically couple the drain terminal of FET device 130 with an array bit line BL outside the resistive change cell. An array word line WL is electrically coupled to gate structure 130*c*.

Figure 2:
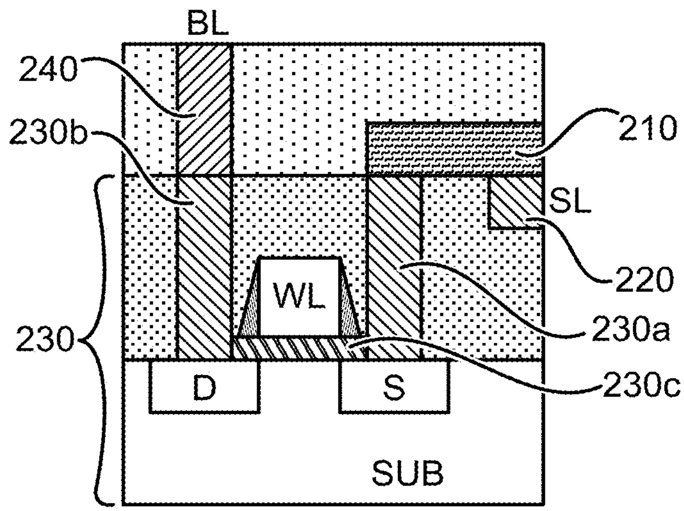
FIG. 2 illustrates an exemplary layout of a horizontally oriented resistive change cell.

FIG. 2 illustrates the layout of an exemplary resistive change cell that includes a horizontally oriented resistive change element (such a structure is sometimes termed a 2D memory cell by those skilled in the art). A typical FET device 230 is formed within a first device layer, including a drain D, a source S, and a gate structure 230*c*. As with the FET device (130) depicted in FIG. 1, the structure and fabrication of such an FET device 230 will be well known to those skilled in the art.

A resistive change element 210 is formed in a second device layer. Conductive structure 230*a* electrically couples a first end of resistive change element 210 with the source terminal of FET device 230. Conductive structure 220 electrically couples a second end of resistive change element 210 with an array source line SL outside the memory cell. Conductive structures 230*b* and 240 electrically couple the drain terminal of FET device 230 with an array bit line BL outside the memory cell. An array word line WL is electrically coupled to gate structure 230*c*.

Within both of the resistive change cells depicted in FIGS. 1 and 2, the resistive change element is adjusted between different resistive states by applying electrical stimulus, typically one or more programming pulses of specific voltages and pulse widths, between the bit line (BL) and the source line (SL). A voltage is applied to the gate structure (130*c* in FIGS. 1 and 230*c* in FIG. 2) through the word line (WL), which enables electrical current to flow through the series combination of the FET device (130 in FIGS. 1 and 230 in FIG. 2) and the resistive change element (110 in FIGS. 1 and 210 in FIG. 2). Depending on the gate voltage applied by the word line (WL), current to the resistive change element 110 may be limited by design, thereby enabling the FET device to behave as a current limiting device. By controlling the magnitude and the duration of this electrical current, the resistive change element (110 in FIGS. 1 and 210 in FIG. 2) can be adjusted between a plurality of resistive states.

The state of the resistive change element cells depicted in FIGS. 1 and 2 can be determined, for example, by applying a DC test voltage, for example, but not limited to, 0.5V, between the source line (SL) and the bit line (BL) while applying a voltage to gate structure (130*c* in FIGS. 1 and 230*c* in FIG. 2) sufficient to turn on the FET device (130 in FIGS. 1 and 230 in FIG. 2) and measuring the current through the resistive change element (110 in FIGS. 1 and 210 in FIG. 2). In some applications this current can be measured using a power supply with a current feedback output, for example, a programmable power supply or a sense amplifier. In other applications this current can be measured by inserting a current measuring device in series with the resistive change element (110 in FIGS. 1 and 210 in FIG. 2).

Alternatively, the state of the resistive change element cells depicted in FIGS. 1 and 2 can also be determined, for example, by driving a fixed DC current, for example, but not limited to, 1 μA, through the series combination of the FET device (130 in FIGS. 1 and 230 in FIG. 2) and the resistive change element (110 in FIGS. 1 and 210 in FIG. 2) while applying a voltage to the gate (130*c* in FIGS. 1 and 230*c* in FIG. 2) sufficient to turn on the FET device (130 in FIGS. 1 and 230 in FIG. 2) and measuring the voltage across the resistive change element (110 in FIGS. 1 and 210 in FIG. 2).

The resistive change element (such as, but not limited to, those depicted in FIGS. 1 and 2) can be formed from a plurality of materials, such as, but not limited to, metal oxide, solid electrolyte, phase change material such as a chalcogenide glass, graphene fabrics, and carbon nanotube fabrics.

For example, U.S. Pat. No. 7,781,862 to Bertin et al., incorporated herein by reference in its entirety, discloses a two-terminal nanotube switching device comprising a first and second conductive terminals and a nanotube fabric article. Bertin teaches methods for adjusting the resistivity of the nanotube fabric article between a plurality of non-volatile resistive states. In at least one embodiment, electrical stimulus is applied to at least one of the first and second conductive elements such as to pass an electric current through said nanotube fabric layer. By carefully controlling this electrical stimulus within a certain set of predetermined parameters (as described by Bertin in U.S. patent application Ser. No. 11/280,786) the resistivity of the nanotube article can be repeatedly switched between a relatively high resistive state and relatively low resistive state. In certain embodiments, these high and low resistive states can be used to store a bit of information.

As described by the incorporated references, a nanotube fabric as referred to herein for the present disclosure comprises a layer of multiple, interconnected carbon nanotubes. A fabric of nanotubes (or nanofabric), in the present disclosure, e.g., a non-woven carbon nanotube (CNT) fabric, may, for example, have a structure of multiple entangled nanotubes that are irregularly arranged relative to one another. Alternatively, or in addition, for example, the fabric of nanotubes for the present disclosure may possess some degree of positional regularity of the nanotubes, e.g., some degree of parallelism along their long axes. Such positional regularity may be found, for example, on a relatively small scale wherein flat arrays of nanotubes are arranged together along their long axes in rafts on the order of one nanotube long and ten to twenty nanotubes wide. In other examples, such positional regularity maybe found on a larger scale, with regions of ordered nanotubes, in some cases, extended over substantially the entire fabric layer. Such larger scale positional regularity is of particular interest to the present disclosure. Nanotube fabrics are described in more detail in U.S. Pat. No. 6,706,402, which is included by reference in its entirety.

While some examples of resistive change cells and elements within the present disclosure specifically reference carbon nanotube based resistive change cells and elements, the methods of the present disclosure are not limited in this regard. Indeed, it will be clear to those skilled in the art that the methods of the present disclosure are applicable to any type of resistive change cell or element (such as, but not limited to, phase change and metal oxide).

Figure 3A:
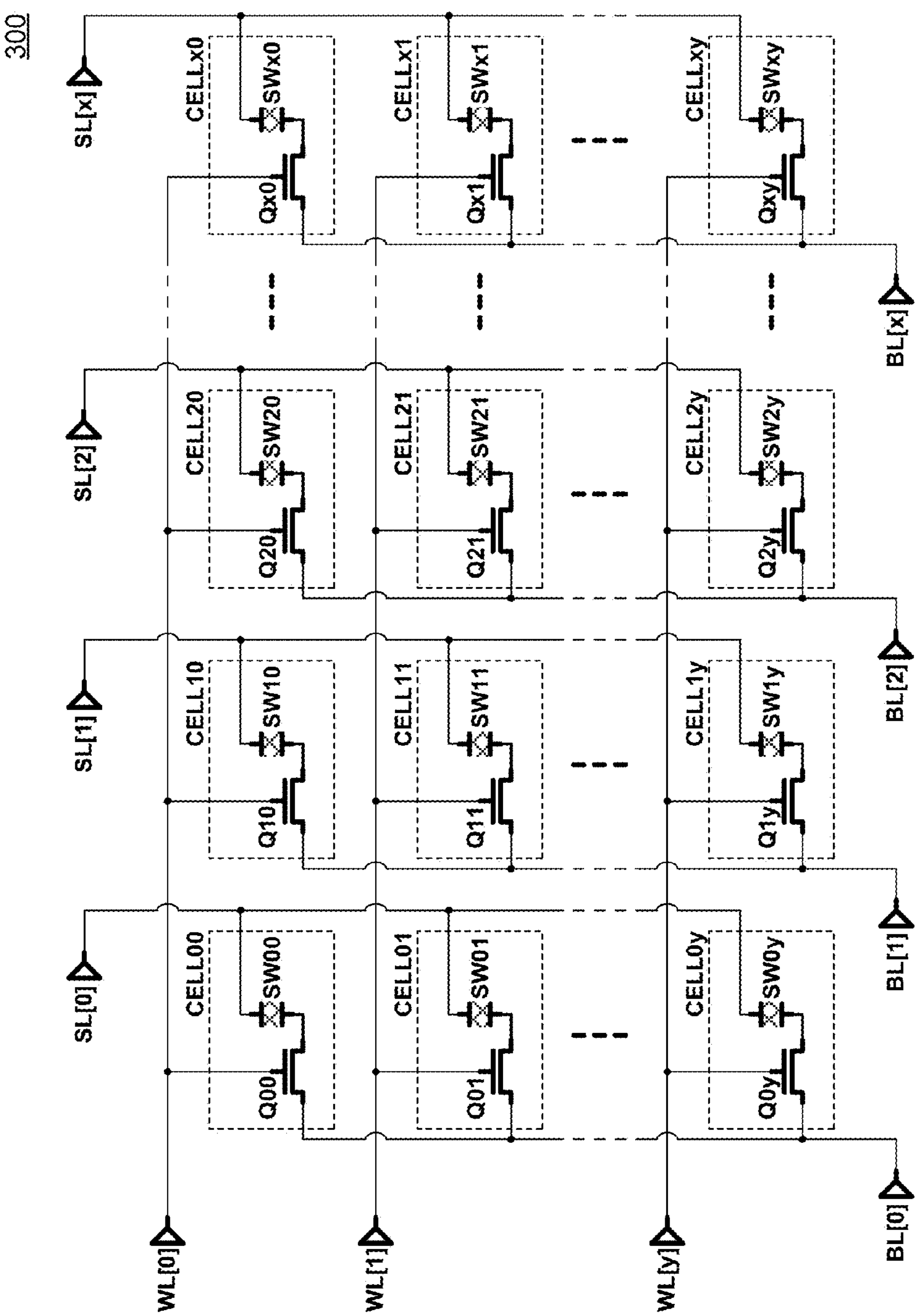
FIG. 3A is a simplified schematic illustrating an exemplary typical architecture for an array of resistive change elements in an open array architecture.

Referring now to FIG. 3A, an exemplary architecture for a typical resistive change element memory array 300 is illustrated in a schematic diagram. The array 300 comprises a plurality of cells (CELL00-CELLxy), each cell including a resistive change element (SW00-SWxy) and a selection device (Q00-Qxy). The individual array cells (CELL00-CELLxy) within resistive change array 300 are selected for reading and programming operations using arrays of source lines (SL[0]-SL[x]), word lines (WL[0]-WL[y]), and bit lines (BL[0]-BL[x]) as will be described below.

Within the exemplary architecture of FIG. 3A, the selection devices (Q00-Qxy) used with the individual array cells (CELL00-CELLxy) are conventional silicon based FETs. However, such arrays are not limited in this regard. Indeed, other circuit elements (such as, but not limited to, diodes or relays) could be used within similar architecture structures to provide cell selection functionality within an array (for example, selection device such as bipolar devices, and FET devices such as SiGe FETs, FinFETs, and FD-SOI).

FIG. 3B is a table describing exemplary programming and READ operations for the resistive change element array shown in FIG. 3A. The table lists the word line, bit line, and source line conditions required to perform a RESET operation, a SET operation, and a READ operation on CELL00 of resistive change element array 300. These operations as well as the function of the resistive change element array 300 depicted in FIG. 3A within these operations will be described in detail below.

The first column of the table within FIG. 3B describes a RESET operation of CELL00 (that is, a programming operation which adjusts the resistive state of resistive change element SW00 from a relatively low resistance to a relatively high resistance). WL[0] is driven to $V_{PP}$ (the logic level voltage required to enable select device Q00), while the remaining word lines (WL[1:*y*]) are driven to 0V (essentially grounded). In this way, only the select devices in the first row of the array (that is, Q00-Qx0) are enabled (or "turned on"). BL[0] is driven to $V_{RST}$ (the programming voltage level required to drive SW00 into a relatively high resistive state), and SL[0] is driven to 0V (essentially grounded). The remaining bit lines (BL[1:*x*]) and the remaining source lines (SL[1:*x*]) are held in high impedance states. In this way, $V_{RST}$ is driven across only the cells in the first column of the array (CELL00-CELL0*y*). As a result of these conditions, the programming voltage, $V_{RST}$, is driven only across SW00 (through enabled selection device Q00), while the other select devices within the array remain isolated from the programming voltage (and thus retain their originally programmed resistive state).

The second column of the table within FIG. 3B describes a SET operation of CELL00 (that is, a programming operation which adjusts the resistive state of resistive change element SW00 from a relatively high resistance to a relatively low resistance). As with the RESET operation, WL[0] is driven to $V_{PP}$ (the logic level voltage required to enable select device Q00), while the remaining word lines (WL[1:*y*]) are driven to 0V (essentially grounded). In this way, only the select devices in the first row of the array (that is, Q00-Qx0) are enabled (or "turned on"). SL[0] is driven to $V_{Set}$ (the programming voltage level required to drive SW00 into a relatively low resistive state), and BL[0] is driven to 0V (essentially grounded). The remaining source lines (SL [1:*x*]) and the remaining bit lines (BL[1:*x*]) are held in high impedance states. In this way, $V_{SET}$ is driven across only the cells in the first column of the array (CELL00-CELL0*y*). As a result of these conditions, the programming voltage, $V_{SET}$, is driven only across SW00 (through enabled selection device Q00), while the other select devices within the array remain isolated from the programming voltage (and thus retain their originally programmed resistive state).

Finally, the third column of the table within FIG. 3B describes a READ operation of CELL00 (that is, an operation which determines (measures) the resistive state of resistive change element SW00). As with the SET and RESET operations, WL[0] is driven to $V_{PP}$ (the logic level voltage required to enable select device Q00), while the remaining word lines (WL[1:*y*]) are held low (approximately 0V in this example) so that only the select devices in the first row of the array (that is, Q00-Qx0) are enabled (or "turned on"). SL[0] is driven to $V_{RD}$ (the voltage level required to READ the resistive state of SW00), and BL[0] is driven to 0V (essentially grounded). The remaining source lines (SL[1:*x*]) and the remaining bit lines (BL[1:*x*]) are held in high impedance states. In this way, $V_{RD}$ is driven across only the cells in the first column of the array (CELL00-CELL0*y*). As a result of these conditions, the READ voltage, $V_{RD}$, is driven only across SW00 (through enabled selection device Q00), while the other select devices within the array remain isolated from the READ voltage. In this way, current will flow only through resistive change element SW00, and by measuring that current, the resistive state of SW00 can be determined.

It should be noted that the programming voltages for the RESET and SET operations ($V_{RST}$ and $V_{SET}$, respectively) as described in the preceding paragraphs were applied in opposite polarities. However, the methods of the present disclosure are not limited in this regard. Indeed, the differing polarity of the RESET and SET operations were used in order to better illustrate the functionality of the array depicted in FIG. 3A. That is to say, programming (SET and RESET) voltage and READ voltages can be driven in either polarity (that is, positive voltage on the source line or positive voltage on the bit line) dependent upon the needs of the specific type of resistive change element used or the specific programming operation in question. As will be shown in detail in the following paragraphs, this is also true of the memory array architectures of the present disclosure. Also, programming (such as SET and RESET) and READ voltages may also all be of the same polarity.

As can be seen through the discussion of FIG. 3B, with respect to the array architecture of FIG. 3A, resistive change elements are well suited for use within memory arrays. However, within certain applications, arrays of resistive change elements can exhibit certain timing and power requirements, and these requirements can—in certain applications—limit the use of such arrays within certain memory interfaces and architectures. For example, within the memory architecture detailed in FIG. 3A, the electrical capacitance of a select line or bit line could—within certain applications—represent a timing limit on how quickly the resistance of an individual cell can be sensed during a READ operation. The relatively large capacitance of the line itself and the resistance of the nonvolatile storage element, in such an application, would introduce a relatively significant RC time constant on the line in question and require a certain amount of time to charge or discharge the line. Within certain applications, resistive change elements arranged into a memory array structure may require relatively high READ voltages and/or currents in order for circuit elements situated at the end of relatively long bit lines or select lines to adequately differentiate between a RESET and SET state within an individually selected resistive change element during a READ operation. These types of timing and power requirements—which can limit the use of resistive change memory arrays within certain applications—are overcome by the resistive change element memory array architecture of the present disclosure.

A First DDR Compatible Resistive Change Element Array Architecture

Figure 4B:
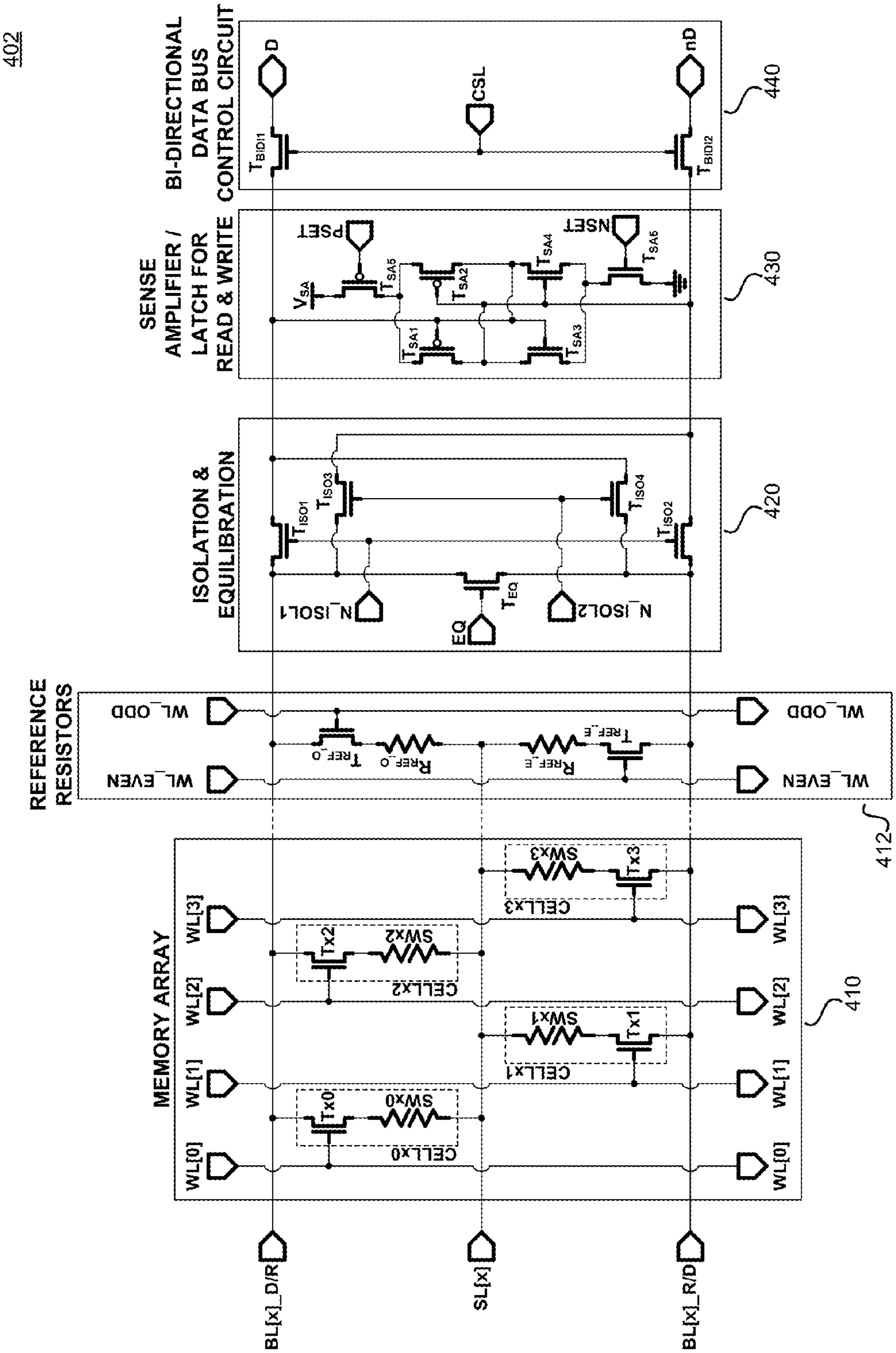
FIG. 4B is a simplified schematic for a first DDR compatible NRAM architecture illustrating a bit line pair (row "x") of a DDR compatible folded bit line resistive change memory array architecture according to the methods of the present disclosure (note that bit line columns are drawn horizontally to accommodate the bit line pairs, isolation devices, and sense amplifier circuit details).

Referring now to FIGS. 4A and 4B, a first DDR compatible memory circuit architecture for an array of resistive change elements according to the present disclosure is shown. For ease of explanation, the exemplary schematic 402 depicting a single row (row "x") of this first architecture is divided into a number of functional sections (410, 412, 420, 430, and 440). Table 401 in FIG. 4A describes each of these functional sections, and their use within both READ and WRITE operations on the array.

Looking to both FIGS. 4A and 4B, the first section 410 within this first DDR compatible architecture of the present disclosure is the memory array itself. These are the individual array cells (CELLx0-CELLx3 in FIG. 4B) themselves, each comprising a resistive change element (SWx0-SWx3, in FIG. 4B) and a selection element (FETs Tx0-Tx3, in FIG. 4B). The individual cells within memory array 410 are addressable responsive to an array of word lines (WL [0]-WL[3] in FIG. 4B), a pair of bit lines (BL[x]_D/R and BL[x]_R/D in FIG. 4B) for each row of the array, and a select line (SL[x] in FIG. 4B) for each row of the array. The use of these arrays lines in both READ and WRITE operations will be described in more detail below.

The next section 412 within this first DDR compatible architecture of the present disclosure contains the reference resistors. Each row within the array of this first DDR compatible architecture includes a pair of reference elements accessible by dedicated word lines (WL_ODD and WL_EVEN, as shown in FIG. 4B). As listed in table 401 in FIG. 4A, the reference resistors are used during READ operations on the array and are inactive during WRITE operations. The use of bit lines pairs for each row (BL[x]_D/R and BL[x]_R/D, as shown in FIG. 4B) allows READ voltages and discharge currents to be applied to a reference resistor ($R_{REF-ODD}$ or $R_{REF-EVEN}$) and a selected array cell simultaneously. By comparing discharge rates through the selected cell with a reference element the resistive state of a selected cell can be determined. The use of these reference resistors within such READ operations will be described in more detail within the discussion of FIG. 5A below.

The next section 420 within this first DDR compatible architecture of the present disclosure provides equilibration and isolation devices. These devices isolate the array cells from the sense amplifier/latch (section 430) and the bi-directional data bus control circuit (section 440) during different phases of a READ or WRITE operation. Responsive to two different isolation control signals (N_ISOLATE1 and N_ISOLATE2, as shown in FIG. 4B), the isolation devices of section 420 also provide a signal inversion function that is required with the folded bit line architecture. The use of these equilibration and isolation devices during READ and WRITE operations within the first DDR compatible architecture of the present disclosure will be described in more detail within the discussion of FIGS. 5A and 5B below.

The next section 430 within this first DDR compatible architecture of the present disclosure is a sense amplifier/latch. During a READ operation (response to control signals PSET and NSET, as shown in FIG. 4B), this sense amplifier/latch compares the bit line pair voltage discharge between the selected array cell and one of the reference elements (section 412) and latches in a logic value corresponding to the logic value stored in the selected array cell. During a WRITE (or programming) operation, this sense amplifier/latch is used to temporarily hold the data value to be stored in a selected array line cell prior to application of the programming current. The use of sense amplifier/latch 430 during READ and WRITE operations within the first DDR compatible architecture of the present disclosure will be described in more detail within the discussion of FIGS. 5A and 5B below.

The bi-directional data bus control circuit 440 within this first DDR compatible architecture of the present disclosure is a bi-directional data bus control circuit. A pair of FETs ($T_{BIDI1}$ and $T_{BIDI2}$, as shown in FIG. 4B) responsive to a control signal (CSL, as shown in FIG. 4B) enable or disable an on-chip bidirectional data bus electrical connection between the sense amplifier/latch of section 430 a data I/O buffer/driver 1067 circuit. In this way, data stored in the sense amplifier/latch during a READ operation can be provided to an off-chip external data bus, and data to be stored in a selected array cell can provided to the sense amplifier/latch from an external data bus by a data I/O buffer/driver 1067 circuit. The use of bi-directional data bus control circuit 440 during READ and WRITE operations within the first DDR compatible architecture of the present disclosure will be described in more detail within the discussion of FIGS. 5A and 5B below. The data I/O buffer/driver 1067 (FIG. 10) circuit is described further below with respect to FIG. 10.

As described above, the simplified schematic of FIG. 4B illustrates a single row (row "x") of a resistive change memory array according to the methods of the present disclosure. The simplified schematic of FIG. 4B is a folded bit line architecture in which a data storage memory cell appears at every other word line and bit line intersection, in a staggered pattern, as illustrated at the intersection of WL[0], WL[1], WL[2], WL[3] and bit line pairs BL[x]_D/R and BL[x]_R/D. Each even numbered data storage memory cell (CELLx0, CELLx2, etc.) is connected to BL[x]_D/R and an even word line (WL[0], WL[2], etc.); each odd numbered data storage memory cell (CELLx1, CELLx3, etc.) is connected to BL[x]_R/D and an odd word line (WL[1], WL[3], etc.); all data storage cells, both even and odd ones, are connected to select line SL[x]. The array select line SL[x] is approximately parallel to array bit line pair BL[x]. In this example, all array select lines are approximately parallel to array bit lines. However, resistive memory arrays may also be formed with array select lines approximately parallel to array word lines; that is, approximately orthogonal to array bit lines. One pair of reference resistors per bit line pair is included for use during READ (sensing) operations, selectable by WL_EVEN and WL_ODD, such that when WL_EVEN is activated reference resistor $R_{REF\_E}$ is connected to bit line BL[x]_R/D, and whenever WL_ODD is activated reference resistor $R_{REF\_O}$ is connected to BL[x]_D/R. WL_EVEN is activated whenever an even word line is selected and WL_ODD is activated whenever an odd word line is selected. Each bit line in the bit line pair may be a data line (D) or a reference line (R) such that only one of the bit line pairs has an active bit along the bit line. Such a folded bit line array results in common mode word to bit line capacitive voltage coupling cancellation by the differential sense amplifier/latch. This common noise cancellation scheme enables lower READ voltages and less array power. However, folded bit line structures have about half the density of open bit line architectures such as the exemplary array of resistive change architecture of FIG. 3A. The CNT switch operation is as described further above with respect to FIG. 3B. It should be noted that for layout convenience in FIG. 4B, word lines are drawn in the vertical y-axis and bit lines are drawn in the horizontal x-axis because of the level of detail along the bit line direction. In simplified memory array 300, FIG. 3A, and block diagram memory 1000, word lines are drawn in the more conventional horizontal "x" (row) direction and bit lines are drawn in the more conventional vertical "y" (column) direction.

Looking again to FIG. 4B, the memory array portion 410 of the memory array row schematic 402 is represented by four resistive change element memory cells (CELLx0, CELLx1, CELLx2, and CELLx3). As indicated by the dotted lines along the bit lines (BL[x]_D/R and BL[x]_R/D), the memory array section 410 of an array row within the architecture of the present disclosure may include more memory cells. For simplicity of illustration, however, only the first four memory cells (CELLx0, CELLx1, CELLx2, and CELLx3) are shown in the simplified schematic of FIG. 4B. It should be noted, however, that the exemplary horizontally laid out bit line (bit line pair "x") depicted in the simplified schematic 402 of FIG. 4B may include as many memory cells as required for a particular memory array (or sub-array).

Each individual memory cell (CELLx0, CELLx1, CELLx2, and CELLx3) includes a resistive change element (SWx0, SWx1, SWx2, and SWx3, respectively) and a selection device (Tx0, Tx1, Tx2, and Tx3, respectively). When enabled by an associated word line (WL[0], WL[1], WL[2], and WL[3], respectively), the selection device in each resistive change memory cell provides an electrically conductive path between one terminal of its associated resistive change memory element and one of the bit lines (BL[x]_D/R or BL[x]_R/D). Responsive to electrical stimuli provided across the associated bit line and the common select line (SL[x]), an individually selected resistive change element can be programmed into a SET or RESET state (as described above in detail with respect to FIGS. 1 and 2) or rapidly READ using the methods of the present disclosure (as described in more detail below).

According to the methods of the present disclosure, the folded bit line architecture shown in FIG. 4B provides two bit lines (BL[x]_D/R and BL[x]_R/D) for each horizontally laid out bit line pair in the memory array. Depending on the physical position of a memory cell being accessed, each of these two bit lines alternates between acting as the active bit line for a selected memory cell and being used to provide access to one of two references cells within the memory array row. Within the exemplary schematic of FIG. 4B, BL[x]_D/R acts as the active bit line for the "even" memory cells (CELLx0 and CELLx2) and acts as the reference bit line for the "odd" memory cells (CELLx1 and CELLx3), with BL[x]_R/D acting in the inverse capacity (active for the "odd" cells and reference for the "even" cells).

As described above, the two reference cells (section 412) provided within the horizontally laid out bit line pair architecture schematic of FIG. 4B allow for rapidly reading the state of an individually selected resistive change memory cell. $T_{REF\text{-}ODD}$ and $R_{REF\text{-}ODD}$ comprise the reference cell used to READ the "odd" positioned memory cells within the array row (CELLx1 and CELLx3), and $T_{REF-EVEN}$ and $R_{REF-EVEN}$ comprise the reference cell used to READ the "even" positioned memory cells within the array row (CELLx0 and CELLx2). $T_{REF-ODD}$ and $T_{REF-EVEN}$ are selection devices (analogous to selection devices Tx0-Tx3) and are responsive to two dedicated word lines (WL_ODD and WL_EVEN, respectively). $R_{REF-ODD}$ and $R_{REF-EVEN}$ are reference elements (for example, but not limited to, fixed resistors or other resistive change elements programmed into a stable reference state). The electrical resistance of these reference elements is fixed to a value between the threshold "low" resistance value (the SET resistance) and the threshold "high" resistance value (the nominal RESET resistance) for the type of resistive change element technology being used. The use of these reference elements during a READ operation will be discussed in detail within the discussion of FIG. 5A below.

It should be noted that while the selection devices (e.g., Tx0-Tx3, $T_{REF-ODD}$, and $T_{REF-EVEN}$) shown in the exemplary schematic of FIG. 4B are shown to be field effect transistors (FETs), the methods of the present disclosure are not limited in this regard. Indeed, other types of circuit elements capable of regulating or otherwise modifying a conductive path between two nodes in an electrical circuit can be used as selection device within the methods of the present disclosure. Such selection devices can include, but are not limited to, diodes, relays, and other resistive change memory elements. For example, bipolar transistors may be used. Similarly, FinFET devices may also be used as select devices. However, selection devices not requiring a semiconductor substrate may also used. For example, fully-depleted silicon-on-insulator (FD-SOI) devices and carbon nanotube FET (CNTFET devices) may also be used, and when combined with CNT resistive storage devices, enable chips fabricated entirely on insulator material. This enables stacking memory layers on one another to achieve greater densities. FD-SOI and CNTFET devices also have the added benefit of substantially lower soft error (SER) rates.

Section 430 of the array row schematic shown in FIG. 4B provides a sense amplifier/latch electrically coupled to the two bit lines (BL[x]_D/R and BL[x]_R/D) of the array row through an isolation element (transfer device) represented by section 420 of the array row schematic 402. During a READ operation, either N_ISOLATE1 (which enables FETs $T_{ISO1}$ and $T_{ISO2}$) or N_ISOLATE2 (which enables FETs $T_{ISO3}$ and $T_{ISO4}$) is activated to electrically couple the two bit lines of the array row (one bit line discharging through a selected resistive change element and the other bit line discharging through one of the two reference elements) to the sense amplifier/latch 430 (comprising FETs $T_{SA1}$-$T_{SA6}$). The two separate isolation controls (N_ISOLATE1 and N_ISOLATE2) are necessary to prevent data inversion when the "odd" numbered cells are READ. Activating N_ISOLATE1 electrically couples BL[x]_D/R to the positive terminal of the sense amplifier/latch 430 (as is required when CELLx0 or CELLx2 is being READ). And, activating N_ISOLATE2 electrically couples BL[x]_R/D to the positive terminal of the sense amplifier/latch 430 (as is required when CELLx1 or CELLx3 is being READ).

As will be explained in more detail with respect to the READ operation timing diagram of FIG. 5A, during the discharging of the two bit lines the PSET and NSET controls are activated, causing the sense amplifier/latch 430 to temporarily store the data value represented by the programmed resistive state of the selected resistive change element. The isolation element 420 can then isolate the memory array portion of the array row from the sense amplifier 430 (by deactivating both N_ISOLATE1 and N_ISOLATE2, and the informational state of the selected memory cell can be READ out at any time through bi-directional data bus control circuit 440 responsive to the CSL control.

It should be noted that the EQ control within the isolation stage 420 of the array row schematic of FIG. 4B is activated just prior to the READ operation to equilibrate the bit line pair voltages and then de-activated prior to word line activation during the READ cycle. The EQ control and its associated circuit element $T_{EQ}$ are only used for bit line pair equilibration during a READ operation. The EQ control is not active during a WRITE operation. The READ operation is described further below with respect to FIGS. 4B and 5A.

During a WRITE operation using this first DDR compatible architecture, data pulses (representing the data values to be written) come into to the array through an on-chip data input/output buffer/driver connected to a data bus that transmits eight bits at a time to a digital interface to the sense amplifier as described in detail with respect to FIG. 10 further below. This input/output buffer puts eight bits on the data bus during every positive array clock transition, and this data is then transmitted via the bi-directional data bus control circuit (440 in FIG. 4B) to the sense amplifier/latch (430 in FIG. 4B). The isolation devices (420 in FIG. 4B) are activated, and the data in the sense amplifier/latch is then transmitted to array bit lines (BL[x]_D/R and BL[x]_R/D in FIG. 4B) through those isolation devices. The array cell (or cells) to be written is enabled through its associated word line, and a programming current is permitted to flow through the selected resistive change element (or elements) from its associated bit line to the select line (SL[x] in FIG. 4B) to perform a WRITE function. As discussed previously, voltage driven onto the bit lines from the sense amplifier/latch 430 (driven by the input/output buffer) is selected to provide a sufficient programming current through the resistive change element in order to adjust the resistive state of the resistive change element.

Within certain applications such as page mode operation, for example, to facilitate compatibility with DDR memory functionality, all bits within an array are rendered into a RESET state during READ operations in the example described further below. However, other methods may be used. For example, all bits within an array may be rendered into a SET state. Alternatively, bits may be in either SET or RESET state. Because in this example all bits are in the RESET state at the start of a WRITE operation, all storage elements within the array can be assumed to be in a high resistance (RESET) state, corresponding to a logic '0'. As such, a WRITE operation, within these certain applications, will only have to provide programming SET currents to those array cells required to be programmed back into a SET state, a low resistance state, corresponding to a logic '1'. WRITE operations using the first DDR compatible architecture of the present disclosure will be described in more detail with respect to FIG. 5B below.

Figure 5A:
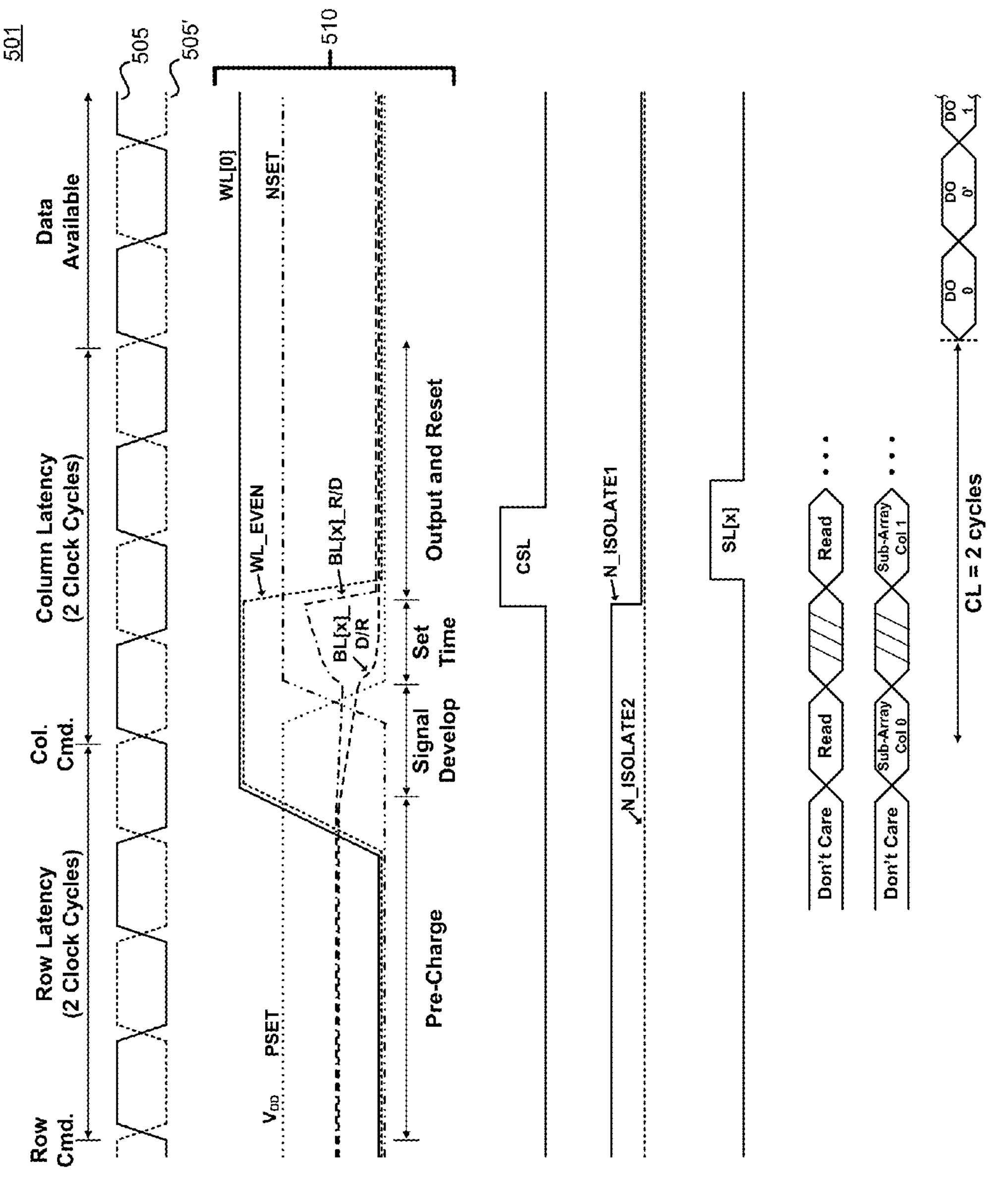
FIG. 5A is a waveform timing diagram illustrating an exemplary READ operation performed on a cell within the first DDR compatible NRAM array architecture detailed in FIG. 4B (note that the waveform diagram of FIG. 5A READ operation also applies to the second DDR compatible NRAM array architecture detailed in FIG. 6B, as the READ operations within both architectures are identical).

Referring now to FIG. 5A, a timing diagram 501 detailing an exemplary READ operation first on a single array cell within a DDR compatible resistive change element array using the first architecture of the present disclosure (as shown in FIG. 4B and discussed above) is shown. Within the exemplary timing diagram 501 of FIG. 5A, it is assumed that the resistive change element within the array cell being READ has been programmed into a low resistance SET state (corresponding to a logic "1").

Referring to READ timing diagram 501, a clock signal (CLK) 505 is used to synchronize the DDR NRAM timing digital interface with the timing of a microprocessor or other digital external control circuit element interfacing with the memory array architecture of the present disclosure. In DDR operation the data rate on the external bus (I/O) is twice (2-times) the data rate on the internal (on-chip) data bus. That is, the data on the internal data bus changes with each positive (up) transition of clock signal 505, while the data on the external I/O data bus changes with both positive (up) and negative (down) transitions of clock signal 505, such that both internal data bus and external data bus transitions remain synchronized with clock signal 505. In this example, referring to timing diagram 501 illustrated in FIG. 5A, synchronized data transitions on both internal data bus and external data bus are achieved by generating a second clock signal 505' that is 180 degrees out of phase with respect to clock signal 505. In this way, for example, eight data bits can be READ to the 8-bit internal data bus with each positive (up) transition of clock signal 505 and these data bit signals transmitted to the data I/O buffer/driver 1067. The data I/O buffer/driver 1067 multiplexes the eight data signals onto the 4-bit external data bus in two sets of four data bit signals at twice (2-times) the internal data bus data rate by using a combination of clock signal 505 and second clock signal 505'. That is, the data on the external data bus transitions with each positive (up) transition of clock signal 505 and each positive (up) transition of the second clock signal 505'. The internal data bus, data I/O buffer/driver 1067, and external data bus are illustrated in FIG. 10.

Generating an on-chip out-of-phase clock signal is one method of achieving a synchronized data rate at twice the data rate on the external data bus with respect to the internal data bus. Other methods may be used as well. While this example describes doubling the external data rate with respect to the internal data rate, similar methods may be used to achieve triple the data rate (a DDR3 NRAM), four times the data rate (a DDR4 NRAM), and even higher synchronized data rates.

Referring to READ timing diagram 501, signal development and sensing 510 waveforms on a selected bit line pair correspond to a stored data value in a selected cell in memory array (sub-array) 410 illustrated in FIG. 4B. Referencing signal development and sensing waveforms 510, the selected bit line pair (BL[x]_D/R and BL[x]_R/D]) are equilibrated to the same voltage, in this example approximately $V_{DD}/2$, during the pre-charge phase of the READ cycle by activating EQ, which is then turned off when activating the selected word line and corresponding reference word line within memory array (or sub-array) 410 illustrated in FIG. 4B. It should be noted that while $V_{DD}/2$ is chosen as the equilibration voltage in this example, other values such as $V_{DD}$, any voltage between $V_{DD}/2$ and $V_{DD}$, and voltages less than $V_{DD}/2$ may also be used. Next, the selected word line, WL[0] in this example, transitions to $V_{DD}+V_{TH}$ and turns on select device Tx0 in CELLx0, which connects resistive change element SWx0 to bit line BL[x]_D/R thereby initiating signal development. In this example, CELLx0 is assumed to be set to a low resistance SET representing a "1" logic state. WL_EVEN is also activated at approximately the same time as WL[0] and also transitions to $V_{DD}+V_{TH}$ and turns on reference device $T_{REF\_E}$ that connects reference resistor $R_{REF\_E}$ to bit line BL[x]_R/D. Both pre-charged bit lines have the same bit line capacitance and both discharge through resistive elements. However, each BL in the bit line pair is connected to a different resistive element resulting in different RC time constants and therefore different rates of discharge and corresponding voltage reduction rates. An amount of time, referred to as signal develop in signal development and sensing waveforms 510, is allowed and the duration depends on the sensitivity of the sense amplifier. For example, if differential the sense amplifier/latch 430 (FIG. 4B) switches at a difference voltage of 50 mV, then the signal develop time is selected to allow a 50 mV differential signal to form. However, if differential the sense amplifier/latch 430 is much more sensitive and switches at a difference voltage of 5 mV for example, then a shorter signal develop time is used. When a sufficient signal develop time is reached, the sense amplifier/latch 430 is turned on and latches the signal based on the difference voltage between bit lines B[x]_D/R and B[x]_R/D after a sufficient set time. Voltage coupling between word line WL[0] and reference word line WL_EVEN to bit lines B[x]_D/R and B[x]_R/D are rejected as common mode noise by differential the sense amplifier/latch 430.

Near the end of the signal develop time in this exemplary READ cycle, sense amplifier/latch 430 is activated as follows. PSET is driven to a low voltage, turning on FET $T_{SA5}$ and thereby connecting terminals FETs $T_{SA1}$ and $T_{SA2}$ to power supply $V_{SA}$ ($V_{SA}=V_{DD}$ for a READ operation in this example). NSET is driven to a high voltage, $V_{DD}$ for example, turning on FET $T_{SA6}$ and thereby connecting terminals FETs $T_{SA3}$ and $T_{SA4}$ to ground. At this time, sense amplifier/latch 430 has been powered up and senses/latches the data signal from cellx0. While N_ISOLATE1 may be enabled (with N_ISOLATE2 disabled) just after activation of the sense amplifier/latch, typically, N-ISOLATE1 is enabled earlier in the READ cycle prior to the activation of sense amplifier/latch 430, for example, at the beginning of the READ cycle. In this way, the sense amplifier/latch (section 430 in FIG. 4B) is coupled through the non-inverting path of the isolation element (section 420 in FIG. 4B) to the memory array and prepared to latch and temporarily hold the data value of the selected cell.

SL[x], the select line common of all the cells within the array row, is held low. And, CSL is held low, disabling bi-directional data bus control circuit 440 (FIG. 4A), until the array data is latched by sense amplifier/latch 430.

Memory arrays, such as memory array 410, are formed using multiple sub-arrays in which a memory sub-array line may contain thousands of individual memory cells. The length of these array lines results in relatively large line capacitance on these bit lines, which can result in relatively large time constants when combined with the resistance of the nonvolatile resistive change elements and limit speed at which these bit lines can charge and discharge due to RC time constants. By using folded bit line pairs such as (BL[x]_D/R and BL[x]_R/D) and differentially sensing bit line pair signals at small differential signal values, sense time can be significantly reduced resulting in faster READ times and faster data rates, such as page mode data rates for example. This is because the methods of the present disclosure, using folded bit line array pairs and differential sensing, do not require that either bit line in the bit line pair completely, or even mostly, discharge to determine the resistance value stored in the selected resistive change element (SWx0), thereby reducing timing delays associated with relatively high capacitance, long bit lines. Faster sensing at lower voltages for the folded array architecture illustrated in FIG. 4B may also result in lower operating power as well. Within applications with very large memory array sizes (for example, but not limited to, 1 Gb or higher), low power READ operations can become a critical design consideration.

Within the exemplary READ operation detailed in FIG. 5A, as illustrated by signal development and sensing waveforms 510, BL[x]_D/R has discharged more quickly than BL[x]_R/D, which indicates that the electrical resistance of SWx0 in CELLx0 is at a significantly lower resistance value (SET state) than the resistance value of $R_{REF-EVEN}$. And since the resistance value of $R_{REF-EVEN}$ has been selected to be a value between a nominal "high" resistance value and a nominal "low" resistance value (as determined by the design and technology of the resistive change elements used in the memory array), this difference in discharge is indicative of low resistance value (or a logic "1") being stored in CELLx0 as described further above and sense amplifier/latch 430 latches and holds a logic "1" state. However, if the electrical resistance of SWx0 in CELLx0 were high (RESET state) representing a logic "0", then BL[x]_D/R would discharge more slowly than BL[x]_R/D because the SWx0 would have a higher resistance than the reference resistor $R_{REF-EVEN}$ and therefore discharge more slowly and sense amplifier/latch 430 latches and holds a logic "0". The logic value held in sense amplifier/latch 430 can be READ out to the on-chip data bus by bi-directional data bus control circuit 440 (FIG. 4B) when CSL is activated by controlling circuitry outside of the memory array.

In the final stage of the READ operation shown in FIG. 5A (the "output and reset" stage), N_ISOLATE1 is driven low, isolating the sense amplifier/latch 430 (FIG. 4B) from memory array 410 (FIG. 4B). Bi-directional data bus control circuit 440 is activated by CSL and the logic value stored in the sense amplifier/latch 430 (FIG. 4B), corresponding to the data stored in the selected array cell, is connected to data output line (D), with its inverse (complement) driven out simultaneously on inverted data output line (nD), onto the on-chip 8-bit data bus, and to the input of the data I/O buffer/driver 1067. The data I/O buffer/driver 1067 (FIG. 10) then latches the data and drives the external 4-bit data bus at two times the data rate as the internal data bus as described further above. In this example, data first appears on the external data bus two clock cycles after the column address is received from the control device. While the DDR NRAM may be operated in a random access mode, typically a page of data is READ out (page mode) as illustrated in FIG. 5A. When data transfer is complete, CSL disables the connection between sense amplifier 430 and bi-directional data bus control circuit 440.

While resistive change elements are non-volatile (that is, they retain their programmed informational state during READ operations or when power is removed from the device), certain types of memory architectures (such as, but not limited to, DRAM capacitive storage memories) result in destructive READ operations. That is, in a conventional DRAM DDR memory array, for example, a READ operation on a cell would destroy the data stored in the cell itself. This data would then have to be written back from the corresponding sense amplifier/latch to the selected cell in the array in a write-back operation. Hence, the amplifier/latch would remain connected to the corresponding bit line pair during the completion of the READ operation cycle in order to restore the original state of cell. However, since a resistive change memory such as an NRAM, for example, performs a non-destructive READ operation, data remains in the array cell, and there is no data write-back requirement from sense amplifier/latch 430, which can be decoupled from the array. Therefore, in this NRAM example, N_ISOL1 is deactivated and transfer devices $T_{ISO1}$ and $T_{ISO2}$ decouple sense amplifier/latch 430 from memory array 410 bit lines BL[x]_D/R and BL[x]_R/D, also WL_EVEN decouples reference resistor $R_{REF-E}$ from bit line BL[x]_R/D, and both bit lines are driven to zero (ground) voltage, as shown by signal development and sensing waveforms 510, since data is latched into sense amplifier/latch 430 for transfer to the on-chip data bus. In this example, since no data write-back is needed, a programming operation may be performed at the end of the READ cycle. Selected word line WL[0] remains activated thereby enabling a RESET operation when SL[x] transitions to a RESET voltage, bit lines are grounded, and SL[x] drives the selected bit to a high resistance RESET state if the cell was in a low resistance SET state. If the cell was in a high resistance RESET state, it remains unchanged in the RESET state. This enables resistive memories such as NRAMs to complete a RESET cycle while data from sense amplifier/latch 430 is transferred via the on-chip data bus to the data I/O buffer/driver 1067 and onto the off-chip output bus. Leveraging the non-volatility of resistive memory bits by RESETTING selected bits to a high resistance state during the completion of the READ cycle simplifies the WRITE operation as described further below. To illustrate this functionality within the memory array architecture of the present disclosure, the exemplary READ operation detailed by timing diagram 501 in FIG. 5A shows a RESET operation concurrent with the data READ out operation (that is, during the time that CSL is activated and the READ data is provided to the external data bus).

Specifically, within this RESET operation, SL[x] is driven high to a required RESET voltage (as described in detail above with respect to SET and RESET operations on resistive change elements) while both of the row's bit lines (BL[x]_D/R and BL[x]_R/D]) are pulled low. WL_EVEN is also driven low, preventing any programming current from passing through reference element $R_{REF-EVEN}$, and WL[0] remains driven high, enabling access to CELLx0. In this way, a programming current is driven through CELLx0 and SWx0 is driven into a RESET state. The remaining word lines (WL[1]-WL[3]) remain low, so the data in remaining memory cells (CELLx1, CELLx2, and CELL x3 in FIG. 4B) remains unchanged. It should be noted that, as discussed above, such a RESET operation on the READ memory cell is not required within the methods of the present disclosure and but is included to illustrate the functionality and advantages of the DDR NRAM architecture presented in FIGS. 4B and 5A.

Figure 5B:
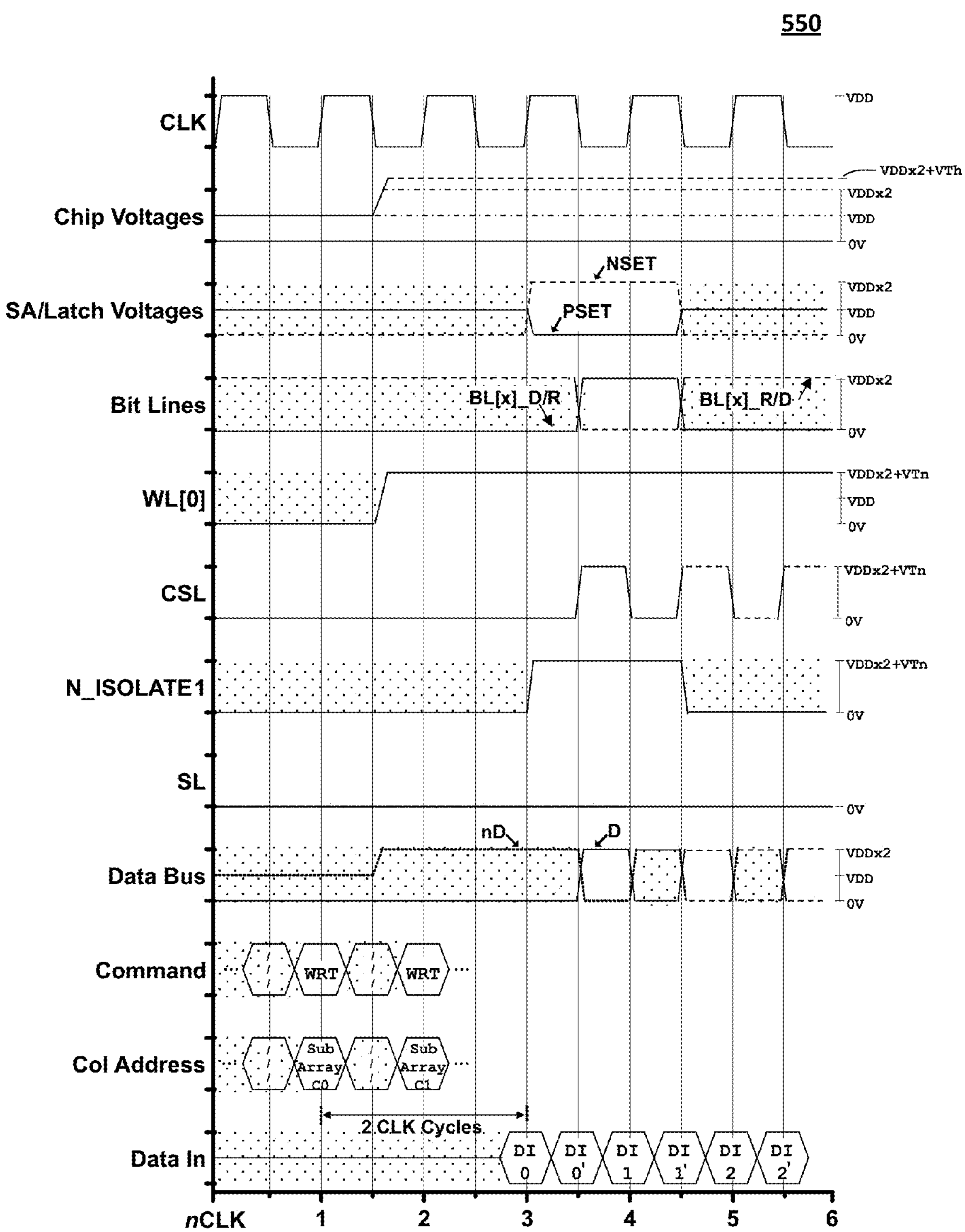
FIG. 5B is a waveform timing diagram illustrating an exemplary WRITE operation performed on a cell within the first DDR compatible NRAM array architecture detailed in FIG. 4B.

Referring now to FIG. 5B, a timing diagram 550 is shown for a WRITE (programming) operation for a first DDR compatible memory circuit architecture. Timing diagram 550 details an exemplary WRITE (programming) operation on a single array cell within a DDR compatible resistive change element in the array of the present disclosure shown in FIG. 4B and discussed above. Within the exemplary timing diagram 550 of FIG. 5B, it is assumed that the resistive change element within the array cell being adjusted from a high resistance RESET state (corresponding to a logic "0") into a low resistance SET state (corresponding to a logic "1").

As described above with respect to FIG. 5A, using the first DDR compatible array architecture of the present disclosure, a READ operation on a selected array cell can be READ and RESET within the same cycle. This READ and RESET method ensures that a selected array cell is in a RESET state (that is, a relatively high resistive state, corresponding to a logic '0') at the conclusion of a READ cycle. A WRITE operation on such a cell, then, would only have to apply a programming SET current on an array cell required to be put into a SET state (that is, a relatively low resistive state, corresponding to a logic '1'). In this way, this first architecture (as detailed in FIG. 4B) can be used with a traditional DDR interface. Further, within certain applications, such a READ/RESET/WRITE process can provide enhanced speed and lower power operation of the resistive change element array. To this end, the exemplary WRITE operation detailed in FIG. 5B provides a SET operation on a selected cell within a resistive change element array using the first DDR compatible array architecture of the present disclosure (CELLx0 as shown in FIG. 4B).

Within the READ operation detailed in FIG. 5A, the sense amplifier/latch 430 shown in FIG. 4A can be operated at relatively low voltages (for example, on the order of 1V). As such, the voltage levels used on the bit lines (BL[x]_D/R and BL[x]_R/D), and within the sense amplifier/latch 430 can be, in certain applications, the system level voltage level used by the external controlling circuitry ("$V_{DD}$"). In this way, the data pulses transmitted to an external data bus through the bi-directional data bus control circuit (440 in FIG. 4B) are also at $V_{DD}$ as they transmitted from the array. However, in certain applications, a WRITE (or programming) operation within the first DDR compatible NRAM architecture of the present disclosure (again, as illustrated in FIG. 4B) may require significantly higher voltages to induce a sufficient programming current through a selected array cell. For example, a WRITE operation might require a voltage level of twice the system level voltage ($V_{DD}\times2$) to be driven on a bit line associated with a selected array cell, requiring this higher voltage to be, at least temporarily, driven onto the on-chip data bus lines (D and nD in FIG. 4B) as well. To illustrate this, the required programming voltage within the exemplary WRITE operation detailed in FIG. 5B is imagined to be $V_{DD}\times2$.

Referring to resistive change memory 1000 illustrated in FIG. 10, described further below, and first DDR compatible resistive change element array architecture schematic 402 illustrated in FIG. 4B, a DDR programming (WRITE) operation is described with respect to timing diagram 550 shown in FIG. 5B. Referring to table 401 in FIG. 4A, reference resistors 412 in schematic 402 are inactive during a WRITE operation. As described above with respect to FIG. 4B, memory array 410 uses a folded bit line architecture, and bit line pair BL[x] represents any folded bit line pair intersecting all word lines in a memory array or memory sub-array. Only one word line at a time is selected (activated) during the WRITE operation and corresponds to a row address in the row address buffer (FIG. 10). As described further above with respect to FIG. 4B, in a folded bit line architecture, cells are staggered such that BL[x]_D/R contains the data input to array 410 when an even word line is activated and BL[x]_R/D contains the data when an odd word line is activated. In this WRITE example, even numbered word line WL[0] is selected. Therefore, CELLx0 illustrated in memory array 410 is selected and the WRITE operation stores data in nonvolatile storage element SWx0. Select line SL[x] is held at a low voltage (ground for example) for a WRITE operation to either even or odd numbered word lines. A column address buffer (FIG. 10) contains the column address locations for the WRITE operation. Timing diagram 550 for a first DDR compatible resistive change element array architecture illustrates a high speed page mode WRITE operation to a pre-selected word line, WL[0] in this example. An on-chip clock CLK signal synchronizes the memory's digital interfaces to an external controller or processor. Input data from an external (off chip) 4-bit data bus arrives at the digital interface of the resistive change memory (FIG. 10) with each positive and negative transition of the clock and eight bits are latched into a data I/O buffer/driver 1067 (FIG. 10) in two groups of 4 bits. Then, at each positive transition of the clock, the eight bits are transferred to the 8-bit on-chip data bus, and bi-directional data bus control circuit 440 (FIG. 4B) is activated and transfers the eight bits to eight sense amplifiers and are written into memory array 410 (FIG. 4B). If there are 2048 bits along a word line, such as word line WL[0] in this example, then the WRITE operation of all bits to be written along word line WL[0] is completed after 256 clock cycles. Then another word line will be selected, WL[1] for example, and similar WRITE operations will be performed. And so on until the entire page is written and the WRITE operation is complete. Timing diagram 550 shows only WL[0] and one representative bit line pair BL[x]. However, it is representative of the WRITE operation for all bits written to memory array 410 of schematic 402 illustrated in FIG. 4B.

Looking again to FIG. 5B, a clock signal (CLK) is used to represent the external synchronization timing requirements of the DDR NRAM memory. Throughout the first clock cycle (between "clock 0" and "clock 1"), the array voltages (represented by the "Chip Voltages" waveform) are all at $V_{DD}$. Select line SL[x] voltage remains low (ground for example) during the entire WRITE cycle. $V_{DD}$ is typically, but not limited to, a voltage of approximately 1 V. The row address has been activated, and word line WL[0] has been selected in this example prior to the start of the first clock CLK cycle (not shown in FIG. 5B). The column address clock generator is activated (FIG. 10) by WRITE "command" WRT. The "Col Address" is received and is stored in the column address buffer (FIG. 10). Column address C0 is selected at the beginning of the WRITE cycle. There is an on chip latency (delay) of 2 CLK cycles in this example before external data is received by the data I/O Buffer/Driver 1067 (FIG. 10). Sense amplifier/latches, such as sense amplifier/latch 430 (FIG. 4B), are inactive with PSET voltage high and NSET voltage low.

At the start of the second clock cycle (between CLK 1 and CLK2) the column address clock generator is activated (FIG. 10) by WRITE "command" WRT, and "Col Address" C0 is selected. In support of the WRITE operation, on-chip voltage generators provide SET voltage $V_{SET}$ in excess of $V_{DD}$. In this example, $V_{SET}=V_{DD}\times2$, and SET overdrive voltage $V_{DD}\times2+V_{TH}$ using known on-chip voltage generation methods. The selected word line WL[0] in this example, illustrated in memory array 410 (FIG. 4B), transitions to $V_{DD}\times2+V_{TH}$ to enable the full SET voltage $V_{DD}\times2$ and WRITE current to nonvolatile storage element SWx0. However, it should be understood that in some cases it may be desirable to limit the SET current flowing into corresponding nonvolatile storage element SWx0 by operating FET Tx0 in a saturation mode. In such cases, word line WL[0] voltage may be driven to a lower voltage than $V_{DD}\times2+V_{TH}$ to achieve a desired lower SET current flow, and may be selected to be even less than $V_{DD}\times2$.

Referring to FIG. 5B, at the start of the third clock cycle (between CLK2 and CLK3) "Command" and "Col Address" are activated in this and each of the subsequent cycles as described with respect to cycles 1 and 2 above. "Data in" begins with data input DI0 from the 4-bit external data bus, which is latched by the data I/O buffer/driver 1067 (FIG. 10) by the end of cycle 3, during the positive transition of clock "CLK". The incoming data pulses on the external 4-bit data bus transition between 0 and $V_{DD}$ voltages for both rising and falling transitions of the clock CLK. These external data pulses are received by the data I/O buffer/driver 1067 in two groups of 4 bits, DI0 and DI0'. Data I/O buffer/driver 1067 (FIG. 10) boosts the voltage to a WRITE voltage of $V_{DD}\times2$ and transmits data waveforms corresponding to 8 bits over the bidirectional internal data bus to bi-directional data bus control circuit 440 (FIG. 4B) at each positive transition of clock CLK, where D and nD pulses transition in a voltage range of zero to $V_{DD}$×2 as shown in timing diagram 550 (FIG. 5B).

Figure 8A:
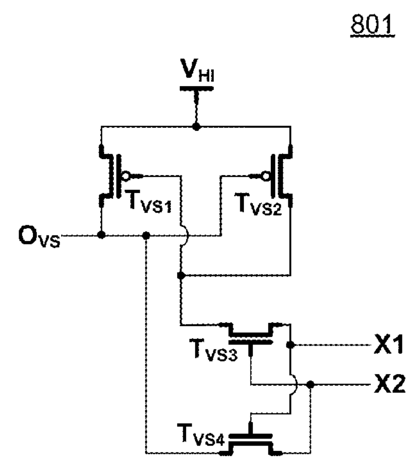
FIGS. 8A-8C are a series of annotated schematic diagrams detailing the operation of the voltage shifter element within the second DDR compatible NRAM array architecture detailed in FIG. 6B.

A voltage shifter circuit, such as voltage shifter circuit 801 shown in FIG. 8A, may be positioned between data I/O buffer/driver 1067 and the 8 bit on chip data bus (FIG. 10) to generate pulses in a voltage range of zero to $V_{DD}$×2 for WRITE operations. Voltage shifter circuit 801 is activated during WRITE operations and is inactive (bypassed) during READ operations. Alternatively, voltage shifter circuit 801 (FIG. 8A) may be incorporated as part of the bi-directional data bus control circuit 640 and activated only during WRITE operations.

Continuing with the third clock cycle timing description, sense amplifier/latches are activated by "SA/Latch voltages" at the end of cycle 3. PSET transitions from $V_{DD}$ to ground thereby connecting FET $T_{SA5}$ to sense amplifier voltage $V_{SA}$, with $V_{SA}$=$V_{SET}$=$V_{DD}$×2 for a WRITE operation (sense amplifier/latch 430, FIG. 4B, for example). NSET transitions from zero to $V_{SET}$=$V_{DD}$×2 voltage thereby connecting FET $T_{SA6}$ to a low voltage (ground). "SA/Latch voltages" shows one of the eight sense amplifiers activated during the first WRITE cycle. Since in this page mode example there are 256 WRITE cycles needed to WRITE all the bits along word line WL[0], the sense amplifier/latch remains activated long enough to latch and temporarily hold a data bit until completion of the first WRITE cycle. It is then deactivated until after another 255 WRITE cycles are completed in order to save power. It is reactivated (not shown) when a new word line is selected by a row decoder (FIG. 10). The column decoder (FIG. 10) selects the eight sense amplifiers again, and the next WRITE cycle begins. "N-ISOLATE1" is activated at the end of cycle 3 because word line WL[0] in this example is an even numbered word line, and is also activated for any other even numbered word line chosen. N-ISOLATE 1 is used to connect sense amplifier/latch 430 to memory array 410 as illustrated in FIG. 4B. However, N_ISOLATE2 (not shown in this example) would be activated instead for each odd numbered word line if selected. N_ISOLATE1 is shown to be deactivated after completion of the first WRITE cycle to decouple the sense amplifier/latch from the array until all bits are written along word line WL[0] and a new word line is selected. Alternatively, since the corresponding sense amplifier/latch is deactivated, the N_ISOLATE1 device could remain activated.

Referring to FIG. 5B, at the start of the fourth clock cycle (between CLK3 and CLK4), "Data in" continues with data input DI0' from the 4-bit external data bus, which is latched by the data I/O buffer/driver 1067 (FIG. 10) in mid-clock cycle 4, during a negative transition of clock "CLK". At this point in the cycle, the 8 bits represented by DI0 and DI0' are available from the data I/O buffer/driver 1067 on the 8-bit bidirectional "Data Bus". "CSL" activates bi-directional data bus control circuit 440 (FIG. 4B) connecting the 8-bit on-chip data bus to each of eight sense amplifier/latches, such as sense amplifier/latch 430, that latch and temporarily hold the data and drive corresponding "Bit Lines". In this example, timing diagram 550 shows one of the eight selected sense amplifiers activated and receiving a logic "1" state, corresponding to data bus input "D" illustrated timing diagram 550, that results in a SET operation in which bit line BL[x]_D/R is driven to $V_{SET}$=$V_{DD}$×2 and sets nonvolatile storage element SWx0 to a low resistance value corresponding to a logic "1" state. "Bit lines" BL[x]_D/R and BL[x]_R/D are connected to opposite terminals of sense amplifier/latch 430 in this example, which shows bit line BL[x]_D/R transitioning to SET voltage $V_{DD}$×2, while complementary bit line BL[x]_R/D remains at a low voltage such as ground. In this example, a logic "1" data bit from one of the eight data bit inputs DI0 and DI0' is shown causing a transition from a RESET logic "0" state to a SET logic "1" state in nonvolatile storage element SWx0 for bit line pair BL[x] (FIG. 4B) in memory array 410. A logic "0" input data bit would have left nonvolatile storage element SWx0 in the RESET, logic "0" state.

Referring to FIG. 5B, during the fifth clock cycle (between CLK4 and CLK5), bit line BL[x]_D/R SET cycle is completed. "SA/Latch voltages" deactivate the corresponding sense amplifier/latch. "N_ISOLATE1" turns isolation transistors to an off state. Word line WL[0] remains active until all bits along the word line are written, which in this page mode example, requires a total of 256 cycles. The next 4-bit DI1 data inputs are received from the external data bus during a positive transition of the clock CLK, then 4-bit DDI1' data inputs are received during the negative transition of the clock CLK. The 8 bits are temporarily latched by data I/O buffer/driver 1067 (FIG. 10) and transmitted to the 8-bit on-chip data bus. CSL is activated and the eight data bits are routed to another 8 sense amplifier/latches corresponding to another column address decoded by the column decoder (FIG. 10). Another 8 bits are written along selected word line WL[0] but at other cells and corresponding storage element locations in memory array 410 (FIG. 4B). The activation of these other sense amplifier/latches and turning on of the activation devices is similar to those illustrated in timing diagram 550 except that they occur during later clock cycles. The 8-bit data WRITE operation is repeated again with input data DI2 and DI2' in cycle 6 (cycle 5 to cycle 6), and so on, until all bits along selected word line WL[0] are written. In this page mode example, 2048 bits are written along word line WL[0] in 256 cycles. The DDR page mode WRITE operation then continues with a new word line when WL[0] is deactivated, and another word line, WL[1] for example, selected by the row decoder is activated. The waveforms shown in timing diagram 550 (FIG. 5B) are repeated until all bits in the page have been written.

As discussed above, the exemplary WRITE operation detailed in FIG. 5B is used to adjust a selected array cell initially in a high resistance RESET state (corresponding to a logic '0') into a low resistance SET state (corresponding to a logic '1') by applying a required SET voltage ($V_{DD}$×2 within this exemplary WRITE operation) to the data bus line (D). However, it should be noted that this WRITE operation could have left this selected array cell in its initial RESET state by simply leaving the data bus line (D) low (driven at 0V, for example) for the WRITE operation as would be consistent with the READ/RESET operation discussed with respect to FIG. 5A above. Further, in other applications this exemplary WRITE operation could have also been used to adjust a resistive change element initially in a low resistance SET state into a high resistance RESET state by driving the data bus line with a required RESET voltage (as discussed previously).

A Second DDR Compatible Resistive Chance Element Array Architecture

As discussed in detail above with respect to FIGS. 4A, 4B, 5A, and 5B, the first DDR compatible resistive change element array architecture of the present disclosure can, in certain applications, result in relatively high voltage data pulses on the internal data bus during WRITE (or programming) operations as compared to the system level voltages being used by digital circuitry controlling the array. Within such applications, these higher voltages may require high voltage-compatible transistors along the entire data path (including the sense amplifier/latch). And—again, within certain application—these larger, high voltage components could represent scaling and/or cost limitations within a memory array design. To this end, the second DDR compatible resistive change element array architecture of the present disclosure is presented. This second architecture includes a voltage shifting element, which can be used within these certain applications, to reduce or otherwise eliminate the need for large and high voltage rated components.

Figure 6B:
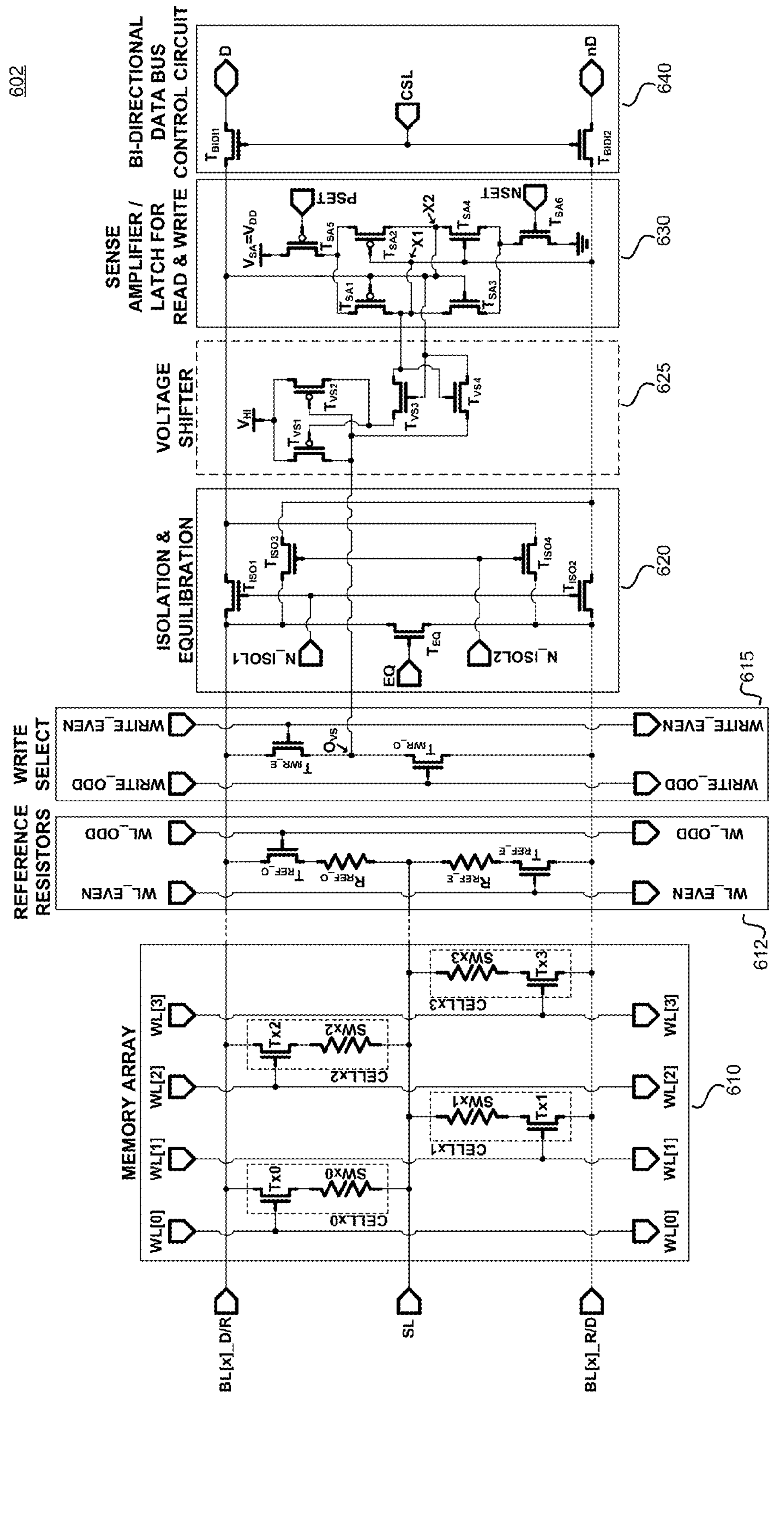
FIG. 6B is a simplified schematic for a second DDR compatible NRAM architecture illustrating a bit line pair (row "x") of a DDR compatible folded bit line resistive change memory array architecture according to the methods of the present disclosure (note that bit line columns are drawn horizontally to accommodate the bit line pairs, isolation devices, voltage shift write circuit, and sense amplifier circuit details).

Referring now to FIGS. 6A and 6B, this second DDR compatible memory circuit architecture for an array of resistive change elements according to the present disclosure is shown. As with FIGS. 4A and 4B, for ease of explanation, the exemplary schematic 602 depicting a single row (row "x") of this second architecture is divided into a number of functional sections (610, 612, 615, 620, 625, 630, and 640). Table 601 in FIG. 6A describes each of these functional sections, and their use within both READ and WRITE operations on the array.

Looking now to both FIGS. 6A and 6B, most of the sections within the second DDR compatible architecture of the present disclosure are identical in structure and function to the first DDR compatible architecture as shown in FIGS. 4A and 4B and discussed in detail above, with the important exception of isolation and equilibration section 620 during a WRITE operation. The operation of isolation and equilibration section 620 (FIG. 6A) and isolation and equilibration section 420 (FIG. 4A) perform essentially the same function during READ. However, during a first DDR compatible architecture WRITE operation, isolation and equilibration section 420 is active and couples the relatively high SET voltage $V_{DD}\times2$ from the sense amplifier/atch 430 to the memory array 410. Conversely, during a second DDR compatible architecture WRITE operation, isolation and equilibration section 620 is inactive and decouples the low $V_{DD}$ voltage of sense amplifier/latch 630 from memory 610, such that when a bit line in memory array 610 is driven to the relatively high SET voltage $V_{DD}\times2$ by voltage shifter 625 and write select 615 circuit, the sense amplifier/latch 630 remains low at $V_{DD}$. Hence, unlike the first DDR compatible architecture, the second DDR compatible architecture during a WRITE operation enables the write data pulses from the 4-bit external data bus, switching between zero and $V_{DD}$, to switch in the same low voltage range through the data I/O buffer/driver 1067 FIG. 10), onto the 8-bit on chip data bus, through bi-directional data bus control circuit 640, and be temporarily latched by sense amplifier/latch 630 also operating between zero and $V_{DD}$, thereby realizing the benefits of the second DDR compatible architecture described further above. The operation of voltage shifter 625 and write select 615 are described further below.

The first section 610 within this second DDR compatible architecture of the present disclosure is the memory array itself. As with first architecture of FIG. 4B these are the individual array cells (CELLx0-CELLx3 in FIG. 6B) themselves, each comprising a resistive change element (SWx0-SWx3, in FIG. 6B) and a selection element (FETs Tx0-Tx3, in FIG. 6B). Each of these cells is addressable responsive to an array of word lines, a pair bit lines (for each row), and a select line (for each array row) as described in detail above with respect to FIG. 4B.

Section 612 within this second DDR compatible architecture contains the reference resistors (identical to section 412 in FIG. 4B). Section 620 within this second DDR compatible architecture provides equilibration and isolation devices. Section 630 within this second DDR compatible architecture is a sense amplifier/latch. And bi-directional data bus control circuit 640 within this second DDR compatible architecture is a data bus bi-directional control. As with the memory array section 610, the structure and function of these sections is identical to those of their counterparts detailed in FIG. 4B and are described in detail within the discussion of FIG. 4B above.

Section 615 (the write select controls) and section 625 (the voltage shifter) of FIG. 6B provide a voltage shifting function during WRITE operations within the second DDR compatible architecture. This voltage shifting function (described further above) will be described in more detail with respect to FIG. 7 and FIG. 8 and allows the sense amplifier/latch 630 and the bi-directional data bus control circuit 640 to operate at $V_{DD}$ (the relatively lower system level voltage, as described with respect to FIG. 5B above) and restricts exposure to the relatively higher programming voltages ("$V_{HI}$" as listed FIG. 6A) to the memory array itself, section 610, and to sections 615 and 625 providing these relatively high voltages. In this way, the need for larger and high voltage rated components for the entire data path during a WRITE operation, as would be required within certain applications using the first DDR compatible architecture of FIG. 4B, is significantly reduced, allowing for more desirable design parameters (in terms of scaling and cost, for example) within such applications.

As shown in FIG. 6A, during a READ operation using the second DDR compatible architecture of the present disclosure, section 615 (the write select controls) and section 625 (the voltage shifter) are disabled. As such, during READ operations the second DDR compatible architecture is essentially identical to the first DDR compatible architecture, and the READ operation is identical to that shown within the waveform diagrams of FIG. 5A. As such, the discussion of the READ operation detailed in FIG. 5A above is also illustrative of a READ operation performed on the second DDR compatible architecture as shown in FIG. 6B. As described above, however, these new sections (615 and 625) provide a voltage shifting function and memory array 610 voltage and current drive function during a WRITE operation by providing a $V_{DD}\times2$ voltage to memory array 610 bit lines. This voltage shifting and drive function is illustrated in the exemplary WRITE operation detailed in FIG. 7.

Figure 7:
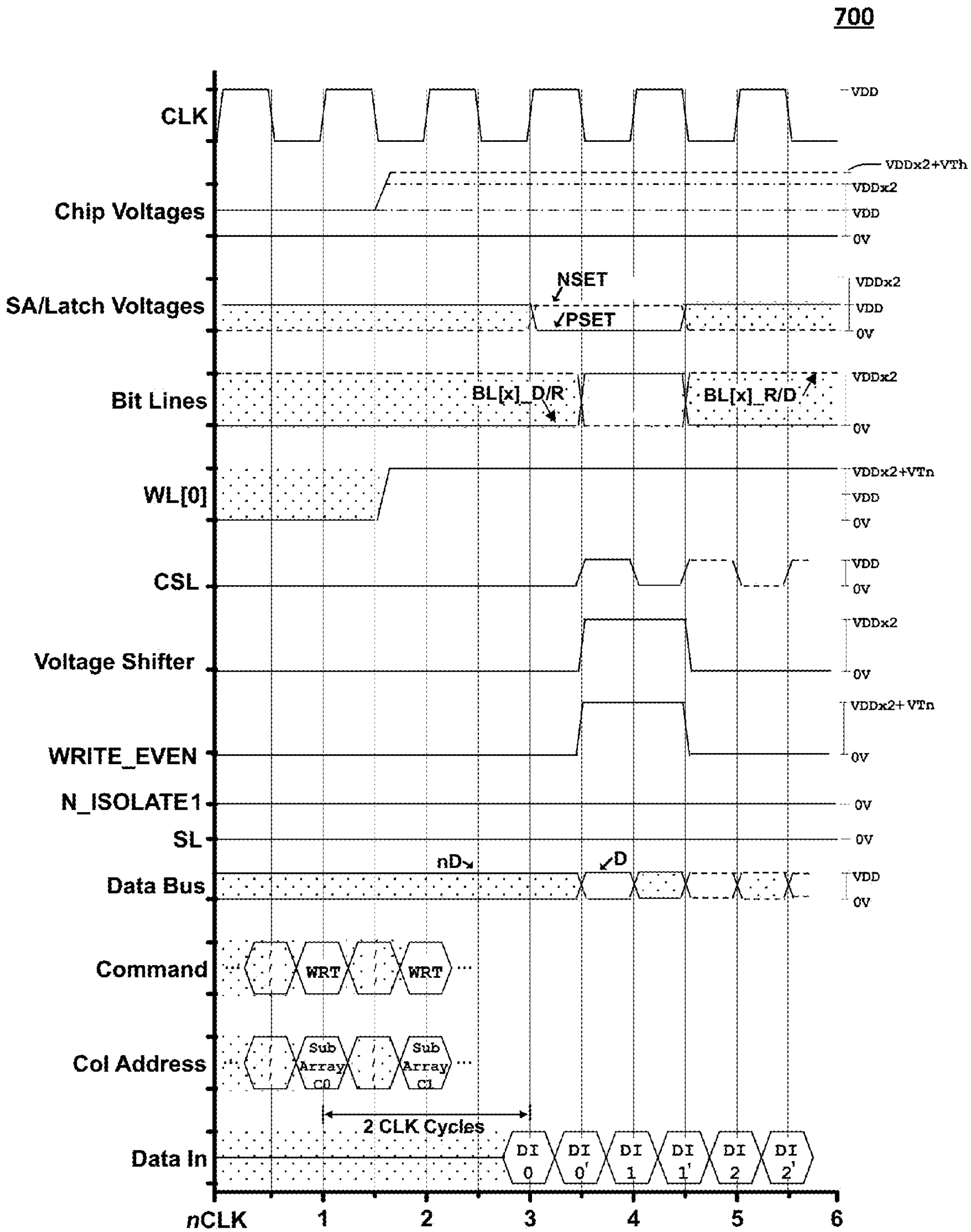
FIG. 7 is a waveform timing diagram illustrating an exemplary WRITE operation performed on a cell within the second DDR compatible NRAM array architecture detailed in FIG. 6B.

Referring now to timing diagram 700 illustrated in FIG. 7, a clock (CLK) signal synchronizes the memory's digital interfaces to an external controller or processor (as was described with in FIG. 5B). As with the exemplary WRITE operation on the first DDR compatible architecture of FIG. 5B, throughout the first clock cycle (between "clock 0" and "clock 1") in FIG. 7, the array voltages (represented by the "Chip Voltages" waveform) remain at $V_{DD}$. Select line SL voltage remains low (ground for example) during the entire WRITE cycle. $V_{DD}$ is typically, but not limited to, a voltage of approximately 1 Volt. The row address has been activated and word line WL[0] has been selected in this example prior to the start of the first clock CLK cycle (not shown in FIG. 7). The column address clock generator is activated (FIG. 10) by WRITE "command" WRT. The "Col Address" is received and is stored in column address buffer (FIG. 10). Column address C0 is selected at the beginning of the WRITE cycle. There is an on chip latency (delay) of 2 CLK cycles in this example before external data is received by the data I/O Buffer/Driver 1067 (FIG. 10). Sense amplifier/latches, such as sense amplifier/latch 630 (FIG. 6B), are inactive with PSET voltage high and NSET voltage low.

However, unlike timing diagram 550 shown in FIG. 5B, in timing diagram 700 (FIG. 6B) N_ISOLATE1 remains low during the entire WRITE cycle so as to isolate sense amplifier/latch 630 from the relatively high voltages applied to bit lines of memory array 610 as explained further above.

Referring to timing diagram 700 (FIG. 7), at the start of the second clock cycle (between CLK1 and CLK2) the column address clock generator is activated (FIG. 10) by WRITE "command" WRT and "Col Address" C1 is selected, which is essentially the same timing described above with respect to timing diagram 550 shown in FIG. 5B. In support of the WRITE operation, on-chip voltage generators provide SET voltage $V_{SET}$ in excess of $V_{DD}$, in this example, $V_{SET}=V_{DD}\times 2$, and SET overdrive voltage $V_{DD}\times 2+V_{TH}$ using known on-chip voltage generation methods. So for example, if $V_{DD}=1$ V, $V_{SET}=2$ V. The selected word line WL[0] in this example, illustrated in memory array 610 (FIG. 6B), transitions to $V_{DD}\times 2+V_{TH}$ to enable the full SET voltage $V_{DD}\times 2$ and WRITE current to nonvolatile storage element SWx0. However, as described above with respect to FIG. 5B, it should be understood that in some cases it may be desirable to limit the SET current flowing into corresponding nonvolatile storage element SWx0 by operating FET Tx0 in a saturation mode.

Referring to FIG. 7, at the start of the third clock cycle (between CLK2 and CLK3) "Command" and "Col Address" are activated in this and each of the subsequent cycles as described with respect to cycles 1 and 2 above. "Data in" begins with data input DI0 from the 4-bit external data bus, which is latched by the data I/O buffer/driver 1067 (FIG. 10) by the end of cycle 3, during the positive transition of clock "CLK". The incoming data pulses on the external 4-bit data bus transition between 0 and $V_{DD}$ voltages for both rising and falling transitions of the clock CLK. These external data pulses are received and temporarily latched by the data I/O buffer/driver 1067 in two groups of 4 bits. Data I/O buffer/driver 1067 then transmits data waveforms corresponding to 8 bits over the bidirectional internal data bus, switching between $V_{DD}$ and zero volts, to bi-directional data bus control circuit 640 (FIG. 6B) at each positive transition of clock CLK, where D and nD also transition in a voltage range of $V_{DD}$ as shown in timing diagram 700 (FIG. 7).

Continuing with the third clock cycle timing description, sense amplifier/latches are activated by "SA/Latch voltages" at the end of cycle 3. PSET transitions from $V_{DD}$ to ground thereby connecting FET TSA5 to sense amplifier/latch 630 voltage $V_{SA}=V_{DD}$ as shown in FIG. 6B. NSET transitions from zero to $V_{DD}$ voltage thereby connecting FET TSA6 to a low voltage (ground). "SA/Latch voltages" shows one of the eight sense amplifiers activated during the first WRITE cycle. Since in this page mode example, there are 256 WRITE cycles needed to write all the bits along word line WL[0], the sense amplifier/latch remains activated long enough to latch and temporarily hold a data bit until completion of the first WRITE cycle. It is then deactivated until after another 255 WRITE cycles are completed in order to save power. It is reactivated (not shown) when a new word line is selected by a row decoder (FIG. 10), the column decoder (FIG. 10) selects the eight sense amplifiers again, and the next WRITE cycle begins. "N-ISOLATE1" remains deactivated during the entire second DDR compatible architecture, as shown in timing diagram 700, to isolate sense amplifier/latch 630 from the relatively high WRITE voltage applied to bit lines of memory array 610 as explained further above.

Referring to FIG. 7, at the start of the fourth clock cycle, (between CLK3 and CLK4), "Data in" continues with data input DI0' from the 4-bit external data bus, which is latched by the data I/O buffer/driver 1067 (FIG. 10) in mid-clock cycle 4, during a negative transition of clock "CLK". At this point in the cycle, the 8 bits represented by DI0 and DI0' are available from the data I/O buffer/driver 1067 on the 8-bit bidirectional "Data Bus". "CSL" activates bi-directional data bus control circuit 640 (FIG. 6B) connecting the 8-bit on-chip data bus to each of eight sense amplifier/latches, such as sense amplifier/latch 630, that latch and temporarily hold the data. In this example, the data bus input to be written into memory array 610 is shown in timing diagram 700 as "D". In the second DDR compatible architecture, voltage shifter 625 is activated as $V_{HI}$ transitions from a low voltage to the WRITE SET voltage $V_{DD}\times 2$. As explained further below with respect to FIG. 8, sense amplifier/latch 630 terminals x1 and x2 voltages are in the range of zero to $V_{DD}$ volts. Voltage shifter 625 output voltage $O_{VS}$ switches from zero to $V_{DD}\times 2$. In this example, since an even word line WL[0] was selected, write select 615 circuit FET $T_{WR\_E}$ is activated when WRITE_EVEN transitions to $V_{DD}\times 2+V_{TH}$ and output voltage $O_{VS}$ drives bit line BL[x]_D/R to $V_{SET}=V_{DD}\times 2$ and sets nonvolatile storage element SWx0 to a low resistance value corresponding to a logic "1" state. If the input data had been a logic "0", the sense amplifier would have been in the opposite state and voltage shifter 625 output voltage $O_{VS}$ would have been a low voltage, essentially zero volts, leaving nonvolatile storage element SWx0 in its pre-set high resistance RESET state. It should be noted that if an odd numbered word line were selected, WRITE_ODD would be enabled instead of WRITE_EVEN, and the programming voltage ($O_{VS}$) would be instead driven onto BL[x]_R/D. The combination of voltage shifter 625 and write select 615 bypass isolation and equilibration 620 circuit to perform a WRITE operation, since a low N_ISOLATE1 voltage keeps isolation and equilibration 620 circuit inactive as explained further above.

Referring to FIG. 7, during the fifth clock cycle (between CLK4 and CLK5), bit line BL[x] D/R SET cycle is completed. "SA/Latch voltages" deactivate the corresponding sense amplifier/latch. Voltage shifter 625 is turned off by disconnecting $V_{HI}$ from chip voltage $V_{DD}\times 2$ and write select 615 is deactivated by WRITE_EVEN. Word line WL[0] remains active until all bits along the word line are written, which in this page mode example, requires a total of 256 cycles. The next 4-bit DI1 data inputs are received from the external data bus during a positive transition of the clock CLK, then 4-bit DDI1' data inputs are received during the negative transition of the clock CLK. The 8 bits are temporarily latched by data I/O buffer/driver 1067 (FIG. 10) and transmitted to the 8-bit on-chip data bus. CSL is activated and the eight data bits are routed to another 8 sense amplifier/latches corresponding to another column address decoded by the column decoder (FIG. 10). Another 8 bits are written along selected word line WL[0] but at other cells and corresponding storage element locations in memory array 610 (FIG. 6B). The activation of these other sense amplifier/latches and turning on of the activation devices is similar to those illustrated in timing diagram 700 except that they occur during later clock cycles. The 8-bit data WRITE operation is repeated again with input data DI2 and DI2' in cycle 6 (cycle 5 to cycle 6), and so on, until all bits along selected word line WL[0] are written. In this page mode example, 2048 bits are written along word line WL[0] in 256 cycles. The DDR page mode WRITE operation then continues with a new word line when WL[0] is deactivated, and another word line, WL[1] for example, selected by the row decoder is activated. The waveforms shown in timing diagram 700 are repeated until all bits in the page have been written.

The second DDR compatible architecture performed essentially the same WRITE function (table 601, schematic 602, and timing diagram 700 illustrated in FIGS. 6A, 6B, and 7, respectively) as the first DDR compatible architecture (table 401, schematic 402, and timing diagram 550 illustrated in FIGS. 4A, 4B, and 5B). However, the second DDR compatible architecture used the relatively low operating voltage $V_{DD}$ (approximately 1 V in this example) in the entire data path including the sense amplifier/latch, digital data interface, on-chip data bus, and data I/O buffer/driver 1067. The higher WRITE voltage of $V_{DD}\times2$ was only used to drive bit lines. Since the first DDR compatible architecture used the relatively high $V_{DD}\times2$ voltage in the entire data path, the second architecture needs far fewer larger and high voltage rated components for the entire data path and significantly reduces power dissipation with lower voltage swings, resulting more desirable (favorable) design parameters in terms of scaling and cost, for example, within such applications as described further above.

Figure 8B:
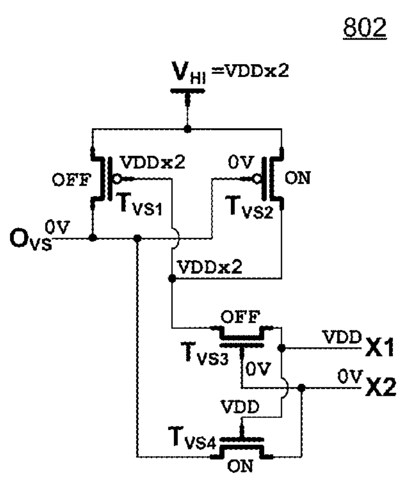
Figure 8C:
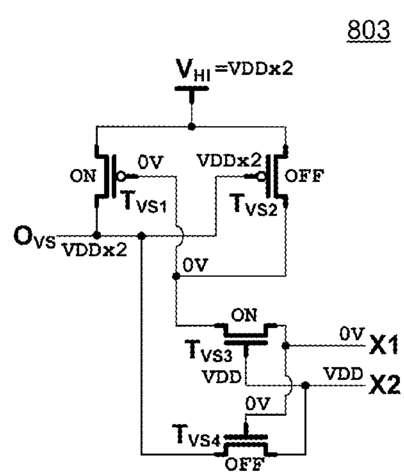

FIGS. 8A-8C illustrate the function of the voltage shifter 625 shown in FIG. 6B and used within the exemplary WRITE operation on the second DDR compatible resistive change element array as detailed in FIG. 7. FIG. 8A shows the voltage shifter circuit 801 isolated from the array circuit for the sake of clarity with input nodes X1 and X2 connected to sense amplifier/latch 630. FIG. 8B shows a first state 802 of node voltages within voltage shifter circuit 801 when input node X1 is at voltage $V_{DD}$ and input node X2 is at 0 V, resulting in an output voltage $O_{VS}$=0 V. And FIG. 8C shows a second state 803 within voltage shifter circuit 801 when input node X1 is at 0 volts and input node X2 is at voltage $V_{DD}$, resulting in an output voltage $O_{VS}=V_{DD}\times2$.

Looking now to FIG. 8A, PFET devices $T_{VS1}$ and $T_{VS2}$ have source terminals that are connected together and pulled up to $V_{HI}$, which represents a required programming voltage (as described above with respect to FIGS. 6B and 7). As with the exemplary WRITE operation of FIG. 7, within FIGS. 8B and 8C this programming voltage is imagined to be $V_{DD}\times2$, or twice the voltage level of the digital circuitry driving the array. The drain of $T_{VS1}$ is connected to the drain of NFET device $T_{VS4}$ and the gate of $T_{VS2}$ at node $O_{VS}$. The drain of $T_{VS2}$ is connected to the drain of NFET $T_{VS3}$ and the gate of $T_{VS1}$. The source of $T_{VS3}$ is connected to the gate of $T_{VS4}$ and to terminal X1 connected to sense amplifier/latch 630. The source of $T_{VS4}$ is connected to the gate of $T_{VS3}$ and to terminal X2 also connected to sense amplifier/latch 630.

As shown in FIG. 8B, when $V_{DD}$ is applied to X1 and 0V is applied to X2 (which would represent a logic '0' temporarily stored in sense amplifier/latch 630), $T_{V\Omega}$ and $T_{VS4}$ are turned on, and $T_{VS1}$ and $T_{VS3}$ are turned off. This results in 0V at node $O_{VS}$, essentially no programming voltage or current driven onto the bit line. However, as shown in FIG. 8C, when 0V is applied to X1 and $V_{DD}$ is applied to X2 (which would represent a logic '1' temporarily stored in sense amplifier/latch 630), $T_{VS1}$ and $T_{VS3}$ are turned on, and $T_{VS2}$ and $T_{VS4}$ are turned off. Referring now FIG. 6B circuits bi-directional data bus control 640, sense amplifier/latch 630, and voltage shifter 625, when terminal D is at $V_{DD}$ and terminal nD is at zero Volts, corresponding to a logic "1", then sense amplifier/latch terminals X1=0 and X2=$V_{DD}$. This results in $V_{HI}$ (the required programming voltage $V_{DD}\times2$ in this example) being driven out at node $O_{VS}$.

Figure 9:
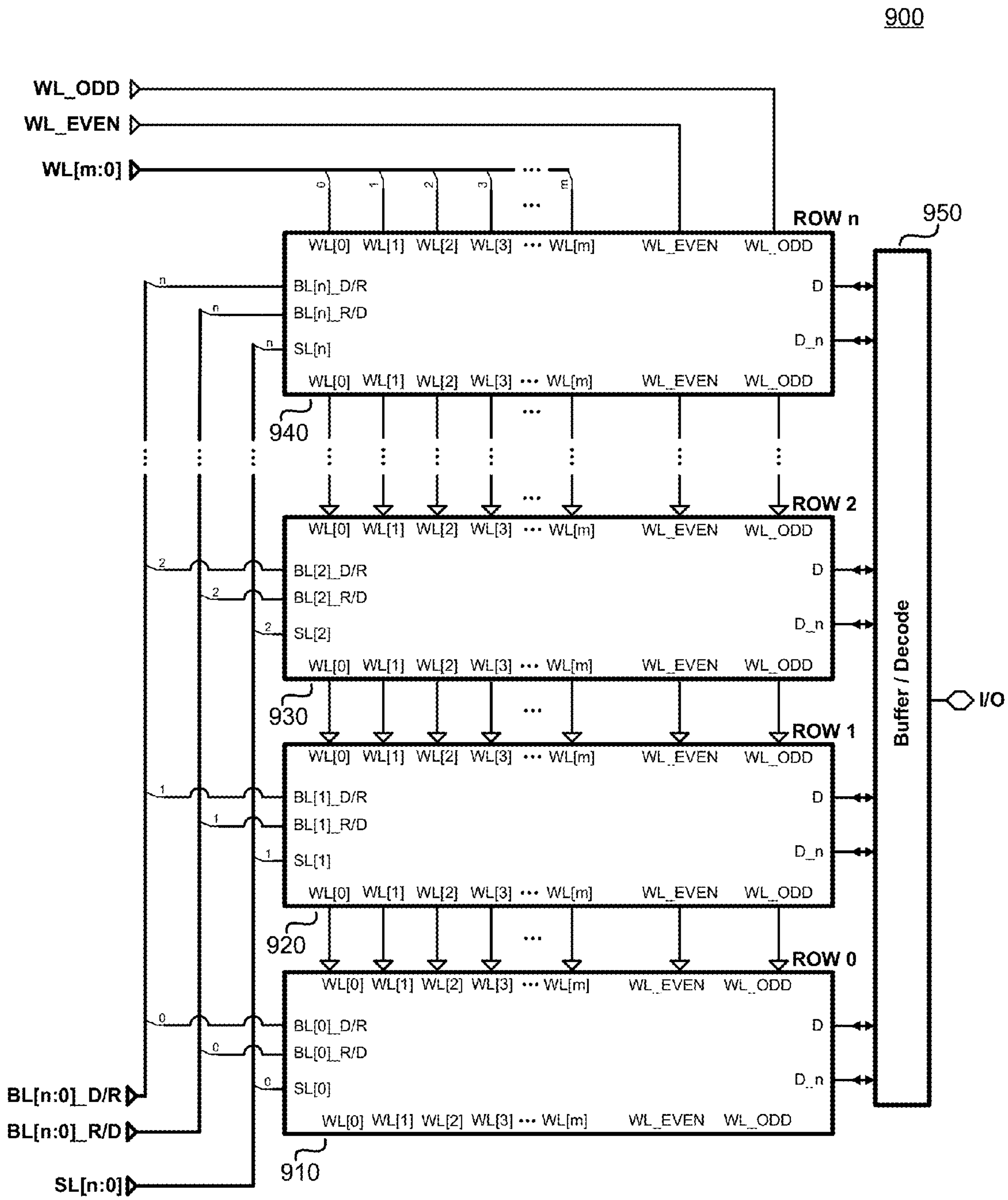
FIG. 9 is a simplified block diagram illustrating the array structure of DDR compatible NRAM architectures of the present disclosure.

Referring now to FIG. 9, a simplified block diagram of a resistive change element memory array 900 and is used to illustrate how the simplified array row schematics 402 and 602 of FIGS. 4B and 6B, respectively, are used within a full memory array. The memory array 900 is comprised of "n+1" rows, with each row containing "m+1" memory cells. Or thought of another way, resistive change memory array 900 comprises an array of resistive change memory elements arranged in a grid of "n+1" rows and "m+1" columns. As described above, the simplified schematics of FIGS. 4B and 6B each showed a representative single row (row "x") of the first and second, respectively, DDR compatible resistive change element architectures of the present disclosure.

Each of the rows (ROW 0, ROW1, ROW 3, and ROW n) in resistive change memory array 900 is represented by a block (910, 920, 930, and 940, respectively). Each of these blocks (910-940) is representative of either the simplified array row schematic 402 illustrated in FIG. 4B or the simplified array row schematic 602 illustrated in FIG. 6B and discussed in detail with respect to the waveform diagrams 550 shown in FIG. 5B and 700 shown in FIG. 7, respectively. The isolation controls (N_ISOLATE1, N_ISOLATE2, and EQ in FIGS. 4B and 6B), the sense amplifier/latch controls (NSET and PSET in FIGS. 4B and 6B), the output controls (CSL in FIGS. 4B and 6B), and the write select controls (WRITE_EVEN and WRITE_ODD in FIG. 6B) are not shown within FIG. 9 for the sake of clarity. However all rows (910-940) can be thought to be responsive to these control signals.

As can be seen in FIG. 9, an array of "n+1" pairs of bit lines (BL[n:0]_D/R and BL[n:0]_R/D) is used to provide each row (910-940) within the resistive change memory array 900 with a pair of dedicated folded bit lines. BL[n:0]_D/R is analogous to BL[x]_D/R in FIGS. 4B and 6B, and BL[n:0]_R/D is analogous to BL[x]_R/D in FIGS. 4B and 6B. An array of select lines (SL[n:0]) is used to provide each row (910-940) within the resistive change memory array 900 with a select line (analogous to SL[x] in FIGS. 4B and 6B). An array of "m+1" word lines (WL[m:0]) is common to all rows (910-940) within the array, and each of the "m+1" resistive change memory cells within each array row (910-940) is responsive to one of these word lines. WL[m:0] is analogous to WL[3:0] in FIGS. 4B and 6B. WL_ODD and WL_EVEN are control signals also common to all rows (910-940) within the memory array 900. As described in detail within the discussion of FIGS. 4B, 5A, and 6B, each array row (910-940) with memory array 900 includes two reference elements. Within each array row (910-940), each of these reference elements is responsive to either WL_ODD or WL_EVEN as detailed in the discussion of FIGS. 4B, 5A, and 6B above.

A buffer/decoder element 950 is used to connect with the data lines (D and nD in FIGS. 4B and 6B) of each of the array rows (910-940) and arrange these data signals into a data input/output (I/O) interface. In this way, the data lines from each row can be selected and processed as befits the needs of the interface for particular application using a specific external control circuitry element (such as, but not limited to, a microprocessor or an FPGA).

Figure 10:
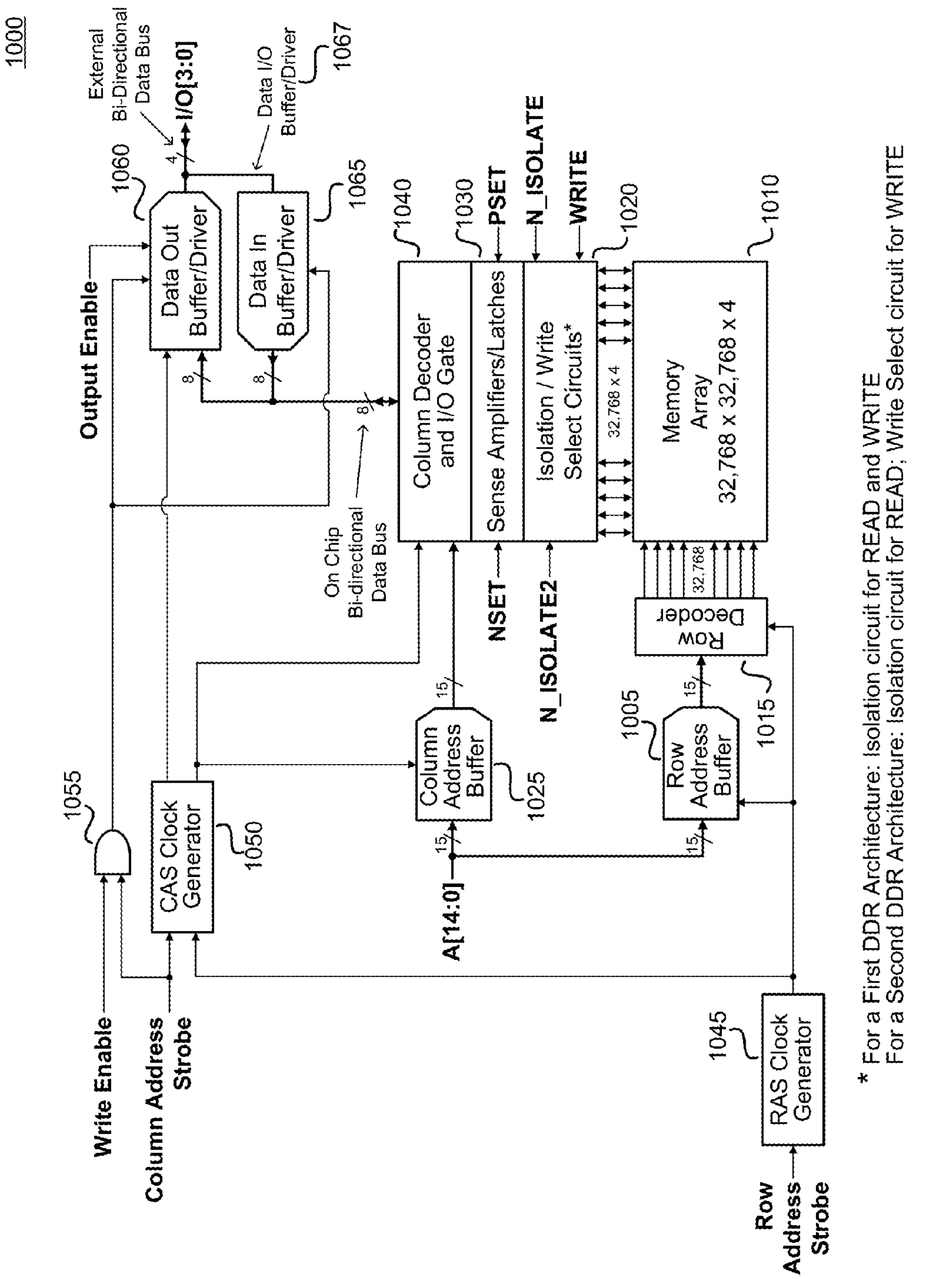
FIG. 10 is system level block diagram illustrating an exemplary 1 Gb×4 DDR compatible architecture for a resistive change memory array according to the methods of the present disclosure.

Referring now to FIG. 10, a system level block diagram illustrating an exemplary 1 Gb×4 resistive change memory 1000 suitable for use with the first and second DDR compatible resistive change array architectures of the present disclosure is shown.

At the core of the resistive change memory 1000 (FIG. 10), a four Gigabit Memory Array element 1010 is architected in a 32,768×32,768×4 configuration. Memory Array element 1010 is coupled to an array of Sense Amplifiers 1030 through an array of Isolation Devices 1020. The Isolation/Write Select Circuits 1020 are responsive to a pair of isolation control signals (N_ISOLATE1 and N_ISOLATE2) or a pair of write select control signals (WRITE_EVEN and WRITE_ODD). For a first DDR architecture, isolation circuit control signal N_ISOLATE is used. However, for a second DDR architecture, isolation circuit control signal N_ISOLATE is used for READ and write select control signal WRITE is used during WRITE operations. The Sense Amplifiers 1030, responsive to control signals NSET and PSET, temporally store and provide array data to the I/O Gate block 1040. Referring back to the simplified array row schematics 402 of FIG. 4B and 602 of FIG. 6B, Memory Array element 1010 is analogous to elements 410 and 610; the Isolation/Write select circuits 1020 are analogous to elements 420, 620, and 615; the Sense Amplifier/Latch circuits 1030 are analogous to elements 430 and 630; and the I/O Gate block 1040 is analogous to element bi-directional data bus control circuit 440 and 640. The Data Out Buffer/Decoder 1060 and the Data In Buffer/Decoder 1065, comprising data I/O buffer/driver 1067, are analogous to element 950 in FIG. 9, and provide interface control between the memory 1000 and an external control circuitry element (such as, but not limited to, a microprocessor, a microcontroller, or an FPGA).

Responsive to the Row Address Strobe control signal, RAS Clock Generator 1045 provides a timing signal to Row Address Buffer 1005 and Row Decoder 1015, which, responsive to the address bus (A[14:0]) generate the row array lines required for addressing memory array 1010. Responsive to a Column Address Strobe control signal, CAS Clock Generator 1050 provides a timing signal to Column Address Buffer 1025, which, responsive to the address bus (A[14:0]), generates the column array lines required for addressing memory array 1010. A Write Enable control signal is ANDed with the Column Address Strobe control signal to provide a timing control to Data Out Buffer/Decoder 1060 and Data In Buffer/Decoder 1065 comprising data I/O buffer/driver 1067.

Although not shown in FIG. 7 (for the sake of clarity), external control circuit elements (such as, but not limited to, a microprocessor, a microcontroller, or an FPGA) are used to apply the different control signals and manage the timing of those control signal as described above and within FIGS. 4A, 4B, 5A, 5B, 6A, 6B, and 7 with respect to the resistive change memory architecture of the present disclosure. The READ operations, for example, detailed in FIG. 5A (and described above) and the WRITE operations detailed in FIGS. 5B and 7 (and described above) can be implemented through a variety of structures as best fits the needs of a specific application. For example, FPGAs, PLDs, microcontrollers, logic circuits, or a software program executing on a computer could all be used to execute the programming operations algorithms detailed in FIGS. 5A, 5B, and 7 and provide the necessary control and selection signals discussed above. In this way, the individual resistive change memory cells with the Memory Array element 1010 in FIG. 10, for example, can be independently selected and programmed or read back (as described above) as is needed for a specific application.

It should be noted that though the resistive change memory array architectures of the present disclosure are presented using the exemplary simplified schematics within FIGS. 4B and 6B and the block diagrams of FIGS. 9 and 10, the methods of the present disclosure should not be limited to those specific electrical circuits depicted. Indeed, it will be clear to those skilled in the art that the electrical circuits depicted in FIGS. 4B, 6B, 9, and 10 can be altered in a plurality of ways to optimize a circuit to practice the described advance architectures within a specific application.

It is preferred, then, that the preceding description of resistive change memory array architectures be representative and inclusive of these variations and not otherwise limited to the specific illustrative parameters detailed.

FIGS. 4B and 6B show schematics of NRAM™ memories with folded array architectures, that is, arrays with a complementary bit line pair for each column, and DDR interfaces designed to be compatible with corresponding DRAM DDR architectures. DRAM memories require a folded array architecture for word line noise cancellation during READ operations because of low signal levels since storage capacitors are 5 to 10 times less than corresponding bit line capacitances. Hence bit line voltages transferred to storage capacitors are reduced by 5 to 10 times. In addition, capacitor current leakage between refresh cycles further reduces the voltage stored. Scaling to smaller dimensions has made the DRAM signal problem more difficult as described in the reference: Kiyoo Itoh, "VLSI Memory Chip Design", Springer, 2001 pages 213-217.

Various NRAM™ memories described further below are DDR compatible, and by extension, DDR2, DDR3, DDR4, DDR5, or more generally, DDRn compatible. The DDR interface is a digital synchronous SDRAM JEDEC specification. However, any interface may be used depending on the application. For example, embedded NRAM™ memories in logic chips may simply interface directly with logic circuits without DDR or any other digital interface. Any of the NRAM™ memories described further below may be embedded in logic chips.

In this application, the terms "program" and "write" are used interchangeably and refer to operations such as SET that reduces the resistance value of the nonvolatile resistive element, or RESET, which increases the resistance value of the nonvolatile (NV) resistive element.

Unlike DRAMs, NRAM™ memories do not have low signal problems during READ operations because bit line voltage can transition to essentially zero volts, referred to as ground. During the READ operation, the bit line voltage may be charged to the full power supply $V_{DD}$ voltage, for example, and allowed to discharge. Or the bit line may be charged to $V_{DD}/2$ and allowed to discharge, for example, to minimize the risk of CNT switch resistance disturb or to reduce power dissipation during a READ operation.

For relatively small NRAM™ memories, such as NRAM™ memories embedded in logic chips, bit line voltage discharge for two or more time constants essentially, to ground (zero volts), may be used. However, for large high performance NRAM™ memories, even one bit line discharge time constant delay may be too long, and sensing in a fraction of a time constant may be required. In NRAM™ memories with low and high resistance state values corresponding to a logic "1" and logic "0", respectively, the bit line voltage discharge time for a relatively low NV resistive element state (value) $R_{LO}$ is substantially less than for a relatively high NV resistive element state $R_{HI}$. The bit line time constant $\tau$=RC is determined primarily by the bit line capacitance C and the NV resistive element resistance R. Since in this example, the NV resistive element high resistance state is typically 10-20 times greater than that of the low resistance state, the time constant $\tau$ is typically approximately 10-20 times higher for the high resistance state than the low resistance state. By selecting a reference resistance value greater than the low resistance state but less than the high resistance state, a difference in voltage is generated during the signal development time illustrated in FIG. 5A. For the example illustrated in FIG. 5A, a NV resistive element in a low resistance state is shown with a faster discharge time than the reference resistance state, resulting in a negative voltage difference, which is detected by the sense amplifier (SA)/Latch and switches to a low voltage state. However, for a NV resistive element in a high resistance state, since the reference resistance discharges at a faster rate, a positive voltage difference occurs during signal development, and the SA/Latch switches to a high voltage state (not illustrated in FIG. 5A).

The SA/Latch is designed to switch in substantially less time than the time constant for the CNT switch low resistance state. For example, for an NRAM™ bit line with 400 fF of capacitance and a low resistance state of $R_{LO}$=100 kΩ, the time constant τ=RC=40 ns. If a 5 ns READ time is needed, then sensing needs to occur faster than the time constant τ, which requires sensing a smaller signal, hence offsetting word line to bit line coupling noise is desirable as described above with respect to FIGS. 4B, 5A, and 6B in an NRAM™ array with a bit line pair folded architecture.

However, because an NRAM™ does not experience bit line to storage element voltage reduction during a write operation, and further reduction due to leakage current, there is no need for adjacent true and complement data bit line pairs as used in DRAM folded architecture arrays. Instead, in NRAM™ memory schematic of first open architecture schematic 1100 illustrated in FIG. 11, an open architecture having twice the density of the folded architecture illustrated in FIG. 4B may be used. The adjacent complementary bit line pairs illustrated in FIGS. 4B and 6B are replaced by a single data bit line in FIG. 11, hereafter referred to as a bit line, connected to a first terminal of an isolation device, whose second terminal is connected to a first terminal of a differential SA/Latch. Any number of bit lines may be used. However, in this example, there are 8 bit lines, of which the complete data path for bit lines BL[0] and BL[1] are shown in column 0 and column 1, respectively. Bit lines are typically referred to as column lines. However, in this specification, bit lines may sometimes be described with respect to rows because of an array layout orientation. Any number of word lines and any number of bit lines may be used. For example, 1024, 2048, or even more word lines and 1024, 2048, or even more bit lines may be used. However, in this example, 4 word lines are shown, referred to as WL[0], WL[1], WL[2], and WL[3]. In this example, an 8-bit bidirectional data bus is used. However, wider data bus widths may be used, such as 16, 32, 64, 128, and 256 bits.

Figure 11:
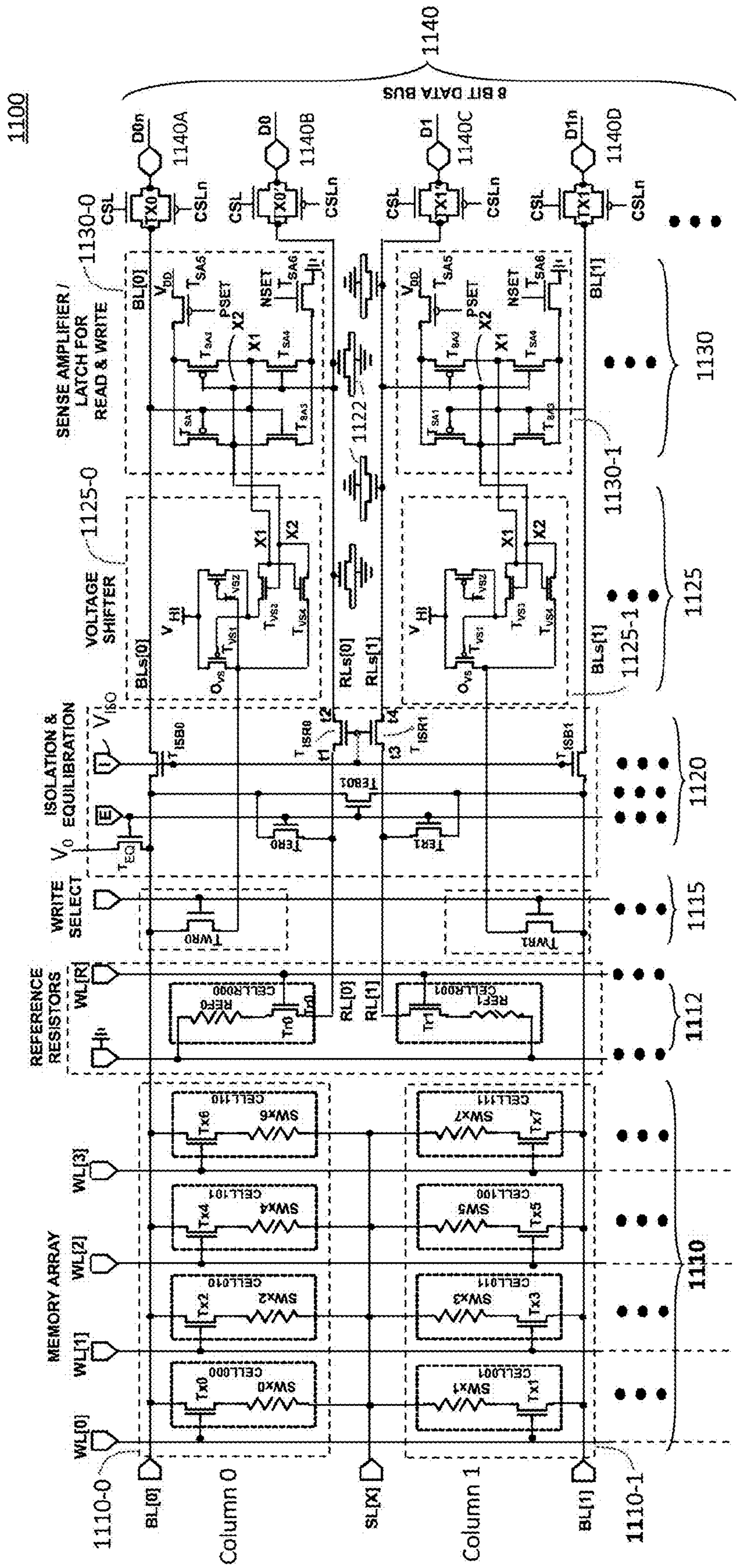
FIG. 11 is a simplified schematic of a DDR NRAM compatible first open architecture with an open resistive change memory array architecture that includes a reference resistor for each bit line (note that bit line columns are drawn horizontally to accommodate a subset of two independent bit lines, isolation devices, voltage shift circuits, and sense amplifier details).

Isolation devices shown in FIG. 11 are used to isolate the sense amplifier (SA)/Latches and on-chip data path that operate (switch) between $V_{DD}$ and ground voltage during both READ and WRITE operations, from voltages applied to bit lines during WRITE operations that may exceed $V_{DD}$ and require the use of voltage shift circuits also shown in FIG. 11.

As illustrated in folded memory schematic 602 in FIG. 6B and described further above, reference resistors are used during READ operations. In FIG. 6B, a reference resistor is connected to each of the true and complement bit lines BL[x]_D/R and BL[x]_R/D. As illustrated in schematic 602 and explained further above, if an even numbered word line is selected, such as WL[0] or WL[2], then the stored data appears on bit lines BL[x]_D/R and WL_EVEN is activated resulting in a reference voltage signal applied to complementary bit line BL[x]_R/D. However, if an odd numbered word line is selected, such as WL[1] or WL[3], then stored data appears on BL[x]_R/D and WL_ODD is activated resulting in a reference voltage signal applied to complementary bit line BL[x]_D/R.

Because an NRAM™ does not experience bit line to storage element voltage reduction during a write operation, and further reduction due to leakage current, there is no need for adjacent true and complement data bit line pairs as used in DRAM folded architecture arrays. Instead, in an NRAM™, an open architecture having twice the density of the folded architecture illustrated in FIG. 4B or 6B may be used as shown in FIG. 11. The adjacent complementary bit line pairs illustrated in FIG. 4B are replaced by a single data bit line, hereafter referred to as a bit line, connected to a first terminal of a differential SA/Latch and a corresponding reference resistor cell line, hereafter referred to as a reference line, may be connected to a second corresponding differential SA/Latch terminal for use during READ operations as illustrated in FIG. 11. The reference line, which is substantially physically shorter than bit lines, needs to have a discharge time constant τ=RC that corresponds with that of the corresponding bit line. In one embodiment, the reference line may have essentially same capacitance as the corresponding bit line to ensure that bit line and reference line discharge time constant capacitance track for sensing purposes. In other embodiments, reference line reference capacitance may be different from that of the bit line, if the reference resistance value is adjusted such that τ=RC remains the same. Reference line capacitance may be adjusted by connecting the reference bit line to multiple FET capacitors as illustrated in FIG. 11 and described further below.

In operation during the READ mode, the reference resistor is activated by applying $V_{WLR}$ to reference word line WL[R] connected to a reference cell select device to generate the reference line signal. $V_{WLR}$ is essentially the same as word line input voltage $V_{WL}$ applied to any line WL[m] with corresponding timing. Therefore, an NRAM™ can use an open array architecture and approximately double the array density with respect to a DRAM array; or approximately double the number of array bits in the same array area as illustrated in FIG. 11 when compared with FIG. 4B or FIG. 6B. The $V_{WLR}$ Pulse Couples Noise to the Reference Lines in Same Way that any of the Word Lines WL[m] line couple noise to the bit lines, thereby cancelling the coupling noise. However, NRAM™s have somewhat larger differential SA/Latch input signals than DRAMs, so noise cancellation may not be needed.

First DDR Compatible Resistive Change Element Open Array Architecture

Resistive change element open array architecture is substantially different from resistive change element folded array architectures. Open array architectures have a nonvolatile (NV) storage cell with a select transistor and a resistive change element connected in series and forming a resistive change element cell at each word line and bit line intersection as illustrated by storage array section 1110 shown in first open architecture schematic 1100, FIG. 11, thereby doubling the memory array density as shown by comparing memory array 610 shown in folded architecture schematic 602 illustrated in FIG. 6B and resistive change memory shown in first open architecture schematic 1100 block diagram and memory array storage array section 1110 illustrated in FIG. 11. Both open and folded resistive change element architectures use reference resistor cells formed with a select transistor and reference resistor in series as illustrated by reference array section 1112 shown in FIG. 11. Equilibration devices for differential SA/Latch sensing and isolation devices are activated (turned-on) during READ operations are illustrated in isolation and equilibration section 1120. However, these elements are integrated somewhat differently in memory array-to-SA/Latch data paths as illustrated in FIGS. 11 and 6B and described further below. Both open and folded architecture schematics 1100 and 602, respectively, have similar isolation devices and voltage shifters used for WRITE operations, and corresponding SA/Latches and bidirectional data paths used in both READ and WRITE operations.

Referring now to FIGS. 11 and 12, an open memory circuit architecture for an array of resistive change elements according to the present disclosure is shown. For ease of explanation, the exemplary first open architecture schematic 1100 depicting two columns of this open architecture is divided into several functional sections (1110, 1112, 1115, 1120, 1125, 1130, and 1140).

NRAM™ memory operations corresponding to first open architecture schematic 1100 are illustrated in table 1200 shown in FIG. 12. FIG. 12 lists the function numbers corresponding to FIG. 11, and whether these functions are active or inactive during READ and WRITE operation. The functions described with respect to FIG. 11 are similar to those described with respect to FIG. 6B, and the corresponding functions listed in Table 1200 shown in FIG. 12 are similar to the functions listed in Table 601 shown in FIG. 6A. For comparison purposes, the function numbers corresponding to FIG. 11 and the corresponding function numbers (in parentheses) corresponding to FIG. 6A are shown in Table 1200. While these READ and WRITE operations are similar to folded architecture schematic 601 illustrated in FIG. 6A, there are significant layout and operational differences because of architectural differences between folded and open architectures as described further above and below. The individual cells within storage array section 1110 are addressable responsive to an array of word lines WL[0]-WL[3], eight bit lines, of which two bit lines BL[0] and BL[1] are shown in FIG. 11 of first open architecture schematic 1100, and a select line SL[x]. Included but not shown in FIG. 11 are: bit lines BL[2], BL[3], and an associated select line SL[x]; bit lines BL[4], BL[5], and an associated select line SL[x]; and bit lines BL[6], BL[7], and an associated select line SL[x]. The use of these array lines in both READ and WRITE operations is described in more detail below. As described further above, in this example, there is a select line SL[x] for each bit line pair, such as BL[0] and BL[1]. However, if desirable, each bit line may be associated with a corresponding select line.

Looking to both FIGS. 11 and 12, the first section 1110 within this open architecture of the present disclosure is the memory array itself. Storage sub-array 1110-0 of storage array section 1110 includes array cells CELL000, CELL010, CELL101, and CELL110 in column 0, corresponding to bit line BL[0] of FIG. 11, each comprising a resistive change element SWx0, SWx2, SWx4, and SWx6, and a selection element Tx0, Tx2, Tx4, and Tx6, respectively, as shown in FIG. 11. With respect to storage sub-array 1110-0, a first terminal of each selection element Tx0, Tx2, Tx4, and Tx6 is connected to bit line BL[0], with a second terminal of each selection element connected to a first terminal of resistive elements SWx0, SWx2, SWx4, and SWx6, respectively, and a second terminal of each of these resistive elements is connected to select line SL[x]. A third terminal of each selection elements Tx0, Tx2, Tx4, and Tx6 is connected to word line WL[0], WL[1], WL[2], and WL[3], respectively.

Also, storage sub-array 1110-1 of storage array section 1110 storage shown in FIG. 11, includes individual array cells CELL001, CELL011, CELL100, and CELL111 in column 1, corresponding to bit line BL[1] of FIG. 11, each comprising a resistive change element SWx1, SWx3, SWx5, and SWx7, and a selection element FETs Tx1, Tx3, Tx5, and Tx7, respectively, as shown in FIG. 11. With respect to storage sub-array 1110-1, a first terminal of each selection element Tx1, Tx3, Tx5, and Tx7 is connected to bit line BL[1], with a second terminal of each selection element connected to a first terminal of resistive elements SWx1, SWx3, SWx5, and SWx7, respectively, and a second terminal of each of these resistive elements is connected to select line SL[x]. A third terminal of each selection elements Tx1, Tx3, Tx5, and Tx7 is connected to word line WL[0], WL[1], WL[2], and WL[3], respectively.

Each bit line in FIG. 11 is connected to a corresponding first terminal of a corresponding SA/Latch though an isolation device. For example, isolation device $T_{ISBO}$ between bit line BL[0] and SA/Latch 1130-0, and isolation device $T_{ISB1}$ between bit line BL[1] and SA/Latch 1130-1 as shown in FIG. 11 and explained further below.

Referring to reference resistor section 1112 in FIGS. 11 and 12 within this open architecture of the present disclosure, reference array section 1112 includes reference resistor cells CELLR000, and CELLR001, corresponding to reference line RL[0] and RL[1], respectively, and each comprising a reference resistor REF0 and REF1, and a selection element Tr0 and Tr1, respectively, as shown in FIG. 11. With respect to reference resistor section 1112, a first terminal of each selection element Tr0 and Tr1 is connected to reference lines RL[0] and RL[1], respectively, with a second terminal of each selection element connected to a first terminal of reference resistor REF0 and REF1, respectively, and a second terminal of each of these resistive elements connected to a reference voltage such as ground. A third terminal of each selection elements Tr0 and Tr1 is connected to reference word line WL[R]. Typically, all reference resistors have the same resistance value, so reference resistors REF0=REF1=REF. Reference lines RL[0] and RL[1] are connected to a second terminal of each of the SA/Latches through an isolation device as illustrated in FIG. 11. For example, isolation device $T_{ISRO}$ between reference line RL[0] and SA/Latch 1130-0, and isolation device $T_{ISR1}$ between reference line RL[1] and SA/Latch 1130-1 as shown in FIG. 11 and explained further below.

The number of reference lines is equal to the number of bit lines. So for this example, BL[0] corresponds to RL[0], BL[1] corresponds to RL[1], BL[2] corresponds to RL[2], BL[3] corresponds to RL[3], BL[4] corresponds to RL[4], BL[5] corresponds to RL[5], BL[6] corresponds to RL[6], and BL[7] corresponds to RL[7].

As listed in table 1200 in FIG. 12, the reference resistors are used during READ operations on the array and are inactive during WRITE operations. The activation of selected bit lines connected to a first terminal of corresponding SA/Latches and the activation of corresponding reference lines connected to a second terminal of corresponding SA/latches as shown in FIG. 11, allows READ voltages and discharge currents to flow through corresponding reference resistors and resistance change elements of selected storage array cells simultaneously. By comparing discharge rates through the selected cell with a corresponding reference element discharge rate, the resistive state of a selected cell can be determined. The use of these reference resistors for such READ operations will be described further below with respect to FIGS. 13A and 13B.

Isolation and equilibration section 1120 within this open architecture of the present disclosure contains isolation and equilibration devices. Isolation devices $T_{ISB0}$ and $T_{ISB1}$, when activated by isolation device control line I which transitions from zero volts to isolation voltage $V_{ISO}$ during a READ operation, connect bit lines BL[0] and BL[1], respectively, to a first terminal of sense amplifier/latches 1130 via bit line segments BLs[0] and BLs[1], respectively. BL[0] connects to a first terminal X1 of SA/Latch 1130-0 via isolation device $T_{ISB0}$ and bit line segment BLs[0] and BL[1] connects to a first terminal X1 of SA/Latch 1130-1 via isolation device $T_{ISB1}$ and bit line segment BLs[1] during READ operations. Also, isolation devices $T_{ISR0}$ and $T_{ISR1}$, when activated by isolation device control line I which transitions to $V_{ISO}$, connect reference lines RL[0] and RL[1], respectively, to a second terminal X2 of SA/Latches 1130. Reference line RL[0] connects to a second terminal X2 of SA/Latch 1130-0 via isolation device $T_{ISR0}$ and reference line segment RLs[0] and reference line RL[1] connects to a second terminal X2 of SA/Latch 1130-1 via isolation device $T_{ISR1}$ and reference line segment RLs[1] during READ operations. Sometimes for convenience, when referring to a READ operation, BL[0], BL[1], RL[0], and RL[1] are sometimes referred to as connecting to a terminal of SA/latch 1130-0 and 1130-1 without mentioning bit line segments and reference line segments since corresponding bit line and bit line segments and reference line and reference line segments are electrically connected by isolation devices during READ operations as described further above.

Figure 13A:
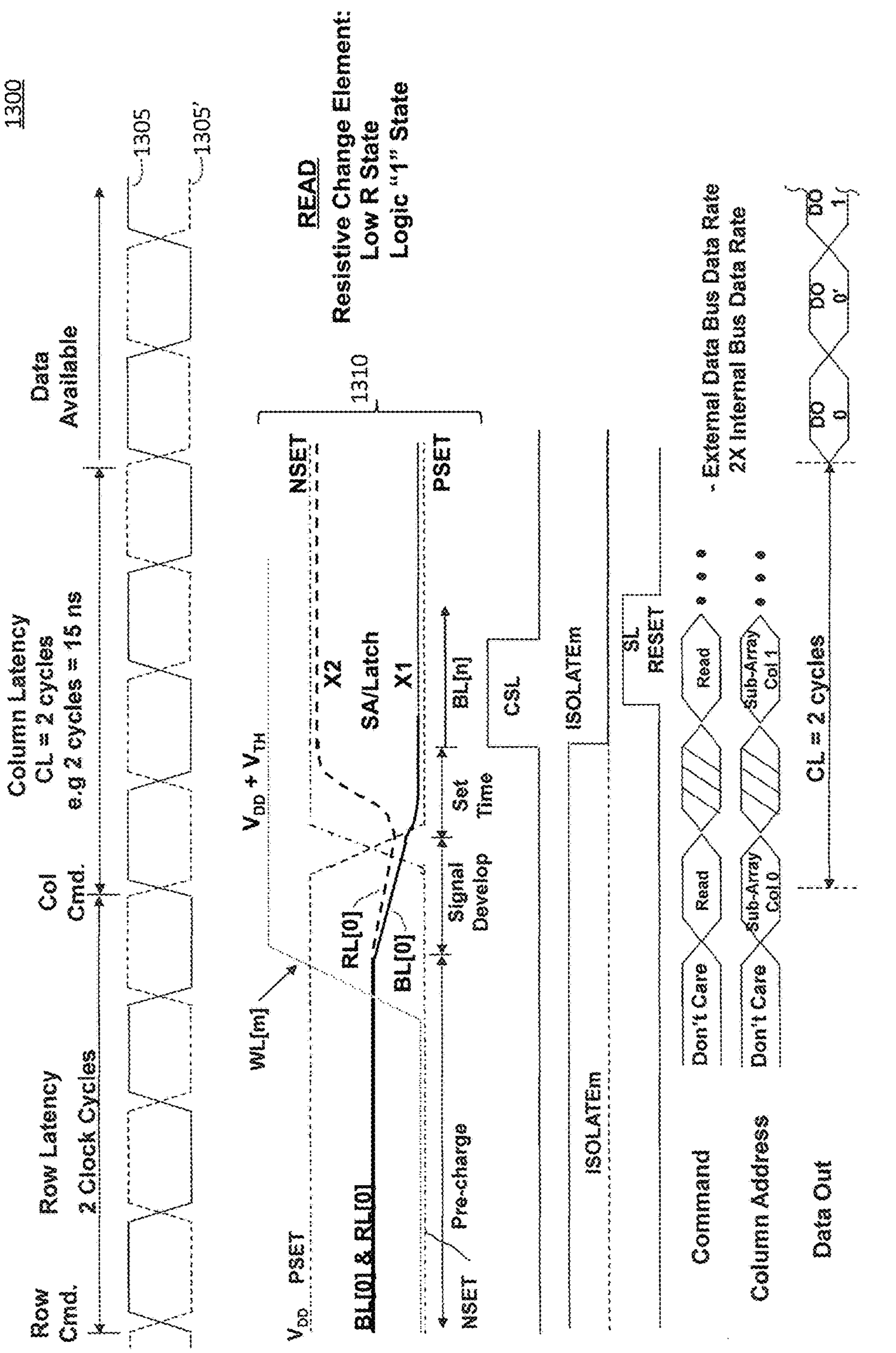
FIG. 13A is a waveform timing diagram illustrating an exemplary READ operation performed on a cell with a resistive change element in a low resistance state within an open resistive change memory array architecture of the first open architecture.
Figure 13B:
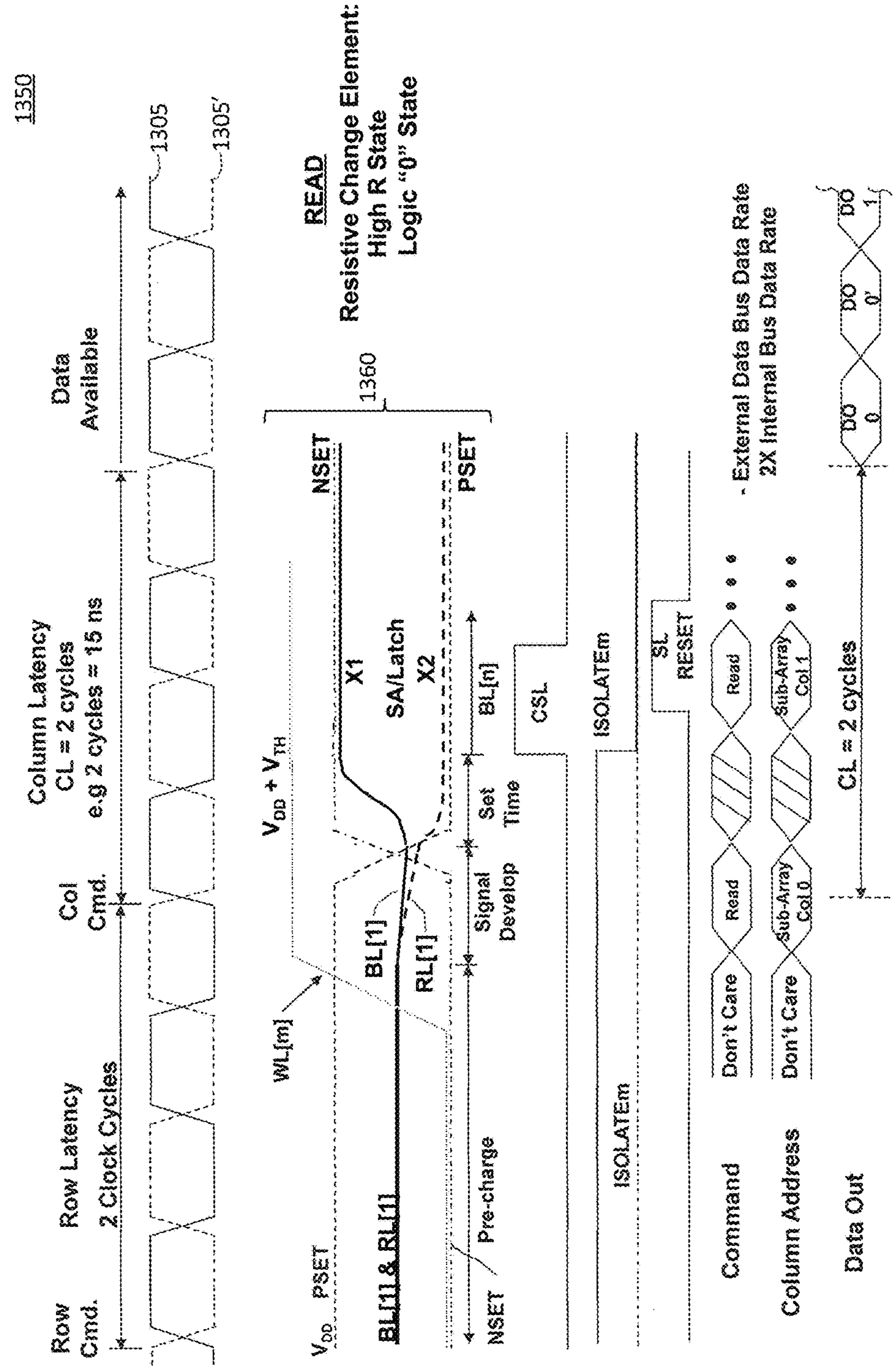
FIG. 13B is a waveform timing diagram illustrating an exemplary READ operation performed on a cell with a resistive change element in a high resistance state within an open resistive change memory array architecture of the first open architecture.

Isolation and equilibration section 1120 also performs an equilibration function just prior to the start of a READ operation, such that all bit lines and reference lines are at the same pre-charge voltage just prior to bit and reference line discharge at the beginning of the READ operation. All equilibration devices are activated by equilibration device control line E that transitions from zero volts to $V_{DD}$ for example, which turns transistor $T_{EQ}$ to an ON state and applies equilibration voltage V0 to bit line BL[0]. During the equilibration operation, equilibration voltage $V_0$ is applied to all bit lines and reference lines in an array subsection because bit line BL[0] is connected to all other bit lines and corresponding reference lines as described further below. Equilibration device $T_{EB01}$ connects bit lines BL[0] and BL[1]; equilibration devices, not shown, connect bit lines BL[2]-to-BL[7] to the same equilibration voltage, and equilibration devices. Equilibration devices $T_{ER0}$ and $T_{ER1}$ connect reference lines RL[0] and RL[1], respectively, to the same equilibration voltage as the bit lines; equilibration devices, not shown, connect reference lines RL[2]-to-RL[7] to the same equilibration voltage, and equilibration devices. In this way, all bit lines, BL[0]-to-BL[7], and reference lines RL[0]-to-RL[7], are connected and pre-charged to the same voltage, in this example, $V_0$. While $V_0=V_{DD}/2$ is chosen as the equilibration voltage in this example, other values such as $V_{DD}$, any voltage between $V_{DD}/2$ and $V_{DD}$, and voltages less than $V_{DD}/2$ may also be used as well. Select lines SL[x] are connected to ground (zero volts) during a READ operation. Then, all equilibration devices are turned OFF and the READ cycle begins as selected bit lines and reference lines discharge at rates $\tau$=RC that correspond to the stored resistance value of each resistance change element and the capacitance of the selected bit lines and each corresponding reference resistor and capacitance of the selected reference lines. Each of the selected SA/Latches 1130 compares the voltage of a corresponding bit line to the reference line voltage, during the signal development time shown in FIGS. 13A and 13B in which a differential voltage develops, and then switches to a logic "1" or logic "0" state based on that differential voltage as illustrated in FIGS. 13A and 13B.

Sense amplifier/latch section 1130 within this open architecture of the present disclosure includes one SA/Latch per bit line. In this example, SA/Latches section 1130 includes eight identical SA/Latches, of which SA/Latch 1130-0 corresponding to bit line BL[0] and SA/Latch 1130-1 corresponding to bit line BL[1] are shown.

Referring to representative SA/Latches 1130-0 and 1130-1, the SA/Latch is formed by a pair of cross coupled CMOS inverters and a pull up and a pulldown transistor as is well known in the literature. A first inverter includes transistors $T_{SA1}$ and $T_{SA3}$ in series forming an output X2 and a second inverter includes transistors $T_{SA2}$ and $T_{SA4}$ in series forming an output X1. The drains of $T_{SA1}$ and $T_{SA2}$ are connected to pullup transistor $T_{SA5}$, which is connected to voltage source $V_{DD}$. The sources of transistors $T_{SA3}$ and $T_{SA4}$ are connected to pull down transistor $T_{SA6}$, which is connected to a reference voltage source such as ground (zero volts). The output of the first inverter X2 is connected to the gates of second inverter transistors $T_{SA2}$ and $T_{SA4}$ and the output of second inverter X1 is connected to the gates of first inverter transistors $T_{SA1}$ and $T_{SA3}$.

With respect to representative SA/Latch 1130-0 input/output first terminal X1 and second terminal X2 and referencing FIG. 11, there are three on-chip bit line data path segments: array bit line BL[0], bit line segment BLs[0], and data bus line 1140A. There are also three reference signal path segments: corresponding reference line RL[0], reference line segment RLs[0], and data bus line 1140B. During a READ operation, array bit line BL[0] and bit line segment BLs[0] are connected to terminal X1 when isolation device $T_{ISB0}$ is activated. Terminal X1 is connected to data bus line 1040A when bidirectional data bus section 1140 is activated. Also, during the same READ operation, corresponding reference line RL[0] and reference line segment RLs[0] are connected to terminal X2 when isolation device $T_{ISR0}$ is activated. Terminal X2 is connected to data line 1040B when bidirectional data bus section 1140 is activated. Data lines 1040A and 1040B are complementary.

After SA/Latch 1130-0 switches and stores the data from storage sub-array 1110-0, terminal X1 is connected to data bus line 1140A by bit line segment BLs[0] and CMOS transfer device TX0, which is activated by true and complement control signals CSL and CSLn, respectively, and BL[0] is disconnected because resistance change element READ is non-destructive and cell write-back is not required. As part of the same READ operation, after SA/Latch 1130-0 switches and stores the data from storage sub-array 1110-0, terminal X2 is connected to data bus line 1140B by reference line segment RLs[0] and CMOS transfer device TX0', activated by control signals CSL and CSLn, and RLs[0] is disconnected from RL[0] when $T_{ISR0}$ is deactivated.

The representative SA/Latch 1130-0 operation described above corresponding to the BL[0] data path also applies to SA/Latch 1130-1 corresponding to the BL[1] data path, and to the bit line data paths of BL[2] to BL[7] of storage array section 1110. Bit lines BL[0] to BL[7] each have corresponding reference lines RL[0] to RL[7] and corresponding SA/Latches.

First DDR Compatible Resistive Change Element Open Array Architecture READ Operations Referring to first open architecture memory schematic 1100 in FIG. 11, two of the 8 data paths in this example are shown. For READ waveforms and timing illustrative purposes, a resistance change element accessed by bit line BL[0] and in a low resistance state, $R_{LO}$=100 kΩ for example, corresponding to a logic "1" is read out as illustrated in FIG. 13A. Also, for READ waveforms and timing illustrative purposes, a resistance change element accessed by bit line BL[1] and in a high resistance state, $R_{HI}$=2 MΩ for example, corresponding to a logic "0" is read out as illustrated in FIG. 13B.

During a READ operation, isolation devices are activated (turned-on) by isolation device control line I, which transitions from zero volts to isolation voltage $V_{ISO}$, and connect memory array bit lines in contact with resistance change element cells with bit line segments in contact with first terminals of SA/latches. Also, isolation devices are activated and connect memory array reference lines with reference line segments in contact with second terminals of SA/latches. For example, as illustrated in FIG. 11, during a READ operation bit line BL [0] is connected to resistance change element cell CELL000 and to bit line segment BLs[0] when isolation device $T_{ISB0}$ is activated (turned-on). Bit line segment BLs[0] is connected to first terminal X1 of SA/latch 1130-0, thereby enabling terminal X1 to be connected with CELL000. Also, as illustrated in FIG. 11, during a READ operation bit line BL[1] is connected to resistance change element cell CELL001 and to bit line segment BLs[1] when isolation device $T_{ISB1}$ is activated (turned-on). Bit line segment BLs[1] is connected to first terminal X1 of SA/latch 1130-1, thereby enabling terminal X1 to be connected with CELL001. Also, for example, as illustrated in FIG. 11, during a READ operation reference line RL[0] is connected to reference resistance cell CELLR000 and to reference line segment RLs[0] when isolation device $T_{ISR0}$ is activated (turned-on) connecting device terminals t1 and t2. Reference line segment RLs[0] is connected to second terminal X2 of SA/latch 1130-0, thereby enabling terminal X2 to be connected with CELLR000. Also, as illustrated in FIG. 11, during a READ operation reference line RL[1] is connected to reference resistance cell CELLR001 and to reference line segment RLs[1] when isolation device $T_{ISR1}$ is activated (turned-on) connecting device terminals t3 and t4. Bit line segment RLs[1] is connected to second terminal X2 of SA/latch 1130-1, thereby enabling terminal X2 to be connected with CELLR001.

Figure 15:
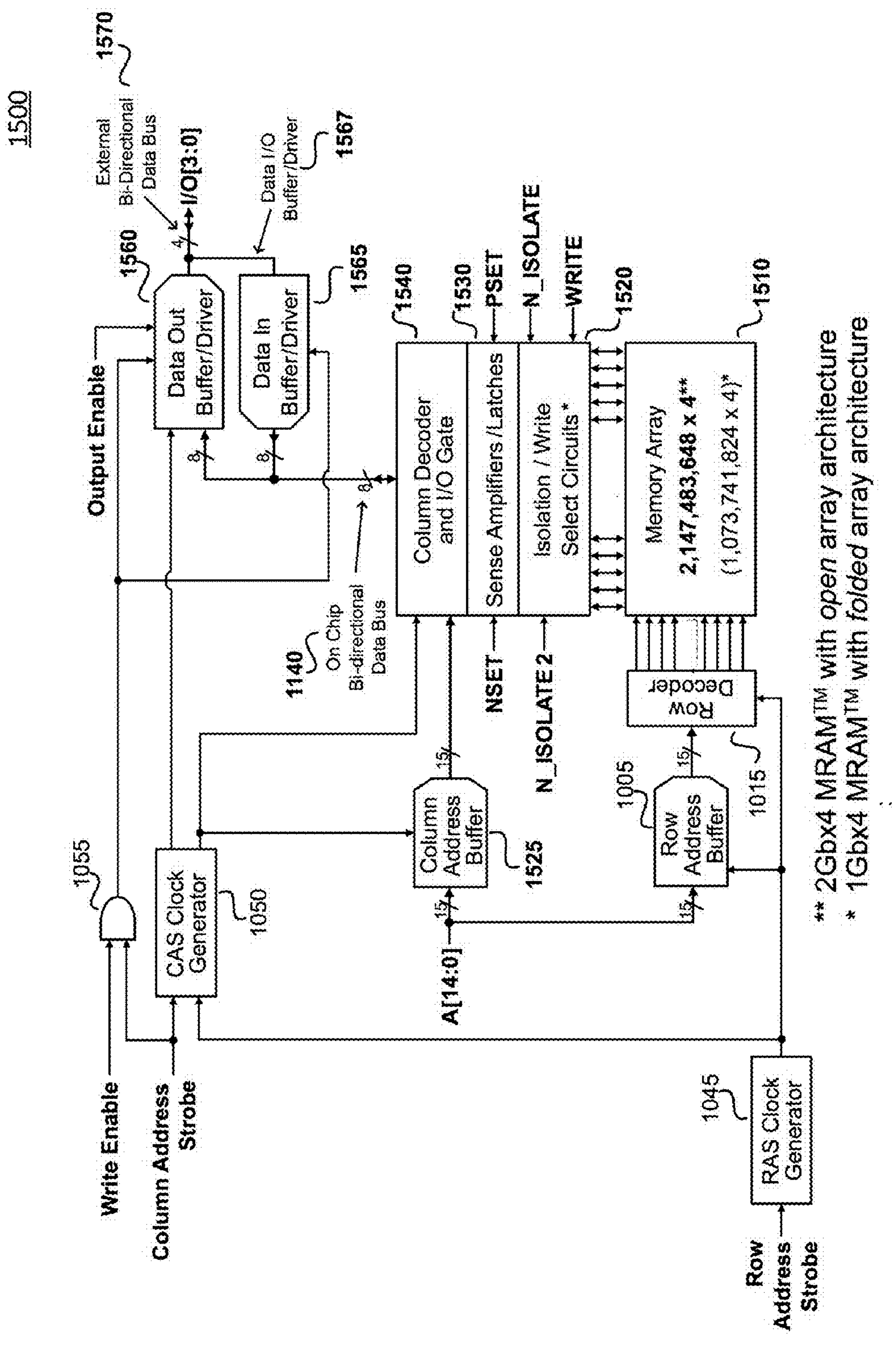
FIG. 15 is a system level block diagram illustrating an exemplary 2 Gb×4 DDR compatible open array architecture for a resistive change memory with an open resistive change memory array according to the methods of the present disclosure.

Referring to READ timing diagrams 1300 and 1350, shown in FIGS. 13A and 13B, respectively, a clock signal (CLK) 1305 is used to synchronize the DDR NRAM timing digital interface with the timing of a microprocessor or other digital external control circuit element interfacing with the memory array architecture of the present disclosure. In DDR operation, the data rate on the external bus (I/O) is twice (2-times) the data rate on the internal (on-chip) data bus. That is, the data on the internal data bus changes with each positive (up) transition of clock signal 1305, while the data on the external I/O data bus changes with both positive (up) and negative (down) transitions of clock signal 1305, such that both internal data bus and external data bus transitions remain synchronized with clock signal 1305. In this example, referring to timing diagrams 1300 and 1350 illustrated in FIGS. 13A and 13B, respectively, synchronized data transitions on both internal data bus and external data bus are achieved by generating a second clock signal 1305' that is 180 degrees out of phase with respect to clock signal 1305. In this way, for example, eight data bits can be READ to the 8-bit internal data bus with each positive (up) transition of clock signal 1305 and these data bit signals transmitted to the data I/O buffer/driver 1567 as illustrated in FIG. 15. The data I/O buffer/driver 1567 multiplexes the eight data signals onto the 4-bit external data bus in two sets of four data bit signals at twice (2-times) the internal data bus data rate by using a combination of clock signal 1305 and second clock signal 1305'. That is, the data on the external data bus transitions with each positive (up) transition of clock signal 1305 and each positive (up) transition of the second clock signal 1305'. The internal data bus 1140, data I/O buffer/driver 1567, and external data bus 1570 are illustrated in FIG. 15.

Clock signal 1305 and second clock signal 1305' shown in FIGS. 13A and 13B correspond to clock signal 505 and second clock signal 505', respectively, shown in FIG. 5A. On-chip bi-directional data bus 1140 shown in FIG. 15 corresponds to the on-chip bi-directional data bus shown in FIG. 10. Data out buffer driver 1560 corresponds to data out buffer driver 1060, data in buffer driver 1565 corresponds to data in buffer driver 1065, data I/O buffer/driver 1567 and external bidirectional data bus 1570 shown in FIG. 15 correspond to data I/O buffer/driver 1067 and the external bidirectional data bus, both shown in FIG. 10, respectively.

Generating an on-chip out-of-phase clock signal is one method of achieving a synchronized data rate at twice the data rate on the external data bus with respect to the internal data bus. Other methods may be used as well. While this example describes doubling the external data rate with respect to the internal data rate, similar methods may be used to achieve triple the data rate (a DDR3 NRAM™), four times the data rate (a DDR4 NRAM™), five times the data rate (a DDR5 NRAM™), and even higher synchronized data rates.

In a first READ operation for a resistance change element having a low resistance storage value, and referring now to READ timing diagram 1300 illustrated in FIG. 13A, signal development and sensing 1310 waveforms on bit line BL[0] correspond to a stored data value in a selected cell in memory sub-array 1110-0 illustrated in FIG. 11. Referencing signal development and sensing waveforms 1310, the selected bit line BL[0] and reference line RL[0] are equilibrated to the same voltage, in this example approximately $V_{DD}/2$, during the pre-charge phase of the READ cycle by activating device control line E in section 1120 (FIG. 11), which is then turned off at the start of the READ cycle when the selected word line is activated. Next, the selected word line, WL[0] in this example, transitions to $V_{DD}+V_{TH}$ and turns on select device Tx0 in CELL000, which connects resistive change element SWx0 to bit line BL[0] thereby initiating data signal development. Word line WL[0] also activates all cells connected to WL[0] in storage array section 1110. However, FIG. 13A shows only the switching waveforms corresponding to BL[0]. In this example, CELL000 is assumed to be set to a low resistance SET representing a logic "1" state. When WL[0] is activated, reference resistor select line WL[R] is activated at the same time and with essentially the same waveform as WL[0], and device Tr0 in CELLR000 connects reference resistor REF0 to reference line RL[0] thereby initiating reference signal development. Bit line BL[0] has a bit line capacitance essentially equal to the sum of the diffusion capacitance of all the select devices. The reference line RL[0], which is substantially physically shorter than bit line BL[0], as well as all other bit lines, has only one cell diffusion node but needs to have a discharge time constant τ=RC that corresponds with the time constant of the corresponding bit line, BL[0] in this example. That is, the reference time constant needs to be greater than the time constant for a resistance change element in a low resistance state, but less than the time constant for a resistance change element in a high resistance state. In one embodiment, the reference line may have essentially same capacitance as the corresponding bit line to ensure that bit line and reference line discharge time constant capacitance track for sensing purposes. In other embodiments, reference line reference capacitance may be different from that of the bit line, if the reference resistance value is adjusted such that τ=RC remains the same. Reference line capacitance, such as the capacitance of RL[0], may be adjusted by connecting the reference line to multiple FET capacitors 1122 illustrated in FIG. 11.

Referring now to first open architecture schematic 1100 (FIG. 11), memory NRAM memory operations table 1200 (FIG. 12), READ timing diagram 1300 (FIG. 13A), and signal development table 1380, at the end of the pre-charge time in which bit line BL[0] and reference line RL[0] are pre-charged to the same voltage, in this example, $V_{DD}/2$, the READ operation begins as word line WL[0] transitions from 0 V to $V_{DD}+V_{TH}$. BL[0] and RL[0] discharge during the signal development time. As shown in FIG. 13A and described further below with respect to signal development table 1380 (FIG. 13C), during the signal development time, bit line BL[0] discharges through CELL000 resistance change element SWx0 in low resistance state $R_{LO}$ to select line SL[x], which is at zero volts (grounded), with a time constant $\tau_{RL}$=40 ns. Also, reference line RL[0] discharges through CELLR000 reference resistance REF0 to zero voltage (ground) with a time constant $\tau_{RR}$=80 ns as shown in FIG. 13A.

Near the end of the signal develop time in this exemplary READ cycle, SA/latch 1130-0 is activated as follows. PSET is driven to a low voltage, turning on FET $T_{SA5}$ and thereby connecting terminals FETs $T_{SA1}$ and $T_{SA2}$ to power supply $V_{SA}=V_{DD}$. NSET is driven to a high voltage, $V_{DD}$ for example, turning on FET $T_{SA6}$ and thereby connecting terminals FETs $T_{SA3}$ and $T_{SA4}$ to ground. At this time, sense amplifier/latch 1130-0 has been powered up and senses/latches the data signal from cell CELL000. Since bit line BL[0] discharges at a faster rate than reference line RL[0], ΔV is negative because ΔV compares bit line voltage to the corresponding reference line voltage, as shown in table 1380 (FIG. 13). Hence, SA/Latch 1130-0 output terminal X1, connected to bit line segment BLs[0], switches to zero (ground) voltage and output terminal X2, connected to reference line segment RLs[0], switches to $V_{DD}$.

In a second READ operation for a resistance change element having a high resistance storage value, (state), and referring now to READ timing diagram 1350 illustrated in FIG. 13B, signal development and sensing 1360 waveforms on bit line BL[1] correspond to a stored data value in a selected cell in memory sub-array 1110-0 illustrated in FIG. 11. Referencing signal development and sensing waveforms 1360, the selected bit line BL[1] and reference line RL[1] are equilibrated to the same voltage, in this example approximately $V_{DD}/2$, during the pre-charge phase of the READ cycle by activating device control line E in section 1120 (FIG. 11), which is then turned off at the start of the READ cycle when the selected word line is activated. Next, the selected word line, WL[0] in this example, transitions to $V_{DD}+V_{TH}$ and turns on select device Tx1 in CELL001, which connects resistive change element SWx1 to bit line BL[1] thereby initiating data signal development. Word line WL[0] also activates all cells connected to WL[0] in storage array section 1110. However, FIG. 13B shows only the switching waveforms corresponding to BL[1]. In this example, CELL001 is assumed to be set to a high resistance RESET value, such as $R_{HI}$=2 MΩ for example, representing a logic "0" state. When WL[0] is activated, reference resistor select line WL[R] is activated at the same time and with essentially the same waveform as WL[0], and device Tr1 in CELLR001 connects reference resistor REF1 to reference line RL[1] thereby initiating reference signal development. Bit line BL[1] has a bit line capacitance essentially equal to the sum of the diffusion capacitance of all the select devices. The reference line RL[1], which is substantially physically shorter than bit line BL[1], as well as all other bit lines, has only one cell diffusion node but needs to have a discharge time constant τ=RC that corresponds with the time constant of the corresponding bit line, BL[1] in this example. That is, the reference time constant needs to be greater than the time constant for a resistance change element in a low resistance state, but less than the time constant for a resistance change element in a high resistance state. In one embodiment, the reference line may have essentially same capacitance as the corresponding bit line to ensure that bit line and reference line discharge time constant capacitance track for sensing purposes. In other embodiments, reference line reference capacitance may be different from that of the bit line, if the reference resistance value is adjusted such that t=RC remains the same. Reference line capacitance, such as the capacitance of RL[1], may be adjusted by connecting the reference line to multiple FET capacitors 1122 illustrated in FIG. 11.

Referring now to first open architecture schematic 1100 (FIG. 11), memory NRAM memory operations table 1200 (FIG. 12), READ timing diagram 1300 (FIG. 13B), and signal development table 1380, at the end of the pre-charge time in which bit line BL[1] and reference line RL[1] are pre-charged to the same voltage, in this example, $V_{DD}/2$, the READ operation begins as word line WL[0] transitions from 0 V to $V_{DD}+V_{TH}$. BL[1] and RL[1] discharge during the signal development time. As shown in FIG. 13B and described further below with respect to signal development table 1380 (FIG. 13C), during the signal development time, bit line BL[1] discharges through CELL001 resistance change element SWx1 high resistance $R_{HI}$ to select line SL[x], which is at zero volts (grounded), with a time constant $\tau_{RH}$=800 ns. Also, reference line RL[1] discharges through CELLR001 reference resistance REF1 to zero voltage (ground) with a time constant $\tau_{RR}$=80 ns as shown in FIG. 13B.

Near the end of the signal develop time in this exemplary READ cycle, SA/latch 1130-1 is activated as follows. PSET is driven to a low voltage, turning on FET $T_{SA5}$ and thereby connecting terminals FETs $T_{SA1}$ and $T_{SA2}$ to power supply $V_{SA}=V_{DD}$. NSET is driven to a high voltage, $V_{DD}$ for example, turning on FET $T_{SA6}$ and thereby connecting terminals FETs $T_{SA3}$ and $T_{SA4}$ to ground. At this time, sense amplifier/latch 1130-1 has been powered up and senses/latches the data signal from cell CELL001. Since bit line BL[1] discharges at a slower rate than reference line RL[1], ΔV is positive because ΔV compares bit line voltage to the corresponding reference line voltage, as shown in table 1380 (FIG. 13). Hence, SA/Latch 1130-1 output terminal X1, connected to BL[1], switches to $V_{DD}$ and output terminal X2, connected RL[1], switches to zero (ground) voltage.

In operation, for first and second READ waveforms and timing illustrative purposes described further above, a resistance change element accessed by bit line BL[0] is in a low resistance state $R_{LO}$ corresponding to a logic "1" and is read out as illustrated in FIG. 13A and a resistance change element accessed by bit line BL[1] is in a high resistance state $R_{HI}$ corresponding to a logic "0" and is read out as illustrated in FIG. 13B. SA/Latches are activated just before the end of the signal development time as illustrated in FIGS. 13A and 13B. READ access time may be calculated by adding 1 ns to the signal development time because SA/Latches begin switching before the end of the signal development time interval. The SA/Latch differential input voltage $\Delta V$ corresponding to signal development times of 4, 5, and 6 ns may be calculated as shown further below and determine the SA/Latch sensitivity required for sensing based on various assumed conditions.

Examples of signal development calculations are described further below. The value of the low resistance element values $R_{LO}$=100 kΩ; reference resistance values $R_{REF}$=200 kΩ; and high resistance change element values $R_{HI}$=2 MΩ. The bit line and reference line capacitances are each approximately 400 fF in this example. The bit line and reference line discharge time constants are as follows. For $R_{LO}$, $\tau_{RL}$=40 ns; for $R_{REF}$, $\tau_{RR}$=80 ns; and for $R_{HI}$, $\tau_{RH}$=800 ns. The difference voltage $\Delta V$ at the SA/latch terminals is calculated for bit line and reference line pre-charge voltages $V_0=V_{DD}/2=0.75$ and $V_0=V_{DD}/2=0.5$ V. For low resistance change element values $R_{L0}$, $\Delta V$ may be calculated as follows: $\Delta V=V_0\ (e^{-\tau/\tau}{}_{RL}-e^{-\tau/\tau}{}_{RR})$, and for high resistance element values $R_{HI}$, $\Delta V=V_0\ (e^{-\tau/\tau}{}_{RH}-e^{-\tau/\tau}{}_{RR})$. The results of these calculations for $V_{DD}$=1.5 volts and $V_{DD}$=1 volts are shown in signal development table 1380 illustrated in FIG. 13C. $\Delta V$ referrers to the bit line voltage with respect to the reference line voltage.

Signal development table 1380 shows the results of calculations for the difference voltage signal $\Delta V$ to SA/Latch inputs for read out of low $R_{LO}$ and high $R_{HI}$ resistance change element values and pre-charge voltages $V_0$ of 0.75 V. and 0.5 V. In this first READ example, referring to FIGS. 11, 13A, and 13C, word line WL[0] is activated, turns on select device Tx0, and bit line BL[0] reads resistance change element SWx0 having a low resistance value $R_{LO}$=100 kΩ and a corresponding voltage discharge time constant $\tau_{RL}$=40 ns. Bit line BL[0] is connected to a first input X1 of SA/Latch 1130-0. When WL[0] is activated, reference resistor select line WL[R] is activated at the same time and with essentially the same waveform as WL[0], and turns on select device Tr0, and reference line RL[0] reads reference resistor REF0=REF, where $R_{REF}$=200 kΩ and a corresponding voltage discharge time constant $\tau_{RR}$=80 ns. Reference line RL[0] is connected to a second input X2 of SA/Latch 1130-0. READ timing diagram 1300 illustrated in FIG. 13A illustrates the READ waveforms associated with WL[m], which corresponds to WL[0] in this example, bit line BL[0], and reference line RL[0]. Signal development table 1380 shown in FIG. 13C gives calculated difference voltage signal $\Delta V$ of −37.5, −43.5, and −52.5 mV for $V_{DD}$=1.5 V and −25, −29, and −35 mV for $V_{DD}$=1.0 volts applied to the inputs of SA/Latch 1130-0 for READ access times of 5, 6, and 7 ns, respectively.

In this second READ example, referring to FIGS. 11, 12, 13B, and 13C, word line WL[0] is activated, turns on select device Tx1, and bit line BL[1] reads resistance change element SWx1 having a high resistance value $R_{HI}$=2 MΩ and a corresponding voltage discharge time constant $\tau_{RH}$=800 ns. Bit line BL[1] is connected to a first input X1 of SA/Latch 1130-1. When WL[0] is activated, reference resistor select line WL[R] is activated at the same time and with essentially the same waveform as WL[0], and turns on select device Tr1, and reference line RL[1] reads reference resistor REF1=REF, where $R_{REF}$=200 kΩ and a corresponding voltage discharge time constant $\tau_{RR}$=80 ns. Reference line RL[1] is connected to a second input X2 of SA/Latch 1130-1. READ timing diagram 1350 illustrated in FIG. 13B illustrates the READ waveforms associated with WL[m], which corresponds to WL[0] in this example, bit line BL[1], and reference line RL[1]. Signal development table 1380 shown in FIG. 13C gives calculated difference voltage signal $\Delta V$ of 33, 40.5, and 45 mV for $V_{DD}$=1.5 V and 22, 27, and 30 mV for $V_{DD}$=1.0 volts applied to the inputs of SA/Latch 1130-1 for READ access times of 5, 6, and 7 ns, respectively.

Signal development table 1380 also summarizes the required SA/Latch sensitivity required for sensing READ signals for power supply voltages of $V_{DD}$=1.5 V and $V_{DD}$=1.0 V. Bit line BL[0] illustrates a first READ operation corresponding to BL[0] connected to a resistance change element having a low resistance value. Bit line BL[1] illustrates a second READ operation corresponding to BL[1] connected to a resistance change element having a high resistance value. However, during memory operation, bit line BL[0] may instead be connected to a resistance change element having a high resistance value. Similarly, BL[1] may instead be connected to a resistance change element having a low resistance value. This is also the case for bit lines BL[2] to BL[7] of storage array section 1110 shown in FIG. 11. Since each bit line may READ a resistance change element having a low or high resistance value, the SA/Latch sensitivity requirements for each of the SA/Latch section 1130 shown in FIG. 11 corresponds to the smallest READ difference voltage signal $\Delta V$ to be sensed. As illustrated by signal development table 1380 shown in FIG. 13C, for a power supply voltage of $V_{DD}$=1.5 Volts, access time and corresponding SA/Latch sensitivity are as follow: 5 ns requires 33 mV; 6 ns requires 40 mV, and 7 ns requires 45 ns. For a power supply voltage of $V_{DD}$=1.0 Volts, access time and corresponding SA Latch sensitivity are as follow: 5 ns requires 22 mV; 6 ns requires 27 mV, and 7 ns requires 30 ns. SA/Latch sensitivities of CMOS technologies in the 10-20 mV range are achievable. On-chip programmable circuits, such as programmable regulated voltage generators and programmable delay controller state machines may be used to optimize resistance change memories into various speed sorts as described further below.

Word line WL[m] and reference resistor select line WL[R] capacitive coupled voltage (noise) to a selected bit line and corresponding reference line, respectively, are cancelled out by the differential sense amplifier. For example, WL[0] capacitive coupled noise to bit line BL[0] and corresponding reference resistor select line WL[R] capacitive coupled noise to reference line RL[0] are cancelled out by differential SA/Latch 1130-0. WL[0] capacitive coupled noise to bit line BL[1] and corresponding reference resistor select line WL[R] capacitive coupled noise to reference line RL[1] are cancelled out by differential SA/Latch 1130-1. The same word line coupled differential noise is rejected for bit lines BL[2] to BL[7] and corresponding reference lines by all SA/Latches in SA/Latch section 1130 shown in FIG. 11.

Referring now to first open array architecture 1100 in FIG. 11, table 1200 in FIG. 12, READ timing diagrams 1300 and 1350 in FIGS. 13A and 13B, and open architecture resistive change memory 1500, respectively, after SA/Latch 1130-0 and 1130-1 have sensed/latched the state of cells CELL000 and CELL001, respectively, SA/Latch states are transferred to chip complementary bidirectional data bus section 1140. Control signals CSL and CSLn and corresponding FET devices, which are a subset of column decoder and I/O gate 1540 shown in FIG. 15, are activated turning on CMOS transfer devices TX0, TX0', TX1 and TX1', respectively, as well as all other transfer devices corresponding to BL[2] to BL[7], not shown in FIG. 11, thereby transferring eight data bits of true and complementary data to bidirectional data bus section 1140, which transfers these eight data bits to data out buffer/driver 1560 via on-chip bidirectional data bus 1140 shown in FIG. 15 during the positive transition of clock 1305 shown in FIGS. 13A and 13B. Data out buffer/driver 1560 transmits four bits at a time to external (two-times) the data rate of the eight bits of on-chip bidirectional data bus 1140.

Referring now to first open architecture schematic 1100 (FIG. 11), table 1200 in FIG. 12, and SA/Latch 1130-0 and READ timing diagram 1300 (FIG. 13A), resistance change element SWx0 in CELL000 stores a low resistance value $R_{LO}$, corresponding to a logic "1" state and a negative difference voltage ΔV as described further above in table 1380 (FIG. 13C), is sensed/latched as zero volts at terminal X1 of SA/Latch 1130-0, corresponding to BL[0]. Terminal X2 is sensed/latched as $V_{DD}$. Therefore, the READ operation illustrated in FIG. 13A stores the complement of the data stored in CELL000 in SA/Latch 1130-0. Hence, data bus 1140A is shown as the complement D0*n* of the stored data having data D0 shown on data bus 1140B.

Referring now to first open architecture schematic 1100 (FIG. 11) and SA/Latch 1130-1 and READ timing diagram 1350 (FIG. 13B), resistance change element SWx1 in CELL001 stores a high resistance value $R_{HI}$, corresponding to a logic "0" state and a positive difference voltage ΔV as described further above in table 1380 (FIG. 13C), is sensed/latched as $V_{DD}$ at terminal X1 of SA/Latch 1130-1, corresponding to BL[1]. Terminal X2 is sensed/latched as a zero voltage. Therefore, the READ operation illustrated in FIG. 13B stores the complement of the data stored in CELL001 in SA/Latch 1130-1. Hence, data bus 1140D is shown as the complement D1*n* of the stored data having data D1 shown on data bus 1140C.

All other SA/Latches 1130 illustrated in FIG. 11 also invert the data state of corresponding cells. Hence, data transferred from these latches to on chip complementary bidirectional data bus section 1140 is the complement of the data stored in storage array section 1110.

Referring now to FIG. 15, described further above and below, data out buffer/driver 1560 complements all data from on-chip bidirectional data bus 1140, such that the data transmitted to external bidirectional bus 1570 corresponds to the data stored in the corresponding cells of storage array section 1110. The data I/O buffer/driver 1067 (FIG. 15) then latches the data and drives the external 4-bit data bus 1570 at two times the data rate as the internal data bus 1140 as shown in FIGS. 13A and 13B and described further above. In this example, data first appears on the external data bus 1570 after a column latency of two clock cycles after the column address is received from the control device. While the DDR NRAM may be operated in a random access mode, typically a page of data is READ out (page mode) as illustrated in FIGS. 13A and 13B. When data transfer is complete, CSL and CSLn disable the connection between SA/Latches 1130-0, 1130-1, and all other SA/Latches in SA/Latch section 1130 and bi-directional data bus 1140.

While resistive change elements are non-volatile (that is, they retain their previously WRITTEN informational state during READ operations or when power is removed from the device), certain types of memory architectures (such as, but not limited to, DRAM capacitive storage memories) result in destructive READ operations. That is, in a conventional DRAM DDR memory array, for example, a READ operation on a cell would destroy the data stored in the cell itself. This data would then have to be written back from the corresponding sense amplifier/latch to the selected cell in the array in a write-back operation. Hence, the amplifier/latch would remain connected to the corresponding bit line pair during the completion of the READ operation cycle in order to restore the original state of cell. However, since a resistive change memory such as an NRAM, for example, performs a non-destructive READ operation, data remains in the array cell, and there is no data write-back requirement from sense amplifier/latches in SA/Latch section 1130, which can be decoupled from the array. Therefore, in this NRAM example, bit line BL[0] and BL[1] isolation devices $T_{ISBO}$ and $T_{ISB1}$, respectively, are deactivated, and storage sub-arrays 1110-0 and 1110-1, respectively, are decoupled from first terminals of sense amplifier/latches 1130-0 and 1130-1, respectively. Reference lines RL[0] and RL[1] isolation devices $T_{ISR0}$ and $T_{ISR1}$, respectively, are deactivated and decouple reference array section 1112 cells from second terminals of SA/Latches 1130-0 and 1130-1, respectively.

In this example, referring to first open architecture 1100 (FIG. 11) and read timing schematics 1300 and 1350 shown in FIGS. 13A and 13B, respectively, since no data write-back is needed, a WRITE operation may be performed at the end of the READ cycle. Selected word line WL[0] remains activated thereby enabling a RESET operation when SL[x] transitions to a RESET voltage, bit lines BL[0] and BL[1] are grounded, and SL[x] drives the selected bit to a high resistance RESET state if the cell was in a low resistance SET state. If the cell was in a high resistance RESET state, it remains unchanged in the RESET state.

Specifically, within this RESET operation, SL[x] is driven high to a required RESET voltage (as described in detail above with respect to SET and RESET operations on resistive change elements) while both bit lines BL[0] and BL[1] are pulled low. No RESET voltage is applied to reference lines RL[0] and RL[1]. In this way, a WRITE current is driven through CELL000 and SWx0 is driven into a RESET state and also through CELL001 and SWx1 is driven into a RESET state. The remaining word lines (WL[1]-WL[3]) remain low, so the data in remaining memory cells of storage array section 1110 remains unchanged. It should be noted that, as discussed above, such a RESET operation on the READ memory cell is not required within the methods of the present disclosure since RESET voltage pulses can be applied to resistance change elements in storage sub-arrays 1110-0 and 1110-1 using bit lines BL[0] and BL[1], respectively. However, the option of a RESET operation before the end of a READ cycle is included because of the advantages of the open array DDR NRAM architecture illustrated in FIG. 11.

In this example, assuming a page mode operation in which WL[0], WL[1], WL[2], and WL[3] are selected in turn, then resistance change elements in storage sub-arrays 1110-0 and 1110-1 may all be RESET to high resistance states. This enables resistive memories such as NRAMs to complete a RESET cycle while data from sense amplifier/latch section 1130 is transferred via on-chip data bus 1140 to out buffer/driver 1060 and onto off-chip output bus 1570. Leveraging the non-volatility of resistive memory bits by RESETTING selected bits to a high resistance state during the completion of the READ cycle simplifies the WRITE operation as described further below. To illustrate this functionality within the memory array architecture of the present disclosure, the exemplary READ operations detailed in READ timing diagrams in FIGS. 13A and 13B show a RESET operation concurrent with the data READ out operation (that is, during the time that CSL and CSLx are activated and the READ data is provided to the external data bus).

Figure 13D:
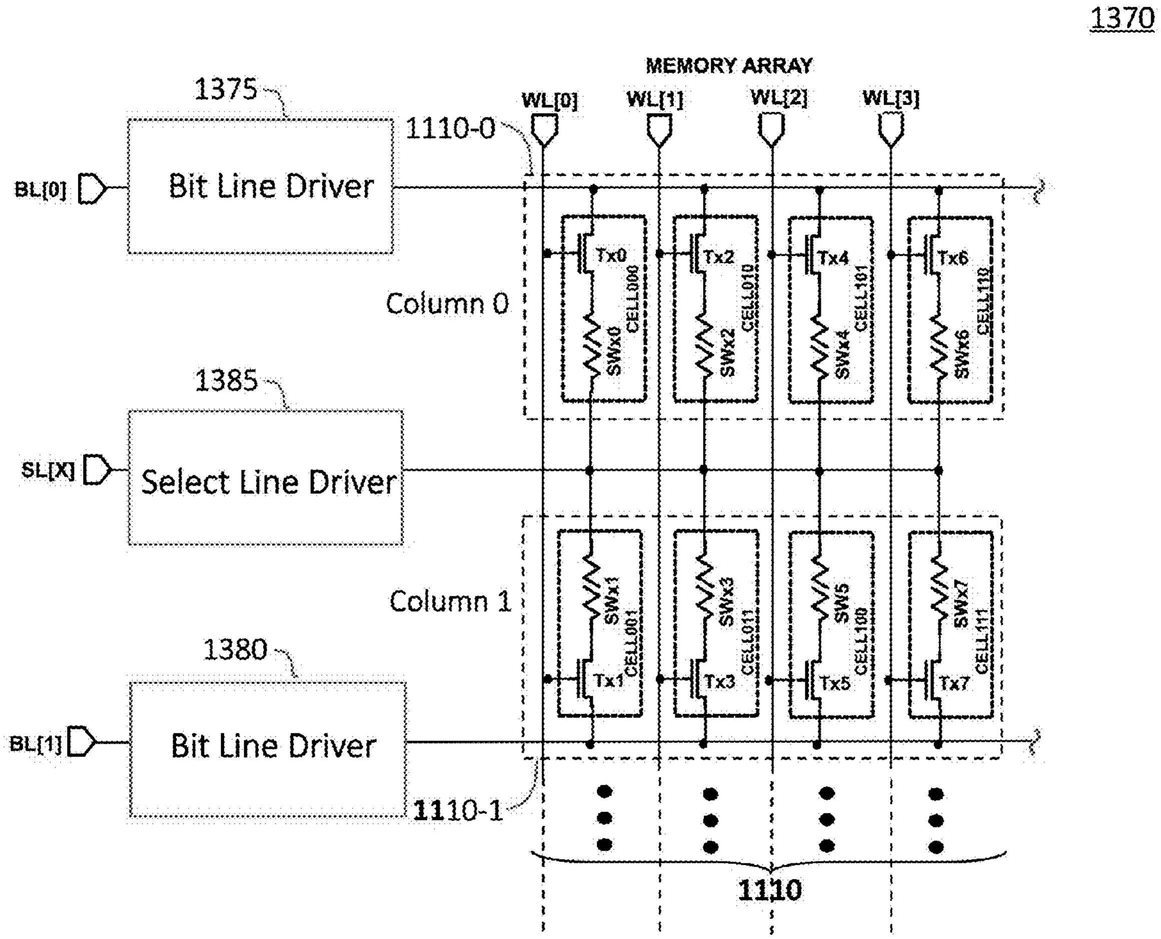
FIG. 13D is a simplified schematic illustration of a DDR NRAM compatible first open architecture with circuits to facilitate a RESET operation of open resistive change memory array cells before the end of a READ operation.

Referring now to FIGS. 11, 13A, and 13B, READ data is transferred from SA/latches 1130-0 and 1130-1, as well as other SA/latches in SA/latches in section 1130, to on-chip bidirectional data bus 1140. Since all SA/latches in section 1130 are isolated from storage array section 1110, WRITE operations such as RESET may be performed simultaneously. However, since on-chip bidirectional data bus 1140 is transmitting data to the data I/O buffer/driver 1567 (FIG. 15), RESET data cannot be transferred using bidirectional data bus 1140. Referring now to FIG. 13D and comparing with FIG. 11, bit line drivers 1375 and 1380 are added to bit lines BL[0] and BL[1], respectively, and select line driver 1385 is added to select line SL[X]. The output of each of these drivers may be in tristate, at zero volts, or performing a WRITE operation, in this example, a RESET operation. This RESET operation switches all resistive change elements in storage sub-arrays 1110-0 and 1110-1 from a low to a high resistance state, or leaves them in an existing high resistance state.

As illustrated in FIGS. 13A and 13B, a pulse SL RESET is applied to select line SL[X] with bit lies BL[0] and BL[1] at zero volts. While a single RESET pulse is shown, multiple RESET pulses may be applied. Typically, multiple RESET pulses may use lower RESET voltage levels. The same RESET operation (not shown) is performed for all resistance change element in storage array section 1110. FIGS. 11 and 13D show select line SL[X] as shared with two adjacent bit lines. However, memory arrays may have a corresponding select line SL for each bit line. For example, BL[0] and SL[0], BL[1] and SL[1]. Alternatively, select line SL[X] may be shared with more than two bits lines.

First DDR Compatible Resistive Change Element Open Array Architecture WRITE Operations An open memory circuit architecture structure for an array of resistive change elements according to the present disclosure is described further above with respect to FIGS. 11 and 12 and functional sections 1110, 1112, 1115, 1120, 1125, 1130, and 1140. READ operations are described further above with respect to functional sections 1110, 1112, 1120, 1130, and 1140. WRITE operations are described further below with respect to functional sections 1110, 1115, 1125, 1130, and 1140, because sections 1112 and 1120 are activated only during READ operations. Sections 1115 and 1125 have been added to the data path to enable WRITE voltages greater than $V_{DD}$ and WRITE current control, for example, to be applied to storage array section 1110, while enabling the data on SA/Latch section 1130 and on-chip bidirectional data bus 1140 to switch between zero and $V_{DD}$ voltage levels.

Figure 14:
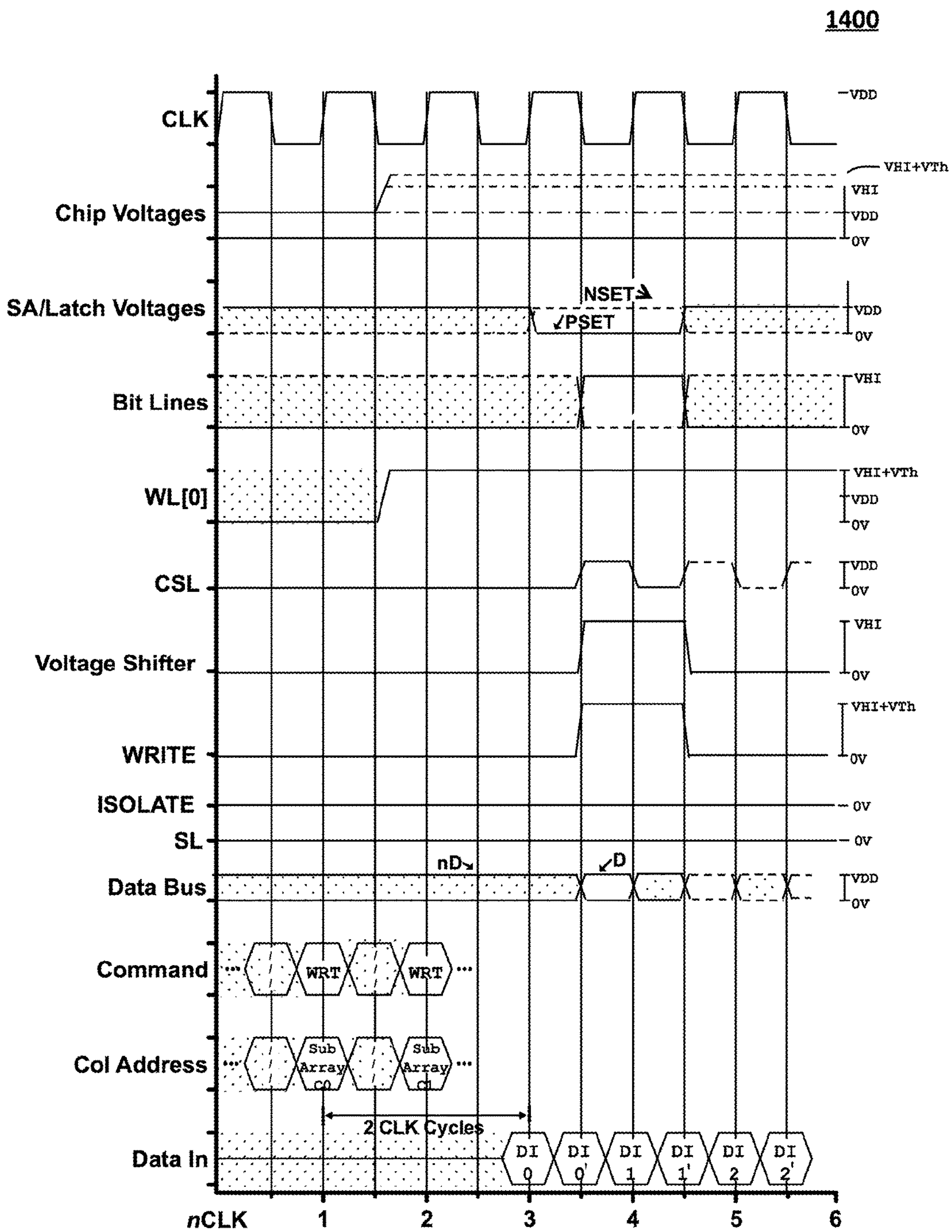
FIG. 14 is a waveform timing diagram illustrating an exemplary WRITE operation performed on a cell with a resistive change element within an open resistive change memory array architecture of the first open architecture.

Referring now to FIG. 14, a timing diagram 1400 is shown for a WRITE (programming) operation for an open DDR compatible memory circuit architecture. Timing diagram 1400 details an exemplary WRITE operation on a single array cell within an open array architecture DDR compatible resistive change element in the storage array section 1110 shown in FIG. 11 and described further above. Within the exemplary timing diagram 1400 of FIG. 14, it is assumed that the resistive change element within the array cell is being adjusted from a high resistance RESET state (corresponding to a logic "0") into a low resistance SET state (corresponding to a logic "1").

As described above with respect to FIGS. 13A and 13B, using the open DDR compatible array architecture described further above with respect to FIG. 11, a READ operation on a selected array cell can be READ and RESET within the same cycle. This READ and RESET method ensures that a selected array cell is in a RESET state (that is, a relatively high resistive state $R_{HI}$, corresponding to a logic '0') at the end of a READ cycle. A WRITE operation on such a cell, then, would only have to apply a SET voltage and current to the array cell as required to be put into a SET state (that is, a relatively low resistive state $R_{LO}$, corresponding to a logic '1'). In this way, this open architecture can be used with a traditional DDR interface. Further, within certain applications, such a READ/RESET/WRITE process can provide enhanced speed and lower power operation of the resistive change element array. To this end, the exemplary WRITE operation detailed in FIG. 14 provides a SET operation on selected cells within a resistive change element array using the open DDR compatible array architecture described above with respect to FIG. 11.

Open architecture timing diagram 1400 illustrated in FIG. 14 is similar to folded architecture timing diagrams 550 and 700 illustrated in FIGS. 5B and 7, respectively. Also, resistive change memory block diagram 1500 is similar to memory block diagram 1000 shown in FIGS. 15 and 10, respectively. In these timing diagrams, two groups of 4 bits each are transferred from an external data bus to a data I/O buffer/driver, with each group of 4 bit transfers corresponding to a positive and negative transition of an on-chip clock CLK. The data I/O buffer/driver then transmits 8 bits corresponding to each positive transition of on-chip clock CLK to 8 SA/latches via an 8 bit wide on-chip data bus and bidirectional data bus control circuits. By way of example, a first group of 8 bits is transferred to a sub-array C0, a second group of 8 bits is transferred to a sub-array C1, and so on, until all data bits corresponding to selected word line WL[0] have been written, at which time, WL[0] is deactivated and word line WL[1] is activated, and the WRITE operation described further above is repeated.

As described further above with respect to folded memory arrays 410 and 610 illustrated in FIGS. 4B and 6B, respectively, there are 2048 bits per word line, or 256 groups of 8 SA/latches along any given word line, such as WL[0], WL[1], and so on. So, there are 256 clock cycles required to WRITE all external data bus bits to all the bits selected by a word line, such as word line WL[0] for example, in a folded memory array architecture.

Referring now to open storage array section 1110 illustrated in FIG. 11, and comparing with folded memory arrays 410 and 610 described further above, open storage array section 1110 has two times the number of bits in corresponding sub-array sections. This is because folded arrays require both a true and complement bit line, such as BL[x]_D/R and BL[x]_R/D, respectively, while open arrays have two separate bit lines, BL[0] and BL[1] in approximately the same area. Hence, the open array architecture illustrated in FIG. 11 has 4096 bits per word line, and 512 clock cycles, each corresponding the transfer of 8 bits, are required to WRITE all the bits to a selected word line, such as WL[0] for example.

Referring now to timing diagram 1400 for a WRITE operation illustrated in FIG. 14, a clock (CLK) signal synchronizes the memory's digital interfaces to an external controller or processor. Throughout the first clock cycle (between "clock 0" and "clock 1") in FIG. 14, the chip voltages for the various memory control functions, address busses, data I/O buffer/drivers, on-chip bi-directional data bus, and other functions described further above with respect to block diagram of resistive change memory of first open architecture 1100 illustrated in FIG. 11 operate between $V_{DD}$ and zero (ground) voltage. During a WRITE operation, write voltage may be higher than $V_{DD}$ and is represented by $V_{HI}$ in FIG. 14, with a gate voltage as high as $V_{HI}+V_{TH}$. Select line SL voltage remains low (ground for example) during the entire WRITE cycle. In the examples described above with respect to table 1380 shown in FIG.

13C, $V_{DD}$ is typically 1 V. to 1.5 V. The row address has been activated and word line WL[0] has been selected in this example prior to the start of the first clock CLK cycle (not shown in FIG. 14). The column address clock generator is activated (FIG. 15) by WRITE "command" WRT. The "Col Address" is received and is stored in column address buffer 1525 (FIG. 15). Column address C0 is selected at the beginning of the WRITE cycle. There is an on chip latency (delay) of 2 CLK cycles in this example before external data is received by the data I/O Buffer/Driver 1567 (FIG. 15). Therefore, sense amplifier/latches, such as sense amplifier/latches 1130-0 and 1130-1 (FIG. 11), are inactive with PSET voltage high and NSET voltage low. Bit line BL[0] isolation device $T_{ISBO}$ and bit line BL[1] isolation device $T_{ISB1}$ remain inactive (OFF) during the WRITE cycle in order to isolate SA/Latches 1130-0 and 1130-1, respectively, from WRITE voltages $V_{HI}$ greater than $V_{DD}$ that may be applied to bit lines BL[0] and BL[1] by voltage shifters 1125-0 and 1125-1, respectively. Reference lines are not used during WRITE operations so RL[0] isolation device $T_{ISR0}$ and reference line RL[1] isolation device $T_{ISR1}$ remain inactive (OFF) and reference resistor select line WL[R] is at zero (ground) voltage during the WRITE operation.

Referring to timing diagram 1400 (FIG. 14), at the start of the second clock cycle (between CLK1 and CLK2) the column address clock generator is activated (FIG. 15) by WRITE "command" WRT and "Col Address" C1 is selected. In support of the WRITE operation, on-chip voltage generators provide SET voltage $V_{SET}$ more than $V_{DD}$, in this example, $V_{SET}=V_{HI}$, and SET overdrive voltage $V_{HI}+V_{TH}$ using known on-chip voltage generation methods such as an on-chip charge pump. So, for example, if $V_{DD}$=1-1.5 V, $V_{SET}$=2 V. The selected word line WL[0] in this example, illustrated in first open architecture schematic 1100 (FIG. 11), transitions to $V_{HI}+V_{TH}$ to enable the full SET voltage $V_{HI}$ and WRITE current to nonvolatile storage element SWx0 for BL[0] or SWx1 for BL[1]. However, it should be understood, that in some cases it may be desirable to limit the SET current flowing into corresponding nonvolatile storage element SWx0 or SWx1 by operating FET Tx0 or Tx1 in saturation mode with a write select voltage less than $V_{HI}$, for example. The use of a saturation mode was as also described further above with respect to FIG. 5B.

Referring to FIG. 14, at the start of the third clock cycle (between CLK2 and CLK3) "Command" and "Col Address" are activated in this and each of the subsequent cycles as described with respect to cycles 1 and 2 above. "Data in" begins with data input DI0 from the 4-bit external data bus 1570 shown in FIG. 15, which is latched by the data I/O buffer/driver 1567 (FIG. 15) by the end of cycle 3, during the positive transition of clock "CLK". The incoming data pulses on the external 4-bit data bus transition between 0 and $V_{DD}$ voltages for both rising and falling transitions of the clock CLK. These external data pulses are received and temporarily latched by the data I/O buffer/driver 1567 in two groups of 4 bits. Data I/O buffer/driver 1567 then transmits data waveforms corresponding to 8 bits to the bidirectional internal data bus 1140, switching between $V_{DD}$ and zero volts, at each positive transition of clock CLK, where D and nD also transition in a voltage range of $V_{DD}$ as shown in timing diagram 1400 (FIG. 14).

Continuing with the third clock cycle timing description, sense amplifier/latches, such as SA/Latch 1130-0 and SA/Latch 1130-1 are activated by "SA/Latch voltages" at the end of cycle 3. PSET transitions from $V_{DD}$ to ground thereby connecting FET TSA5 of sense amplifier/latches 1130-0 and 1130-1 voltage to $V_{DD}$ as shown in FIG. 11. NSET transitions from zero to $V_{DD}$ voltage thereby connecting FET TSA6 of sense amplifier/latches 1130-0 and 1130-1 voltage to a low voltage (ground). "SA/Latch voltages" shows two of the eight sense amplifiers, SA/Latch 1130-0 and SA/Latch 1130-1, activated during the first WRITE cycle. Since in this open array architecture page mode example, there are 512 WRITE cycles needed to write all the bits along word line WL[0], the sense amplifier/latches remain activated long enough to latch and temporarily hold data bits until corresponding array bits are written, and then these SA/latches may be optionally deactivated to save power until completion of the first WRITE cycle and beginning of the next WRITE cycle. Another 512 WRITE cycles begins when a new word line is selected by a row decoder (FIG. 15), and the column decoder (FIG. 15) selects the first eight sense amplifiers as a new WRITE cycle begins. Isolation devices "isolate" remain deactivated during the entire second open DDR architecture WRITE cycle, as shown in timing diagram 1400, to isolate sense amplifier/latches 1130-0 and 1130-1 from the relatively high $V_{HI}$ WRITE voltage applied to bit lines of memory array 1110 by voltage shifters 1125-0 and 1125-1 as explained further above.

Referring to FIG. 14, at the start of the fourth clock cycle, (between CLK3 and CLK4), "Data in" continues with data input DI0' from the 4-bit external data bus, which is latched by the data I/O buffer/driver 1567 (FIG. 15) in mid-clock cycle 4, during a negative transition of clock "CLK". At this point in the cycle, the 8 bits represented by DI0 and DI0' are available from the data I/O buffer/driver 1567 on the 8-bit bidirectional "Data Bus" 1140. At this point in the example, BL[0] is assumed to be selected. "CSL and CSLn" activate bi-directional data bus control CMOS pass gates X0 and X0' (FIG. 11) connecting one of the 8-bit on-chip data bus to each of eight sense amplifier/latches in SA/Latch section 1130, that latch and temporarily hold the data. In this example, the data bus input to be written into storage array section 1110 (FIG. 11) by BL[0] is shown in timing diagram 1400 as "D". In the open DDR array architecture, voltage shifter 1125-0 is activated as $V_{HI}$ transitions from a low voltage to the WRITE SET voltage $V_{HI}$. As explained further above with respect to FIG. 8, sense amplifier/latch terminals X1 and X2 voltages, in this case SA/Latches 1130-0 outputs, are in the range of zero to $V_{DD}$ volts. Voltage shifter 1125-0 output voltage $O_{VS}$ switches from zero to $V_{HI}$. In this example, word line WL[0] was selected, write select 1115 circuit FET $T_{WR0}$ is activated when WRITE SELECT transitions to $V_{HI}+V_{TH}$ and output voltage $O_{VS}$ drives bit line BL[0] to $V_{SET}=V_{HI}$ and sets nonvolatile storage element SWx0 to a low resistance value corresponding to a logic "1" state. If the input data had been a logic "0", written to SWx1 for example, CMOS pass gates X1 and X1' (FIG. 11) would have transmitted the data to the sense amplifier 1130-1, voltage shifter 1125-1 would have been activated, and voltage shifter 1125-1 output voltage $O_{VS}$ would have been a low voltage, essentially zero volts, leaving nonvolatile storage element SWx1 in its pre-set high resistance RESET state.

Referring to FIG. 14, during the fifth clock cycle (between CLK4 and CLK5), bit line BL[1] SET cycle is completed. "SA/Latch voltages" deactivate the corresponding sense amplifier/latch. Voltage shifter 1125-0 is turned off by disconnecting from the $V_m$ chip voltage and write select 1115 is deactivated by WRITE SELECT. Word line WL[0] remains active until all bits along the word line are written, which in this page mode example, requires a total of 512 cycles. The next 4-bit DI1 data inputs are received from the external data bus during a positive transition of the clock CLK, then 4-bit DI1' data inputs are received during the negative transition of the clock CLK. The 8 bits are temporarily latched by data I/O buffer/driver 1567 (FIG. 15) and transmitted to the 8-bit on-chip data bus. CSL and CLSn are activated and the eight data bits are routed to another 8 sense amplifier/latches corresponding to another column address decoded by the column decoder (FIG. 15). Another 8 bits are written along selected word line WL[0] but at other cells and corresponding storage element locations in storage array section 1110 (FIG. 11). The activation of these other sense amplifier/latches and turning on of the activation devices is similar to those illustrated in timing diagram 1400 except that they occur during later clock cycles. The 8-bit data WRITE operation is repeated with input data DI2 and DI2' in cycle 6 (cycle 5 to cycle 6), and so on, until all bits along selected word line WL[0] are written. In this page mode example, 4096 bits are written along word line WL[0] in 512 cycles (8 bits/cycle×512 cycles). The DDR page mode WRITE operation then continues with a new word line when WL[0] is deactivated, and another word line, WL[1] for example, selected by the row decoder is activated. The waveforms shown in timing diagram 1400 shown in FIG. 14 are repeated until all bits in the page have been written.

Second DDR Compatible Resistive Change Element Open Array Architecture

Figure 16:
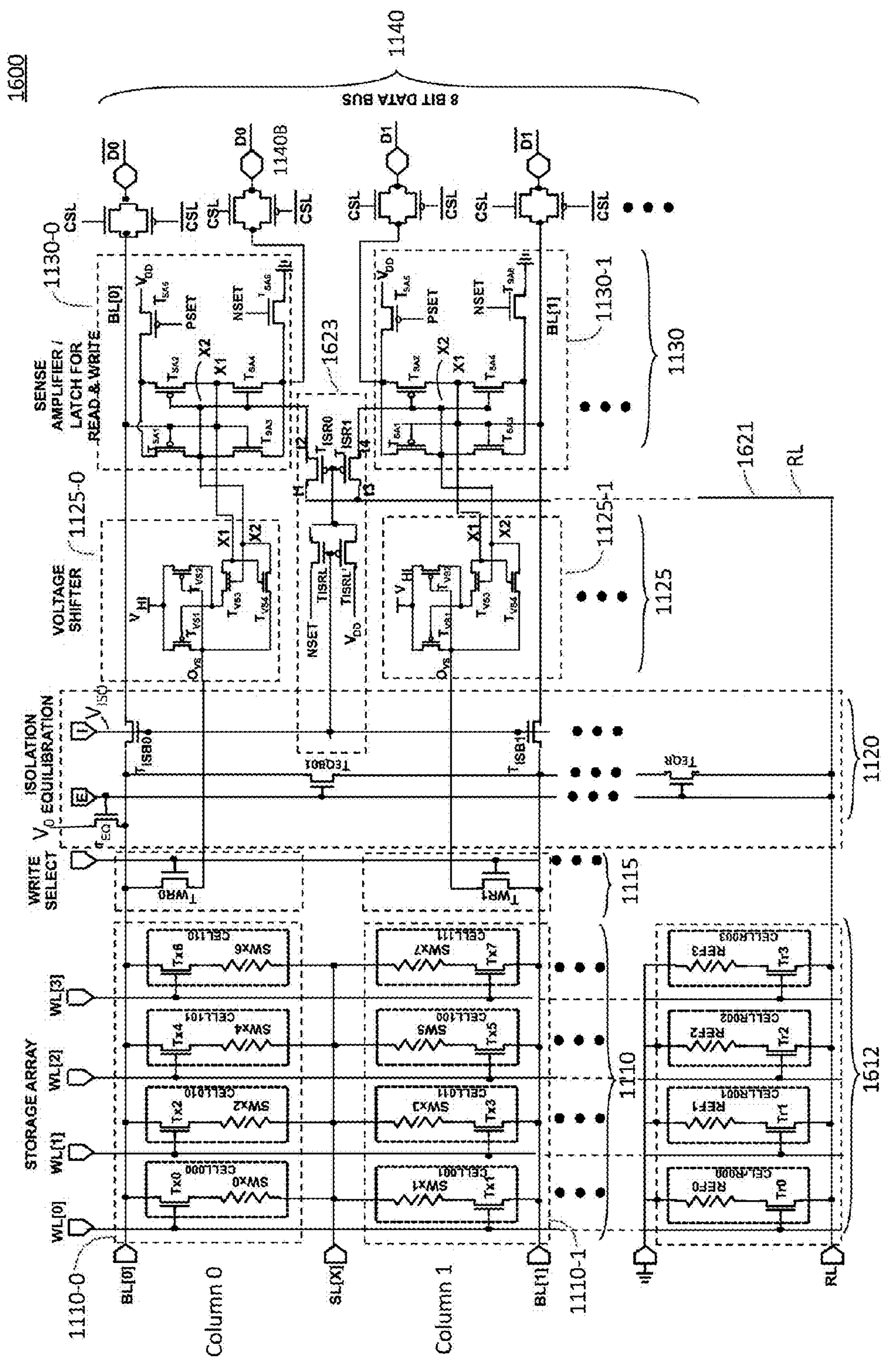
FIG. 16 is a simplified schematic of a DDR NRAM compatible second open architecture with an open resistive change memory array architecture that includes a reference resistor for each word line connected to a single reference line (note that bit line columns are drawn horizontally to accommodate a subset of two independent bit lines, isolation devices, voltage shift circuits, and sense amplifier details).

Referring now to second open architecture schematic 1600 illustrated in FIG. 16, and comparing with first open architecture schematic 1100 illustrated in FIG. 11, second open architecture schematic 1600 changes the physical location and operation of reference resistor cells and reduces the number of reference lines. Reference resistors are removed from the bit line data path and added to the word line cell select path.

For example, referring to FIG. 11, reference resistor cells shown in reference array section 1112 are selected by reference resistor select line WL[R] and there is one reference resistor cell for each bit line. However, referring to FIG. 16, reference resistor select line WL[R] is eliminated, and instead, reference resistor cells shown in reference array section 1612 are selected by the word lines WL[0], WL[1], WL[2], and WL[3], which are the same word lines that select resistive change element cells corresponding to bit lines BL[0], BL[1], and other bit lines in storage array section 1110. The number of reference resistance cells in FIG. 16 are equal to the number of word lines. Also, since the number of cell select transistor junctions connected to reference line 1621 is the same as for bit lines such as BL[0] and BL[1], FET capacitors 1122 shown in FIG. 11 are not needed for reference line 1621. Significantly, there is only one reference line for the eight bit lines BL[0], BL[1], BL[2], BL[3], BL[4], BL[5], BL[6], and BL[7], of which BL[0] and BL[1] are shown in FIG. 16.

Referring now to FIG. 16, and as described further above with respect to FIG. 11, when operating in a READ mode, isolation devices are activated (turned-on) and connect memory array bit lines in contact with resistance change element cells with bit line segments in contact with first terminals of SA/latches. For example, as illustrated in FIG. 16, during a READ operation bit line BL[0] is connected to resistance change element cell CELL000 and to bit line segment BLs[0] when isolation device $T_{ISB0}$ is activated (turned-on). Bit line segment BLs[0] is connected to first terminal X1 of SA/latch 1130-0, thereby enabling terminal X1 connection with CELL000. Also, as illustrated in FIG. 16, during a READ operation bit line BL[1] is connected to resistance change element cell CELL001 and to bit line segment BLs[1] when isolation device $T_{ISB1}$ is activated (turned-on). Bit line segment BLs[1] is connected to first terminal X1 of SA/latch 1130-1, thereby enabling terminal X1 connection with CELL001.

However, with respect to the single reference line shared with multiple bit lines, 8 bit lines in this example, the reference line (RL) 1621 shown in second open architecture schematic 1600 illustrated in FIG. 16 requires reference line interface circuit 1623 instead of the one isolation device per reference line, such as isolation devices $T_{ISR0}$ and $T_{ISR1}$ in which terminals t1 and t3, respectively, are each connected to separate reference lines, and terminals t2 and t4 are each connected to and SA/latches that switch independently of each other and any other SA/latches as illustrated and described further above with respect to FIG. 11. This is because terminals t1 and t3 are each connected to separate reference lines RL[0] and RL[1], respectively. However, since second open architecture schematic 1600 illustrated in FIG. 16 has only one reference line 1621, terminals t1 and t3 are therefore both connected to RL 1621, such that when isolation devices $T_{ISR0}$ and $T_{ISR1}$ are activated, terminals t1, t2 and t3, t4, respectively, are connected and SA/latches 1130-0 and 1130-1 cannot switch independently of each other or any other latches sharing reference line 1621.

Figure 17:
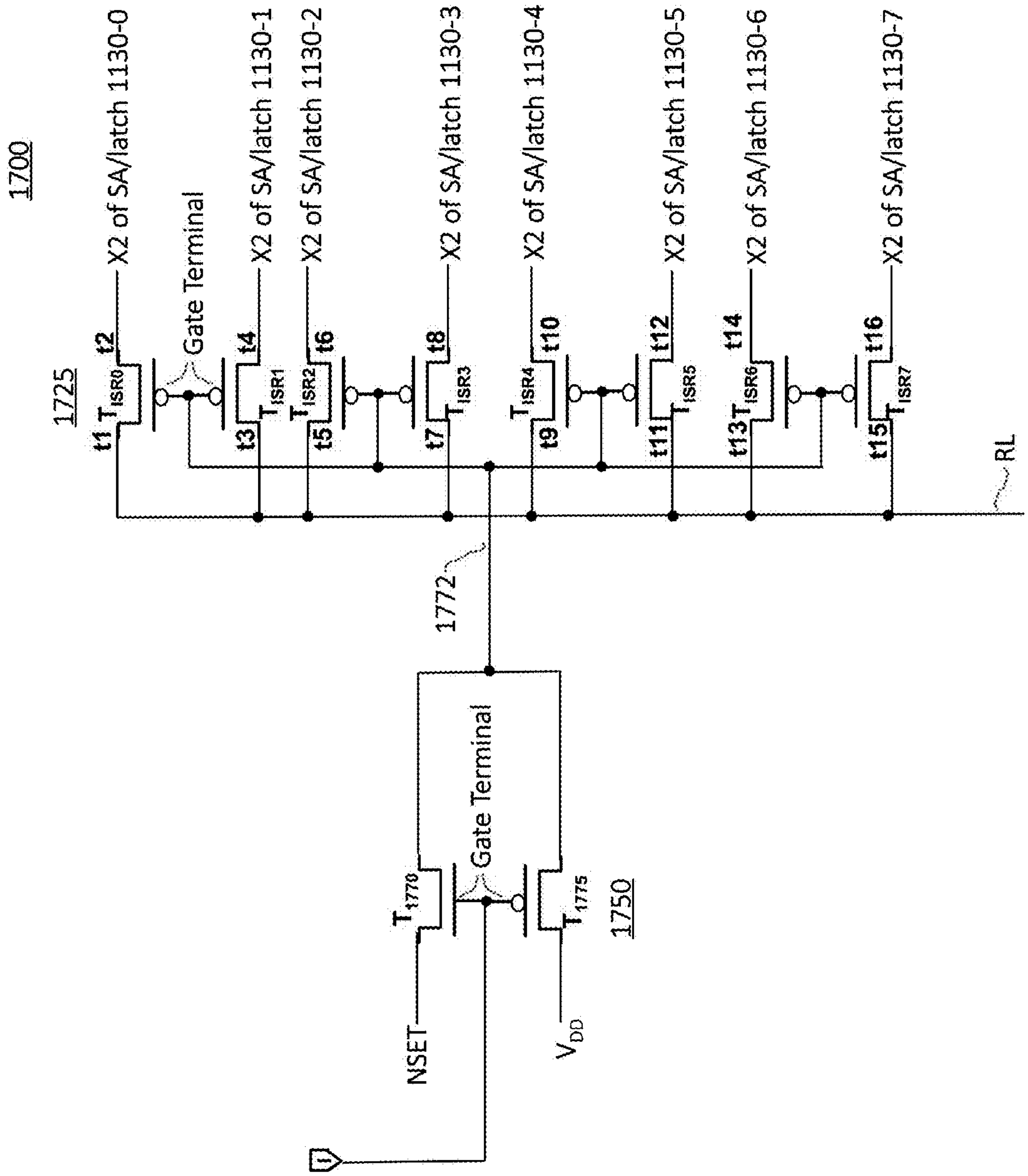
FIG. 17 is a simplified schematic diagram of a reference line interface circuit that enables a DDR NRAM compatible open architecture with an open resistive change memory array architecture to operate with a single reference line used with multiple bit lines and corresponding multiple sense amplifier/latches.

Reference line interface circuit 1700 illustrated in FIG. 17 is designed to enable terminals of isolation devices in isolation device section 1725 to all be connected to a reference line RL, such as reference line 1621 shown in FIG. 16. In this example, isolation device terminals t1 and t3, as well as additional corresponding terminals of other isolation devices, such as t5, t7, t9, t11, t13, and t15 are connected to the same reference line RL, such as reference line 1621 without causing SA/latch interference during switching. Isolation device section 1725, in this example, consists of eight isolation devices, each isolation device is a PFET device and has a first terminal connected to reference line RL, a second terminal connected to X2 of eight corresponding SA/latches in SA/latch section 1130, and a gate terminal connected to the mode control circuit output 1772 of mode control circuit 1750. For example, referring now to isolation devices $T_{ISR0}$, $T_{ISR1}$, $T_{ISR2}$, $T_{ISR3}$, $T_{ISR4}$, $T_{ISR5}$, $T_{ISR6}$, and $T_{ISR7}$, a first terminal of each isolation device is connected to reference line RL; a second terminal is connected to second terminal X2 of corresponding SA/latches 1130-0, 1130-1, 1130-2, 1130-3, 1130-4, 1130-5, 1130-6, and 1130-7, respectively; and the gate terminal of each device of each isolation device is connected to the gate of all other isolation devices, which are connected to the output 1772 of mode control circuit 1750. FIG. 16 illustrates reference line interface circuit 1623, corresponding to reference line interface circuit 1700, with first terminals of isolation devices $T_{ISR0}$ and $T_{ISR1}$ t1 and t3, respectively, connected to reference line RL; second terminals t2 and t4, each connected to a terminal X2 of SA/latches 1130-0 and 1130-1, respectively; and gate terminals connected to a mode control circuit corresponding to mode control circuit 1750 illustrated in FIG. 17.

Referring now to FIG. 17, mode control circuit 1750 is formed by a pair of NFET and PFET transistors $T_{1770}$ and $T_{1775}$, respectively, having gate terminals connected to each other and to device control line I which transitions to $V_{ISO}$ such that either one or the other may be ON, but not both at the same time. In READ mode, isolation device control I has a positive voltage and NFET transistor $T_{1770}$ is ON and PFET transistor $T_{1775}$ is OFF. In WRITE mode, isolation device control I has zero volts and NFET transistor $T_{1770}$ is OFF and PFET transistor $T_{1775}$ is ON. Transistors $T_{1770}$ and $T_{1775}$ shown in FIG. 17 correspond to transistors $T_{ISRL}$ and $T_{ISRL'}$, respectively, illustrated in FIG. 16.

Figure 18A:
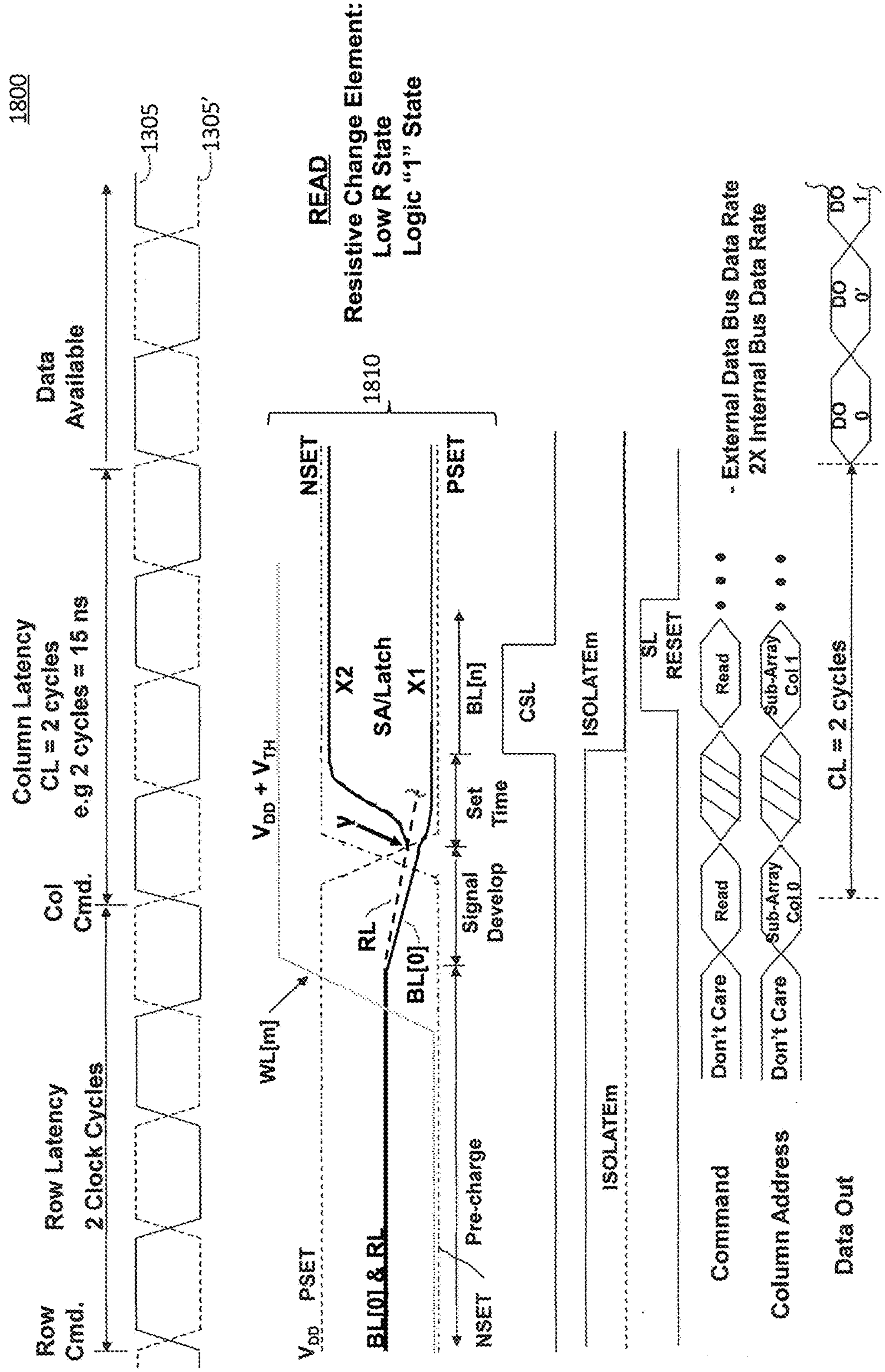
FIG. 18A is a waveform timing diagram illustrating an exemplary READ operation performed on a cell with a resistive change element in a low resistance state within an open resistive change memory array architecture of the second open architecture.
Figure 18B:
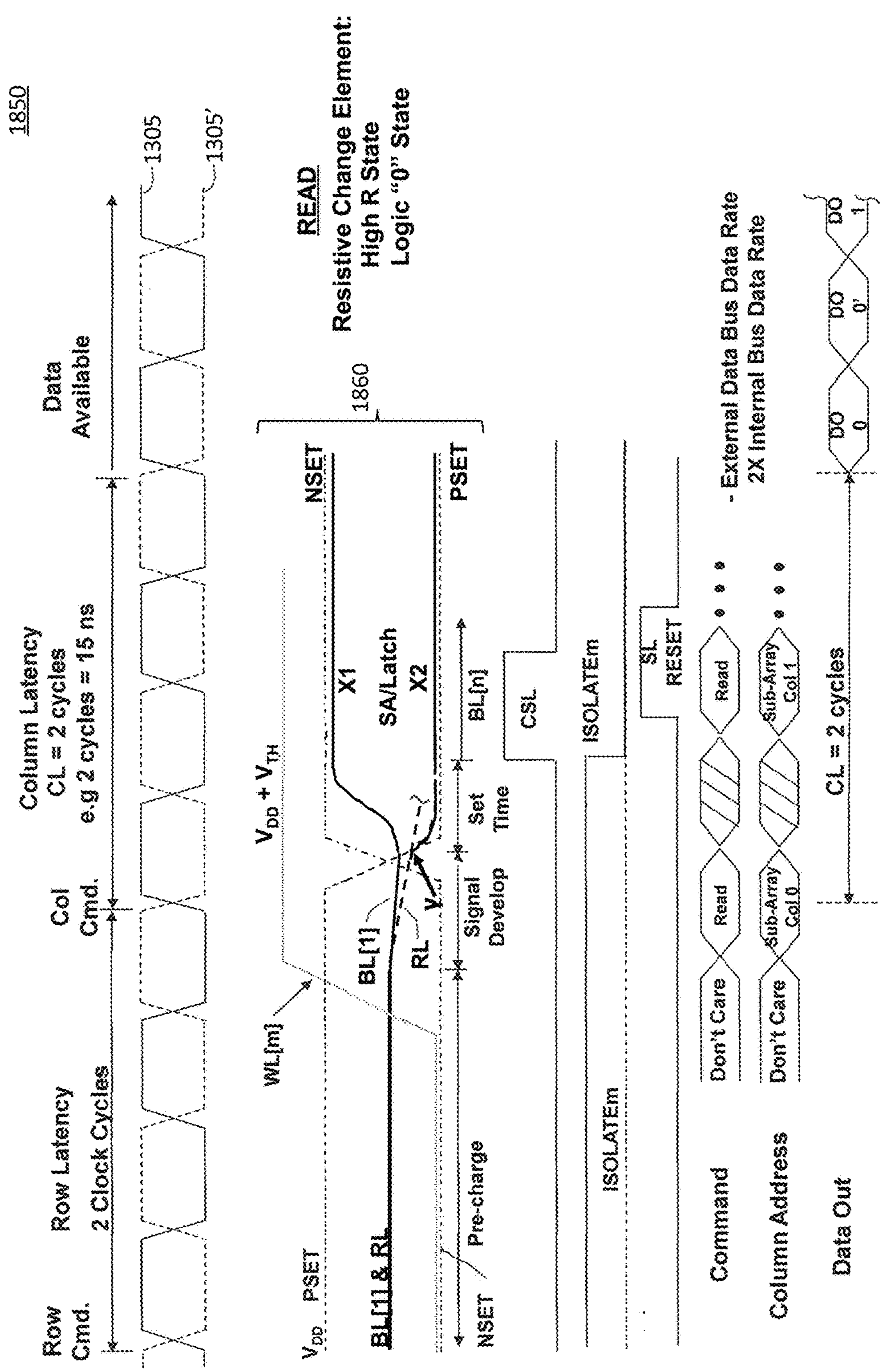
FIG. 18B is a waveform timing diagram illustrating an exemplary READ operation performed on a cell with a resistive change element in a high resistance state within an open resistive change memory array architecture of the second open architecture.

In operation, referring now to FIGS. 16 and 17 operated in a READ mode with waveforms illustrated in FIGS. 18A and 18B, isolation device control line I has a positive voltage such as $V_{DD}$ and in this example, the READ cycle begins with a pre-charge time interval in which equilibration device control line E switches to a positive voltage, such as $V_{DD}$ for example, and bit lines BL[0], BL[1], . . . , BL[7] and reference line RL, such as reference line 1621, are all connected and set to $V_{DD}/2$, and then disconnected when equilibration device control line E transitions to zero volts at the end of the pre-charge time interval, thereby starting the signal develop time interval. All SA/latches in SA/latch section 1130, such as SA/latches 1130-0 and 1130-1, are inactive during both the pre-charge and signal develop time intervals because NSET voltage is at zero volts and PSET voltage is at $V_{DD}$. During the signal develop time interval shown in FIGS. 18A and 18B, all bit lines in storage array section 1110 discharge at rates determined by the time constant RC, where R is the resistance change element value of the selected resistance charge element cell and C is the bit line capacitance. During the same signal develop time interval, reference line RL, such as reference line 1621, also discharges with a time constant RC where R is the reference resistor value and C is the reference line 1621 capacitance. The bit line and reference line capacitance values are essentially the same. Typically, all reference resistors shown in reference array section 1612 have the same resistance value, so reference resistors REF0=REF1=REF2=REF 3=REF, where the REF resistance value is greater than the low resistance change element state but less than the high resistance change element state as described further above.

Referring now to FIG. 16 and second open architecture schematic 1600 READ operations and signal development and sensing waveforms 1810 and 1860 shown in FIGS. 18A and 18B, respectively, for bit lines B[0] and BL[1], respectively, these bit line waveforms correspond essentially to READ signal development and sensing waveforms 1110 and 1160 for bit lines BL[0] and BL[1], respectively, described further above with respect to FIGS. 13A and 13B and first open architecture schematic 1100 shown in FIG. 11. However, reference lines RL[0] and RL[1] READ operations in signal development and sensing waveforms 1810 and 1860, respectively, shown in FIGS. 18A and 18B, respectively, and described further below are substantially different than reference waveforms RL[0] and RL[1] in signal development and sensing waveforms 1110 and 1160, respectively, described further above with respect to FIGS. 11A and 11B, respectively.

In operation, referring now to reference line interface circuit 1700 shown in FIG. 17, and more specifically to mode control circuit 1750, transistor $T_{1770}$ is in an ON state, transistor $T_{1775}$ is in an OFF state, and NSET is at zero volts during the pre-charge and signal develop time intervals and therefore mode control circuit output 1772 has been at zero volts. Since output 1772 has been at zero volts, all gate terminals of PFET isolation devices $T_{ISR0}$, $T_{ISR1}$, $T_{ISR2}$, $T_{ISR3}$, $T_{ISR4}$, $T_{ISR5}$, $T_{ISR6}$, and $T_{ISR7}$ were at zero volts and were in an ON state during the pre-charge and signal development time intervals, thereby connecting reference line RL, such as reference line 1621, to second terminal X2 of all the SA/latches of SA/latch section 1130 shown in FIG. 16, and enabling the completion of signal development. At approximately the end of the signal develop time interval as illustrated in FIGS. 18A & 18B, SA/latches in SA/latch section 1130 shown in FIG. 16 are activated (turned-on) when NSET transitions from zero volts to $V_{DD}$ and PSET transitions from $V_{DD}$ to zero volts, thereby starting the set time interval during which SA/latches, such as SA/latches 1130-0 and 1130-1, logic states are set to correspond to the resistance change element value. The point in time at which reference line 1621 is decoupled from the terminals X2 of the SA/latches is indicated by the symbol gamma (γ) and an arrow in both READ timing diagrams illustrated in FIGS. 18A and 18B.

Referring now to reference line (RL) 1621 shown in FIG. 16, the pre-charge and signal development time waveforms are essentially the same for reference line RL shown in FIGS. 18A and 18B when compared to reference lines RL[0] and RL[1] shown in FIGS. 13A and 13B, respectively, until the end of the signal development time indicated by the symbol γ, because the reference resistor and reference line capacitance values are essentially the same. Then, the NSET voltage transition to $V_{DD}$ changes output 1772 from zero to $V_{DD}$ voltage, which turns all PFET isolation devices in section 1725 to an OFF state, thereby decoupling all second terminal X2 nodes of all SA/latches in SA/latch section 1130 from reference line RL, such as reference line 1621, and therefore from each other, thereby preventing voltage coupling between SA/latches, during the set time interval and until the end of the READ cycle. Reference line RL waveforms are substantially different with respect to reference line RL[0] and RL[1] after the end of signal development time γ.

Referring now READ timing diagram 1800 and signal development and sensing waveform 1810 shown in FIG. 18A, when sensing a resistance change element is in a low resistance state, the voltage on bit line BL[0] is lower than the voltage on reference line RL at the end of signal development time γ. This change is highlighted in FIG. 18A by showing that the RL waveform continues to discharge (dotted line) after the time indicated by γ, while the SA/latch terminal X2, decoupled from reference line RL, switches to $V_{DD}$. SA/latch terminal X1 switches to zero volts.

Referring now to READ timing diagram 1850 and signal development and sensing waveform 1860 shown in FIG. 18B, when sensing a resistance change element is in a high resistance state, the voltage on bit line BL[1] is higher than the voltage on reference line RL at the end of signal development time γ. This change is highlighted in FIG. 18B by showing that the RL waveform continues to discharge (dotted line) after the time indicated by γ, while the SA/latch terminal X2, decoupled from reference line RL, switches to zero volts. SA/latch terminal X1 switches to $V_{DD}$.

In this example, and examples described further above and further below, because of the non-destructive read-out (NDRO) operations in NRAM memories, there is no need for a resistance change element write back operation as there is for a destructive read-out (DRO) operations in DRAM for example. Therefore, it is possible confine the full SA/latch zero to $V_{DD}$ transition to bit line segments, while reducing the voltage appearing on the corresponding bit line connected to the selected resistance change element in the storage array. It is desirable to reduce the array voltage to reduce power dissipation and the risk of disturbing the state of the resistance change element. The amount of voltage reduction in the array depends on the isolation voltage $V_{ISO}$ applied to the isolation transistor gate, the lower the better.

During the equilibration operation, bit lines and reference lines are pre-charged to equilibration voltage $V_0$. In these examples, $V_0=V_{DD}/2$. During signal development, bit lines and reference lines discharge toward zero volts at different rates (RC time constants) during signal development time as described further below with respect to READ timing diagrams illustrated in FIGS. 13A, 13B, 18A, and 18B. Hence isolation voltage $V_{ISO}$ value is only required to be at least $V_0+V_{TH}$, and since $V_0=V_{DD}/2$ in this example, $V_{ISO}>=V_{DD}/2+V_{TH}$ is required. Assuming $V_{DD}$=1.0 V. and $V_{TH}$=0.3 V., $V_{ISO}$=0.8 V. or higher. Referring now to bit line BL[1] and waveforms 1360 illustrated in FIG. 18B and described further above, a READ operation performed on a resistance change element in a high resistance state causes SA/latch 1130-1 shown in FIG. 16 to switch with first terminal X1 at $V_{DD}$=1.0 V. applied to bit line segment BLs[1] and second terminal X2 at zero volts. Isolation transistor $T_{ISB1}$ is in saturation mode with a gate voltage $V_{ISO}$=0.8 V., drain connected to BLs[1] at 1 V., and bit line BL[1] connected to sub-array 1110-1 at $V_{GS}$-$V_{TH}$=0.8-0.3=0.5 V. Bit line BL[1] voltage in sub-array 1110-1 resulting from SA/latch 1130-1 switching to 1.0V is reduced in half to 0.5 V. This voltage reduction significantly reduces array power. Also, it enables a WRITE (SET) voltage of $V_{DD}$=1.0 V. without a READ disturb concern.

Referring now to FIGS. 18A, 18B, and 15, the logic state of all SA/latches in SA/latch section 1130 are transmitted via on-chip bidirectional data bus 1140 to data I/O buffer driver 1567 shown in FIG. 15 and available on external bidirectional data bus 1570 after a column latency (CL) of 2 cycles of clock 1305.

Referring now to FIGS. 16, 18A and 18B and RESET pulse SL RESET, a RESET operation may be performed prior to the end of the READ cycle as described further above with respect to FIGS. 13A, 13B, and 13D.

In operation, second open architecture schematic 1600 shown in FIG. 16 has the same WRITE operational waveforms as those of first open architecture schematic 1100 shown in FIG. 11, which are shown in FIG. 14 because reference lines are not used (bypassed) in WRITE operations. This is because in a WRITE mode, isolation device control line I is at zero volts, and referring to mode control circuit 1750 shown in FIG. 17, transistor $T_{1770}$ is turned OFF and transistor $T_{1775}$ ON. Transistor $T_{1775}$ connects $V_{DD}$ to output 1772, which turns OFF all PFET isolation devices in isolation device section 1725 during write operations. Hence, with respect to WRITE operations, voltage shifter section 1125 and corresponding write select section 1115 shown in FIG. 16 are essentially the same circuits as voltage shifter section 1125 and corresponding write select section 1115 shown in FIG. 11. Therefore, operationally, WRITE timing diagram 1400 shown in FIG. 14 is the same for both FIG. 16 and FIG. 11 schematics.

Third DDR Compatible Resistive Change Element Open Array Architecture

Figure 19:
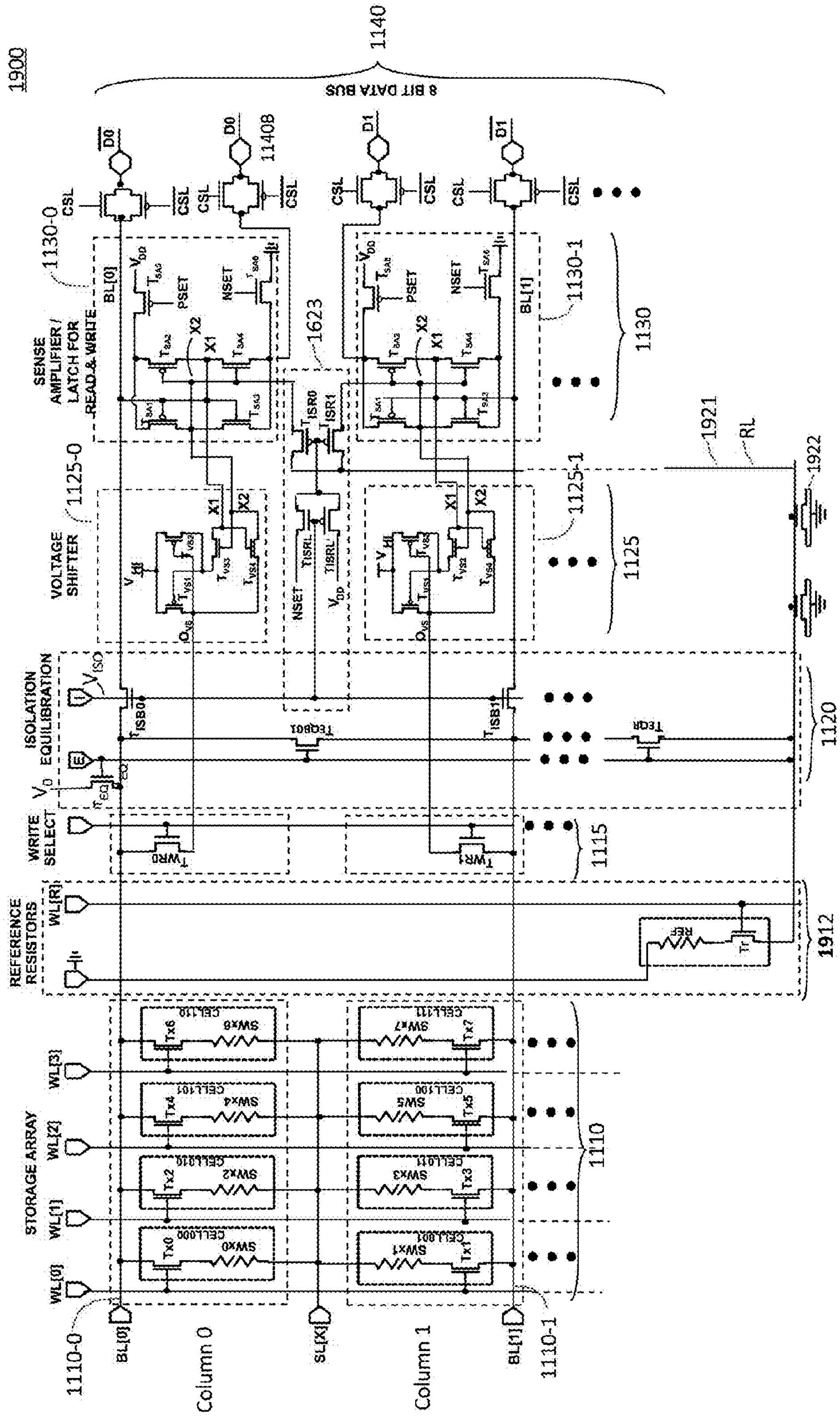
FIG. 19 is a simplified schematic of a DDR NRAM compatible third open architecture with an open resistive change memory array architecture that includes a single reference resistor for all word lines connected to a single reference line (note that bit line columns are drawn horizontally to accommodate a subset of two independent bit lines, isolation devices, voltage shift circuits, and sense amplifier details).

Referring now to third open architecture schematic 1900 illustrated in FIG. 19, and comparing with second open architecture schematic 1600 illustrated in FIG. 16, third open architecture schematic 1900 is a simplification of the FIG. 16 schematic by replacing reference array section 1612 shown in FIG. 16 with a single reference resistor cell 1912. Single reference resistor cell 1912 is formed with a first terminal of reference resistor REF connect to a reference voltage such as ground (zero volts) and a second terminal connected with a first terminal of select transistor Tr. A second terminal of transistor Tr is connected to the single reference line 1921, and the third terminal of transistor Tr, a gate terminal, is connected to reference resistor select line WL[R].

Reference line 1921, which is substantially physically shorter and has substantially less line capacitance than bit lines BL[0] and BL[1], as well as all other bit lines, has only one cell diffusion node. As discussed further above with respect to FIG. 11, a reference line, such as reference line 1921 for example, needs a discharge time constant τ=RC that corresponds with the time constant of the corresponding bit lines, such as bit lines BL[0] and BL[1] in this example. That is, the reference time constant needs to be greater than the time constant for a resistance change element in a low resistance state, but less than the time constant for a resistance change element in a high resistance state. In one embodiment, the reference line may have essentially same capacitance as the corresponding bit line to ensure that bit line and reference line discharge time constant capacitance track for sensing purposes. In other embodiments, reference line reference capacitance may be different from that of the bit line, if the reference resistance value REF is adjusted such that τ=RC remains the same. Reference line 1921 capacitance may be adjusted by connecting the reference line to multiple FET capacitors 1922 illustrated in FIG. 19.

Referring to FIG. 19, in operation, during a READ cycle, reference resistor select line WL[R] is activated at the same time as one of the selected word lines such as word line WL[0], WL[1], WL[2], and WL[3] in this example. Referring now to FIG. 17 described further above and FIG. 19, in operation during a READ mode with waveforms illustrated in FIGS. 18A and 18B, the READ cycle begins with a pre-charge time interval in which equilibration device control line E switches to a positive voltage, such as $V_{DD}$ for example, and bit lines BL[0], BL[1], . . . , BL[7] and reference line RL, such as reference line 1921, are all connected and set to $V_{DD}/2$, and then disconnected when equilibration device control line E transitions to zero volts at the end of the pre-charge time interval, thereby starting the signal develop time interval. All SA/latches in SA/latch section 1130, such as SA/latches 1130-0 and 1130-1, are inactive during both the pre-charge and signal develop time intervals because NSET voltage is at zero volts and PSET voltage is at $V_{DD}$. During the signal develop time interval shown in FIGS. 18A and 18B, all bit lines in storage array section 1110 discharge at rates determined by the time constant RC, where R is the resistance change element value of the selected resistance charge element cell and C is the bit line capacitance. During the same signal develop time interval, reference line RL, such as reference line 1921, also discharges with a time constant RC where R is the reference resistor value and C is the reference line 1921 capacitance. The reference line time constant RC, which is a combination of the reference resistor REF and reference line capacitance, is selected as described further above such that the reference line time constant is greater than the time constant for a resistance change element in a low resistance state, but less than the time constant for a resistance change element in a high resistance state.

In operation, referring now to reference line interface circuit 1700 shown in FIG. 17 described further above, and more specifically to mode control circuit 1750, transistor $T_{1770}$ is in an ON state, transistor $T_{1775}$ is in an OFF state, and NSET is at zero volts during the pre-charge and signal develop time intervals and therefore mode control circuit output 1772 had been at zero volts. Since output 1772 has been at zero volts, all gate terminals of PFET isolation devices $T_{ISR0}$, $T_{ISR1}$, $T_{ISR2}$, $T_{ISR3}$, $T_{ISR4}$, $T_{ISR5}$, $T_{ISR6}$, and $T_{ISR7}$ were at zero volts and were in an ON state during the pre-charge and signal development time intervals, thereby connecting reference line RL, such as reference line 1921, to second terminal X2 of all the SA/latches of SA/latch section 1130 shown in FIG. 19, and enabling the completion of signal development. Note that reference line interface circuit 1623 shown in FIG. 19 is a subset of reference line interface circuit 1700 shown in FIG. 17 as described further above. At approximately the end of the signal develop time interval as illustrated in FIGS. 18A & 18B, SA/latches in SA/latch section 1130 shown in FIG. 18 are activated (turned-on) when NSET transitions from zero volts to $V_{DD}$ and PSET transitions from $V_{DD}$ to zero volts, thereby starting the set time interval during which SA/latches, such as SA/latches 1130-0 and 1130-1, logic states are set to correspond to the resistance change element value as described further above with respect to FIGS. 18A and 18B. The NSET voltage transition to $V_{DD}$ changes output 1772 from zero to $V_{DD}$ voltage, which turns all PFET isolation devices section 1725 to an OFF state, thereby decoupling all second terminal X2 nodes of all SA/latches in SA/latch section 1130 from reference line RL, such as reference line 1921, and preventing voltage coupling between SA/latches during the set time interval and until the end of the READ cycle.

Since SA/latches, such as SA/latches in SA/latch section 1130 shown in FIG. 18, are decoupled from reference line RL, such as reference line 1921, during set time and until the end of the READ cycle as described further above, in operation, third open architecture schematic 1900 shown in FIG. 19 has the same READ operational waveforms as those of second open architecture schematic 1600 shown in FIG. 16, which are shown in FIGS. 18A and 18B.

Referring now to FIGS. 18A, 18B, and 15, the logic state of all SA/latches in SA/latch section 1130 are transmitted via on-chip bidirectional data bus 1140 to data I/O buffer driver 1567 shown in FIG. 15 and available on external bidirectional data bus 1570 after a column latency (CL) of 2 cycles of clock 1305.

Referring now to FIGS. 19, 18A and 18B and RESET pulse SL RESET, a RESET operation may be performed prior to the end of the READ cycle as described further above with respect to FIGS. 13A, 13B, and 13D.

In operation, third open architecture schematic 1900 shown in FIG. 19 has the same WRITE operational waveforms as those of first open architecture schematic 1100 shown in FIG. 11, which are shown in FIG. 14 because reference lines are not used (bypassed) in WRITE operations. This is because in a WRITE mode, isolation device control line I is at zero volts, and referring to mode control circuit 1750 shown in FIG. 17, transistor $T_{1770}$ is turned OFF and transistor $T_{1775}$ ON. Transistor $T_{1775}$ connects $V_{DD}$ to output 1772, which turns OFF all PFET isolation devices in isolation device section 1725 during write operations. Hence, with respect to WRITE operations, voltage shifter section 1125 and corresponding write select section 1115 shown in FIG. 19 are essentially the same circuits as voltage shifter section 1125 and corresponding write select section 1115 shown in FIG. 11. Therefore, operationally, WRITE timing diagram 1400 shown in FIG. 14 is the same for both FIG. 19 and FIG. 11 schematics.

Fourth DDR Compatible Resistive Change Element Open Array Architecture

Figure 20:
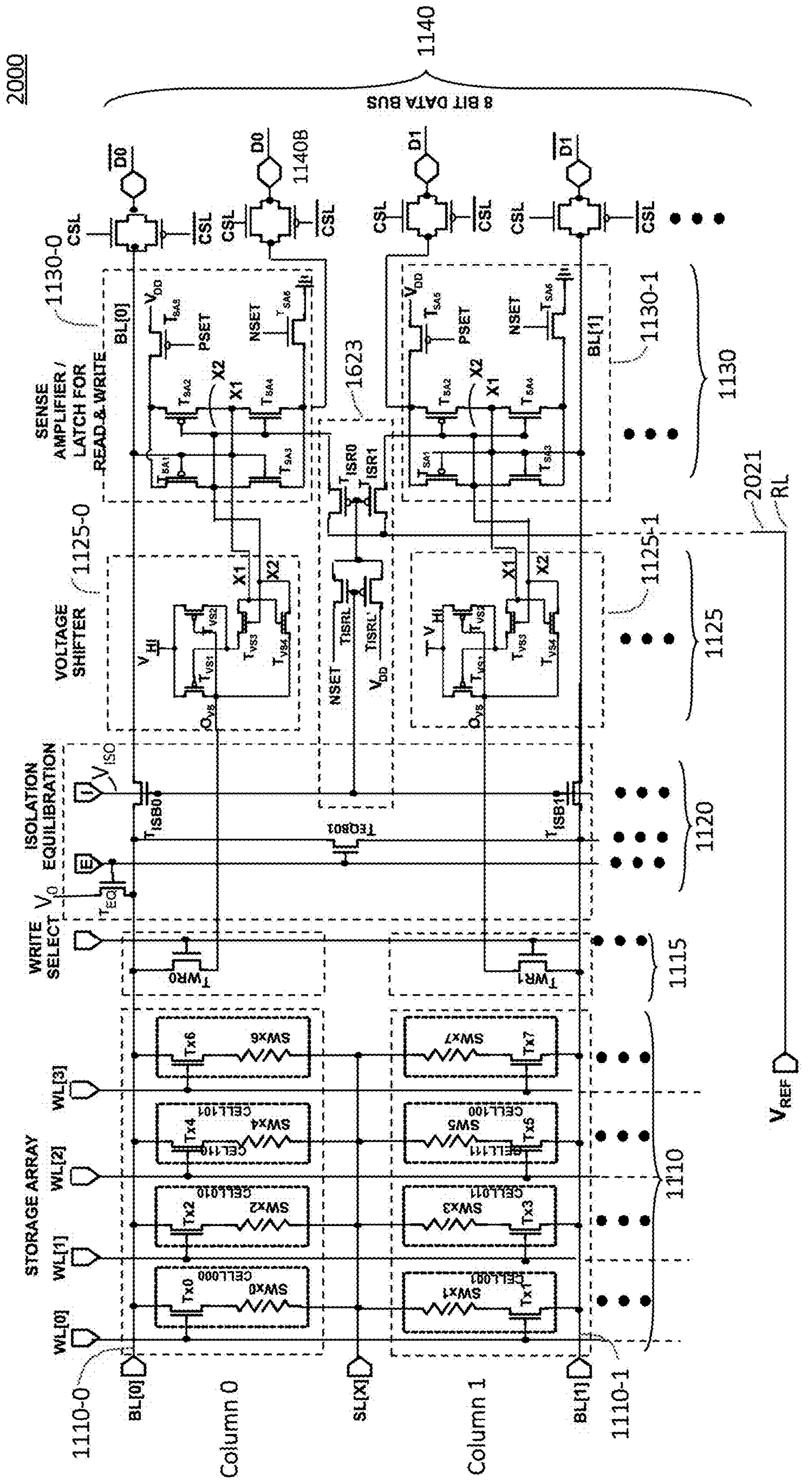
FIG. 20 is a simplified schematic of a DDR NRAM compatible fourth open architecture with an open resistive change memory array architecture no reference resistors. A reference voltage is connected to a single reference line (note that bit line columns are drawn horizontally to accommodate a subset of two independent bit lines, isolation devices, voltage shift circuits, and sense amplifier details).

Referring now to fourth open architecture schematic 2000 illustrated in FIG. 20, and comparing with second and third open architectures illustrated in FIGS. 16 and 19, respectively, fourth open architecture eliminates all reference resistors connected to reference lines, and instead applies reference voltage $V_{REF}$ directly to reference line 2021 shown in FIG. 20. $V_{REF}$ is a constant voltage value chosen to be at a higher voltage value than the discharge value of a bit line connected to a resistance change element in a low resistance state, $R_{LO}$=100 kΩ for example, but at a lower voltage than a bit line connected to a resistance change element in a high resistance state, $R_{HI}$=2 MΩ for example, at the end of the signal development time gamma (γ) as shown in READ timing diagrams 2100 and 2150 illustrated in FIGS. 21A and 21B, respectively. Reference line 2021 shown in FIG. 20 is connected to reference line interface circuit 1623, which is in turn connected to second terminal X2 of each SA/latch in SA/latch section 1130. The operation of reference line interface circuit 1623 is the same as described further above with respect to FIGS. 16, 17, 18A, and 18B.

In operation, the READ cycle begins with a pre-charge time interval in which equilibration device control line E switches to a positive voltage, such as $V_{DD}$ for example, and bit lines BL[0], BL[1], . . . , BL[7] are all connected and set to $V_0=V_{DD}/2$, and then disconnected when equilibration device control line E transitions to zero volts at the end of the pre-charge time interval, thereby starting the signal develop time interval. All SA/latches in SA/latch section 1130, such as SA/latches 1130-0 and 1130-1, are inactive during both the pre-charge and signal develop time intervals because NSET voltage is at zero volts and PSET voltage is at $V_{DD}$. During the signal develop time interval shown in FIGS. 21A and 22B, all bit lines in storage array section 1110 discharge at rates determined by the time constant RC, where R is the resistance change element value of the selected resistance charge element cell and C is the bit line capacitance as described further above. During the same signal develop time interval, reference line 2021 remains at the same constant voltage $V_{REF}$, and reference line interface circuit 1623 transmits $V_{REF}$ to terminal X2 of SA/latch 1130-0, which is also connected to bit line BL[0] at terminal X1, and terminal X2 of SA/latch 1130-1, which is also connected to bit line BL[1] at terminal X1.

Figure 21A:
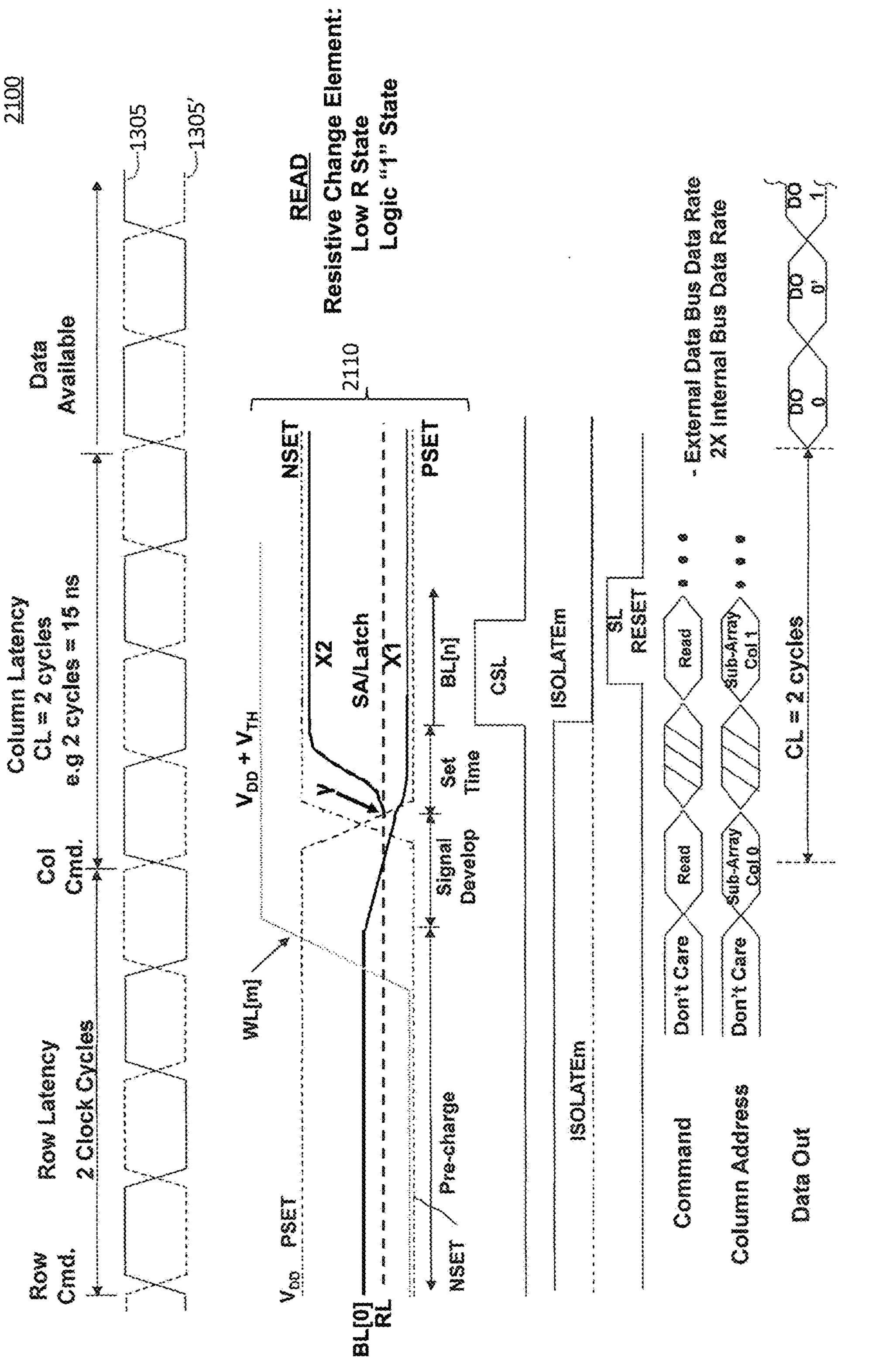
FIG. 21A is a waveform timing diagram illustrating an exemplary READ operation performed on a cell with a resistive change element in a low resistance state within an open resistive change memory array architecture of the fourth open architecture.
Figure 21B:
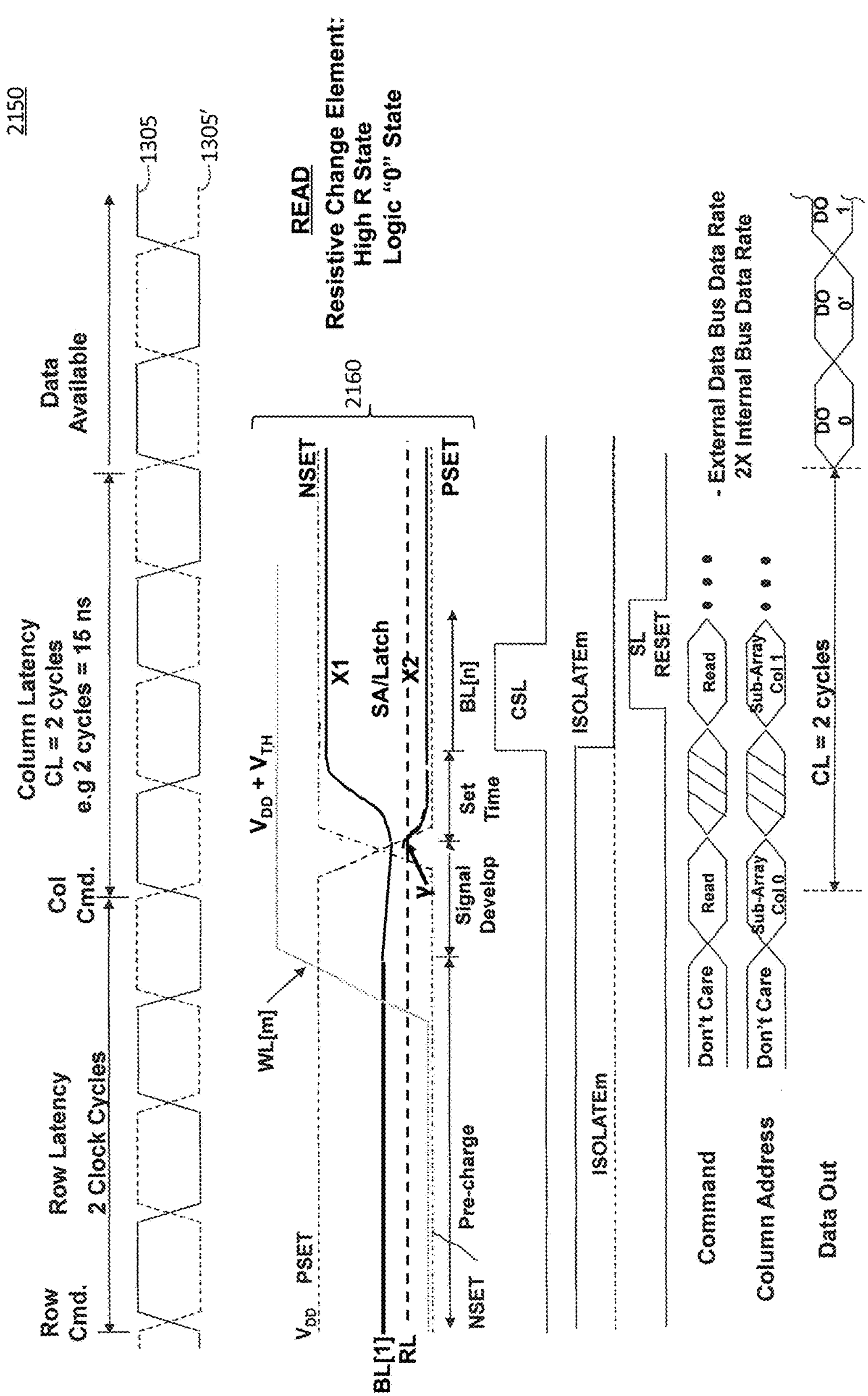
FIG. 21B is a waveform timing diagram illustrating an exemplary READ operation performed on a cell with a resistive change element in a high resistance state within an open resistive change memory array architecture of the fourth open architecture.

In operation, SA/latches in SA/latch section 1130, such as SA/latch 1130-0 and 1130-1 shown in FIG. 20, are decoupled from reference line 2021 at the end of signal development and the beginning of set time as indicated by gamma (γ) in READ timing diagrams shown in FIGS. 21A and 21B. This decoupling occurs when NSET transitions from zero volts to $V_{DD}$ and PSET transitions from $V_{DD}$ to zero volts and SA/latch outputs switch to $V_{DD}$, with either terminal X1 or X2 at $V_{DD}$ and the other at zero volts until the end of the READ operation, depending on the resistance change element resistance state as shown in READ timing diagrams 21A and 21B illustrated in FIGS. 21A and 21B, respectively, and described further above with respect to FIGS. 16, 17, 18A, and 18B.

Referring now to signal development and sensing waveform 2110 shown in FIG. 21A, when sensing a resistance change element is in a low resistance state, the voltage on bit line BL[0] is lower than the voltage on reference line RL at the end of signal development time γ. This change is highlighted in FIG. 21A by showing that the RL waveform remains as reference voltage $V_{REF}$ (dotted line) after the time indicated by γ, while the SA/latch terminal X2, decoupled from reference line RL, switches to $V_{DD}$, and SA/latch terminal X1 switches to zero volts.

Referring now to FIGS. 21A, 21B, and 15, the logic state of all SA/latches in SA/latch section 1130 are transmitted via on-chip bidirectional data bus 1140 to data I/O buffer driver 1567 shown in FIG. 15 and available on external bidirectional data bus 1570 after a column latency (CL) of 2 cycles of clock 1305.

Referring now to FIGS. 19, 18A and 18B and RESET pulse SL RESET, a RESET operation may be performed prior to the end of the READ cycle as described further above with respect to FIGS. 13A, 13B, and 13D.

Fifth DDR Compatible Resistive Change Element Open Array Architecture

Referring now to schematic 2000 shown in FIG. 20, signal development and sensing waveforms 2110 and 2160 illustrated in FIGS. 21A and 21B described further above, the signal development time is 4 ns and the set time is 1 ns. This READ timing corresponds to a column latency of 2 cycles as described further above. Referring now to signal development and timing table 2200 illustrated in FIG. 22, the top row, bit line BL[0] shown in FIG. 21A connected to a resistance change element in low resistance state discharges to approximately 660 mV for a pre-charge voltage $V_0$=0.75 and to 440 mV for a pre-charge voltage of 0.5 volts. The top row shows bit line BL[1] shown in FIG. 21B connected to a resistance change element in a high resistance state discharges to approximately 775 mV for a pre-charge voltage $V_0$=0.75 volts and to 500 mV for a pre-charge of 0.5 volts. If the reference voltage $V_{SET}$ is set at 717 mV, then the SA/latch input signal is plus or minus 57.5 mV for a pre-charge $V_0$=0.75 volts. If the reference $V_{SET}$ is set at 470 mV, then SA/latch input signal is plus or minus 30 mV for a pre-charge voltage of $V_0$=0.5 V. A negative input voltage to the SA/latch corresponds to a low resistance stored state and a positive voltage corresponds to a high resistance stored state. The methods of calculations used for table 2200 shown in FIG. 22 are similar to those for table 1380 illustrated in FIG. 13C.

When fabricating high performance DDR open architecture resistive change memories such as illustrated in block diagram 1500 shown in FIG. 15, a substantial number of memory chips will be unable to operate at sufficient speed to complete the READ timing operation and have the output data on external bidirectional data bus 1570 with a column latency of 2 cycles. This is especially likely for $V_{DD}$=1.0 V. power supply with an equilibration voltage $V_0$=0.5 V. However, there are typically many applications that can use slower memories with clock latencies of 3 and 4 clock cycles, for example.

Referring now to table 2200 shown in FIG. 22 and focusing on the lower operating voltage of $V_{DD}$=1.0 volts and corresponding equilibration voltage of $V_0$=0.5 V., SA/latch input signal increases to plus or minus 63 mV for a column latency of 3 cycles and plus or minus 92 mV for a column latency of 4 cycles. As described further above, clock signal 1305 shown in FIGS. 21A and 21B is used to synchronize the DDR NRAM timing digital interface with the timing of a microprocessor or other digital external control circuit element interfacing with the memory array architecture shown in FIG. 15. Clock signal 1305 corresponds to a time delay of 7.5 ns per clock cycle. Therefore, the access time increases to 12.5 ns for a column latency of 3 clock cycles and 20 ns for a column latency of 4 clock cycles, which increases signal development time resulting bigger SA/latch input signals.

Increasing SA/latch input signals requires the ability to optimize both reference voltage $V_{SET}$ and SA/latch activation time for column latencies of 2, 3, and 4 cycles. One approach is to use an on-chip built-in self-test (BIST) function to activate on-chip programmable state machines to generate multiple reference voltages $V_{REF}$ and timings BIST functions and their applications are well known in the industry. On-chip programmable state machines are described further below.

Figure 23:
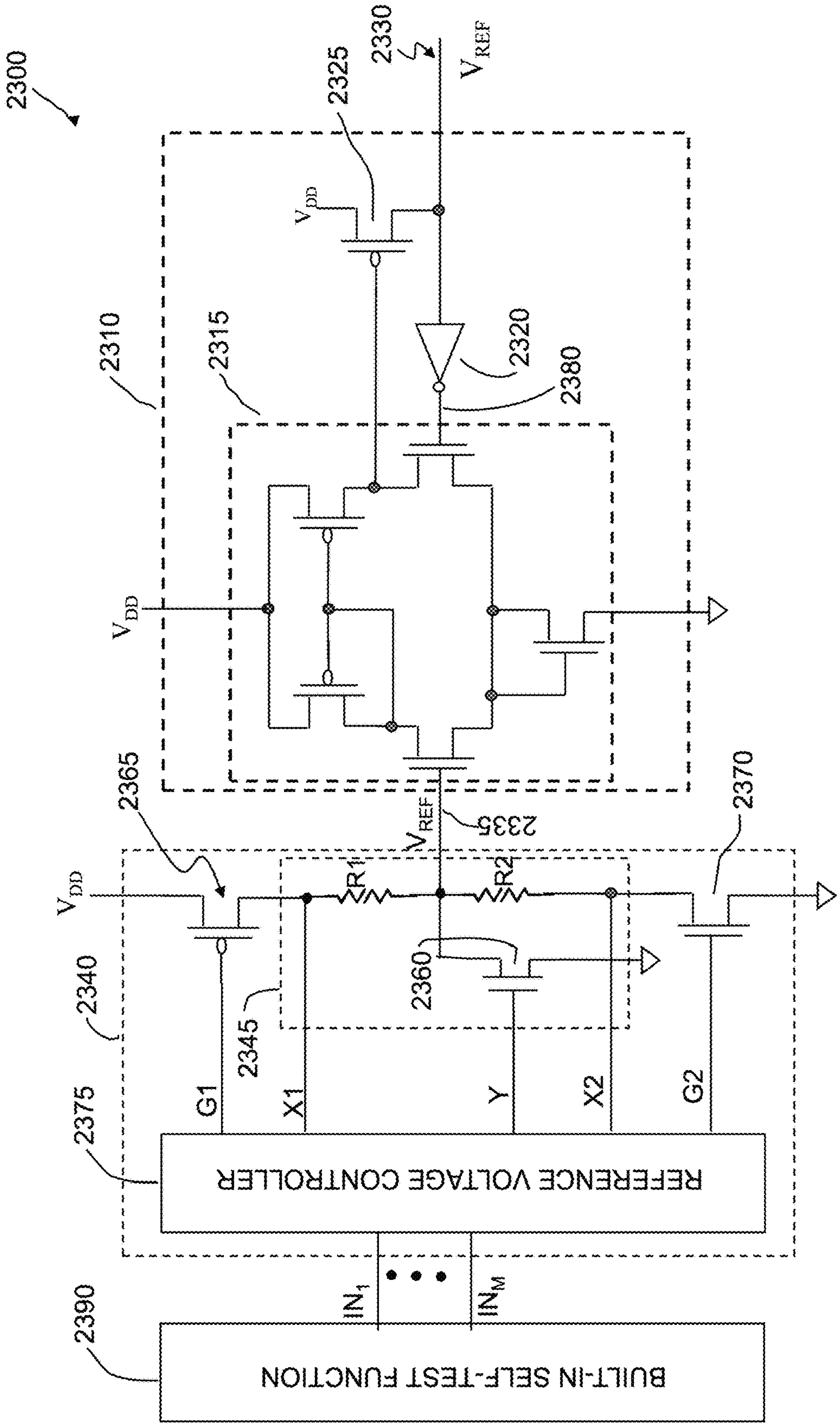
FIG. 23 is a programmable regulated voltage generator that controls the reference voltage applied to the reference line of FIG. 20.

FIG. 23 shows programmable regulated voltage generator 2300 taught in U.S. Pat. No. 7,852,114 to Bertin et al., incorporated herein by reference in its entirely. Programmable voltage generator 2340 is used to generate reference voltage $V_{REF}$ corresponding to those in table 2200 shown in FIG. 22. On chip voltage regulator 2310 output node 2330 is connected to reference line 2031 shown in FIG. 20 and provides an optimized and regulated reference voltage $V_{REF}$ to reference line 2021, which is connected to reference line interface circuit 1623. Referring to table 2200 shown in FIG. 22, in this example, programmable regulated voltage generator 2300 provides $V_{REF}$ values of 717 mV, 643.5 mV, and 593 mV for circuits operating with $V_{DD}$=1.5 volts, and 470 mV, 429 mV, and 395 mV for circuits operating with $V_{DD}$=1.0 V.

In a WRITE operation mode for CNT switches R1 and R2, reference voltage controller 2375 activates mode control signal Y that turns FET 2360 ON, while keeping FETs 2365 and 2370 OFF. Nonvolatile CNT select circuits controls the WRITE operation of CNT switches R1 and R2. When FET 2360 is ON, the common node between CNT switches R1 and R2 is at zero volts. WRITE pulses X1 are used to perform a WRITE operation that determines the resistance state of CNT switch R1. Also, WRITE pulses X2 are used to perform a WRITE operation that determines the resistance of R2. WRITE operations may use a single pulse or multiple pulses to set the state of CNT switches R1 and R2.

In a READ operation mode, reference controller 2375 turns FET 2360 OFF, and FETs 2365 and 2370 ON. CNT switch resistance values are much greater than the channel resistances of both FET 2365 and 2370. The voltage at common node 2335 is the desired reference voltage $V_{REF}$, which is equal to [R2/(R1+R2)] $V_{DD}$ and is the first input to on-chip voltage regulator 2310. The second input node is 2380 and is connected to output node 2330 by an inverter. Output transistor 2325, connected to $V_{DD}$, supplies a regulated reference voltage $V_{REF}$ to output node 2330. Referring now to signal development and timing table 2200 shown in FIG. 22 and programmable regulated voltage generator 2300 shown in FIG. 23, if R2 is programmed to 100 kΩ, and R1 is programmed to 133 kΩ, and if $V_{DD}$=1.0 V. (1,000 mV), then output node 2330 $V_{REF}$=429 mV.

Referring to development and timing table 2200 shown in FIG. 22 and FIGS. 21A and 21B, a signal development time of 11.5 ns is needed to enable BL[0] connected to a resistance change element in a low resistance state $R_{LO}$ to discharge to 366 mV. and BL[1] connected to a resistance change element in a high resistance state $R_{HI}$ to discharge to 492 mV. by the end of signal development time gamma (γ). When compared to reference voltage $V_{REF}$=429 mV, a low state resistance $R_{DD}$ results in a bit line discharge to 366 mV and a minus 63 mV input the corresponding SA/latch and a high state resistance $R_{HI}$ results in a bit line discharge to 492 mV, and a plus 63 mV input to the corresponding SA/latch, both at the beginning of the SA/latch set time. Since the SA/latch time is 1 ns, then the corresponding access time of 62.5 ns refers to the time when resistance change element state reading begins to the time when the SA/latch has switched (been set) with an output voltage corresponding to a low resistance state $R_{LO}$ logic state or a high resistance state $R_{HI}$ logic state. As illustrated in table 2200, access time of 12.5 ns corresponds to a column latency of 3 clock cycles.

Built-in self-test (BIST) function 2390 is that portion of the BIST function that activates programmable regulated voltage generator 2300. BIST function 2390 may be activated during testing prior to product shipping. Alternatively, BIST function 2390 can be activated remotely to reprogram reference $V_{REF}$ in the field.

As described further above, optimization of both reference voltage $V_{SET}$ and SA/latch activation time is required. Reference voltage optimization was described further above.

Figure 24B:
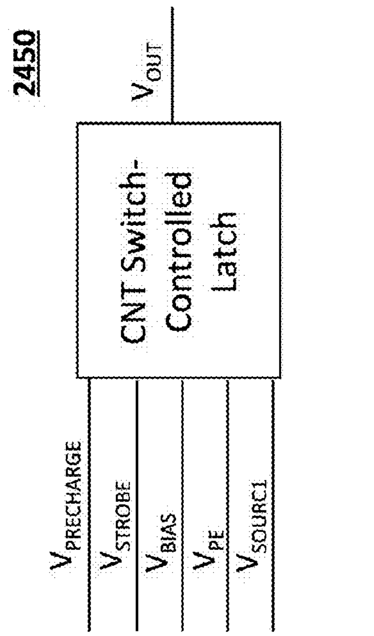
FIGS. 24A and 24B are a simplified schematic and a block diagram, respectively, of a carbon nanotube switch controlled latch circuit that provides an output voltage that corresponds the resistance state of a programmed carbon nanotube switch.
Figure 24A:
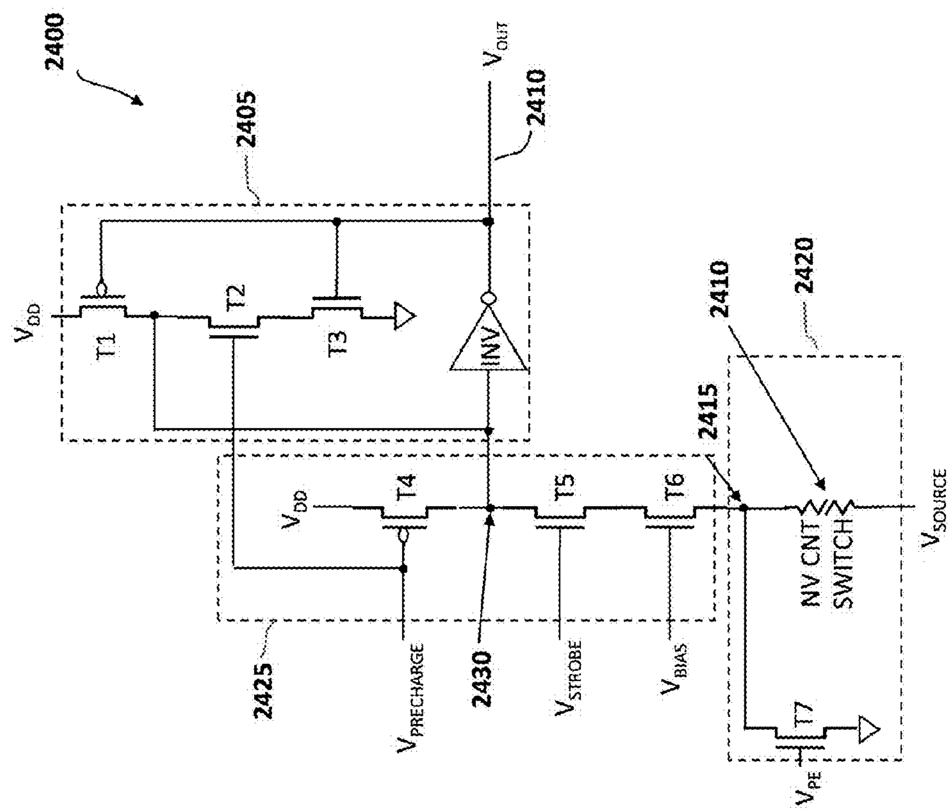

Control of SA/latch timing control is described further below with respect to programmable SA/latch timing control circuit 2500 shown in FIG. 25, which incorporates CNT switch-controlled latch circuit 2400 shown in FIG. 24.

FIG. 24 shows CNT switch-controlled latch circuit 2400 taught in U.S. Pat. No. 8,008,745 to Bertin et al., incorporated herein by reference in its entirely. CNT switch-controlled latch circuit 2400 is used to switch latch 2405 to a logic output voltage $V_{OUT}$ on node 2410 of $V_{DD}$ or zero volts based on the low ($R_{LO}$) or high ($R_{HI}$) resistance stored resistance values of nonvolatile (NV) CNT switch 2410.

NV stored resistor state control circuit 2420 has two operating modes, a WRITE mode that switches nonvolatile CNT switch 2410 to a low resistance state $R_{LO}$ or a high resistance state $R_{HI}$, and a READ mode that senses the stored resistance value. In a WRITE mode, mode select transistor T7 is in an ON state connecting node 2415 to a reference voltage such as ground (zero volts). $V_{SOURCE}$ is activated and provides one or more WRITE pulses to NV CNT switch 2410, which transitions to a low $R_{LO}$ resistance state, which is typically in the range of 10 kΩ to 50 kΩ, or to a high $R_{HI}$ resistance state, which is typically 1 MΩ or higher. The stored resistance value is retained when power is turned OFF and is available for sensing when power is turned ON. The NV CNT switch resistance values can be changed an essentially unlimited number of times. However, in most applications, the stored resistance states are only changed a few times. In a READ operation, mode select transistor T7 is turned OFF and $V_{SOURCE}$ is set at zero volts. In a READ mode, node 2415 is connected to zero volts through NV CNT switch 2410.

In operation, when power is turned ON, latch trip-control circuit 2425 is used to convert the nonvolatile stored resistance state in NV CNT switch 2410 to an output voltage $V_{OUT}$ on node 2410. Transistor T4 is turned ON, pre-charges node 2430, and is then turned OFF. Bias transistor T6 is ON, typically in the linear range of operation. Then, a strobe pulse is applied to transistor T5 and node 2430 discharges through transistors T5, T6, and NV CNT switch 2410 to ground. The node 2430 discharge rate is determined primarily by the resistance state of NV CNT switch 2410. For the relatively low resistance value $R_{LO}$, node 2430 discharges relatively quickly to a low voltage the during the strobe-ON time window, and latch 2405 switches to $V_{OUT}=V_{DD}$ output on node 2410. However, for the relatively high value $R_{HI}$, node 2430 discharges relatively slowly, and latch 2405 switches to $V_{OUT}$=zero volts on node 2410. When power is turned ON, CNT switch-controlled latch circuit 2400 always switches to $V_{OUT}=V_{DD}$ for a low resistance stored value of $R_{LO}$ and $V_{OUT}$=zero volts for a high resistance stored value of $R_{HI}$.

CNT switch-controlled latch circuit 2400 may be used to replace defective word lines with redundant word lines and defective bit lines with redundant bit lines. CNT switch controlled latch circuit 2400 is shown in schematic form 2450 shown in FIG. 24B. However, CNT switch-controlled latch circuit 2400 may also be incorporated in other circuits for other applications, for instance for timing control as part of a SA/latch control circuit as described further below.

Figure 25:
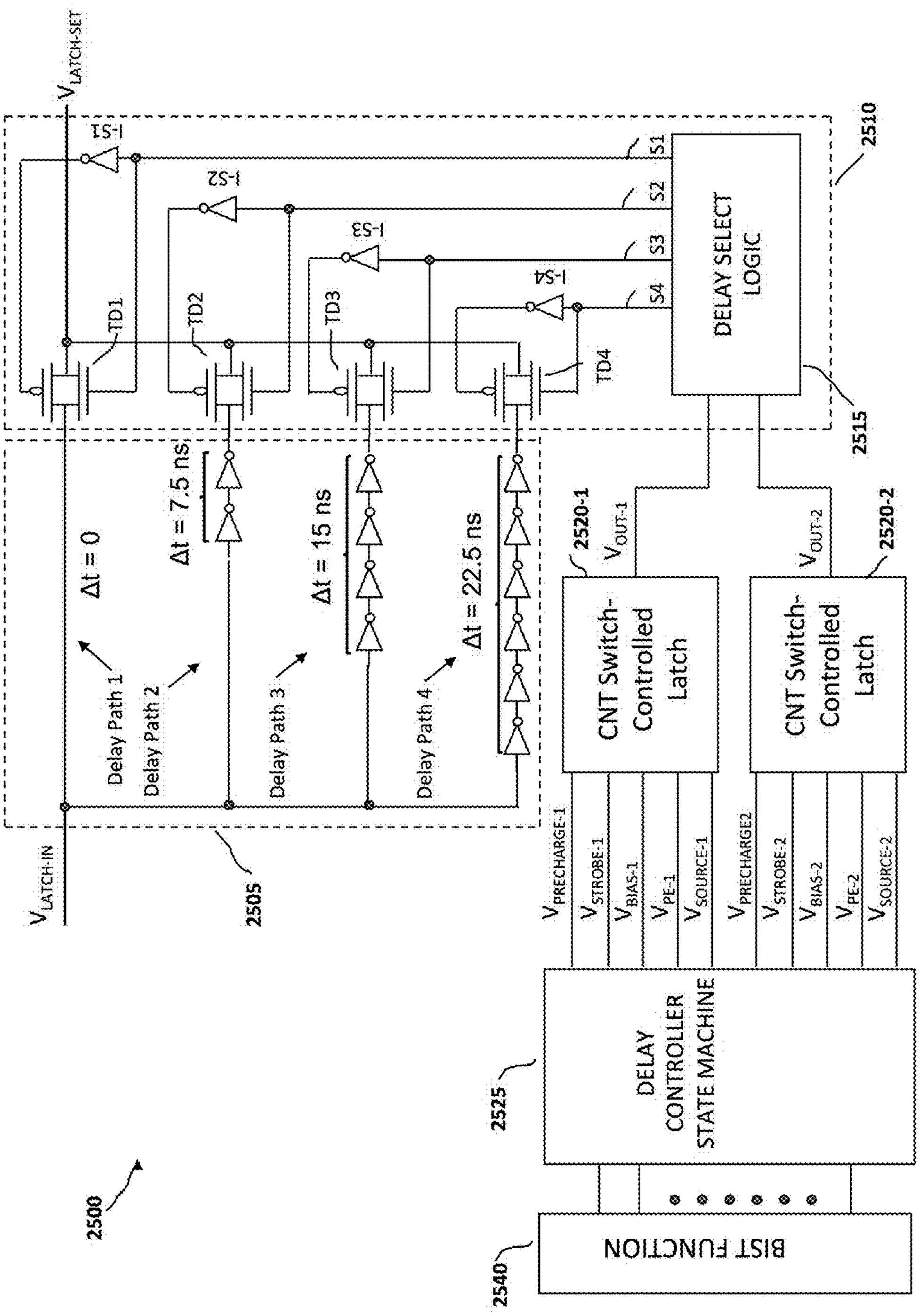
FIG. 25 is a programmable sense amplifier/latch timing control circuit that controls the duration of the signal development time shown in FIGS. 21A and 21B and the corresponding sense amplifier/latch switching time.

FIG. 25 shows programmable SA/latch timing control circuit 2500 taught in U.S. Pat. No. 8,008,745 to Bertin et al., incorporated herein by reference in its entirely. Programmable SA/latch timing control circuit 2500 illustrated in FIG. 25 is used to vary the signal development time shown in FIGS. 21A and 21B in controlled increments, corresponding to access time intervals shown in signal development and timing table 2200 described further above. Programmable SA/latch timing control circuit 2500 incorporates two CNT switch-controlled latch circuits 2400 to provide logic inputs that choose one of several time delay increments to control the duration of signal development shown in FIGS. 21A and 21B. As described further above, when power is turned-on, latch circuits 2400 always provide the voltage outputs corresponding to preprogrammed NV CNT switch resistance states.

Referring now to programmable SA/latch timing control circuit 2500 shown in FIG. 25, a BIST function 2540 activates delay controller state machine 2525. During an initialization phase, state machine 2525 provides programming pulses to CNT switch-controlled latch circuits 2520-1 and 2520-2. These pulses are similar to those described further above with respect to CNT switch controlled latch circuit 2400 shown in FIG. 24. CNT switch-controlled latches 2520-1 and 2520-2 each have a NV CNT switch, corresponding to NV CNT switch 2410 described further above with respect to FIG. 24, programmed to a low resistance state $R_{LO}$ or and high resistance state $R_{HI}$. Once the initialization programming phase is complete, every time power is turned on the voltage outputs $V_{OUT\text{-}1}$ and $V_{OUT\text{-}2}$ of CNT switch-controlled latches 2520-1 and 2520-2, respectively, have the same voltage values, which correspond to the stored NV CNT switch resistance states. These output voltages remain the same each time power is turned on, unless NV CNT switches are re-programmed. Therefore, programmable SA/latch activation timing circuit 2500 always adds the same time delay to the signal development time.

Time delay circuit 2505 includes four delay paths. A $V_{LATCH\text{-}IN}$ pulse is applied to the input of time delay circuit 2505. $V_{LATCH\text{-}SET}$ is a pulse output provided by logic delay block 2510 that initiates NSET and PSET voltage transitions to activate a SA/latch, which switches to a state corresponding to the input voltage at time gamma (γ), which is illustrated in FIGS. 21A and 21B. In this example, the pulse $V_{LATCH\text{-}IN}$ propagates through all four delay paths resulting in a $V_{LATCH\text{-}SET}$ pulse with one of the following delays: delay path 1 adds zero delay; delay path 2 adds 7.5 ns of delay; delay path 3 adds 15 ns of delay; and delay path 4 adds 22.5 ns of delay. Delay select logic 2515 activates one of four select signal delays S1, S2, S3, or S4 that choose one of the 4 delay paths. Delay select signal S1 connects directly a first terminal of CMOS transfer device TD1, and through inverter I-S1 to a second terminal, thereby selecting delay path 1 adding no delay, such that the $V_{LATCH\text{-}SET}$ pulse is the same as $V_{LATCH\text{-}IN}$; delay select signal S2 connects directly to a first terminal of CMOS transfer device TD2, and through inverter I-S2 to a second terminal, thereby selecting delay path 2 and adding a delay of 7.5 ns, such that the $V_{LATCH\text{-}SET}$ pulse is the $V_{LATCH\text{-}IN}$ pulse delayed by 7.5 ns; delay select signal S3 connects directly to a first terminal of CMOS transfer device TD3, and through inverter I-S3 to a second terminal, thereby selecting delay path 3 and adding a delay of 15 ns, such that the $V_{LATCH\text{-}SET}$ pulse is the $V_{LATCH\text{-}IN}$ pulse delayed by 15 ns; delay select signal S4 connects directly to a first terminal of CMOS transfer device TD4, and through inverter I-S4 to a second terminal, thereby selecting delay path 4 and adding a delay of 22.5 ns, such that the $V_{LATCH\text{-}SET}$ pulse is the $V_{LATCH\text{-}IN}$ pulse delayed by 22.5 ns.

Referring now to signal development and timing table 2200 shown in FIG. 22, the top row, if delay select signal S1 is chosen, no delay is added to the signal development time of 4 ns, which corresponds to access time of 5 ns since SA/latch switching time is approximately 1 ns. Referring now to the middle row of table 2200, if delay select signal S2 is chosen, a delay of 7.5 ns is added to the signal development time of 4 ns shown in FIGS. 21A and 21B for a total signal development time of 11.5 ns, which corresponds to an access time 12.5 ns once the SA/latch has switches. An access time of 12.5 ns corresponds to the $V_{SET}$=429 example described in detail further above with respect to programmable regulated voltage generator 2300.

At this point in the specification, signal development and signal development time for the middle row are compared with those of the top row of table 2200, for a power supply voltage of $V_{DD}$=1.0 V. The column latency of the middle row is increased to 3 clock cycles from 2 clock cycles for the top row. Now referring to clock 1305 shown in FIGS. 21A and 21B, an increase of 1 clock cycle corresponds to 7.5 ns. Signal development time is increased from 4 ns to 11.5 ns, and corresponding access time, which adds approximately 1 ns for SA/latch switching, results in access time increase from 5 ns to 12.5 ns. The increased signal development time enables a longer bit line discharge time, which more than doubles the SA/latch input signal from +−30 mV to +−63 mV. as shown by comparing top row values with middle row values in table 2200.

In operation, programmable regulated voltage generator 2300 and programmable SA/latch activation circuit 2500 can be programmed by reference voltage controller 2375 and delay controller state machine 2525, respectively, for either table 2200 top row column latency of 2 clock cycles, with corresponding SA/latch input signal voltage of +−30 mV, or alternatively, programmed for a column latency of 3 clock cycles, with corresponding SA/latch input signal voltage of +−63 mV, which more than doubles the input signal to SA/latches. Each time open architecture resistive change memory 1500 shown in FIG. 15 is turned on, the memory will operate with a clock latency of either 2 or of 3 clock cycles, unless programmable regulated voltage generator 2300 and programmable SA/latch activation circuit 2500 are reprogrammed.

It is possible to further delay memory performance to a column latency of 4 clock cycles as shown in the bottom row of table 2200 shown in FIG. 22 using methods described further above, and to increase reference time delays and SA/latch input signal voltage even more. However, column latency clock cycle delays may become too long for high performance applications.

Programmable regulated voltage generators, such as programmable regulated voltage generator 2300 shown in FIG. 23, CNT switch-controlled latch circuits, such as CNT switch-controlled latch circuit 2400, and programmable SA/latch timing control circuits, such as programmable SA/latch timing control circuit 2500 shown in FIG. 25 may be used with any memory, logic, or analog circuit configuration. This includes first open architecture schematic 1100 shown in FIG. 11; second open architecture schematic 1600 shown in FIG. 16; third open architecture schematic 1900 shown in FIG. 19; fourth open architecture schematic 2000 shown in FIG. 20; and fifth open architecture schematic 2000 shown in FIG. 20, which incorporates programmable regulated voltage generator 2300 shown in FIG. 23, CNT switch-controlled latch circuit 2400 shown in FIG. 24, programmable SA/latch activation circuit 2500 shown in FIG. 25.

Various NRAM Memory Interfaces

As described further above, NRAMs may be DDR2, DDR3, DDR4, DDR5, or more generally, DDRn compatible. The DDR interface is a digital synchronous SDRAM JEDEC specification. However, NRAM interfaces may be compatible with other interfaces for higher performance of power-performance applications.

For example, instead of the 8 bit on-chip bus and 4 bit external bus described further above, much wider interfaces may be used. Wide I/O interfaces may be used to interface NRAMs directly with CPU chips, for example, on top of CPU chips, connected directly of using an interposer. Such an interface may be 128 bits or higher, for example, to match the on-chip bus of the CPU chips, which may include multiple CPU cores.

For very high performance applications, with a tolerance for higher power dissipation, such as in servers, stacks of NRAMs may be used with substantially higher bandwidths and high number of I/Os.

In graphics applications, NRAMs may be connected directly with graphics processor units (GPUs) with 1024, 2048, and even higher I/O interfaces.

Cell Area Minimization as a Function of NRAM Memory Architecture

It should be noted in this application that array lines SL may be referred to as select line SL or source lines SL.

Folded and substantially denser open array architectures were compared in terms of schematics and READ and WRITE operations as described further above. At this point in the specification, NRAM cell layout efficiency, that is, cell area minimization as a function of cell layouts and array architectures is described further below. Data storage cells are formed with 1 transistor, typically an FET, and 1 nonvolatile resistive change element, a nonvolatile carbon nanotube (NV CNT) switch for example, which together form a 1T, 1R cell.

Figure 26C:
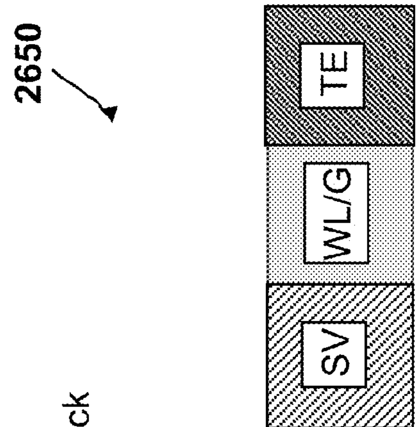
FIG. 26C is planar view of the nonvolatile memory cell shown in FIGS. 26A and 26B.
Figure 26B:
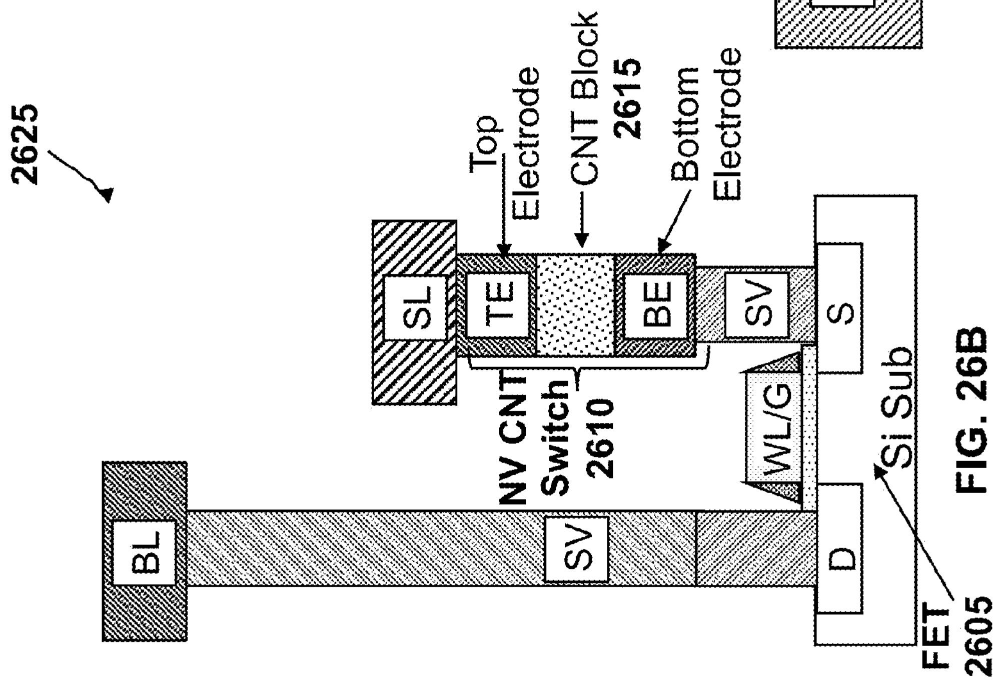
FIG. 26B is a second simplified cross-sectional drawing of a nonvolatile memory cell with a nonvolatile CNT switch having a CNT block with top and bottom contacts and an FET select transistor in a silicon substrate.
Figure 26A:
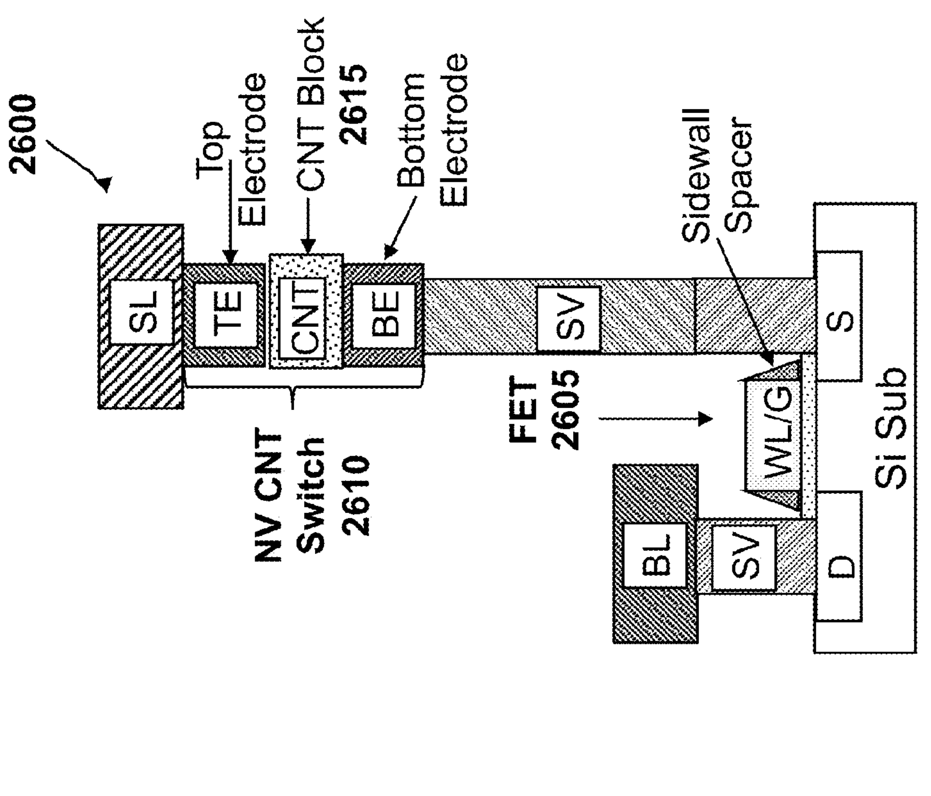
FIG. 26A is a first simplified cross-sectional drawing of a nonvolatile memory cell with a nonvolatile CNT switch having a CNT block with top and bottom contacts and an FET select transistor in a silicon substrate.

Referring now to FIGS. 26A and 26B, nonvolatile memory cells 2600 and 2625, respectively, both include a cell select (selection) device such a field effect transistor (FET) 2605 and nonvolatile CNT switch 2610. Nonvolatile CNT switch 2610 includes a CNT block 2615 that stores the resistive state of the cell, with a top electrode TE and a bottom electrode BE in contact with the top and bottom surfaces, respectively, of CNT block 2615. Cell select FET 2605 is formed in a silicon substrate with a drain region D and source region S, and a gate region forming and un-forming a conductive channel between drain D and source S. A gate may be metallic or semiconducting. A gate voltage forms and un-forms the conductive channel. The gate voltage is determined by the voltage of the word line WL in contact with the gate G, and the combination is referred to in FIGS. 26A and 26B as WL/G. Sidewall spacers may be included in the gate region to enhance cell select FET 2605 operation as is well known in the industry. Stud vias SV are used to interconnect elements within the cell, as well forming contacts between cell elements and array wiring such as bit line BL to FET drain D for example.

Word line WL is one of the array lines of the memory array. Array bit line BL, orthogonal to the word line WL, is in contact with drain region D. Array select line SL, which may be parallel to the bit line or parallel to the word line, is connected to the top electrode TE of the NV CNT switch 2610. Source S is in electrical contact with bottom electrode BE through stud via SV. In the array schematics described further above, select lines SL are parallel to bit lines. In the cell and array wiring combinations described further below, select lines parallel to bit lines and select lines parallel to word lines are compared with respect to array density and memory operational considerations. Vertically oriented nonvolatile CNT switches are described in U.S. Pat. Nos. 8,008,745; 8,513,768; 7,835,170; and 9,390,790, all of which are hereby incorporated by reference in their entirety.

Nonvolatile memory cells 2600 and 2625 are essentially the same, except that cell 2600 shows a select line SL in contact with top electrode TE positioned structurally higher than bit line BL in contact with stud via SV, while cell 2625 shows the BL in contact with a stud via SV positioned structurally higher than a select line SL in contact with top electrode TE. Either one of cells 2600 and 2625 may be used in array configurations.

FIG. 26C shows a plan view 2650 of both cell 2600 and 2625 in the absence of bit line BL and select line SL. Bit line BL connects to the surface of stud via SV and select line SL connects to the top surface of top electrode TE. A segment of WL over the gate of the FET is shown as WL/G. Plan view 2650 is used further below to illustrate various memory array cell interconnect architectures and corresponding cell layouts and areas for purpose of comparing various array architectural options.

Referring now to FIG. 27, Table 2700 shows operating conditions for a 4 Mb NRAM memory fabricated in a CMOS fabricator using 140 nm ground rules, with arrays formed with cells such as cells 2600 or 2625 illustrated in FIGS. 26A and 26B, respectively. Memory performance was compared for two methods of operation.

In a first method of operation, NV CNT switch 2610 was used as a unipolar, that is a unidirectional, current, device in which a WRITE operation was performed such that both SET and RESET voltages were applied to bit line BL, with word line WL activated, and with select line SL at a reference voltage such as ground. In a unipolar WRITE operation, SET or RESET pulses are applied from bit line BL through stud via SV to the drain D of cell select FET 2605. If cell select FET 2605 is turned ON (activated) by word line/gate WL/G, then SET or RESET pulses are applied to bottom electrode BE of CNT block 2615 through cell select FET 2605 source S and stud via SV. Top electrode TE of CNT block 2615 is connected to select line SL, which is at a reference voltage such as 0 V. SET or RESET current flows from bit line BL, through FET 2605 and CNT block 2615, to select line SL. SET time, that is transition from a high to a low resistance state, was about 10 microseconds (us). RESET time, that is transition from a low resistance to high resistance state was about 5 nanoseconds (ns).

In a second method of operation, NV CNT switch 2610 was used as a bipolar, that is bidirectional, current device in which a WRITE operation was performed such that a SET voltage was applied to bit line BL and a RESET voltage was applied to select line SL, with word line WL activated. In a bipolar WRITE operation, SET pulses are applied from bit line BL through stud via SV to the drain D of FET 2605. If FET 2605 is turned ON (activated) by word line/gate WL/G, then SET pulses are applied to bottom electrode BE of CNT block 2615 through FET 2605 source S and stud via SV. Top electrode TE of CNT block 2615 is connected to select line SL, which is held at a reference voltage such as 0 V during a SET operation. SET current flows from bit line BL, through FET 2605 and CNT block 2615, to select line SL. However, in a bipolar WRITE operation, RESET pulses are applied from select line SL to top electrode TE of CNT block 2615 and through CNT block 2615 to bottom electrode BE and to FET 2605 source S. If FET 2605 is activated by word line/gate WL/G, then RESET pulses are transmitted to drain D to stud via SV and to bit line BL, which is held at a reference voltage such as 0V. RESET current flows from select line SL, through FET 2605 and CNT block 2615, to bit line BL. SET time, that is transition from a high to a low resistance state, was about 5 nanoseconds (ns). RESET time, that is transition from a low resistance to high resistance state, was about 5 nanoseconds (ns).

Both modes of operation may be used. However, in this application, the focus is on high performance and therefore the memory architectures described further above and those described further below use NV CNT switches in a bipolar mode to achieve the fastest SET and RESET switching times.

During READ operations, select lines SL are set at a reference voltage such as zero volts (ground) and bit lines are pre-charged to $V_{DD}/2$ and discharge rates for low and high resistance states are compared to the discharge rate of a reference resistor whose value is higher than the low resistance state and lower than the high resistance state. Alternatively, discharge voltage can be compared with a reference voltage. Both methods are described further above.

While not described further above, READ operation can be performed with bit lines BL grounded and select lines SL pre-charged.

At this point in the specification, the focus is on the bit line data path and various cell and array architectural combinations. As described further above with respect to table 2700 shown in FIG. 27, the goal is dense, high performance memories, and therefore on bipolar (bidirectional current) device operation of nonvolatile carbon nanotube switch (NV CNT switch 2610) storage devices.

With respect to READ operations, a low column access READ time latency requires sensing and latching a voltage corresponding to a low or a high resistance state in substantially less than a bit line time constant using circuits and methods described further above. The READ voltage at the start of the READ cycle is $V_{DD}/2$ and discharges to lower voltage levels.

With respect to WRITE operations, as illustrated in table 2700 shown in FIG. 27, the SET operation typically needs 1-1.5 V., while the RESET operation needs 2-2.5 volts. NV CNT switches 2610 are formed in the back end of the line (BEOL) metallurgy of a CMOS process. CMOS technologies use a variety of n-type and p-type FET devices. The smallest area (smallest footprint) FET devices in current state-of-the-art CMOS processes typically operate at 1-1.2 volts, and typically can tolerate voltages up to 1.5-2 V. without punch-through or excessive leakage currents. To achieve a small cell size, it is desirable to use a small 1-1.2 V. cell select device FET 2605 in series with the NV CNT switch 2610 illustrated in FIGS. 26A and 26B. Such a device can operate with READ and SET voltage levels in the 1-1.5 V. range. However, RESET voltages in the 2-2.5 V. range are too high for minimum size devices. CMOS technologies typically include multiple devices operating at several higher voltages, including 2.0-2.5 V., and 3-3.5 volts, which can also be used in off-chip drivers (OCDs). However, using significantly larger higher voltage cell select FET devices results in cells and corresponding memory arrays that are too large.

Various architectures described further above and further below are designed to perform RESET operations to a high resistance state at the end of a READ cycle, or alternatively, RESET at the beginning of a WRITE cycle. In this way, SET voltages of $V_{SET}$=1-1.5 volts can be applied to bit lines BLs. In a WRITE operation, if $V_{SET}$ is 1-1.5 V., the selected bit switches from a high to a low resistance state. However, if $V_{SET}$ is zero volts, the selected bit remains in a high resistance state. Array architectures that enable RESET operations with select lines SL at switching at 2-2.5 volts, while limiting voltages across cell select FETs to 1-1.5 V. are described further below At this point in specification, cell layouts and sizes for various memory array configurations are compared and cell sizes are summarized in table 3400 shown in FIG. 34 further below.

Figure 28:
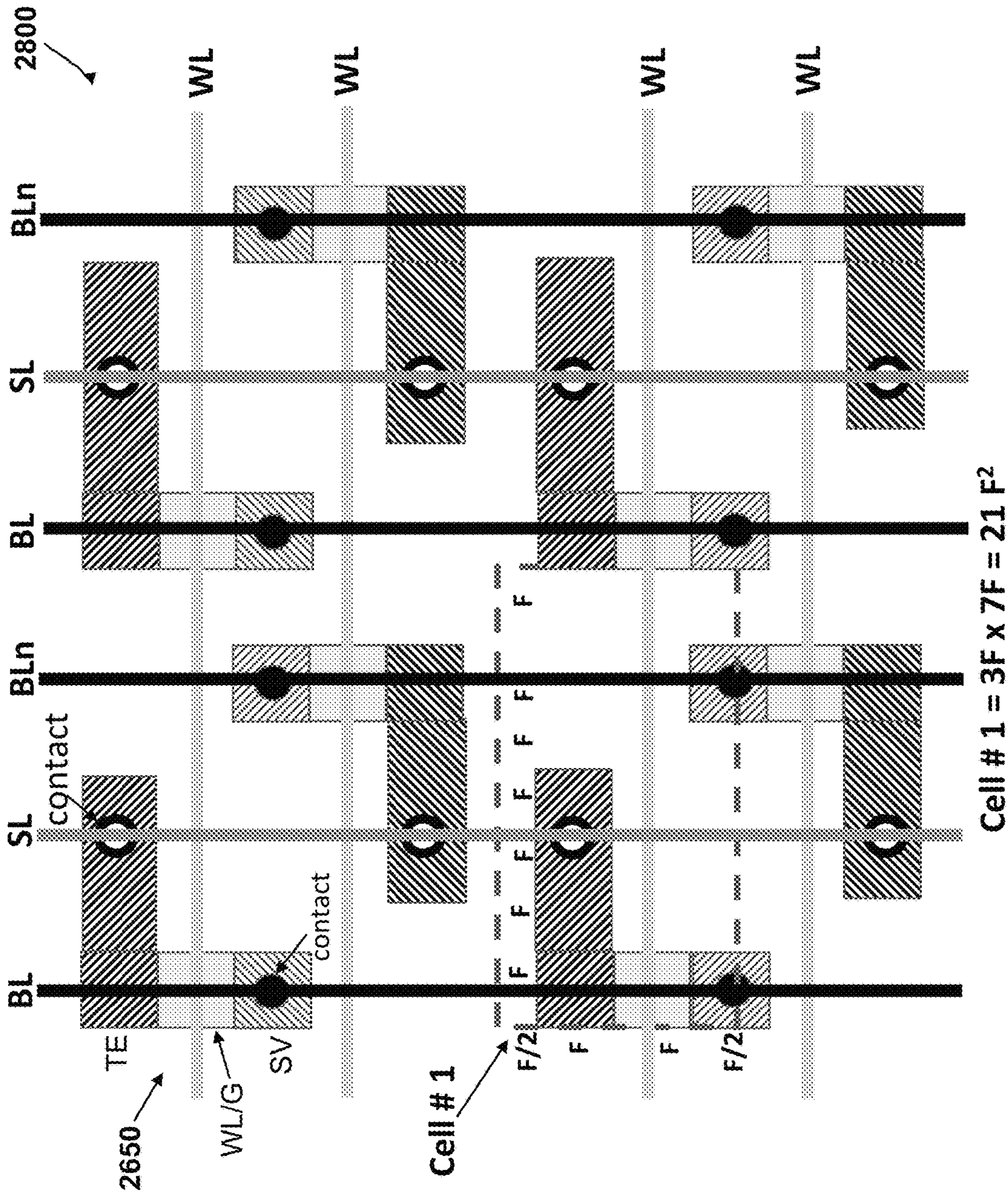
FIG. 28 is a plan view of a cell and array layout for a 1T, 1R memory cell in a folded array architecture.

Referring now to a plan view of cell and array layout 2800 illustrated in FIG. 28, FIG. 28 shows a 1T, 1R NRAM memory architecture that corresponds to both folded array schematic 410 illustrated in FIG. 4B and folded array schematic 610 illustrated in FIG. 6B described further above. Plan view 2650 illustrated in FIG. 26C is repeated at multiple cell locations and interconnected with array wiring of word lines WL, bit lines BL, and select lines SL as shown. The array wiring widths are minimum widths F as indicated in FIG. 28, where F is a minimum technology node dimension. However, array wires are drawn as lines, with cell contacts, for ease of visualization.

Referring now to FIGS. 26A, 26B, and 26C, bit lines BL contact underlying stud vias SV, select lines SL contact underlying top electrodes TE, and word lines WL are in direct contact with underlying FET 2605 gates and referred to as a WL/G integrated contact and gate. Bit lines BL are orthogonal to word lines WL. Select lines SL may be parallel to bit lines BL as shown, or parallel to word lines WL. Each cell in this folded array architecture includes one NV CNT switch 2610 with WL, BL, and SL connections and a complementary bit line BLn without a corresponding NV CNT switch for noise word line to bit line capacitive coupling noise cancellation purposes as explained further above with respect to FIGS. 4B and 6B.

As illustrated by representative cell #1 in a plan view of cell and array layout 2800 shown in FIG. 28, the folded array architecture results in relatively large cells and therefore, relatively large memory arrays. Cell #1 has an area of 21 $F^2$ as shown in FIG. 28 and in FIG. 34 for purposes of comparison with other cell and array architectures.

Figure 29:
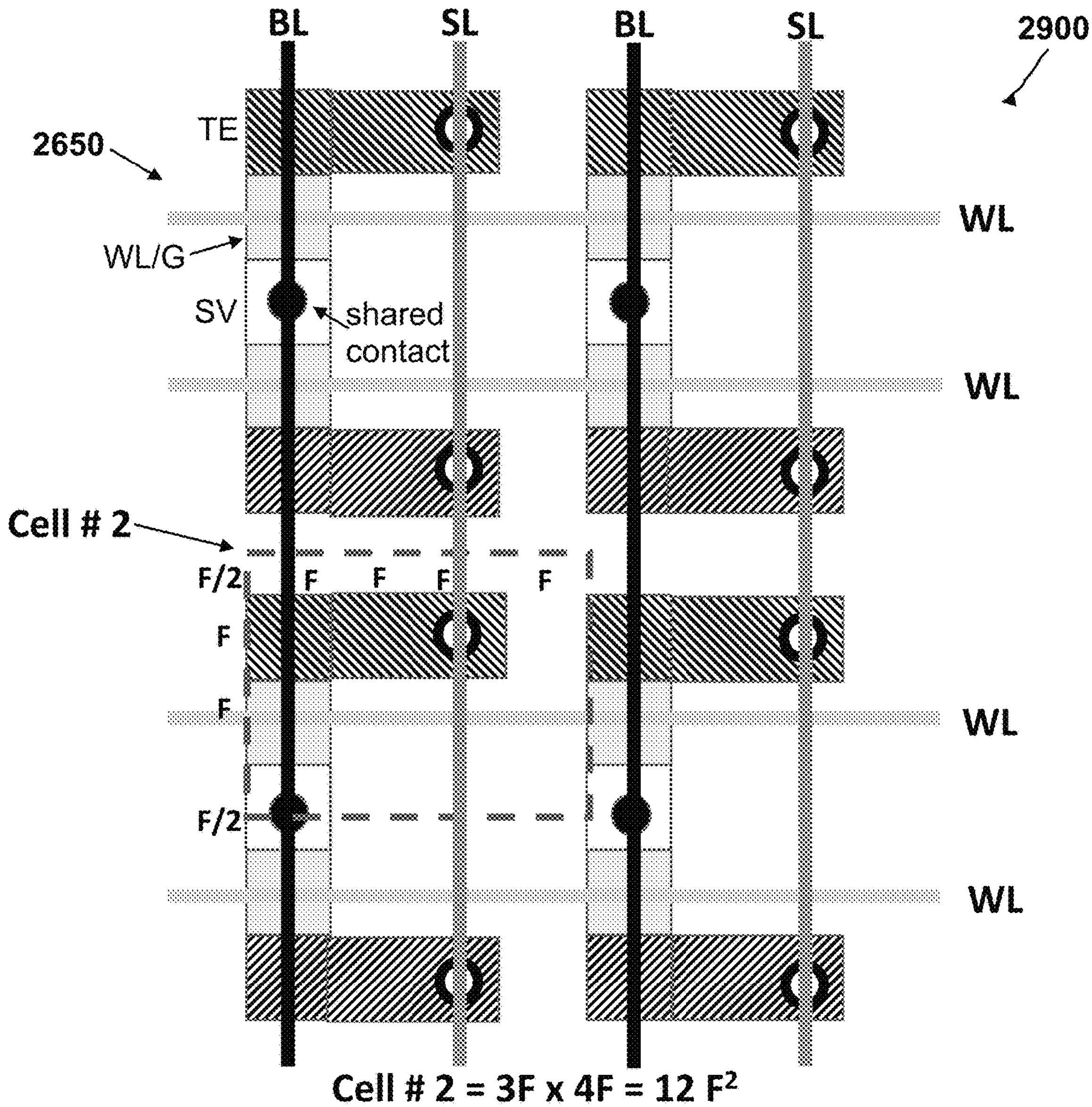
FIG. 29 is a plan view of a cell and array layout for a 1T, 1R memory cell in an open array architecture having an array with word lines orthogonal to bit lines and select lines, and alternating bit lines and select lines.

Referring now to a plan view of cell and array layout 2900 illustrated in FIG. 29, FIG. 29 shows a 1T, 1R NRAM memory cell with an open array architecture with alternating parallel bit lines BL and select lines SL, both lines orthogonal to word lines WL. Plan view 2650 illustrated in FIG. 26C is repeated at multiple cell locations and interconnected with array wiring of word lines WL, bit lines BL, and select lines SL as shown. The array wiring widths are minimum widths F as indicated in FIG. 29. However, array wires are drawn as lines, with cell contacts, for ease of visualization.

Referring now to FIGS. 26A, 26B, and 26C, bit lines BL contact underlying stud vias SV, select lines SL contact underlying top electrodes TE, and word lines WL are in direct contact with underlying FET 2605 gates and referred to as a WL/G integrated contact. Bit lines BL are orthogonal to word lines WL. Select lines SL may be parallel to bit lines BL as shown, or parallel to word lines WL. Each cell in this open array architecture includes one NV CNT switch 2610 with WL, BL, and SL connections. Adjacent cells share a bit line contact, which reduces cell area.

As illustrated by representative cell #2 in a plan view of cell and array layout 2900 shown in FIG. 29, alternating bit lines BL and select lines SL in an open array architecture, results in a substantially smaller cell size than the folded array architecture cell and array layout 2800 shown in FIG. 28. Cell #2 has an area of 12 $F^2$ as shown in FIG. 29 and in FIG. 34 for purposes of comparison with other cell and array architectures.

Figure 30:
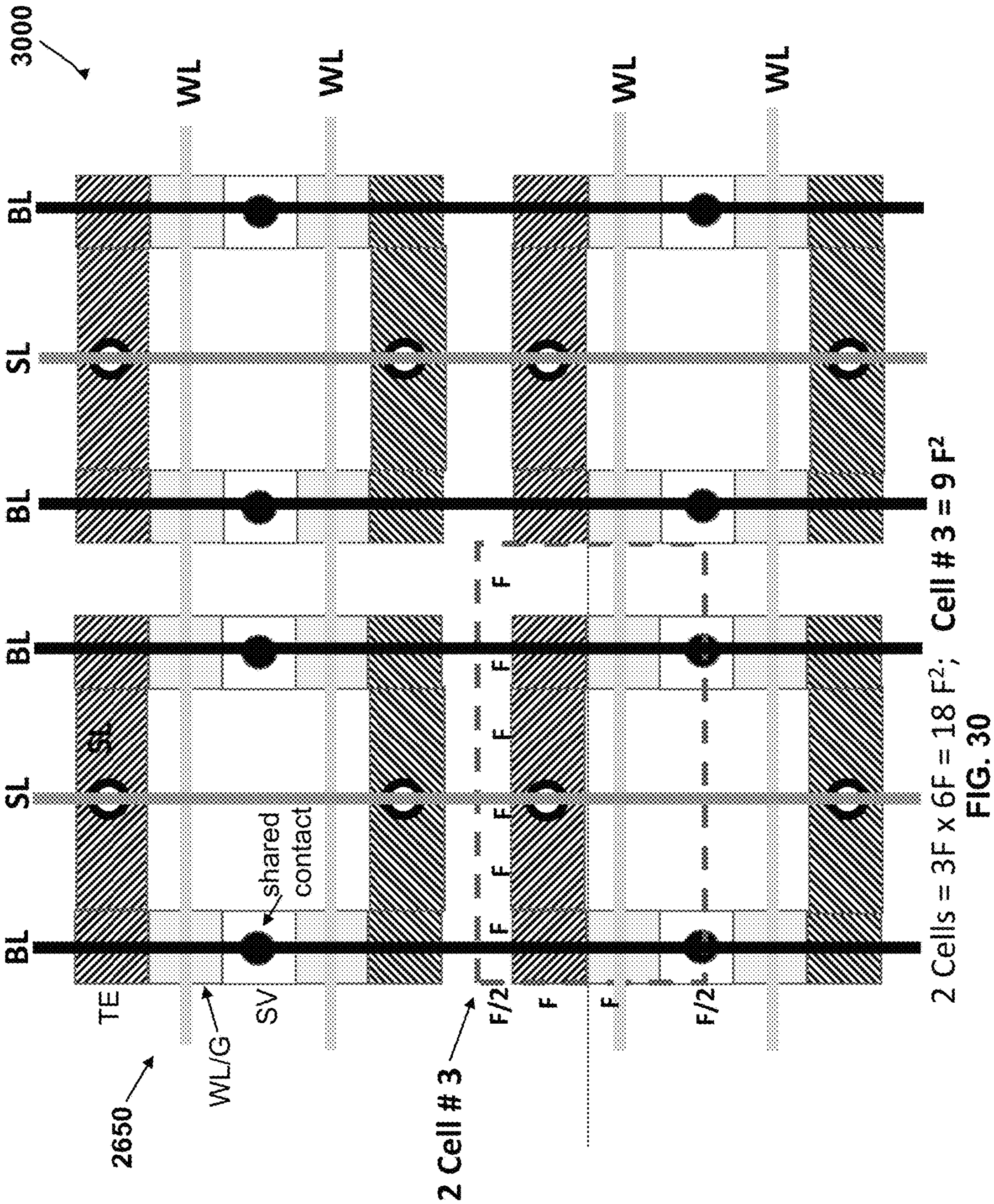
FIG. 30 is a plan view of a cell and array layout for a 1T, 1R memory cell in an open array architecture having an array with word lines orthogonal to bit lines and select lines, with one select line shared with two bit lines.

Referring now to a plan view of cell and array layout 3000 illustrated in FIG. 30, FIG. 30 shows a 1T, 1R NRAM memory cell with an open array architecture with two parallel bit lines BL and a shared select line SL, both lines orthogonal to word lines WL. Plan view 2650 illustrated in FIG. 26C is repeated at multiple cell locations and interconnected with array wiring of word lines WL, bit lines BL, and select lines SL as shown. The array wiring widths are minimum widths F as indicated in FIG. 30. However, array wires are drawn as lines, with cell contacts, for ease of visualization.

Referring now to FIGS. 26A, 26B, and 26C, bit lines BL contact underlying stud vias SV, select lines SL contact underlying top electrodes TE, and word lines WL are in direct contact with underlying FET 2605 gates and referred to as a WL/G integrated contact. Bit lines BL are orthogonal to word lines WL. Select lines SL may be parallel to bit lines BL as shown, or parallel to word lines WL. Each cell in this open array architecture includes one NV CNT switch 2610 with WL, BL, and SL connections. Adjacent cells share a bit line contact, which reduces cell area.

As illustrated by representative cell #3 in a plan view of cell and array layout 3000 shown in FIG. 30, having a pair of bit lines BL sharing a select line SL results in a substantially smaller cell size than the cell and array layout 2900 described further above with respect to FIG. 29 and therefore, relatively smaller memory arrays. Cell #3 has an area of 9 $F^2$ as shown in FIG. 30 and in FIG. 34 for purposes of comparison with other cell and array architectures.

Cell and array layout 3000 shown in FIG. 30 correspond to open array schematic architectures described further above with respect to storage array section 1110 illustrated in FIGS. 11, 16, 19, and 20.

Figure 31:
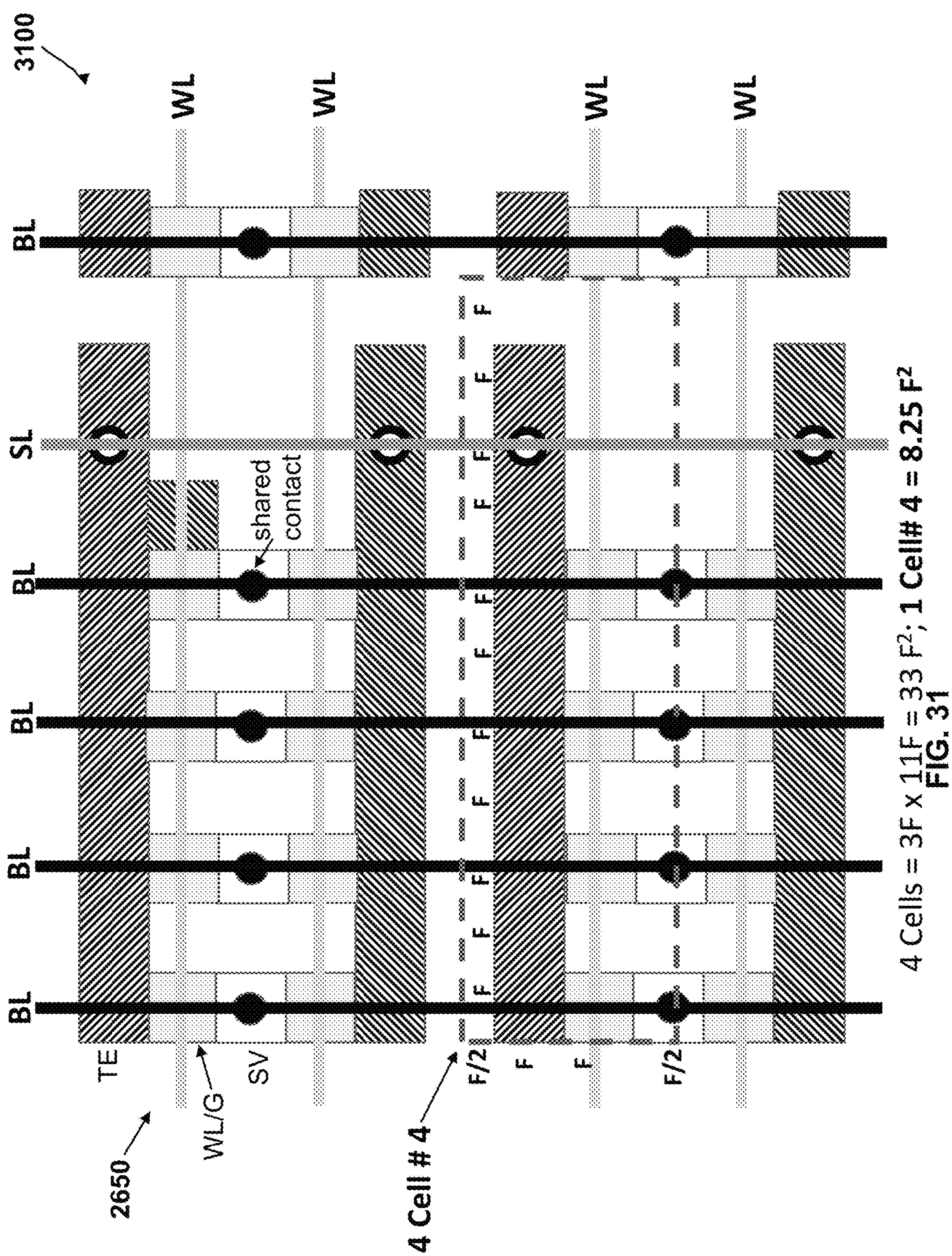
FIG. 31 is a plan view of a cell and array layout for a 1T, 1R memory cell in an open array architecture having an array with word lines orthogonal to bit lines and select lines, with one select line shared with four bit lines.

Referring now to a plan view of cell and array layout 3100 illustrated in FIG. 31, FIG. 31 shows a 1T, 1R NRAM memory cell with an open array architecture with four parallel bit lines BL and a shared select line SL, both lines orthogonal to word lines WL. Plan view 2650 illustrated in FIG. 26C is repeated at multiple cell locations and interconnected with array wiring of word lines WL, bit lines BL, and select lines SL as shown. The array wiring widths are minimum widths F as indicated in FIG. 31. However, array wires are drawn as lines, with cell contacts, for ease of visualization.

Referring now to FIGS. 26A, 26B, and 26C, bit lines BL contact underlying stud vias SV, select lines SL contact underlying top electrodes TE, and word lines WL are in direct contact with underlying FET 2605 gates and referred to as a WL/G integrated contact. Bit lines BL are orthogonal to word lines WL. Select lines SL may be parallel to bit lines BL as shown, or parallel to word lines WL. Each cell in this open array architecture includes one NV CNT switch 2610 with WL, BL, and SL connections. Adjacent cells share a bit line contact, which reduces cell area.

As illustrated by representative cell #4 in a plan view of cell and array layout 3100 shown in FIG. 31, having four bit lines BL sharing a select line SL results in a smaller cell size than the cell and array layout 3000 described further above with respect to FIG. 30 and therefore, relatively smaller memory arrays. Cell #4 has an area of 8.25 $F^2$ as shown in FIG. 31 and in FIG. 34 for purposes of comparison with other cell and array architectures. Comparing cell areas of cell #4 with cell #3 shows a cell area reduction of less than 10%.

Figure 32:
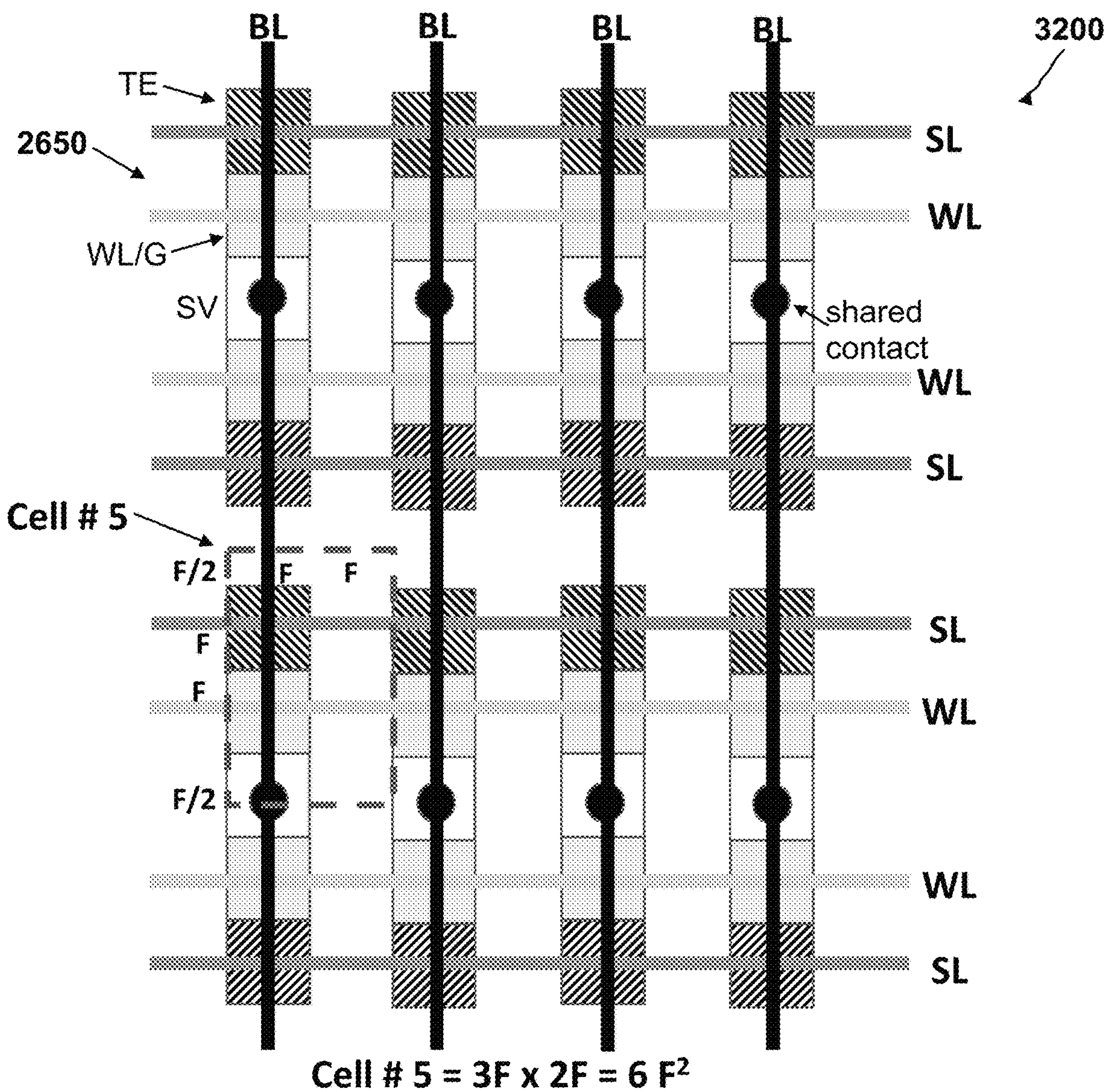
FIG. 32 is a plan view of a cell and array layout for a 1T, 1R memory cell in an open array architecture having an array with word lines orthogonal to bit lines and parallel with select lines, with one select line corresponding with one word line.

Referring now to a plan view of cell and array layout 3200 illustrated in FIG. 32, FIG. 32 shows a 1T, 1R NRAM memory cell with an open array architecture with bit lines BL orthogonal to word lines WL and select lines SL parallel to word lines WL. Plan view 2650 illustrated in FIG. 26C is repeated at multiple cell locations and interconnected with array wiring of word lines WL, bit lines BL, and select lines SL as shown. The array wiring widths are minimum widths F as indicated in FIG. 32. However, array wires are drawn as lines, with cell contacts, for ease of visualization.

Referring now to FIGS. 26A, 26B, and 26C, bit lines BL contact underlying stud vias SV, select lines SL contact underlying top electrodes TE, and word lines WL are in direct contact with underlying FET 2605 gates and referred to as a WL/G integrated contact. Bit lines BL are orthogonal to word lines WL. Select lines SL are parallel to word lines WL. Each cell in this open array architecture includes one NV CNT switch 2610 with WL, BL, and SL connections. Adjacent cells share a bit line contact, which reduces cell area.

As illustrated by representative cell #5 in a plan view of cell and array layout 3200 shown in FIG. 32, having both word lines WL and select lines SL parallel to each other and orthogonal to bit lines BL results in a substantially smaller cell size than the cell and array layout 3100 described further above with respect to FIG. 31 and therefore, relatively smaller memory arrays. Cell #5 has an area of 6 $F^2$ as shown in FIG. 32 and in FIG. 34 for purposes of comparison with other cell and array architectures. Cell #5 has the smallest cell area of any of the five cells discussed above as is shown in table 3400 illustrated in FIG. 34.

Figure 33:
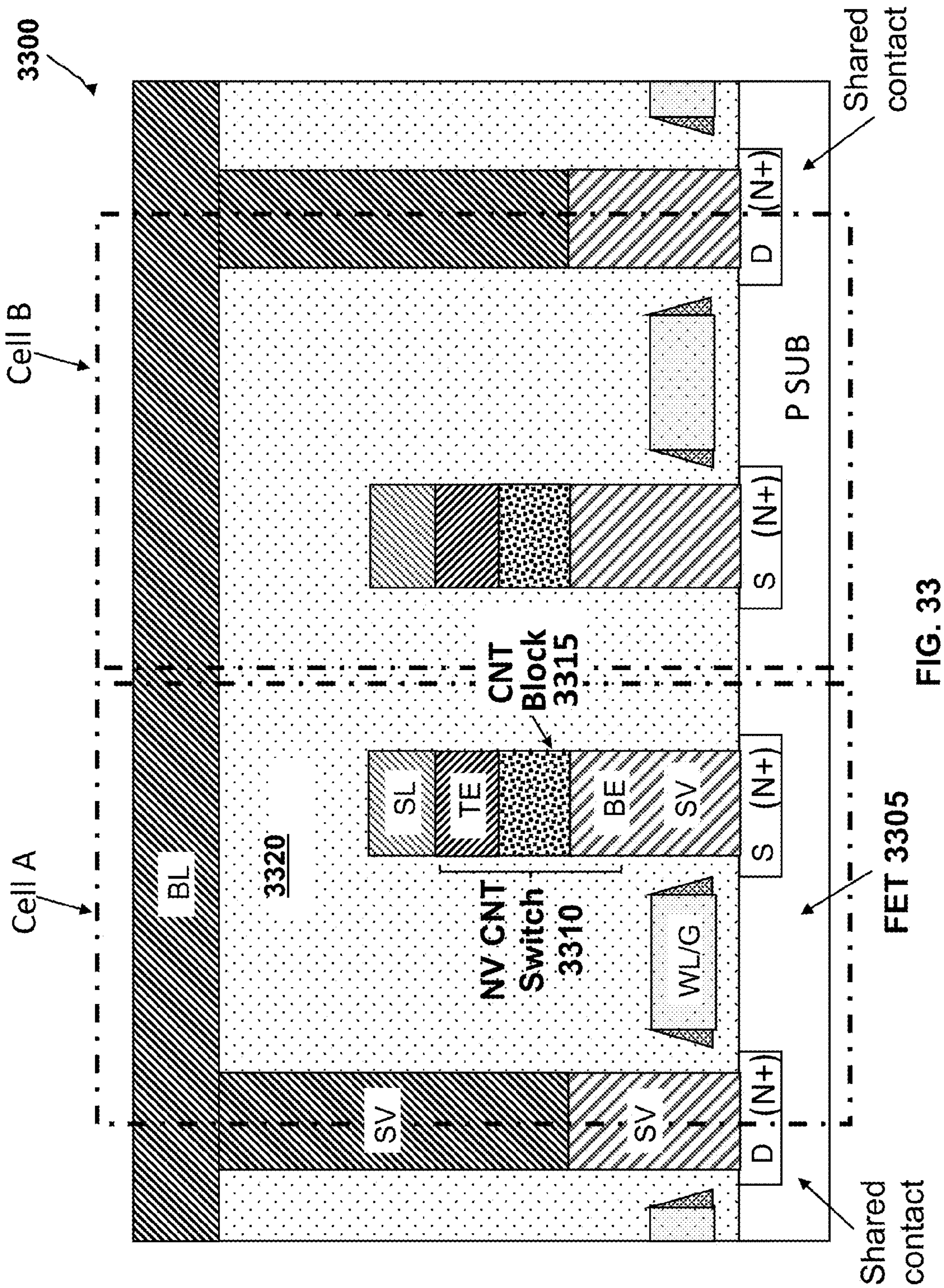
FIG. 33 is an NRAM a drawing of a cross section of FIG. 26B along the bit line direction

FIG. 33 illustrates 1T, 1R NRAM array cross section 3300 taken along the bit line BL in contact with cell #5 and illustrated in the plan view of cell and array layout 3200 shown in FIG. 32. Cross section 3300 shows cell #5, referred to as memory cell A, and an adjacent cell that shares a common bit line contact, that is referred to cell B.
Memory cell A and cell B are mirror images of one another. Representative memory cell A is used to describe the cell structure. In this example, since cross section 3300 shows bit line BL above select lines SL, FIG. 26B is the corresponding cell structure.

Memory cell A shows cell select transistor FET 3305, corresponding to field effect transistor (FET) 2605 illustrated in FIG. 26B, and includes source S and drain D formed in a p-type silicon substrate. Combined word line WL and FET gate, referred to as WL/G, fabricated with sidewall spacers, is part of an array word line that forms gate regions and array interconnections WL/G and controls the drain-to-source channel region ON and OFF states using well known FET device operating methods. Alternatively, a separate word line conductor (not shown) may be used to interconnect gate regions of cell select devices such as cell select FET 3305. Stud SV, embedded in dielectric 3320, provides a conductive path between source S and bottom electrode BE of NV CNT switch 3310 also embedded in dielectric 3320, in which stud SV may be used as a bottom contact terminal to CNT block 3315 of NV CNT switch 3310. A top electrode TE in contact with the top surface of CNT block 3315 forms a second contact and is also in contact with select lines SL.

Drain D of cell select FET 3305 contacts a first stud via SV, which in turn contacts a second stud via SV, which in turn contacts bit line BL, thereby interconnecting bit line BL and drain D. Second stud via SV and bit line BL may be formed at the same time. Drain D is shared with an adjacent cell, partially visible in FIG. 33.

Bit line BL and stud vias SV may be made of aluminum, titanium, TiN, or other conductive materials for contacts and array wires such as, Al(Cu), Ag, Au, Bi, Ca, Co, $CoSi_x$, Cr, Cu, Fe, In, Ir, Mg, Mo, $MoSi_2$, Na, Ni, $NiSi_x$, Os, Pb, PbSn, PbIn, Pd, $Pd_2Si$, Pt, $PtSi_x$, Rh, RhSi, Ru, RuO, Sb, Sn, Ta, TaN, TiAu, TiCu, TiPd, $TiSi_x$, TiW, W, $WSi_2$, Zn, $ZrSi_2$, and others for example. Examples of semiconductors that may be used as conductive terminals or array wires are: Si (doped and undoped), Ge, SiC, GaP, GaAs, GaSb, InP, InAs, InSb, ZnS, ZnSe, CdS, CdSe, CdTe and other examples. Various allotropes of carbon may also be used as first conductive terminals and array wires, such as: amorphous carbon (aC); carbon nanotubes such as nanotube fabrics, buckyballs, and other examples.

However, if copper is used as a conductor, then a tantalum nitride liner is required as is well known in the industry. In addition to the well-known copper and tantalum nitride (or other liner materials) liner to prevent Cu penetration into silicon, a tantalum nitride liner is needed between the copper and both top and bottom electrodes of CNT block 3315 to prevent copper penetration in the CNT block region.

The plan view of cell and array layout 3200 illustrated in FIG. 32 and the corresponding cross section 3300 illustrated in FIG. 33 show the integrated structure fabricated through the bit line BL definition level. Additional insulating (and conductor) layers may be formed above bit line BL (not shown) including final chip passivation and chip terminal metal layers (not shown). Further cell and layout structures and integration details are included in U.S. Pat. No. 7,835,170 to Bertin et al. hereby incorporated by reference in its entirety.

In some embodiments, memory cells such as memory cell A and memory cell B form NRAM memory arrays, such as cell and array layout 3200 illustrated in FIG. 32 that are estimated to be approximately $6F^2$ in area as illustrated further above in FIGS. 32 and 34, where F is a minimum technology node dimension.

Referring now to table 3400 illustrated in FIG. 34, table 3400 summarizes cell layout areas as a function of various array architectures described further above for cells #1-5 in a single table. All open array architectures are substantially denser than the cell #1 folded array architecture.

First, comparing open array architectures corresponding to cells #2-4 with parallel bit lines BL and select lines SL, both orthogonal to word lines WL, the first open array architecture cell is cell #2, which is substantially smaller in area than folded array architecture cell #1 (FIGS. 29 and 34), being nearly half the cell area, making it a useful cell option.

An open array architecture with two bit lines BL for every select line corresponding with cell #3, reduces the cell area of cell #2 by 25% (FIGS. 30 and 34). This is the reason that the cell #3 architecture was used in various open arrays described schematically further above.

However, an open array architecture with four bit lines BL for every select line SL, corresponding with cell #4, reduces the area of cell #3 by less than 10% (FIGS. 31 and 34) and is therefore not of interest for inclusion with cell and array architecture examples in this application.

As shown in table 3400 illustrated in FIG. 34, cell #5 has the smallest cell area of $6F^2$ (FIGS. 32 and 34). Open architecture cell #5 has a unique architecture compared to cells #1-4 because the array wiring is different. While bit lines BL and word lines WL are orthogonal, select lines SL are parallel to word lines WL and therefore orthogonal to bit lines BL.

Based on cell and array layout area comparisons described further above and summarized in table 3400 and illustrated in FIG. 34, new bit line data path architectures and operation based on cell #2 and cell #5 configurations are shown schematically as part of bit line data paths as described further below.

Sixth DDR Compatible Resistive Change Element Open Array Architecture

Referring now to the plan view of cell and array layout 2900, also referred to as cell #2, in FIG. 29, the alternating, parallel bit line BL and select line SL cell layout is shown schematically, further below, in several bit line data path architectures. These schematic representations fall into two categories.

In a sixth schematic representation of cell #2, corresponding architectures are designed for high speed page mode operations similar to architectures described further above, in which RESET operations are performed before the end of READ cycles, such that WRITE operations consist of a SET operation that either changes the state of a nonvolatile resistive change element, such as a NV CNT switch, from a high to a low resistance state, or leaves the nonvolatile resistive change element in a high resistance state. Examples of sixth schematic representations of cell #2 are described further below.

In a seventh schematic representations of cell #2, RESET before the end of READ cycles is eliminated, and SET and RESET operations are performed during WRITE operations. READ and WRITE, READ-Modify-WRITE, and also high-speed page mode may be performed. Examples of seventh schematic representations of cell #2 are described further below.

Figure 35:
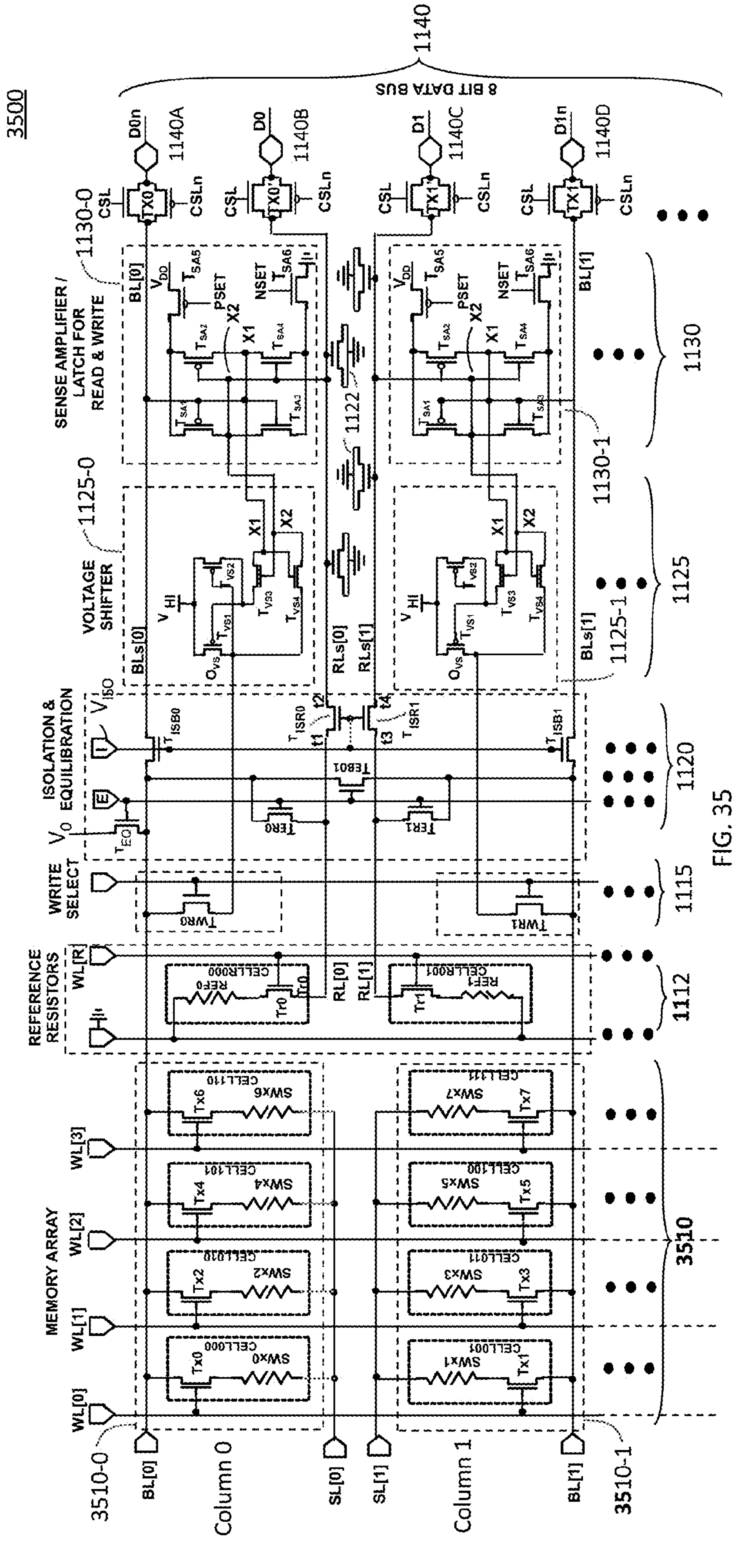
FIG. 35 is a simplified schematic of a DDR NRAM compatible sixth, v1 open architecture with an open resistive change memory array architecture, corresponding to the FIG. 29 cell, that includes a reference resistor for each bit line (note that bit line columns are drawn horizontally to accommodate a subset of two independent bit lines, isolation devices, voltage shift circuits, and sense amplifier details) operating in a RESET before the end of READ mode.

Referring now to sixth (version 1) open architecture schematic 3500 shown in FIG. 35, corresponding to a plan view of cell and array layout 2900 shown in FIG. 29, and to first open architecture schematic 1100 shown in FIG. 11, storage array section 3510 replaces storage array section 1110. Subarrays 3510-0 and 3510-1 replace subarrays 1110-0 and 1110-1, respectively.

READ operations are performed with select lines SL at zero volts. Hence READ operations for open architecture schematics 3500 and 1100 are the same.

With respect to SET operations, select lines SL are at zero volts. Hence, SET operations for open architecture schematics 3500 and 1100 are the same. However, RESET operations for open architecture schematics 3500 and 1100 are somewhat different as described further below.

Nonvolatile 1T,1R memory cell 2625 illustrated in FIG. 26 shows select line SL in contact with the top electrode TE of CNT block 2615, which forms a portion of NV CNT switch 2610. Hence, select line SL[0] is in contact with the top electrode TE of NV CNT switches SWx0, SWx2, SWx4, and SWx6 shown in storage subarray 3510-0. And, select line SL[1] is in contact with the top electrode TE of NV CNT switches SWx1, SWx3, SWx5, and SWx7 shown in storage subarray 3510-1. Referring now to array storage section 3510 illustrated in FIG. 35, in a RESET operation, storage subarray 3510-0 shown in FIG. 35 RESETs a single nonvolatile resistive change element (NV CNT switch, for example) at each word line WL and select line SL intersection when a representative word line such as WL[0] is selected, bit line BL[0] is at zero volts, and select line SL[0] is at a RESET voltage $V_{RESET}$.

Referring now to array storage section 3510 illustrated in FIG. 35, in a RESET operation, storage subarray 3510-1 shown in FIG. 35 RESETs a single nonvolatile resistive change element (NV CNT switch) at each word line WL and select line SL intersection when a representative word line such as WL[0] is selected, bit line BL[1] is at zero volts, and select line SL[1] is at a RESET voltage $V_{RESET}$.

Referring now to array storage section 1110 illustrated in FIG. 11, by way of comparison, storage subarrays 1110-0 and 1110-1 share a common select line SL[x]. Therefore, select line SL[x] is in contact with the top electrode TE of NV CNT switches SWx0, SWx2, SWx4, and SWx6 in storage subarray 1110-0 as well as the top electrode TE of NV CNT switches SWx1, SWx3, SWx5, and SWx7 in storage subarray 1110-1. Referring now to array storage section 1110 illustrated in FIG. 11, in a RESET operation, storage subarrays 1110-0 and 1110-1 shown in FIG. 11 RESET a pair of nonvolatile resistive change element (NV CNT switches, for example) at each word line WL and select line SL intersection when a representative word line such as WL[0] is selected, bit lines BL[0] and BL[1] are at zero volts, and select line SL[0] is at a RESET voltage $V_{RESET}$.

However, it is possible to selectively RESET only one of a pair of resistive storage elements (NV CNT switches, for example) even with shared select line SL[X]. Representative word line WL[0] is connected to select transistors in cells CELL000 in storage subarray 1110-0 and CELL001 in storage subarray 1110-1. Select line SL[X] is at $V_{RESET}$ voltage. If bit line BL[0] is at zero volts and BL[1] is at $V_{RESET}/2$, then only NV CNT switch SWx0 will be RESET to a high resistance state. However, if bit line BL[1] is at zero volts and bit line BL[0] is at $V_{RESET}/2$, then only NV CNT switch SWx1 will be RESET to a high resistance state. This is because bit lines at $V_{RESET}/2$ only allow half the $V_{RESET}$ voltage to appear across the NV CNT switch.

Figure 36:
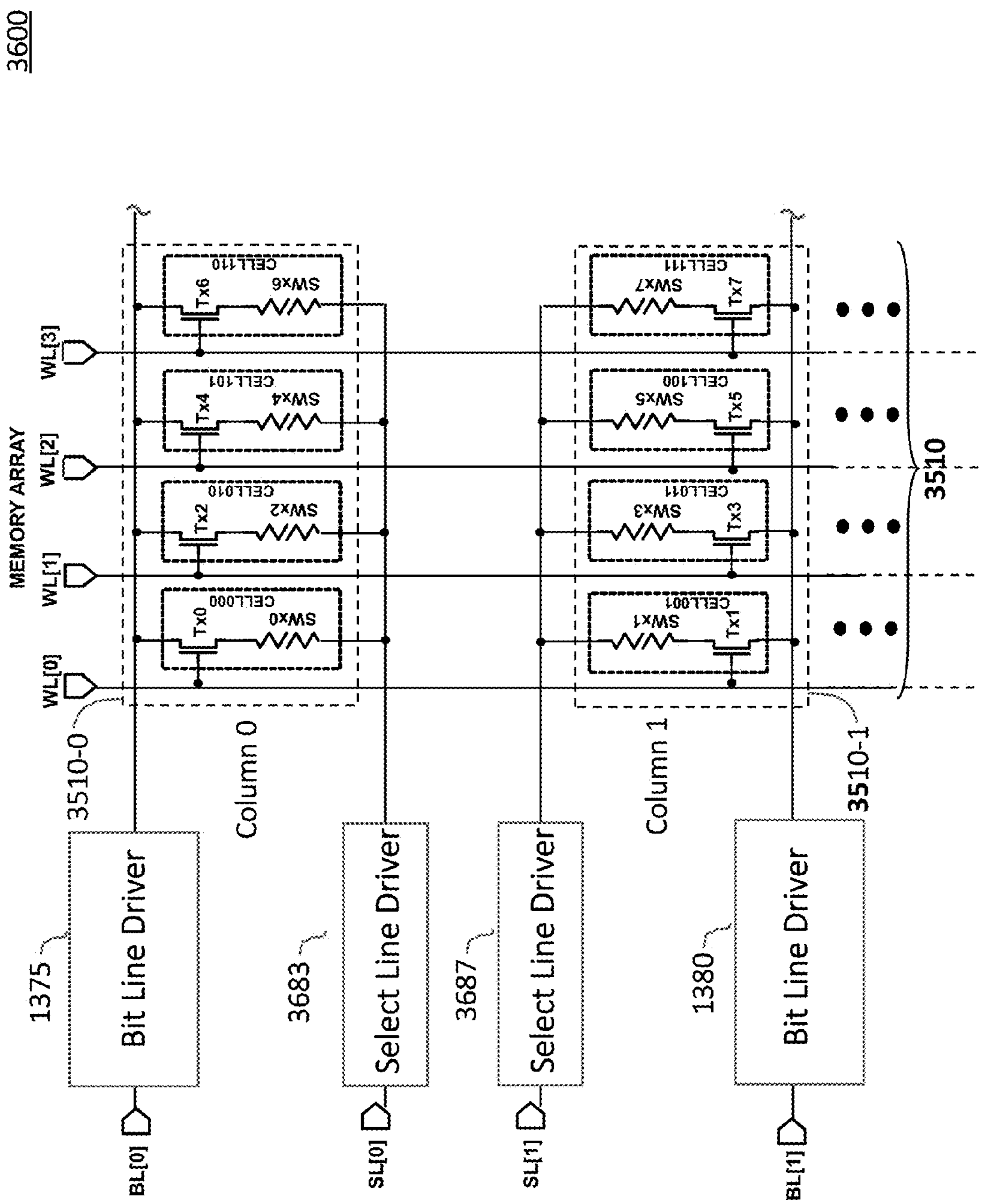
FIG. 36 is a simplified schematic of a RESET circuit with word lines, bit line drivers, and select line drivers.

Referring now to RESET circuit 3600 illustrated in FIG. 36 and comparing with FIG. 35, bit line drivers 1375 and 1380 are added to bit lines BL[0] and BL[1], respectively, and select line drivers 3683 and 3687 are added to select lines SL[0] and SL[1], respectively. The output of each of these drivers may be in tristate, at zero volts, or performing a WRITE operation, in this example, a RESET operation. In this example, if select line driver 3683 applies $V_{RESET}$ voltage to select line SL[0] and bit line driver 1375 is set to zero volts, then all resist change elements in storage subarray 3510-0 switch from a low to a high resistance state. Or, if already in a high resistance state, remain in that existing high resistance state. Alternatively, if select line driver 3687 applies $V_{RESET}$ voltage to select line SL[1] and bit line driver 1380 is set to zero volts, then all resist change elements in storage subarray 3510-1 switch from a low to a high resistance state. Or, if already in a high resistance state, remain in that existing high resistance state.

RESET circuit 3600 illustrate in FIG. 36 is similar to RESET circuit 1370 illustrated in FIG. 13D. The only difference between circuit 1370 and 3600 is that circuit 1370 has only one select line driver 1385 applying $V_{RESET}$ to select line SL[X] which is common to both storage subarrays 1110-0 and 1110-1. If both bit line driver 1375 and 1380 are at zero volts, then when $V_{RESET}$ is applied to select line SL[X], then this RESET operation switches all resistive change elements in storage sub-arrays 1110-0 and 1110-1 from a low resistance to a high resistance state, or leaves them in an existing high resistance states. If however, bit line driver 1380 is switched to $V_{RESET}/2$ and bit line driver 1375 is at zero volts, then all resist change elements in storage subarray 1110-0 switch from a low to a high resistance state. Or, if already in a high resistance state, remain in that existing high resistance state. Also, if bit line driver 1375 is switched to $V_{RESET}/2$ and bit line driver 1380 is at zero volts, then all resist change elements in storage subarray 1110-1 switch from a low to a high resistance state. Or, if already in a high resistance state, remain in that existing high resistance state.

As described further above, the operation of sixth (version 1) open architecture schematic 3500 illustrated in FIG. 35 and first open architecture schematic 1100 illustrated in FIG. 11 are similar. Hence, READ and WRITE operations are essentially the same. Therefore, READ timing diagrams 1300 illustrated in FIG. 13A and 1350 illustrated in FIG. 13B apply for both sixth (version 1) open architecture schematic 3500 and first open architecture schematic 1100. Also, WRITE timing diagram 1400 applies for both sixth (version 1) open architecture schematic 3500 and first open architecture schematic 1100.

Figure 37:
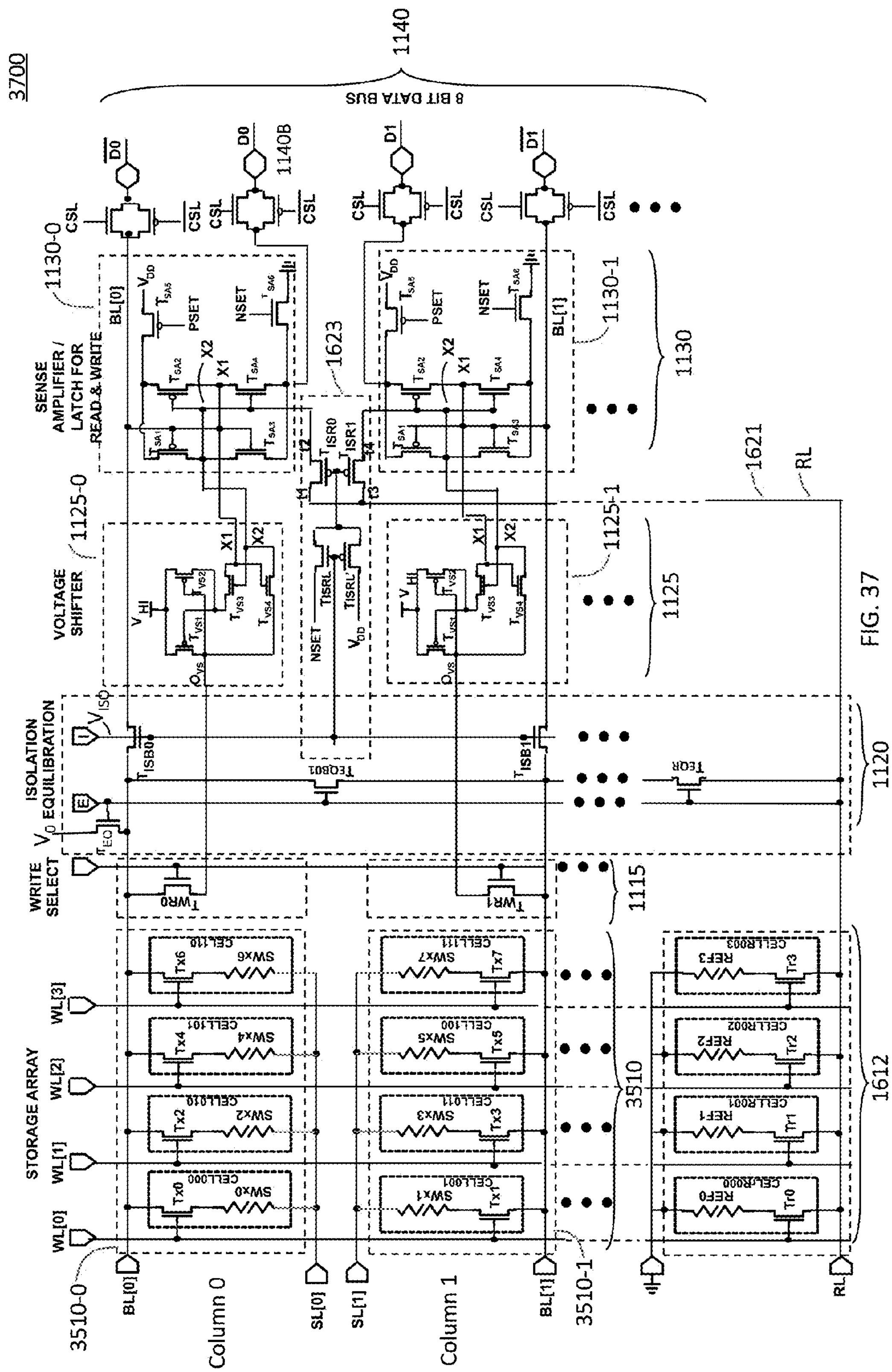
FIG. 37 is a simplified schematic of a DDR NRAM compatible sixth, v2 open architecture with an open resistive change memory array architecture, corresponding to the FIG. 29 cell, that includes a reference resistor for each word line connected to a single reference line (note that bit line columns are drawn horizontally to accommodate a subset of two independent bit lines, isolation devices, voltage shift circuits, and sense amplifier details) operating in a RESET before the end of READ mode.

Referring now to sixth (version 2) open architecture schematic 3700 shown in FIG. 37, corresponding to a plan view of cell and array layout 2900 shown in FIG. 29, and to second open architecture schematic 1600 shown in FIG. 16, storage array section 3510 replaces storage array section 1110. Subarrays 3510-0 and 3510-1 replace subarrays 1110-0 and 1110-1, respectively.

READ operations are performed with select lines SL at zero volts. Hence READ operations for open architecture schematics 3700 and 1600 are the same.

With respect to SET operations, select lines are at zero volts. Hence, SET operations for open architecture schematics 3700 and 1600 are the same. However, RESET operations for open architecture schematics 3700 and 1600 are somewhat different as described further below.

Nonvolatile 1T,1R memory cell 2625 illustrated in FIG. 26 shows select line SL in contact with the top electrode TE of CNT block 2615, which forms a portion of NV CNT switch 2610. Hence, select line SL[0] is in contact with the top electrode TE of NV CNT switches SWx0, SWx2, SWx4, and SWx6 shown in storage subarray 3510-0. And, select line SL[1] is in contact with the top electrode TE of NV CNT switches SWx1, SWx3, SWx5, and SWx7 shown in storage subarray 3510-1. Referring now to array storage section 3510 illustrated in FIG. 37, in a RESET operation, storage subarray 3510-0 shown in FIG. 37 RESETs a single nonvolatile resistive change element (NV CNT switch, for example) at each word line WL and select line SL intersection when a representative word line such as WL[0] is selected, bit line BL[0] is at zero volts, and select line SL[0] is at a RESET voltage $V_{RESET}$.

Referring now to array storage section 3510 illustrated in FIG. 37, in a RESET operation, storage subarray 3510-1 shown in FIG. 37 RESETs a single nonvolatile resistive change element (NV CNT switch) at each word line WL and select line SL intersection when a representative word line such as WL[0] is selected, bit line BL[1] is at zero volts, and select line SL[1] is at a RESET voltage $V_{RESET}$.

Referring now to array storage section 1110 illustrated in FIG. 16, by way of comparison, storage subarrays 1110-0 and 1110-1 share a common select line SL[x]. Therefore, select line SL[x] is in contact with the top electrode TE of NV CNT switches SWx0, SWx2, SWx4, and SWx6 in storage subarray 1110-0 as well as the top electrode TE of NV CNT switches SWx1, SWx3, SWx5, and SWx7 in storage subarray 1110-1. Referring now to array storage section 1110 illustrated in FIG. 16, in a RESET operation, storage subarrays 1110-0 and 1110-1 shown in FIG. 16 RESET a pair of nonvolatile resistive change element (NV CNT switches, for example) at each word line WL and select line SL intersection when a representative word line such as WL[0] is selected, bit lines BL[0] and BL[1] are at zero volts, and select line SL[0] is at a RESET voltage $V_{RESET}$.

However, it is possible to selectively RESET only one of a pair of resistive storage elements (NV CNT switches, for example) even with shared select line SL[X]. Representative word line WL[0] is connected to select transistors in cells CELL000 in storage subarray 1110-0 and CELL001 in storage subarray 1110-1. Select line SL[X] is at $V_{RESET}$ voltage. If bit line BL[0] is at zero volts and BL[1] is at $V_{RESET}/2$, then only NV CNT switch SWx0 will be RESET to a high resistance state. However, if bit line BL[1] is at zero volts and bit line BL[0] is at $V_{RESET}/2$, then only NV CNT switch SWx1 will be RESET to a high resistance state. This is because bit lines at $V_{RESET}/2$ only allow half the $V_{RESET}$ voltage to appear across the NV CNT switch.

Referring now to RESET circuit 3600 illustrated in FIG. 36 and comparing with FIG. 37, bit line drivers 1375 and 1380 are added to bit lines BL[0] and BL[1], respectively, and select line drivers 3683 and 3687 are added to select lines SL[0] and SL[1], respectively. The output of each of these drivers may be in tristate, at zero volts, or performing a WRITE operation, in this example, a RESET operation. In this example, if select line driver 3683 applies $V_{RESET}$ voltage to select line SL[0] and bit line driver 1375 is set to zero volts, then all resist change elements in storage subarray 3510-0 switch from a low to a high resistance state. Or, if already in a high resistance state, remain in that existing high resistance state. Alternatively, if select line driver 3687 applies $V_{RESET}$ voltage to select line SL[1] and bit line driver 1380 is set to zero volts, then all resist change elements in storage subarray 3510-1 switch from a low to a high resistance state. Or, if already in a high resistance state, remain in that existing high resistance state.

RESET circuit 3600 illustrate in FIG. 36 is similar to RESET circuit 1370 illustrated in FIG. 13D. The only difference between circuit 1370 and 3600 is that circuit 1370 has only one select line driver 1385 applying $V_{RESET}$ to select line SL[X] which is common to both storage subarrays 1110-0 and 1110-1. If both bit line driver 1375 and 1380 are at zero volts, then when $V_{RESET}$ is applied to select line SL[X], then this RESET operation switches all resistive change elements in storage sub-arrays 1110-0 and 1110-1 from a low resistance to a high resistance state, or leaves them in an existing high resistance states. If however, bit line driver 1380 is switched to $V_{RESET}/2$ and bit line driver 1375 is at zero volts, then all resist change elements in storage subarray 1110-0 switch from a low to a high resistance state. Or, if already in a high resistance state, remain in that existing high resistance state. Also, if bit line driver 1375 is switched to $V_{RESET}/2$ and bit line driver 1380 is at zero volts, then all resist change elements in storage subarray 1110-1 switch from a low to a high resistance state. Or, if already in a high resistance state, remain in that existing high resistance state.

As described further above, the operation of sixth (version 2) open architecture schematic 3700 illustrated in FIG. 37 and second open architecture schematic 1600 illustrated in FIG. 16 are similar. Hence, READ and WRITE operations are essentially the same. Therefore, READ timing diagram 1800 illustrated in FIG. 18A and 1850 illustrated in FIG. 18B apply for both sixth (version 2) open architecture schematic 3700 and first open architecture schematic 1600. Also, WRITE timing diagram 1400 applies for both sixth (version 2) open architecture schematic 3700 and second open architecture schematic 1600.

Figure 38:
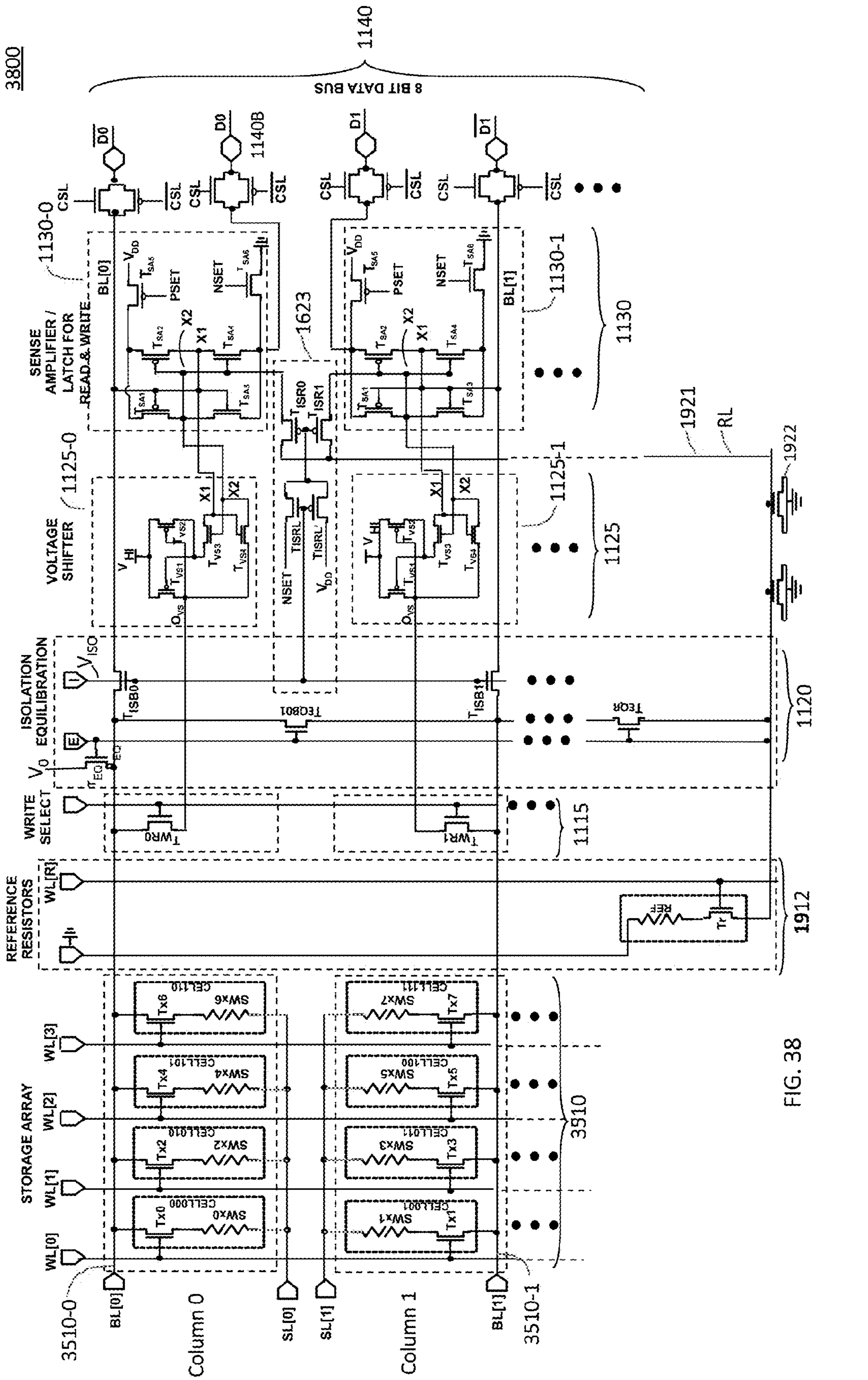
FIG. 38 is a simplified schematic of a DDR NRAM compatible sixth, v3 open architecture with an open resistive change memory array architecture, corresponding to the FIG. 29 cell, that includes a single reference resistor for all word lines connected to a single reference line (note that bit line columns are drawn horizontally to accommodate a subset of two independent bit lines, isolation devices, voltage shift circuits, and sense amplifier details) operating in a RESET before the end of READ mode.

Referring now to sixth (version 3) open architecture schematic 3800 shown in FIG. 38, corresponding to a plan view of cell and array layout 2900 shown in FIG. 29, and to third open architecture schematic 1900 shown in FIG. 19, storage array section 3510 replaces storage array section 1110. Subarrays 3510-0 and 3510-1 replace subarrays 1110-0 and 1110-1, respectively.

READ operations are performed with select lines SL at zero volts. Hence READ operations for open architecture schematics 3800 and 1900 are the same.

With respect to SET operations, select lines are at zero volts. Hence, SET operations for open architecture schematics 3800 and 1900 are the same. However, RESET operations for open architecture schematics 3800 and 1900 are somewhat different as described further below.

Nonvolatile 1T,1R memory cell 2625 illustrated in FIG. 26 shows select line SL in contact with the top electrode TE of CNT block 2615, which forms a portion of NV CNT switch 2610. Hence, select line SL[0] is in contact with the top electrode TE of NV CNT switches SWx0, SWx2, SWx4, and SWx6 shown in storage subarray 3510-0. And, select line SL[1] is in contact with the top electrode TE of NV CNT switches SWx1, SWx3, SWx5, and SWx7 shown in storage subarray 3510-1. Referring now to array storage section 3510 illustrated in FIG. 38, in a RESET operation, storage subarray 3510-0 shown in FIG. 38 RESETs a single nonvolatile resistive change element (NV CNT switch, for example) at each word line WL and select line SL intersection when a representative word line such as WL[0] is selected, bit line BL[0] is at zero volts, and select line SL[0] is at a RESET voltage $V_{RESET}$.

Referring now to array storage section 3510 illustrated in FIG. 38, in a RESET operation, storage subarray 3510-1 shown in FIG. 38 RESETs a single nonvolatile resistive change element (NV CNT switch) at each word line WL and select line SL intersection when a representative word line such as WL[0] is selected, bit line BL[1] is at zero volts, and select line SL[1] is at a RESET voltage $V_{RESET}$.

Referring now to array storage section 1110 illustrated in FIG. 19, by way of comparison, storage subarrays 1110-0 and 1110-1 share a common select line SL[x]. Therefore, select line SL[x] is in contact with the top electrode TE of NV CNT switches SWx0, SWx2, SWx4, and SWx6 in storage subarray 1110-0 as well as the top electrode TE of NV CNT switches SWx1, SWx3, SWx5, and SWx7 in storage subarray 1110-1. Referring now to array storage section 1110 illustrated in FIG. 19, in a RESET operation, storage subarrays 1110-0 and 1110-1 shown in FIG. 19 RESET a pair of nonvolatile resistive change element (NV CNT switches, for example) at each word line WL and select line SL intersection when a representative word line such as WL[0] is selected, bit lines BL[0] and BL[1] are at zero volts, and select line SL[0] is at a RESET voltage $V_{RESET}$.

However, it is possible to selectively RESET only one of a pair of resistive storage elements (NV CNT switches, for example) even with shared select line SL[X]. Representative word line WL[0] is connected to select transistors in cells CELL000 in storage subarray 1110-0 and CELL001 in storage subarray 1110-1. Select line SL[X] is at $V_{RESET}$ voltage. If bit line BL[0] is at zero volts and BL[1] is at $V_{RESET}/2$, then only NV CNT switch SWx0 will be RESET to a high resistance state. However, if bit line BL[1] is at zero volts and bit line BL[0] is at $V_{RESET}/2$, then only NV CNT switch SWx1 will be RESET to a high resistance state. This is because bit lines at $V_{RESET}/2$ only allow half the $V_{RESET}$ voltage to appear across the NV CNT switch.

Referring now to RESET circuit 3600 illustrated in FIG. 36 and comparing with FIG. 38, bit line drivers 1375 and 1380 are added to bit lines BL[0] and BL[1], respectively, and select line drivers 3683 and 3687 are added to select lines SL[0] and SL[1], respectively. The output of each of these drivers may be in tristate, at zero volts, or performing a WRITE operation, in this example, a RESET operation. In this example, if select line driver 3683 applies $V_{RESET}$ voltage to select line SL[0] and bit line driver 1375 is set to zero volts, then all resist change elements in storage subarray 3510-0 switch from a low to a high resistance state. Or, if already in a high resistance state, remain in that existing high resistance state. Alternatively, if select line driver 3687 applies $V_{RESET}$ voltage to select line SL[1] and bit line driver 1380 is set to zero volts, then all resist change elements in storage subarray 3510-1 switch from a low to a high resistance state. Or, if already in a high resistance state, remain in that existing high resistance state.

RESET circuit 3600 illustrated in FIG. 36 is similar to RESET circuit 1370 illustrated in FIG. 13D. The only difference between circuit 1370 and 3600 is that circuit 1370 has only one select line driver 1385 applying $V_{RESET}$ to select line SL[X] which is common to both storage subarrays 1110-0 and 1110-1. If both bit line driver 1375 and 1380 are at zero volts, then when $V_{RESET}$ is applied to select line SL[X], then this RESET operation switches all resistive change elements in storage sub-arrays 1110-0 and 1110-1 from a low resistance to a high resistance state, or leaves them in an existing high resistance states. If however, bit line driver 1380 is switched to $V_{RESET}/2$ and bit line driver 1375 is at zero volts, then all resist change elements in storage subarray 1110-0 switch from a low to a high resistance state. Or, if already in a high resistance state, remain in that existing high resistance state. Also, if bit line driver 1375 is switched to $V_{RESET}/2$ and bit line driver 1380 is at zero volts, then all resist change elements in storage subarray 1110-1 switch from a low to a high resistance state. Or, if already in a high resistance state, remain in that existing high resistance state.

As described further above, the operation of sixth (version 3) open architecture schematic 3800 illustrated in FIG. 38 and third open architecture schematic 1900 illustrated in FIG. 19 are similar. Architecture schematics 1600 and 1900 are operationally the same because both include reference resistors. Hence, READ and WRITE operations are essentially the same. Therefore, READ timing diagram 1800 illustrated in FIG. 18A and 1850 illustrated in FIG. 18B apply for sixth (version 3) open architecture schematic 3800, third open architecture 1900, and second open architecture schematic 1600. Also, WRITE timing diagram 1400 applies for sixth (version 3) open architecture schematic 3800, third open architecture schematic 1900, and second open architecture schematic 1600.

Figure 39:
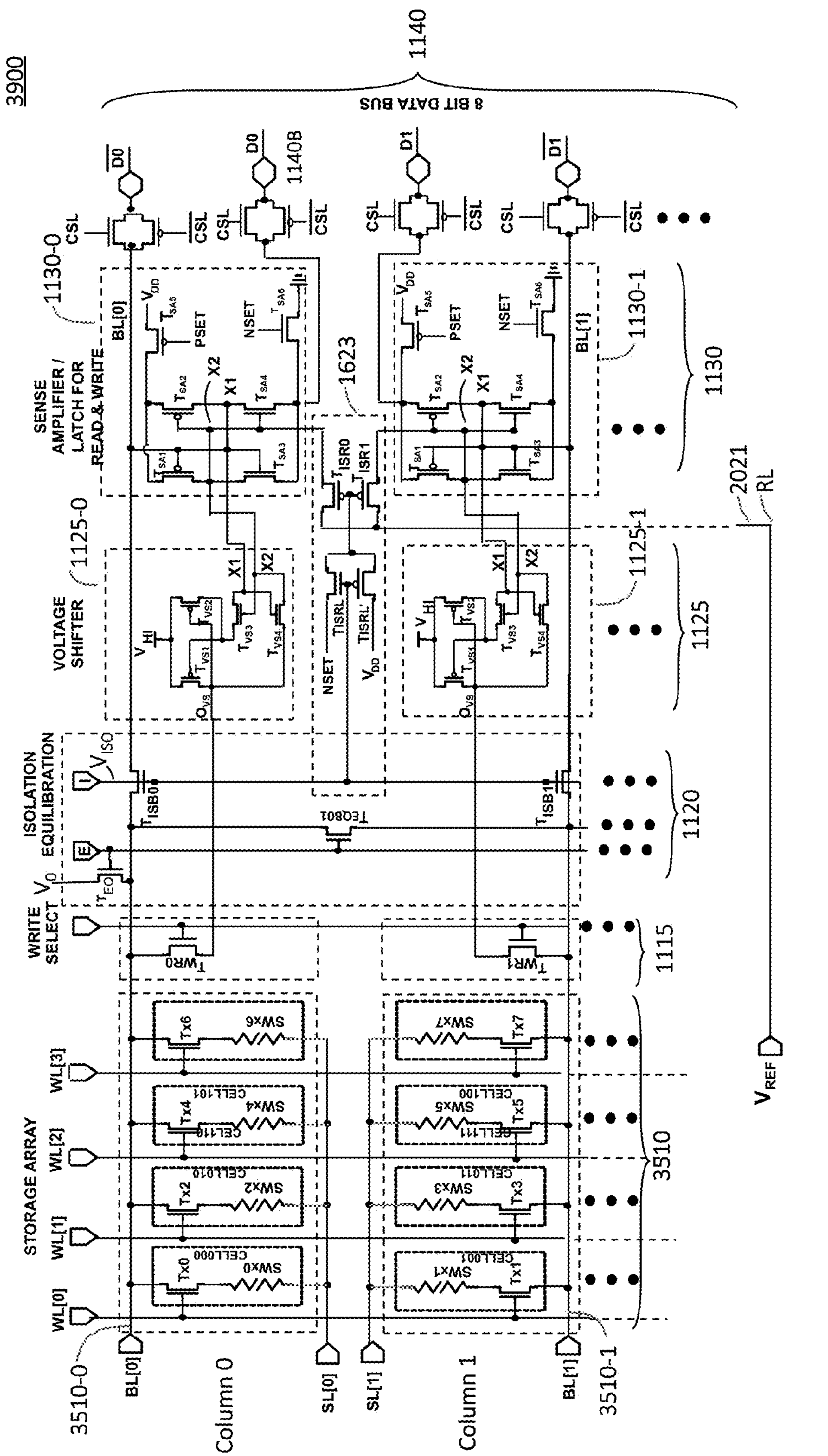
FIG. 39 is a simplified schematic of a DDR NRAM compatible sixth, v4 open architecture with an open resistive change memory array architecture, corresponding to the FIG. 29 cell, and no reference resistors. A reference voltage is connected to a single reference line (note that bit line columns are drawn horizontally to accommodate a subset of two independent bit lines, isolation devices, voltage shift circuits, and sense amplifier details) operating in a RESET before the end of READ mode.

Referring now to sixth (version 4) open architecture schematic 3900 shown in FIG. 39, corresponding to a plan view of cell and array layout 2900 shown in FIG. 29, and to fourth open architecture schematic 2000 shown in FIG. 20, storage array section 3510 replaces storage array section 1110. Subarrays 3510-0 and 3510-1 replace subarrays 1110-0 and 1110-1, respectively.

READ operations are performed with select lines SL at zero volts. Hence READ operations for open architecture schematics 3900 and 2000 are the same.

With respect to SET operations, select lines are at zero volts. Hence, SET operations for open architecture schematics 3900 and 2000 are the same. However, RESET operations for open architecture schematics 3900 and 2000 are somewhat different as described further below.

Nonvolatile 1T,1R memory cell 2625 illustrated in FIG. 26 shows select line SL in contact with the top electrode TE of CNT block 2615, which forms a portion of NV CNT switch 2610. Hence, select line SL[0] is in contact with the top electrode TE of NV CNT switches SWx0, SWx2, SWx4, and SWx6 shown in storage subarray 3510-0. And, select line SL[1] is in contact with the top electrode TE of NV CNT switches SWx1, SWx3, SWx5, and SWx7 shown in storage subarray 3510-1. Referring now to array storage section 3510 illustrated in FIG. 39, in a RESET operation, storage subarray 3510-0 shown in FIG. 39 RESETs a single non-volatile resistive change element (NV CNT switch, for example) at each word line WL and select line SL intersection when a representative word line such as WL[0] is selected, bit line BL[0] is at zero volts, and select line SL[0] is at a RESET voltage $V_{RESET}$.

Referring now to array storage section 3510 illustrated in FIG. 39, in a RESET operation, storage subarray 3510-1 shown in FIG. 39 RESETs a single nonvolatile resistive change element (NV CNT switch) at each word line WL and select line SL intersection when a representative word line such as WL[0] is selected, bit line BL[1] is at zero volts, and select line SL[1] is at a RESET voltage $V_{RESET}$.

Referring now to array storage section 1110 illustrated in FIG. 20, by way of comparison, storage subarrays 1110-0 and 1110-1 share a common select line SL[x]. Therefore, select line SL[x] is in contact with the top electrode TE of NV CNT switches SWx0, SWx2, SWx4, and SWx6 in storage subarray 1110-0 as well as the top electrode TE of NV CNT switches SWx1, SWx3, SWx5, and SWx7 in storage subarray 1110-1. Referring now to array storage section 1110 illustrated in FIG. 20, in a RESET operation, storage subarrays 1110-0 and 1110-1 shown in FIG. 20 RESET a pair of nonvolatile resistive change element (NV CNT switches, for example) at each word line WL and select line SL intersection when a representative word line such as WL[0] is selected, bit lines BL[0] and BL[1] are at zero volts, and select line SL[0] is at a RESET voltage $V_{RESET}$.

However, it is possible to selectively RESET only one of a pair of resistive storage elements (NV CNT switches, for example) even with shared select line SL[X]. Representative word line WL[0] is connected to select transistors in cells CELL000 in storage subarray 1110-0 and CELL001 in storage subarray 1110-1. Select line SL[X] is at $V_{RESET}$ voltage. If bit line BL[0] is at zero volts and BL[1] is at $V_{RESET}/2$, then only NV CNT switch SWx0 will be RESET to a high resistance state. However, if bit line BL[1] is at zero volts and bit line BL[0] is at $V_{RESET}/2$, then only NV CNT switch SWx1 will be RESET to a high resistance state. This is because bit lines at $V_{RESET}/2$ only allow half the $V_{RESET}$ voltage to appear across the NV CNT switch.

Referring now to RESET circuit 3600 illustrated in FIG. 36 and comparing with FIG. 39, bit line drivers 1375 and 1380 are added to bit lines BL[0] and BL[1], respectively, and select line drivers 3683 and 3687 are added to select lines SL[0] and SL[1], respectively. The output of each of these drivers may be in tristate, at zero volts, or performing a WRITE operation, in this example, a RESET operation. In this example, if select line driver 3683 applies $V_{RESET}$ voltage to select line SL[0] and bit line driver 1375 is set to zero volts, then all resist change elements in storage subarray 3510-0 switch from a low to a high resistance state. Or, if already in a high resistance state, remain in that existing high resistance state. Alternatively, if select line driver 3687 applies $V_{RESET}$ voltage to select line SL[1] and bit line driver 1380 is set to zero volts, then all resist change elements in storage subarray 3510-1 switch from a low to a high resistance state. Or, if already in a high resistance state, remain in that existing high resistance state.

RESET circuit 3600 illustrate in FIG. 36 is similar to RESET circuit 1370 illustrated in FIG. 13D. The only difference between circuit 1370 and 3600 is that circuit 1370 has only one select line driver 1385 applying $V_{RESET}$ to select line SL[X] which is common to both storage subarrays 1110-0 and 1110-1. If both bit line driver 1375 and 1380 are at zero volts, then when $V_{RESET}$ is applied to select line SL[X], then this RESET operation switches all resistive change elements in storage sub-arrays 1110-0 and 1110-1 from a low resistance to a high resistance state, or leaves them in an existing high resistance states. If however, bit line driver 1380 is switched to $V_{RESET}/2$ and bit line driver 1375 is at zero volts, then all resist change elements in storage subarray 1110-0 switch from a low to a high resistance state. Or, if already in a high resistance state, remain in that existing high resistance state. Also, if bit line driver 1375 is switched to $V_{RESET}/2$ and bit line driver 1380 is at zero volts, then all resist change elements in storage subarray 1110-1 switch from a low to a high resistance state. Or, if already in a high resistance state, remain in that existing high resistance state.

As described further above, the operation of sixth (version 4) open architecture schematic 3900 illustrated in FIG. 39 and second open architecture schematic 2000 illustrated in FIG. 20 are similar. Hence, READ and WRITE operations are essentially the same. Therefore, READ timing diagram 2100 illustrated in FIG. 21A and 2150 illustrated in FIG. 21B apply for both sixth (version 4) open architecture schematic 3900 and first open architecture schematic 2000. Also, WRITE timing diagram 1400 applies for both sixth (version 4) open architecture schematic 3900 and second open architecture schematic 2000.

Referring now to sixth (version 5), the open architecture schematic is the same as open architecture schematic 3900 shown in FIG. 39. READ operations are essentially the same as READ timing diagrams 2100 and 2150 illustrated in FIGS. 21A and 21B, respectively. WRITE operations are essentially the same as timing diagram 1400. However, sixth (version 5) open architecture includes on-chip programmable regulated voltage generator 2300 illustrated in FIG. 23 and programmable SA/latch timing control circuit 2500 illustrated in FIG. 25, which also includes CNT switch-controlled latch circuits 2400 and 2450 shown in FIGS. 24A and 24B, respectively. Hence, sixth (version 5) open architecture schematic adds on-chip programmable reference voltage control and signal development time control to the sixth (version 4) open architecture described further above.

Referring now to a plan view of cell and array layout illustrated in FIG. 29, FIG. 29 shows a 1T, 1R NRAM memory cell with an open array architecture with alternating parallel bit lines BL and select lines SL, both lines orthogonal to word lines WL as described further above. The array wiring widths are minimum widths F as indicated in FIG. 29 (cell #2). However, array wires are drawn as lines, with cell contacts, for ease of visualization.

Cell and array layout 2900, described further above, is shown schematically as storage array section 3510 in open architecture schematics 3500, 3700, 3800, and 3900 as illustrated in FIGS. 35, 37, 38, and 39, respectively, and are referred to collectively as the sixth open architecture schematic representations, and individually as different versions of this open architecture. The sixth open architecture schematics are all based on a RESET operation during READ prior to the end of the READ cycle using RESET circuit 3600 shown in FIG. 36 to apply a $V_{RESET}$ pulse to select lines SL with corresponding bit lines BL at a low voltage such as zero volts, for example, and as described further above. Hence all nonvolatile resistive change elements (NV CNT switches, for example) in storage array section 3510 are RESET to a high resistance state (value) $R_{HI}$. $R_{HI}$ may be 1 MΩ or higher resistance, for example, as described further above. Hence during a WRITE operation, it is only necessary to provide a SET pulse to bit lines BL, with corresponding select lines SL at a reference voltage such as zero Volts. As described further above, if a SET pulse $V_{SET}$ is applied to a bit line, the nonvolatile resistive change element switches from a high resistance state $R_{HI}$ to a low resistance state $R_{LO}$, 100 kΩ for example. However, if $V_{SET}$ is zero volts, then $R_{HI}$ remains unchanged.

Seventh DDR Compatible Resistive Change Element Open Array Architecture

At this point in the specification, alternative open architecture schematics are described further below, by which READ and WRITE operations are changed. These alternative open architectures are described as seventh and eighth open architecture representations, beginning with the seventh representation, which includes several versions.

Figure 40:
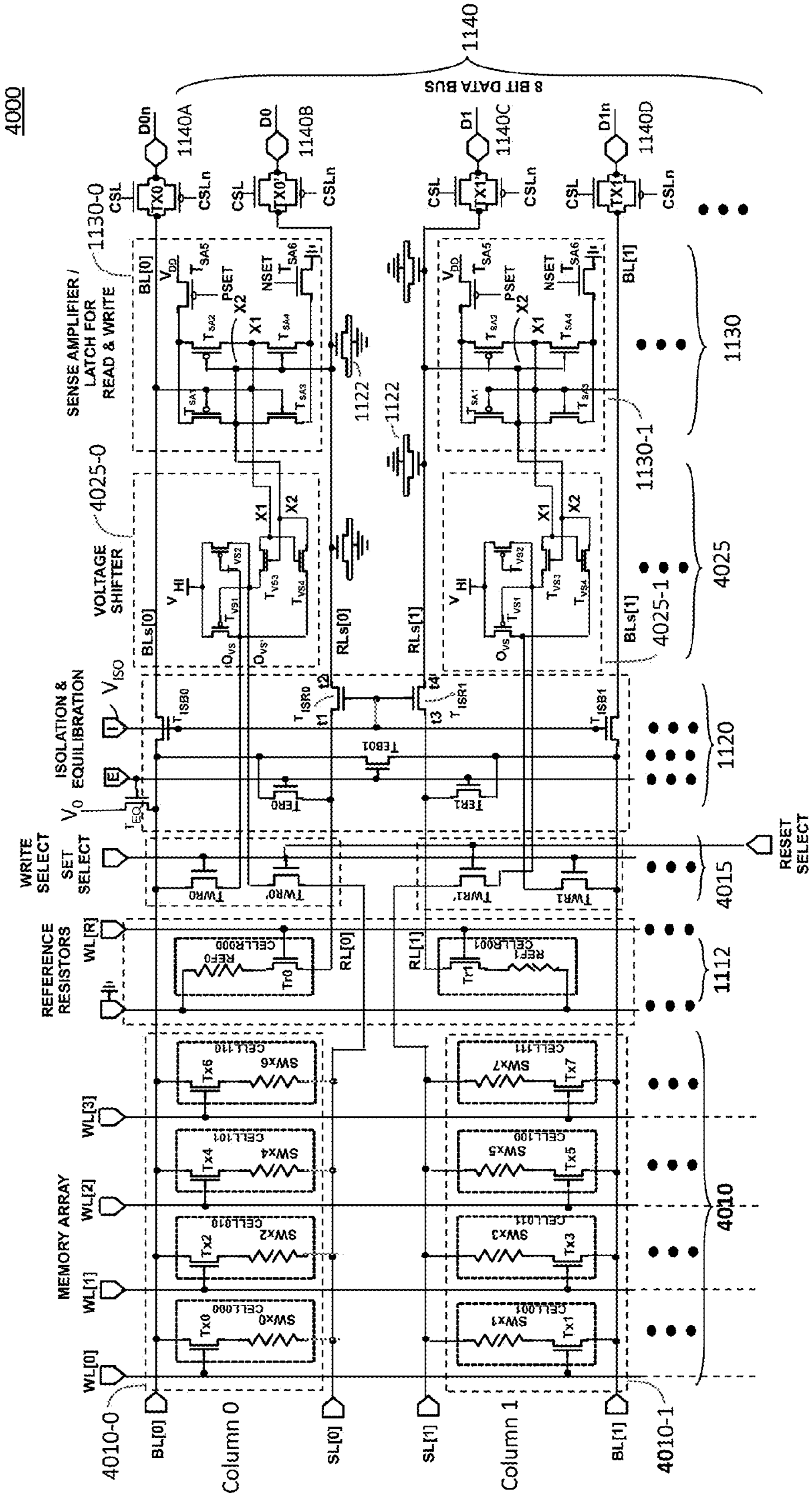
FIG. 40 is a simplified schematic of a DDR NRAM compatible seventh, v1open architecture with an open resistive change memory array architecture, corresponding to the FIG. 29 cell, that includes a reference resistor for each bit line (note that bit line columns are drawn horizontally to accommodate a subset of two independent bit lines, isolation devices, voltage shift circuits, and sense amplifier details) operating in a READ/WRITE mode.

Referring now to seventh (version 1) open architecture schematic 4000 shown in FIG. 40, corresponding to a plan view of cell and array layout 2900 shown in FIG. 29, and to sixth (version 1) open architecture schematic 3500 shown in FIG. 35, storage array section 4010 replaces storage array section 3510. Storage subarrays 4010-0 and 4010-1 replace storage subarrays 3510-0 and 3510-1, respectively.

Storage subarray 4010-0 and 4010-1 of storage array section 4010 illustrated in FIG. 40 are connected to bit lines BL[0] and BL[1], respectively, and to select lines SL[0] and SL[1], respectively. Corresponding storage subarrays 3510-0 and 3510-1 of storage array section 3510 illustrated in FIG. 35 are both also connected to BL[0] and BL[1], respectively, and to select lines SL[0] and SL[1], respectively. However, SL[0] and SL[1] of storage array section 4010 shown in FIG. 40 are connected to FETs controlled by a RESET select line in WRITE select section 4015 as described further below, while SL[0] and SL[1] of storage array section 3510 shown in FIG. 35 are connected to select line drivers 3683 and 3687, respectively, of RESET circuit 3600 shown in FIG. 36 as described further above.

Referring now to FIGS. 40 and 35, WRITE select section 4015 replaces WRITE select section 1115, respectively. WRITE select section 4015 includes FET $T_{WR0}$ with a first terminal connected to bit line bit line BL[0] and a second terminal connected to output $O_{VS}$ of voltage shifter 4025-0. A third terminal, a gate, is connected to a SET select line that is activated during WRITE operations. WRITE select section 4015 also includes FET $T_{WR1}$ with a first terminal connected to bit line bit line BL[1] and a second terminal connected to output $O_{VS}$ of voltage shifter 4025-1. A third terminal, a gate, is connected to the SET select line that is activated during WRITE operations. Both FETs $T_{WR0}$ and $T_{WR1}$, connected to the SET select line, are included in WRITE select section 4015 and correspond to FETs $T_{WR0}$ and $T_{WR1}$ included in WRITE select section 1115. FETs $T_{WR0}$ and $T_{WR1}$ in WRITE selection 1115 are connected to corresponding terminals as shown in FIG. 35 and perform the same function described further above. The SET select line shown in WRITE select section 4015 corresponds to the WRITE select line shown in WRITE select section 1115. Both perform the same SET operation during a WRITE operation.

In addition to FETs $T_{WR0}$ and $T_{WR1}$ connected to bit lines BL[0] and BL[1], respectively, and controlled by the SET select line, WRITE select section 4015 also includes FETs $T_{WR0'}$ and $T_{WR1'}$, each with a first terminal connected to select line SL[0] and SL[1], respectively, and a second terminal connected to output $O_{VS'}$ of voltage shifters 4025-0 and 4025-1, respectively. Outputs $O_{VS}$ and $O_{VS'}$ are complements of each other. That is, when one is at $V_{HI}$ the other is at zero Volts, and vice versa. Each of the FETs $T_{WR0'}$ and $T_{WR1'}$ have a third terminal, a gate, connected to the RESET select line.

Referring now to FIG. 40, seventh (version 1) open architecture schematic 4000 performs both SET and RESET operations with voltage shifter section 4025 providing outputs $O_{VS}$ and $O_{VS'}$ and WRITE select section 4015 enabling both SET and RESET operations. RESET circuit 3600 is not required.

During a WRITE operation, data bus section 1140 receives external input data pulses from data I/O buffer/driver 1567 as illustrated in block diagram 1500 illustrated in FIG. 15 and transmits the input data pulses to SA/latches 1130-0 and 1130-1, which are activated and receive and temporarily store the data as described further above. During a WRITE operation, voltage shifters 4025-0 and 4025-1, respectively, receive the SA/latch inputs. Voltage shifter 4025-0 output $O_{VS}$ drives bit line BL[0] and output $O_{VS'}$ drives select line SL[0] in storage subarray 4010-0 though FET devices $T_{WR0}$ and $T_{WR0'}$, respectively, of WRITE select section 4015. Voltage shifter 4025-1 output $O_{VS}$ drives bit line BL[1] and output $O_{VS'}$ drives select line SL[1] in storage subarray 4010-0 though FET devices $T_{WR1}$ and $T_{WR1'}$, respectively, of WRITE select section 4015.

Voltage shifters 4025-0 and 4025-1 are connected to an on-chip voltage of $V_{HI}$ generated from chip voltage $V_{DD}$ by DC voltage doubling (doubler) circuits. Voltage doubling circuits are well known in the electronics industry.

The required value of $V_{HI}$ may be determined for these examples by referring to table 2700 illustrated in FIG. 27. In this example, $V_{RESET}$ may be as high as 2.5 V. Therefore, $V_{HI}$ must be at least 2.5 V., and preferably higher, to accommodate programmable on-chip voltage regulation. Assuming a chip voltage $V_{DD}$=1V. for example and two DC voltage doubling circuits in series, each with 90% efficiency, the voltage double output $V_{OUT\_D}$ is approximately 3.6 V. (1.9×1.9 voltage multiplier). Referring now to on-chip programmable regulated voltage generator 2300 illustrated in FIG. 23 described further above, and assuming $V_{DD}$ is replaced by voltage doubler output $V_{OUT\text{-}D}$, programmable nonvolatile CNT switches R1 and R2 resistance values are adjusted as described further above and determine the output node 2330 voltage. In this example, the resistance values of NV CNT switches R1 and R2 are adjusted as described further above, such that on-chip programmable regulated voltage generator 2300 supplies a regulated reference voltage $V_{REF}$ that is equal to $V_{HI}$. In this example, based on the $V_{SET}$ and $V_{RESET}$ values shown in table 2700 illustrated in FIG. 27, $V_{HI}$ may be set at 2.5 V., for example, the higher of the two voltages.

Referring now to WRITE select section 4015 illustrated in FIG. 40, and a SET mode WRITE, the SET select line gate voltage may be chosen such that FETs $T_{WR0}$ and $T_{WR1}$ are in saturation, thereby limiting and controlling the voltage and current applied to bit lines BL[0] and BL[1], respectively. The current flow may additionally be controlled by the device dimensions of width and length (W/L ratio, for example). Referring now to table 2700 illustrated in FIG. 27, the $V_{SET}$ voltage range may be 1-1.5 volts. The SET select line gate voltage may be controlled by an on-chip programmable circuit, for example, on-chip programmable regulated voltage generator 2300 illustrated in FIG. 23 and described further above, such that the output of FETs $T_{WR0}$ and $T_{WR1}$ to bit lines BL[0] and BL[1], respectively, reduce the output $O_{VS}$ voltage from $V_{HI}$ to a bit line $V_{SET}$ voltage of 1.5 volts. Alternatively, if an NRAM chip SET voltage requirement is $V_{SET}$=1.2 volts, for example, then the SET select line gate voltage may be adjusted instead such that the output of FETs $T_{WR0}$ and $T_{WR1}$ to bit lines BL[0] and BL[1], reduces the output $O_{VS}$ voltage from $V_{HI}$ to a $V_{SET}$ voltage of 1.2 V.

Referring now to WRITE select section 4015 illustrated in FIG. 40, and a RESET mode WRITE, the RESET select line gate voltage may be chosen such that FETs $T_{WR0'}$ and $T_{WR1'}$ are in saturation, thereby limiting and controlling the voltage and current applied to source lines SL[0] and SL[1], respectively. The current flow may additionally be controlled by the device dimensions of width and length (W/L ratio, for example). Referring now to table 2700 illustrated in FIG. 27, the $V_{RESET}$ voltage range may be 2-2.5 volts. The RESET select line gate voltage may be controlled by an on-chip programmable circuit, for example, on-chip programmable regulated voltage generator 2300 illustrated in FIG. 23 and described further above, such that the output of FETs $T_{WR0'}$ and $T_{WR1'}$ to select lines SL[0] and SL[1], respectively, reduce the output $O_{VS'}$ voltage from $V_{HI}$ to a bit line $V_{RESET}$ voltage of 2.25 volts, for example.

Referring now to seventh (version 1) open architecture schematic 4000 illustrated in FIG. 40, a RESET circuit such as RESET circuit 3600 illustrated in FIG. 36 is not required because a RESET operation near the end of the READ cycle is not needed.

Figure 41A:
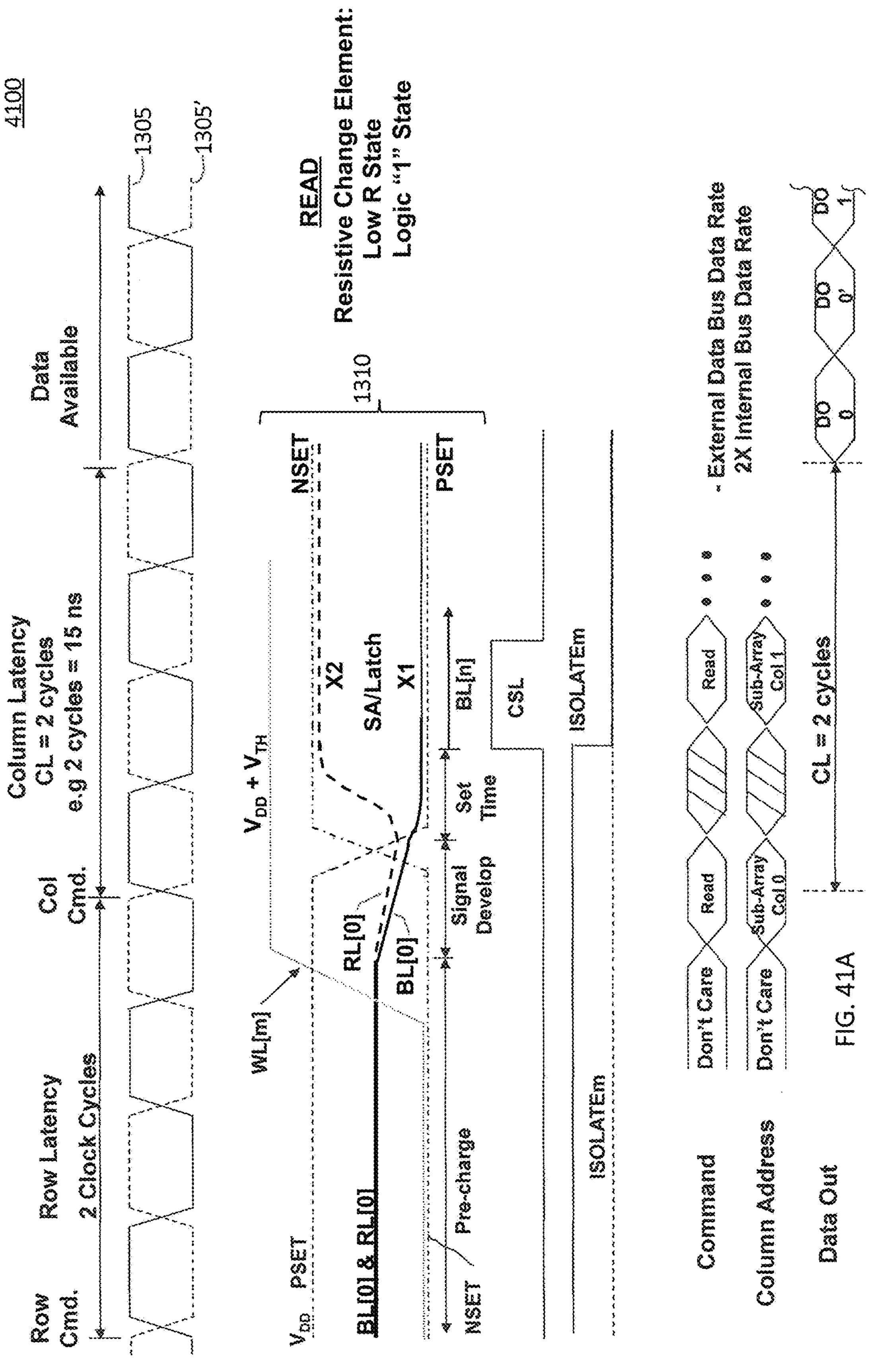
FIG. 41A is a waveform timing diagram illustrating an exemplary READ operation performed on a cell with a resistive change element in a low resistance state within an open resistive change memory array architecture of the seventh, v1open architecture.

READ operations for BL[0] are performed with select line SL[0] at zero volts, without a RESET operation before the end of the READ cycle, as shown in READ timing diagram 4100 illustrated in FIG. 41A. READ timing diagram 4100 operations are the same as those described further above with respect to READ timing diagram 1300 illustrated in FIG. 13A, except that the waveform SL RESET is omitted.

Figure 41B:
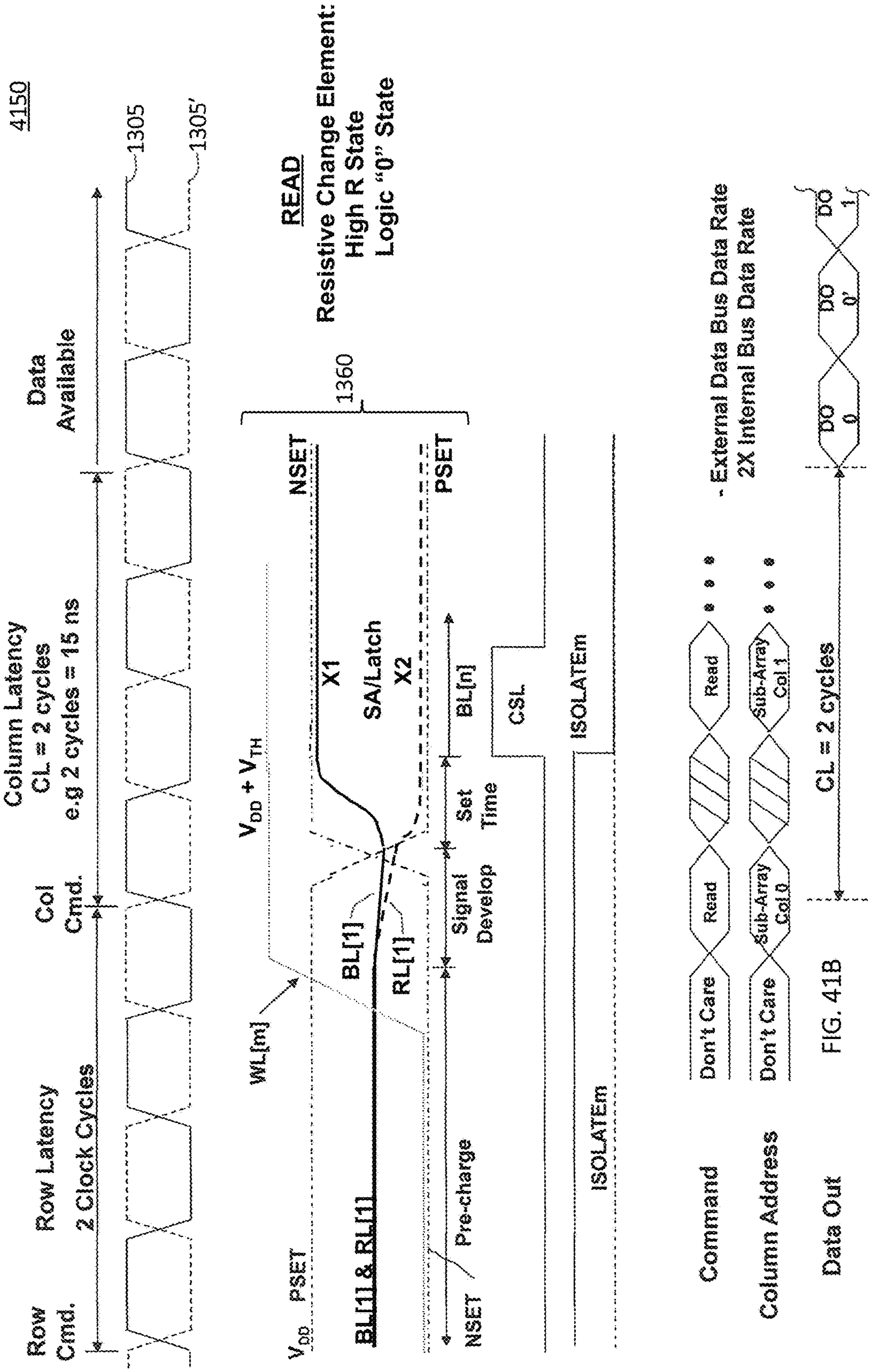
FIG. 41B is a waveform timing diagram illustrating an exemplary READ operation performed on a cell with a resistive change element in a high resistance state within an open resistive change memory array architecture of the seventh, v1open architecture.

READ operations for BL[1] are performed with select line SL[1] at zero volts, without a RESET operation before the end of the READ cycle, as shown in READ timing diagram 4150 illustrated in FIG. 41B. READ timing diagram 4150 operations are the same as those described further above with respect to READ timing diagram 1350 illustrated in FIG. 13B, except that the waveform SL RESET is omitted.

Figure 42:
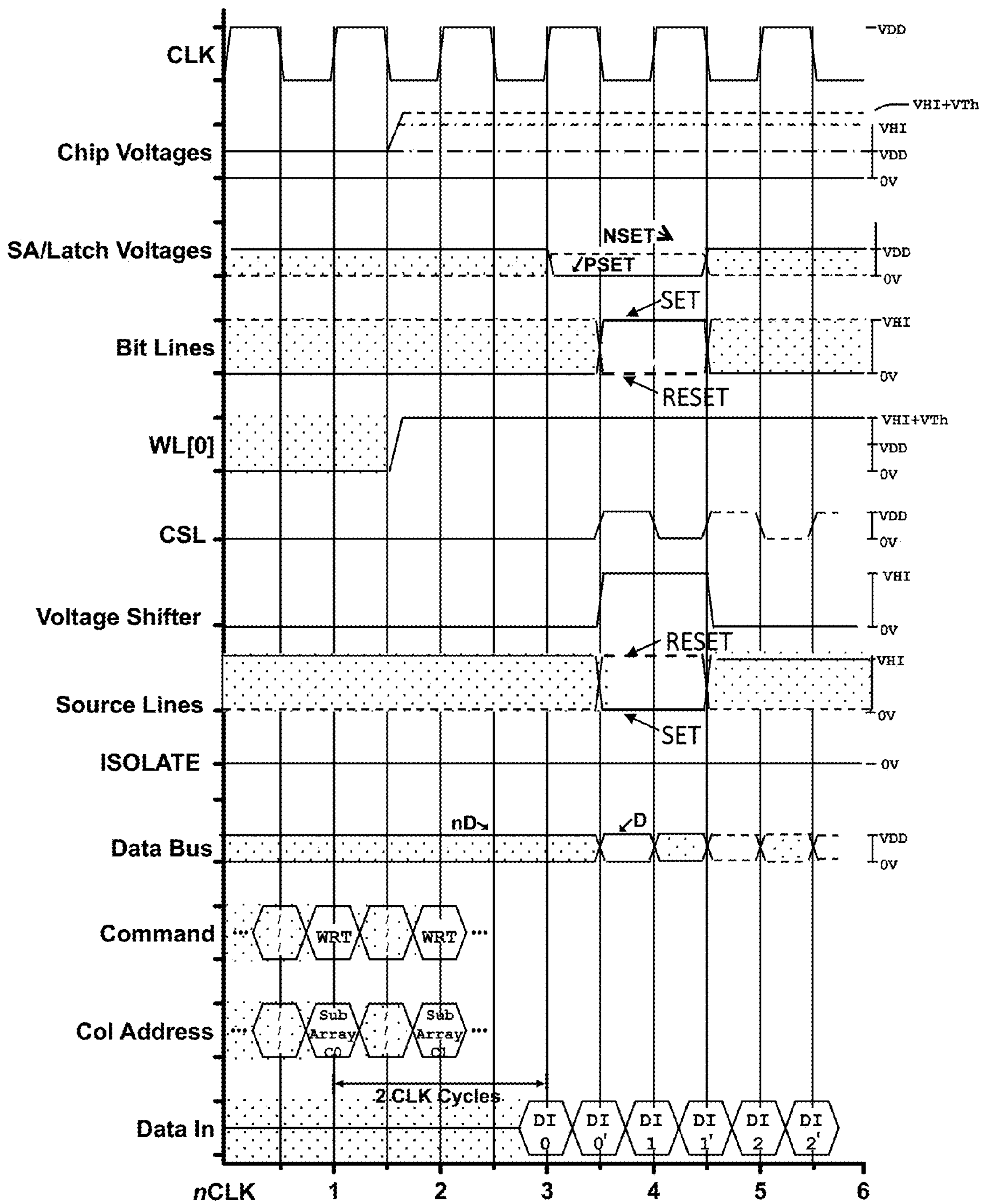
FIG. 42 is a waveform timing diagram illustrating an exemplary WRITE operation performed on a cell with a resistive change element within an open resistive change memory array architecture of the seventh open architecture.

With the elimination of RESET before the end of READ as illustrated in FIGS. 41A and 41B, the WRITE operation includes both SET and RESET modes as illustrated in WRITE timing diagram 4200 illustrated in FIG. 42. As shown in FIG. 42, during a SET WRITE operation, bit lines transition to a SET voltage $V_{SET}$ and corresponding select lines are at zero Volts. During a RESET WRITE operation, select lines transition to a RESET voltage $V_{RESET}$, and bit lines are at zero Volts. All other functions are as described further above with respect to WRITE timing diagram 1400 illustrated in FIG. 14.

Figure 43:
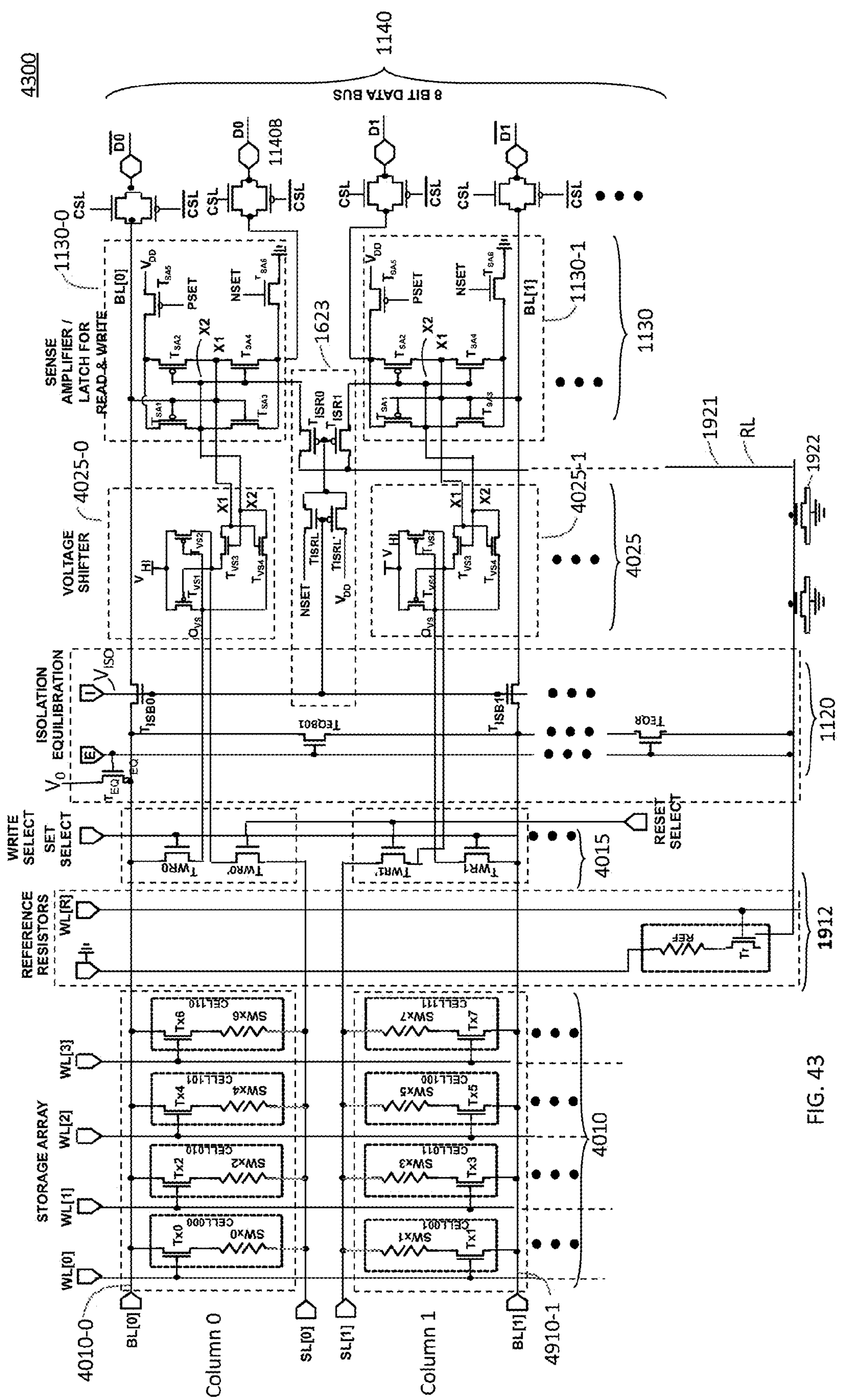
FIG. 43 is a simplified schematic of a DDR NRAM compatible seventh, v3 open architecture with an open resistive change memory array architecture, corresponding to the FIG. 29 cell, that includes a single reference resistor for all word lines connected to a single reference line (note that bit line columns are drawn horizontally to accommodate a subset of two independent bit lines, isolation devices, voltage shift circuits, and sense amplifier details) operating in a READ/WRITE mode.

Referring now to seventh (version 3) open architecture schematic 4300 shown in FIG. 43, corresponding to a plan view of cell and array layout 2900 shown in FIG. 29, and to sixth (version 3) open architecture schematic 3800 shown in FIG. 38, storage array section 4010 replaces storage array section 3510. Storage subarrays 4010-0 and 4010-1 replace storage subarrays 3510-0 and 3510-1, respectively.

Referring now to sixth (version 3) open architecture schematic 3800 with a one reference resistor and sixth (version 2) open architecture schematic 3700 with one reference resistor per word line, versions 3 and 2 have the same operating characteristics. Hence, only a seventh (version 3) open architecture schematic 4300 is shown.

Storage subarray 4010-0 and 4010-1 of storage array section 4010 illustrated in FIG. 43 are connected to bit lines BL[0] and BL[1], respectively, and to select lines SL[0] and SL[1], respectively. Corresponding storage subarrays 3510-0 and 3510-1 of storage array section 3510 illustrated in FIG. 38 are both also connected to BL[0] and BL[1], respectively, and to select lines SL[0] and SL[1], respectively. However, SL[0] and SL[1] of storage array section 4010 shown in FIG. 43 are connected to FETs controlled by a RESET select line in WRITE select section 4015 as described further below, while SL[0] and SL[1] of storage array section 3510 shown in FIG. 38 are connected to select line drivers 3683 and 3687, respectively, of RESET circuit 3600 shown in FIG. 36 as described further above.

Referring now to FIGS. 43 and 38, WRITE select section 4015 replaces WRITE select section 1115, respectively. WRITE select section 4015 includes FET $T_{WR0}$ with a first terminal connected to bit line bit line BL[0] and a second terminal connected to output $O_{VS}$ of voltage shifter 4025-0. A third terminal, a gate, is connected to a SET select line that is activated during WRITE operations. WRITE select section 4015 also includes FET $T_{WR1}$ with a first terminal connected to bit line bit line BL[1] and a second terminal connected to output $O_{VS}$ of voltage shifter 4025-1. A third terminal, a gate, is connected to the SET select line that is activated during WRITE operations. Both FETs $T_{WR0}$ and $T_{WR1}$, connected to the SET select line, are included in WRITE select section 4015 and correspond to FETs $T_{WR0}$ and $T_{WR1}$ included in WRITE select section 1115. FETs $T_{WR0}$ and $T_{WR1}$ in WRITE selection 1115 are connected to corresponding terminals as shown in FIG. 38 and perform the same function described further above. The SET select line shown in WRITE select section 4015 corresponds to the WRITE select line shown in WRITE select section 1115. Both perform the same SET operation during a WRITE operation.

In addition to FETs $T_{WR0}$ and $T_{WR1}$ connected to bit lines BL[0] and BL[1], respectively, and controlled by the SET select line, WRITE select section 4015 also includes FETs $T_{WR0'}$ and $T_{WR1'}$, each with a first terminal connected to select line SL[0] and SL[1], respectively, and a second terminal connected to output $O_{VS'}$ of voltage shifters 4025-0 and 4025-1, respectively. Outputs $O_{VS}$ and $O_{VS'}$ are complements of each other. That is, when one is at $V_{HI}$ the other is at zero Volts, and vice versa. Each of the FETs $T_{WR0'}$ and $T_{WR1'}$ have a third terminal, a gate, connected to the RESET select line.

Referring now to FIG. 43, seventh (version 3) open architecture schematic 4300 performs both SET and RESET operations with voltage shifter section 4025 providing outputs $O_{VS}$ and $O_{VS'}$ and WRITE select section 4015 enabling both SET and RESET operations. RESET circuit 3600 is not required.

During a WRITE operation, data bus section 1140 receives external input data pulses from data I/O buffer/driver 1567 as illustrated in block diagram 1500 illustrated in FIG. 15 and transmits the input data pulses to SA/latches 1130-0 and 1130-1, which are activated and receive and temporarily store the data as described further above. During a WRITE operation, voltage shifters 4025-0 and 4025-1, respectively, receive the SA/latch inputs. Voltage shifter 4025-0 output $O_{VS}$ drives bit line BL[0] and output $O_{VS'}$ drives select line SL[0] in storage subarray 4010-0 though FET devices $T_{WR0}$ and $T_{WR0'}$, respectively, of WRITE select section 4015. Voltage shifter 4025-1 output $O_{VS}$ drives bit line BL[1] and output $O_{VS'}$ drives select line SL[1] in storage subarray 4010-0 though FET devices $T_{WR1}$ and $T_{WR1'}$, respectively, of WRITE select section 4015.

Voltage shifters 4025-0 and 4025-1 are connected to an on-chip voltage of $V_{HI}$ generated from chip voltage $V_{DD}$ by DC voltage doubling (doubler) circuits. Voltage doubling circuits are well known in the electronics industry.

The required value of $V_{HI}$ may be determined for these examples by referring to table 2700 illustrated in FIG. 27. In this example, $V_{RESET}$ may be as high as 2.5 V. Therefore, $V_{HI}$ must be at least 2.5 V., and preferably higher, to accommodate programmable on-chip voltage regulation. Assuming a chip voltage $V_{DD}$=1V. for example and two DC voltage doubling circuits in series, each with 90% efficiency, the voltage double output $V_{OUT\_D}$ is approximately 3.6 V. (1.9×1.9 voltage multiplier). Referring now to on-chip programmable regulated voltage generator 2300 illustrated in FIG. 23 described further above, and assuming $V_{DD}$ is replaced by voltage doubler output $V_{OUT-D}$, programmable nonvolatile CNT switches R1 and R2 resistance values are adjusted as described further above and determine the output node 2330 voltage. In this example, the resistance values of NV CNT switches R1 and R2 are adjusted as described further above, such that on-chip programmable regulated voltage generator 2300 supplies a regulated reference voltage $V_{REF}$ that is equal to $V_{HI}$. In this example, based on the $V_{SET}$ and $V_{RESET}$ values shown in table 2700 illustrated in FIG. 27, $V_{HI}$ may be set at 2.5 V., for example, the higher of the two voltages.

Referring now to WRITE select section 4015 illustrated in FIG. 43, and a SET mode WRITE, the SET select line gate voltage may be chosen such that FETs $T_{WR0}$ and $T_{WR1}$ are in saturation, thereby limiting and controlling the voltage and current applied to bit lines BL[0] and BL[1], respectively. The current flow may additionally be controlled by the device dimensions of width and length (W/L ratio, for example). Referring now to table 2700 illustrated in FIG. 27, the $V_{SET}$ voltage range may be 1-1.5 volts. The SET select line gate voltage may be controlled by an on-chip programmable circuit, for example, on-chip programmable regulated voltage generator 2300 illustrated in FIG. 23 and described further above, such that the output of FETs $T_{WR0}$ and $T_{WR1}$ to bit lines BL[0] and BL[1], respectively, reduce the output $O_{VS}$ voltage from $V_{HI}$ to a bit line $V_{SET}$ voltage of 1.5 volts. Alternatively, if an NRAM chip SET voltage requirement is $V_{SET}$=1.2 volts, for example, then the SET select line gate voltage may be adjusted instead such that the output of FETs $T_{WR0}$ and $T_{WR1}$ to bit lines BL[0] and BL[1], reduces the output $O_{VS}$ voltage from $V_{HI}$ to a $V_{SET}$ voltage of 1.2 V.

Referring now to WRITE select section 4015 illustrated in FIG. 43, and a RESET mode WRITE, the RESET select line gate voltage may be chosen such that FETs $T_{WR0'}$ and $T_{WR1'}$ are in saturation, thereby limiting and controlling the voltage and current applied to source lines SL[0] and SL[1], respectively. The current flow may additionally be controlled by the device dimensions of width and length (W/L ratio, for example). Referring now to table 2700 illustrated in FIG. 27, the $V_{RESET}$ voltage range may be 2-2.5 volts. The RESET select line gate voltage may be controlled by an on-chip programmable circuit, for example, on-chip programmable regulated voltage generator 2300 illustrated in FIG. 23 and described further above, such that the output of FETs $T_{WR0'}$ and $T_{WR1'}$ to select lines SL[0] and SL[1], respectively, reduce the output $O_{VS'}$ voltage from $V_{HI}$ to a bit line $V_{RESET}$ voltage of 2.25 volts, for example.

Referring now to seventh (version 3) open architecture schematic 4300 illustrated in FIG. 43, a RESET circuit such as RESET circuit 3600 illustrated in FIG. 36 is not required because a RESET operation near the end of the READ cycle is not needed.

Figure 44A:
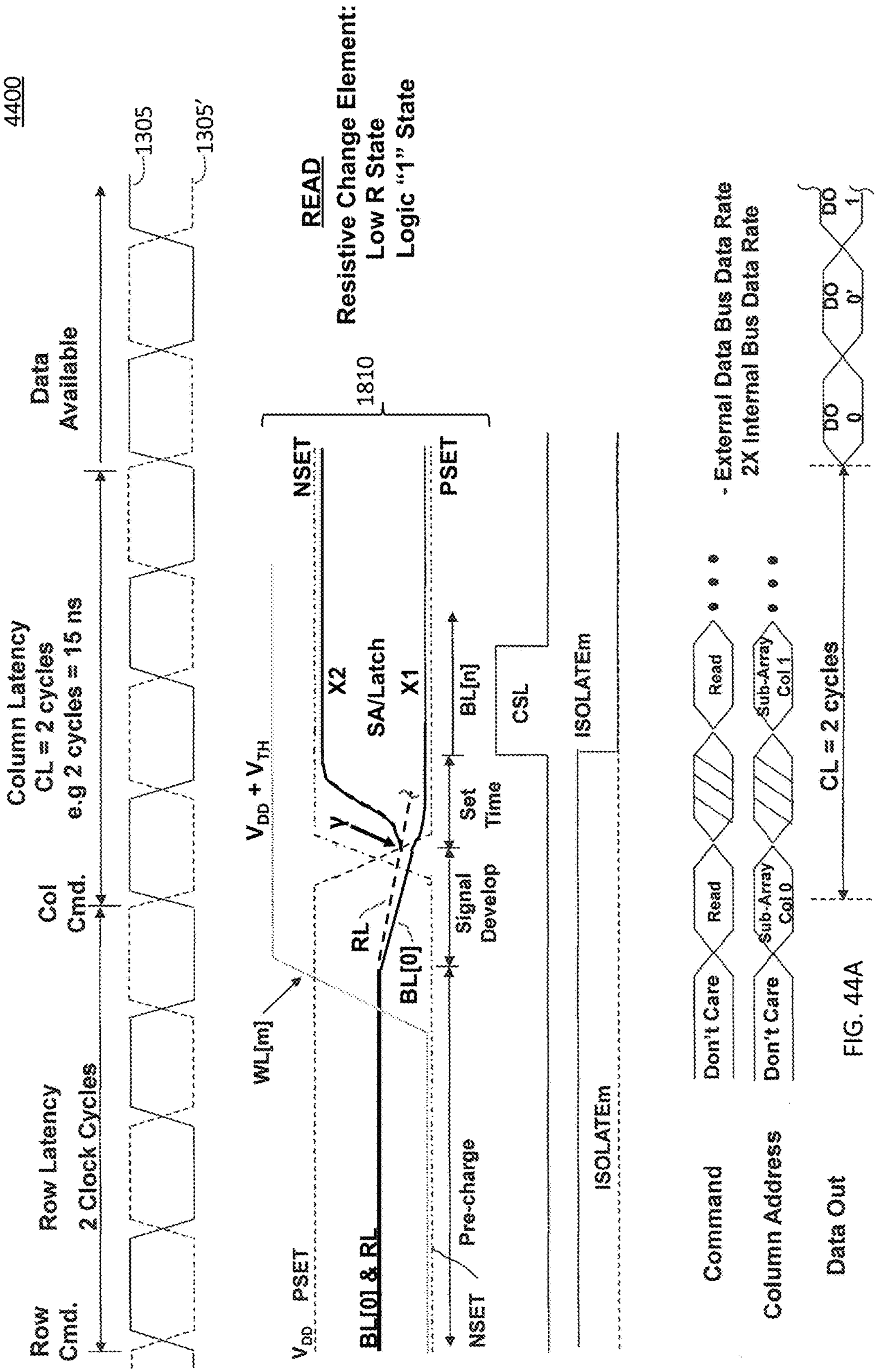
FIG. 44A is a waveform timing diagram illustrating an exemplary READ operation performed on a cell with a resistive change element in a low resistance state within an open resistive change memory array architecture of the seventh, v3 open architecture.

READ operations for BL[0] are performed with select line SL[0] at zero volts, without a RESET operation before the end of the READ cycle, as shown in READ timing diagram 4400 illustrated in FIG. 44A. READ timing diagram 4400 operations are the same as those described further above with respect to READ timing diagram 1800 illustrated in FIG. 18A, except that the waveform SL RESET is omitted.

Figure 44B:
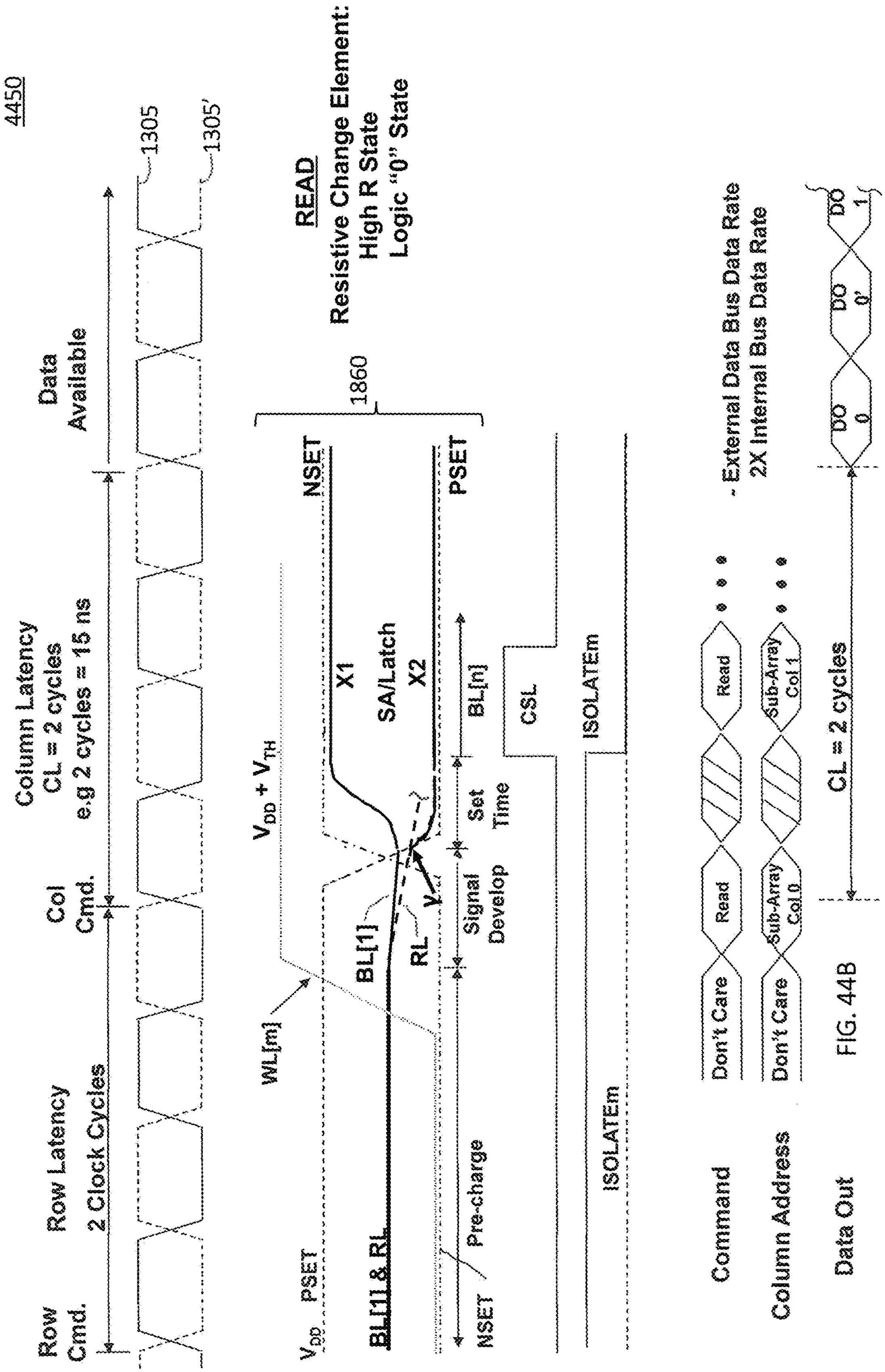
FIG. 44B is a waveform timing diagram illustrating an exemplary READ operation performed on a cell with a resistive change element in a high resistance state within an open resistive change memory array architecture of the seventh, v3 open architecture.

READ operations for BL[1] are performed with select line SL[1] at zero volts, without a RESET operation before the end of the READ cycle, as shown in READ timing diagram 4450 illustrated in FIG. 44B. READ timing diagram 4450 operations are the same as those described further above with respect to READ timing diagram 1850 illustrated in FIG. 18B, except that the waveform SL RESET is omitted.

With the elimination of RESET before the end of READ as illustrated in FIGS. 44A and 44B, the WRITE operation includes both SET and RESET modes as illustrated in WRITE timing diagram 4200 illustrated in FIG. 42. As shown in FIG. 42, during a SET WRITE operation, bit lines transition to a SET voltage $V_{SET}$ and corresponding select lines are at zero Volts. During a RESET WRITE operation, select lines transition to a RESET voltage $V_{RESET}$, and bit lines are at zero Volts. All other functions are as described further above with respect to WRITE timing diagram 1400 illustrated in FIG. 14.

Figure 45:
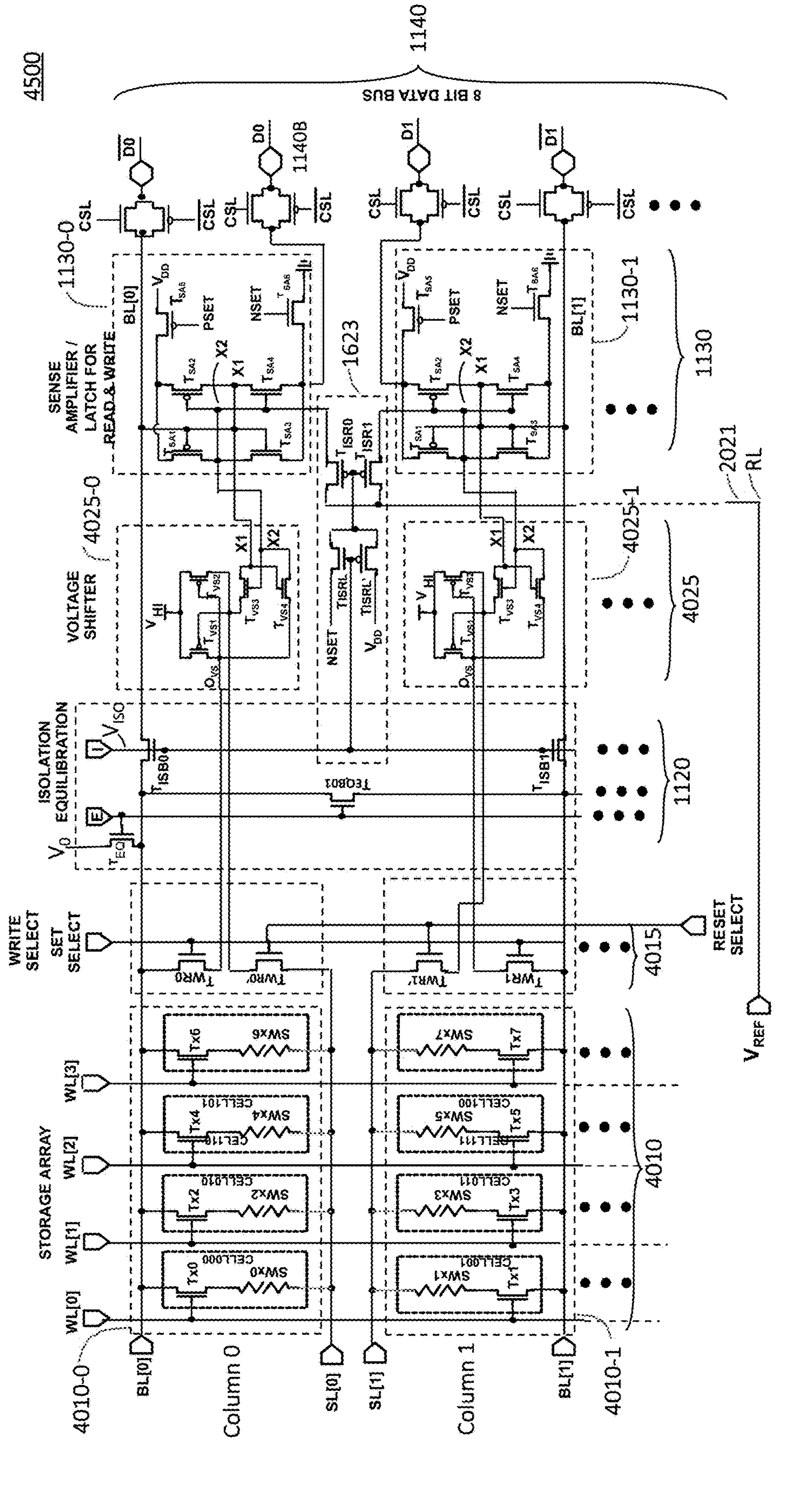
FIG. 45 is a simplified schematic of a DDR NRAM compatible seventh, v4 open architecture with an open resistive change memory array architecture, corresponding to the FIG. 29 cell, and no reference resistors. A reference voltage is connected to a single reference line (note that bit line columns are drawn horizontally to accommodate a subset of two independent bit lines, isolation devices, voltage shift circuits, and sense amplifier details) operating in a READ/WRITE mode.

Referring now to seventh (version 4) open architecture schematic 4500 shown in FIG. 45, corresponding to a plan view of cell and array layout 2900 shown in FIG. 29, and to sixth (version 4) open architecture schematic 3900 shown in FIG. 39, storage array section 4010 replaces storage array section 3510. Storage subarrays 4010-0 and 4010-1 replace storage subarrays 3510-0 and 3510-1, respectively.

Storage subarray 4010-0 and 4010-1 of storage array section 4010 illustrated in FIG. 45 are connected to bit lines BL[0] and BL[1], respectively, and to select lines SL[0] and SL[1], respectively. Corresponding storage subarrays 3510-0 and 3510-1 of storage array section 3510 illustrated in FIG. 39 are both also connected to BL[0] and BL[1], respectively, and to select lines SL[0] and SL[1], respectively. However, SL[0] and SL[1] of storage array section 4010 shown in FIG. 45 are connected to FETs controlled by a RESET select line in WRITE select section 4015 as described further below, while SL[0] and SL[1] of storage array section 3510 shown in FIG. 39 are connected to select line drivers 3683 and 3687, respectively, of RESET circuit 3600 shown in FIG. 36 as described further above.

Referring now to FIGS. 45 and 39, WRITE select section 4015 replaces WRITE select section 1115, respectively. WRITE select section 4015 includes FET $T_{WR0}$ with a first terminal connected to bit line bit line BL[0] and a second terminal connected to output $O_{VS}$ of voltage shifter 4025-0. A third terminal, a gate, is connected to a SET select line that is activated during WRITE operations. WRITE select section 4015 also includes FET $T_{WR1}$ with a first terminal connected to bit line bit line BL[1] and a second terminal connected to output $O_{VS}$ of voltage shifter 4025-1. A third terminal, a gate, is connected to the SET select line that is activated during WRITE operations. Both FETs $T_{WR0}$ and $T_{WR1}$, connected to the SET select line, are included in WRITE select section 4015 and correspond to FETs $T_{WR0}$ and $T_{WR1}$ included in WRITE select section 1115. FETs $T_{WR0}$ and $T_{WR1}$ in WRITE selection 1115 are connected to corresponding terminals as shown in FIG. 39 and perform the same function described further above. The SET select line shown in WRITE select section 4015 corresponds to the WRITE select line shown in WRITE select section 1115. Both perform the same SET operation during a WRITE operation.

In addition to FETs $T_{WR0}$ and $T_{WR1}$ connected to bit lines BL[0] and BL[1], respectively, and controlled by the SET select line, WRITE select section 4015 also includes FETs $T_{WR0'}$ and $T_{WR1'}$, each with a first terminal connected to select line SL[0] and SL[1], respectively, and a second terminal connected to output $O_{VS'}$ of voltage shifters 4025-0 and 4025-1, respectively. Outputs $O_{VS}$ and $O_{VS'}$ are complements of each other. That is, when one is at $V_{HI}$ the other is at zero Volts, and vice versa. Each of the FETs $T_{WR0'}$ and $T_{WR1'}$ have a third terminal, a gate, connected to the RESET select line.

Referring now to FIG. 45, seventh (version 4) open architecture schematic 4500 performs both SET and RESET operations with voltage shifter section 4025 providing outputs $O_{VS}$ and $O_{VS'}$ and WRITE select section 4015 enabling both SET and RESET operations. RESET circuit 3600 is not required.

During a WRITE operation, data bus section 1140 receives external input data pulses from data I/O buffer/driver 1567 as illustrated in block diagram 1500 illustrated in FIG. 15 and transmits the input data pulses to SA/latches 1130-0 and 1130-1, which are activated and receive and temporarily store the data as described further above. During a WRITE operation, voltage shifters 4025-0 and 4025-1, respectively, receive the SA/latch inputs. Voltage shifter 4025-0 output $O_{VS}$ drives bit line BL[0] and output $O_{VS'}$ drives select line SL[0] in storage subarray 4010-0 though FET devices $T_{WR0}$ and $T_{WR0'}$ of WRITE select section 4015. Voltage shifter 4025-1 output $O_{VS}$ drives bit line BL[1] and output $O_{VS'}$ drives select line SL[1] in storage subarray 4010-0 though FET devices $T_{WR1}$ and $T_{WR1'}$ of WRITE select section 4015.

Voltage shifters 4025-0 and 4025-1 are connected to an on-chip voltage of $V_{HI}$ generated from chip voltage $V_{DD}$ by DC voltage doubling (doubler) circuits. Voltage doubling circuits are well known in the electronics industry.

The required value of $V_{HI}$ may be determined for these examples by referring to table 2700 illustrated in FIG. 27. In this example, $V_{RESET}$ may be as high as 2.5 V. Therefore, $V_{HI}$ must be at least 2.5 V., and preferably higher, to accommodate programmable on-chip voltage regulation. Assuming a chip voltage $V_{DD}$=1V. for example and two DC voltage doubling circuits in series, each with 90% efficiency, the voltage double output $V_{OUT\_D}$ is approximately 3.6 V. (1.9×1.9 voltage multiplier). Referring now to on-chip programmable regulated voltage generator 2300 illustrated in FIG. 23 described further above, and assuming $V_{DD}$ is replaced by voltage doubler output $V_{OUT-D}$, programmable nonvolatile CNT switches R1 and R2 resistance values are adjusted as described further above and determine the output node 2330 voltage. In this example, the resistance values of NV CNT switches R1 and R2 are adjusted as described further above, such that on-chip programmable regulated voltage generator 2300 supplies a regulated reference voltage $V_{REF}$ that is equal to $V_{HI}$. In this example, based on the $V_{SET}$ and $V_{RESET}$ values shown in table 2700 illustrated in FIG. 27, $V_{HI}$ may be set at 2.5 V., for example, the higher of the two voltages.

Referring now to WRITE select section 4015 illustrated in FIG. 45, and a SET mode WRITE, the SET select line gate voltage may be chosen such that FETs $T_{WR0}$ and $T_{WR1}$ are in saturation, thereby limiting and controlling the voltage and current applied to bit lines BL[0] and BL[1], respectively. The current flow may additionally be controlled by the device dimensions of width and length (W/L ratio, for example). Referring now to table 2700 illustrated in FIG. 27, the $V_{SET}$ voltage range may be 1-1.5 volts. The SET select line gate voltage may be controlled by an on-chip programmable circuit, for example, on-chip programmable regulated voltage generator 2300 illustrated in FIG. 23 and described further above, such that the output of FETs $T_{WR0}$ and $T_{WR1}$ to bit lines BL[0] and BL[1], respectively, reduce the output $O_{VS}$ voltage from $V_{HI}$ to a bit line $V_{SET}$ voltage of 1.5 volts. Alternatively, if an NRAM chip SET voltage requirement is $V_{SET}$=1.2 volts, for example, then the SET select line gate voltage may be adjusted instead such that the output of FETs $T_{WR0}$ and $T_{WR1}$ to bit lines BL[0] and BL[1], reduces the output $O_{VS}$ voltage from $V_{HI}$ to a $V_{SET}$ voltage of 1.2 V.

Referring now to WRITE select section 4015 illustrated in FIG. 45, and a RESET mode WRITE, the RESET select line gate voltage may be chosen such that FETs $T_{WR0'}$ and $T_{WR1'}$ are in saturation, thereby limiting and controlling the voltage and current applied to source lines SL[0] and SL[1], respectively. The current flow may additionally be controlled by the device dimensions of width and length (W/L ratio, for example). Referring now to table 2700 illustrated in FIG. 27, the $V_{RESET}$ voltage range may be 2-2.5 volts. The RESET select line gate voltage may be controlled by an on-chip programmable circuit, for example, on-chip programmable regulated voltage generator 2300 illustrated in FIG. 23 and described further above, such that the output of FETs $T_{WR0'}$ and $T_{WR1'}$ to select lines SL[0] and SL[1], respectively, reduce the output $O_{VS'}$ voltage from $V_{HI}$ to a bit line $V_{RESET}$ voltage of 2.25 volts, for example.

Referring now to seventh (version 4) open architecture schematic 4500 illustrated in FIG. 45, a RESET circuit such as RESET circuit 3600 illustrated in FIG. 36 is not required because a RESET operation near the end of the READ cycle is not needed.

Figure 46A:
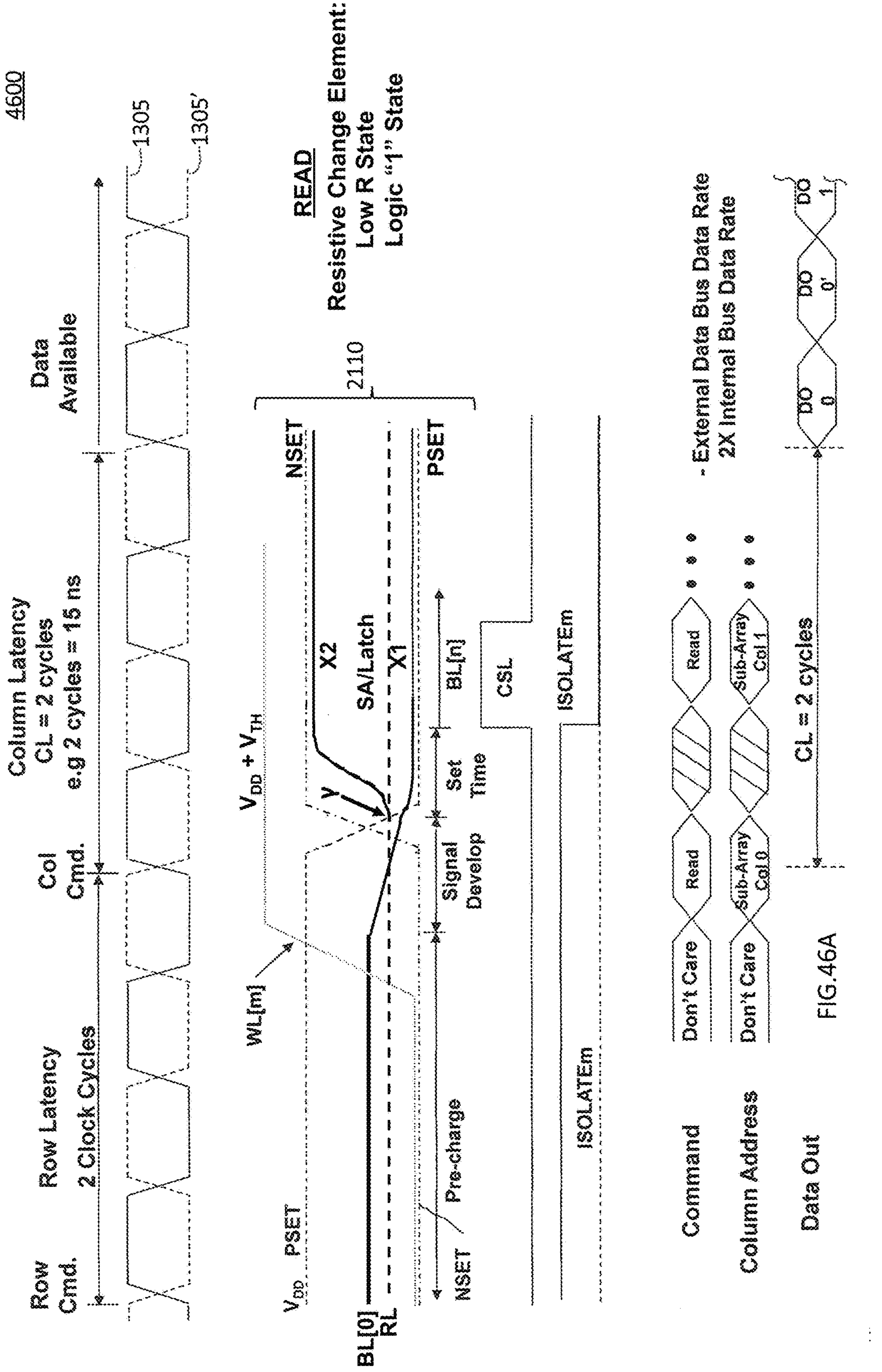
FIG. 46A is a waveform timing diagram illustrating an exemplary READ operation performed on a cell with a resistive change element in a low resistance state within an open resistive change memory array architecture of the seventh, v4 open architecture.

READ operations for BL[0] are performed with select line SL[0] at zero volts, without a RESET operation before the end of the READ cycle, as shown in READ timing diagram 4600 illustrated in FIG. 46A. READ timing diagram 4600 operations are the same as those described further above with respect to READ timing diagram 2100 illustrated in FIG. 21A, except that the waveform SL RESET is omitted.

Figure 46B:
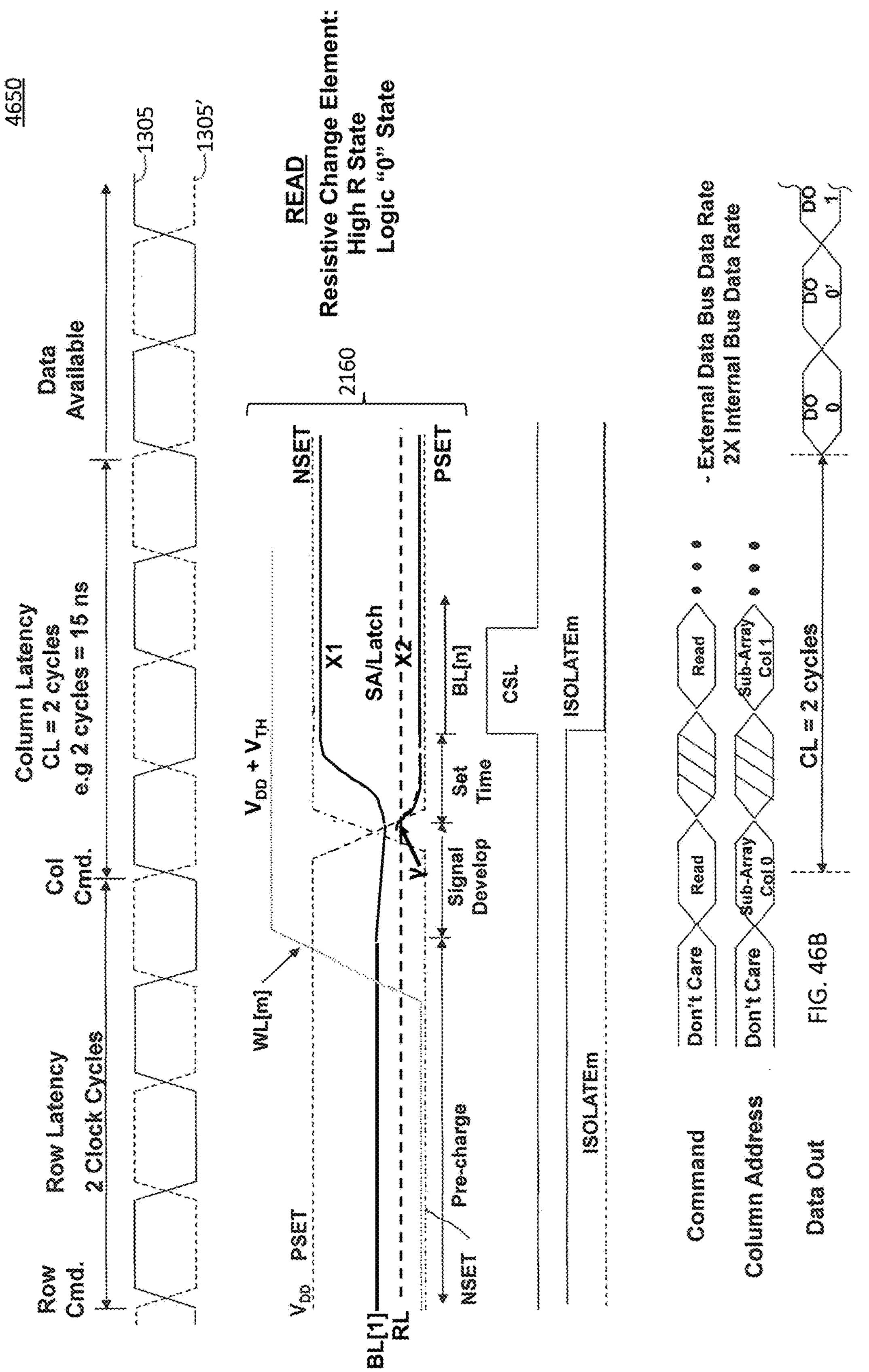
FIG. 46B is a waveform timing diagram illustrating an exemplary READ operation performed on a cell with a resistive change element in a high resistance state within an open resistive change memory array architecture of the seventh, v4 open architecture.

READ operations for BL[1] are performed with select line SL[1] at zero volts, without a RESET operation before the end of the READ cycle, as shown in READ timing diagram 4650 illustrated in FIG. 46B. READ timing diagram 4650 operations are the same as those described further above with respect to READ timing diagram 2150 illustrated in FIG. 21B, except that the waveform SL RESET is omitted.

With the elimination of RESET before the end of READ as illustrated in FIGS. 46A and 46B, the WRITE operation includes both SET and RESET modes as illustrated in WRITE timing diagram 4200 illustrated in FIG. 42. As shown in FIG. 42, during a SET WRITE operation, bit lines transition to a SET voltage $V_{SET}$ and corresponding select lines are at zero Volts. During a RESET WRITE operation, select lines transition to a RESET voltage $V_{RESET}$, and bit lines are at zero Volts. All other functions are as described further above with respect to WRITE timing diagram 1400 illustrated in FIG. 14.

Referring now to seventh (version 5), the open architecture schematic is the same as open architecture schematic 4500 shown in FIG. 45. READ operations are essentially the same as READ timing diagrams 4600 illustrated in FIGS. 46A and 46B, respectively. WRITE operations are essentially the same as timing diagram 4200 shown in FIG. 42. However, seventh (version 5) open architecture includes on-chip programmable regulated voltage generator 2300 illustrated in FIG. 23 and programmable SA/latch timing control circuit 2500 illustrated in FIG. 25, which also includes CNT switch-controlled latch circuits 2400 and 2450 shown in FIGS. 24A and 24B, respectively. Hence, seventh (version 5) open architecture schematic adds on-chip programmable reference voltage control and signal development time control to the seventh (version 4) open architecture described further above.

With respect to all versions of seventh open architecture schematics 4000, 4300, and 4500, described further above, RESET circuit 3600 is not required during the WRITE operation. However, RESET circuit 3600 may be included as an option. In this way, the seventh open architecture architectures described further above can be operated in at least these two modes.

In operation, for example, if bit line drivers 1375 and 1380 are in tristate with floating outputs and if select line drivers 3683 and 3687 are also in tristate, then there is no RESET before the end of the READ cycle, and the WRITE operation is as shown in WRITE timing diagram 4200 illustrated in FIG. 42.

Alternatively, in operation, for example, if RESET select lines in the respective seventh architecture schematics 4000, 4300, and 4500 are held at zero volts, and if RESET is performed before the end of the READ operation, then the WRITE operation is as shown in WRITE timing diagram 1400 illustrated in FIG. 14.

Eighth DDR Compatible Resistive Change Element Open Array Architecture

At this point in the specification, alternative open architecture schematics are described further below, by which READ and WRITE operations are changed.

Referring now to plan view of 1T, 1R NRAM cell and array layout 3200 illustrated in FIG. 32, the array architecture is changed. Bit lines BL and word lines WL are orthogonal. However, unlike all other architectures described further above, select lines SL and word lines WL are parallel, and therefore select lines SL are orthogonal to bit lines BL. The corresponding minimum cell area of $6F^2$, where F represents the minimum technology feature size, and referred to as cell #5, is substantially smaller than all other minimum cell areas as shown in table 3400 illustrated in FIG. 34. All open architecture schematics illustrated further below incorporate cell and array layout 3200, focusing on bit line data path architecture and various modes of operation. All modes of operation described further below are subsets of an eighth open array architecture.

Having select lines SL parallel to word lines WL facilitates WRITE operations because it enables a high-speed RESET operation of all bits along a selected word line by pulsing a corresponding select line SL with a voltage $V_{RESET}$. RESET operations can be performed at high speed, but require higher voltages (2-2.5 V.) than for a SET operation (1-1.5 V.) as shown in table 2700 illustrated in FIG. 27. However, as described further below, the higher RESET voltage does not appear across the terminals of cell select FETs, such as FET 3305 shown in FIG. 33. Hence, the highest voltage across the terminals of FET 3305 is the SET voltage. This WRITE mode of operation used in various schematics referred to as eighth open architecture schematics and described further below is referred to as a RESET-before-WRITE mode.

Figure 47:
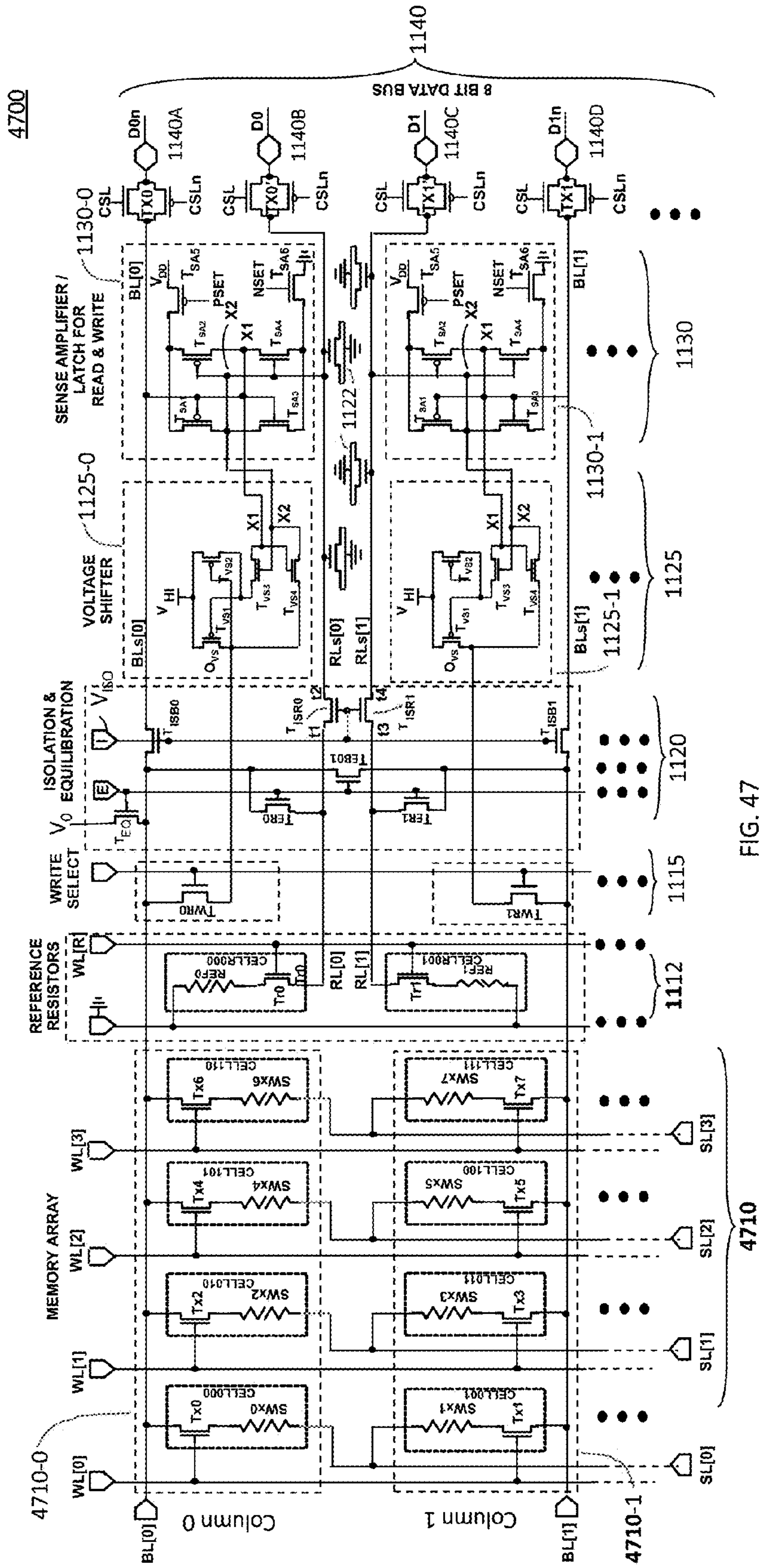
FIG. 47 is a simplified schematic of a DDR NRAM compatible eighth, v1open architecture with an open resistive change memory array architecture, corresponding to the FIG. 32 cell, that includes a reference resistor for each bit line (note that bit line columns are drawn horizontally to accommodate a subset of two independent bit lines, isolation devices, voltage shift circuits, and sense amplifier details) operating in a RESET before WRITE mode.

Referring now to eighth (version 1) open architecture schematic 4700 shown in FIG. 47, corresponding to a plan view of cell and array layout 3200 shown in FIG. 32, and to first open architecture schematic 1100 shown in FIG. 11, storage array section 4710 replaces storage array section 1110. Subarrays 4710-0 and 4710-1 replace subarrays 1110-0 and 1110-1, respectively.

Nonvolatile 1T,1R memory cell 2625 illustrated in FIG. 26 shows select line SL in contact with the top electrode TE of CNT block 2615, which forms a portion of NV CNT switch 2610. Hence, select line SL[0] is in contact with the top electrode TE of NV CNT switches SWx0 and SWx1 shown in storage subarray 4710-0 and 4710-1, respectively. Select line SL[1] is in contact with the top electrode TE of NV CNT switches SWx2 and SWx3 shown in storage subarray 4710-0 and 4710-1, respectively. Select line SL[2] is in contact with the top electrode TE of NV CNT switches SWx4 and SWx5 shown in storage subarray 4710-0 and 4710-1, respectively. Select line SL[3] is in contact with the top electrode TE of NV CNT switches SWx6 and SWx7 shown in storage subarray 4710-0 and 4710-1, respectively.

READ operations are performed with select lines SL, corresponding to selected word lines WL, at zero volts. Referring to eighth (version 1) open architecture schematic 4700 illustrated in FIG. 47, if word line WL[0] is selected, then cell select devices $T_{X0}$, and $T_{X1}$, connected to bit lines BL[0] and BL[1], respectively, are ON. Select line SL[0], corresponding to word line WL[0], is at zero volts. Hence, pre-charged bit lines BL[0] and BL[1] discharge through nonvolatile resistive change elements (corresponding to NV CNT switches, in this example) SWx0 and SWx1, respectively, to SL[0], which is at zero volts. A low or high resistance state, $R_{LO}$ or $R_{HI}$, respectively, of each nonvolatile resistive change element is sensed by SA/latches 1130-0 and 1130-1, respectively, and temporarily stored as a corresponding logic state as described further above.

Whenever a row address selects a word line, a corresponding select line can also be activated. In a READ operation, if word line WL[1] is selected, cell select devices $T_{X2}$ and $T_{X3}$ are turned ON, select line SL[1] is grounded (zero volts), and pre-charged bit lines BL[0] and BL[1] are discharged through nonvolatile resistive change elements SWx2 and SWx3, respectively, and the resistance state of SWx2 and SWx3 are temporarily stored as corresponding logic states by SA/latches 1130-0 and 1130-1, respectively, as described further above.

In a READ operation, if word line WL[2] is selected, cell select devices $T_{X4}$ and $T_{X5}$ are turned ON, select line SL[2] is grounded (zero volts), and pre-charged bit lines BL[0] and BL[1] are discharged through nonvolatile resistive change elements SWx4 and SWx5, respectively, and the resistance state of SWx4 and SWx5 are temporarily stored as corresponding logic states by SA/latches 1130-0 and 1130-1, respectively, as described further above.

In a READ operation, if word line WL[3] is selected, cell select devices $T_{X6}$ and $T_{X7}$ are turned ON, select line SL[3] is grounded (zero volts), and pre-charged bit lines BL[0] and BL[1] are discharged through nonvolatile resistive change elements SWx6 and SWx7, respectively, and the resistance state of SWx6 and SWx7 are temporarily stored as corresponding logic states by SA/latches 1130-0 and 1130-1, respectively, as described further above.

Figure 49A:
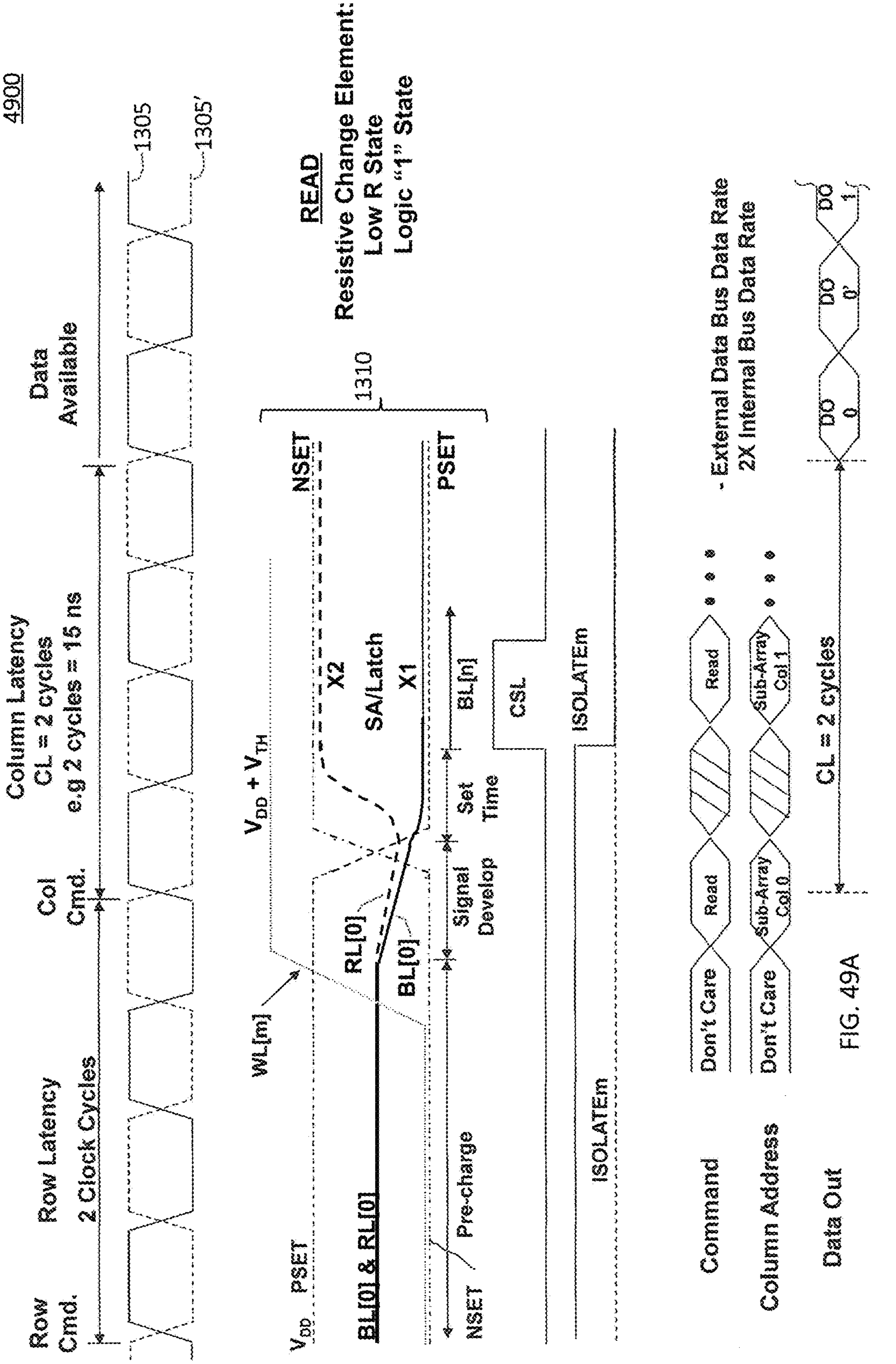
FIG. 49A is a waveform timing diagram illustrating an exemplary READ operation performed on a cell with a resistive change element in a low resistance state within an open resistive change memory array architecture of the eighth, v1 open architecture.

Referring now to FIG. 49A, READ timing diagram 4900 shows a READ operation for bit line BL[0], with word line WL[0] activated and corresponding select line SL[0] at zero volts as described further above. READ timing diagram 4900 operations are the same as those described further above with respect to READ timing diagram 1300 illustrated in FIG. 13A, except that the waveform SL RESET is omitted because eighth (version 1) open architecture schematic 4700 is operated in a RESET-before-WRITE mode.

Figure 49B:
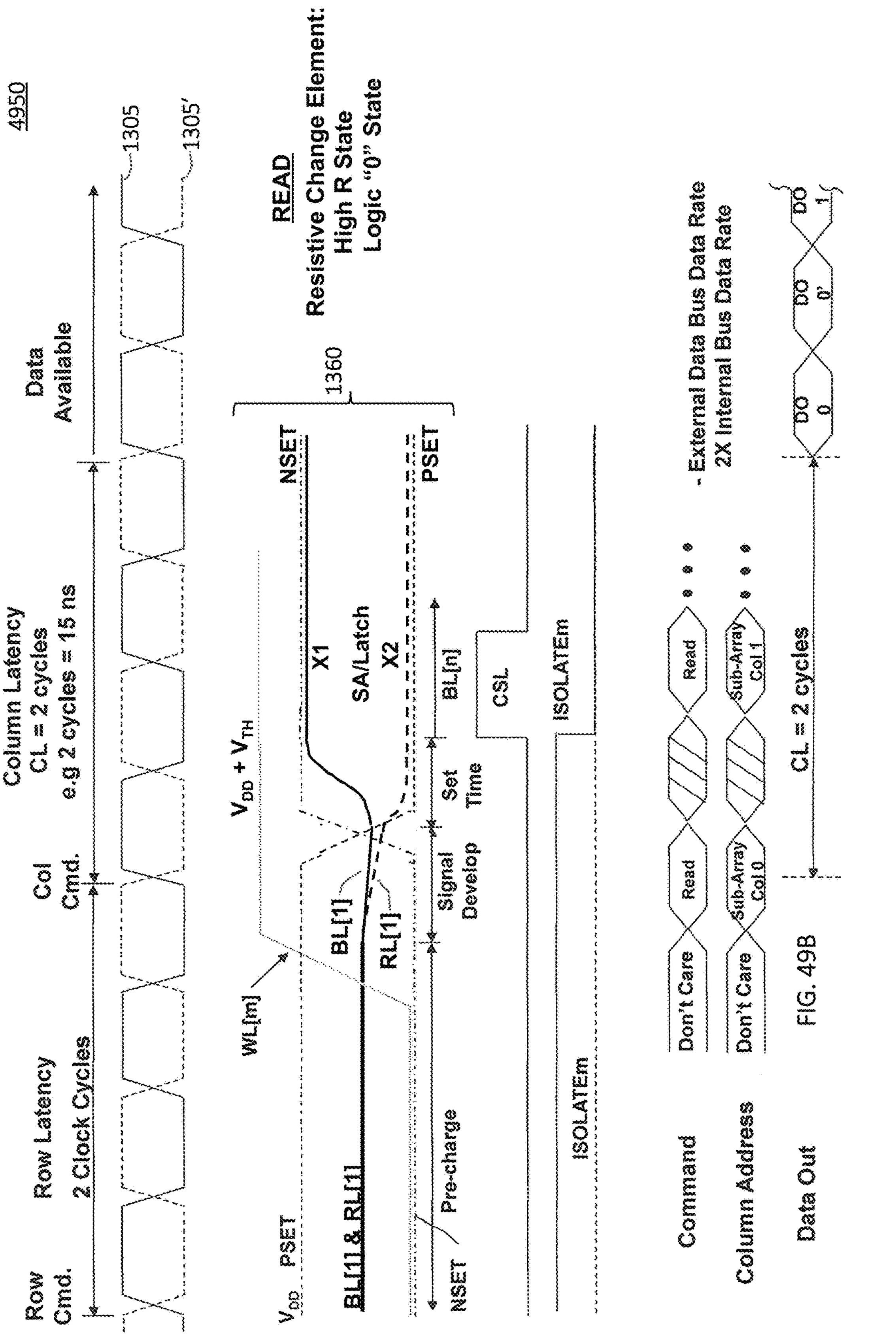
FIG. 49B is a waveform timing diagram illustrating an exemplary READ operation performed on a cell with a resistive change element in a high resistance state within an open resistive change memory array architecture of the eighth, v1 open architecture.

Referring now to FIG. 49B, READ timing diagram 4950 shows a READ operation for bit line BL[1], with word line WL[0] activated and corresponding select line SL[0] at zero volts as described further above. READ timing diagram 4950 operations are the same as those described further above with respect to READ timing diagram 1350 illustrated in FIG. 13B, except that the waveform SL RESET is omitted because eighth (version 1) open architecture schematic 4700 is operated in a RESET-before-WRITE mode.

Referring now to eighth (version 1) open architecture schematic 4700 illustrated in FIG. 47, storage array section 4710 and storage subarrays 4710-0 and 4710-1, READ operations for BL[0] with word line WL[1] activated and SL[1] grounded; READ operations for BL[0] with WL[2] activated and SL[2] grounded; and READ operations for BL[0] with WL[3] activated and SL[3] grounded, have the same timing diagram as READ timing diagram 4900 illustrated in FIG. 49A.

Referring now to eighth (version 1) open architecture schematic 4700 illustrated in FIG. 47, storage array section 4710 and storage subarrays 4710-0 and 4710-1, READ operations for BL[1] with word line WL[1] activated and SL[1] grounded; READ operations for BL[1] with WL[2] activated and SL[2] grounded; and READ operations for BL[1] with WL[3] activated and SL[3] grounded, have the same timing diagram as READ timing diagram 4950 illustrated in FIG. 49B.

Figure 50:
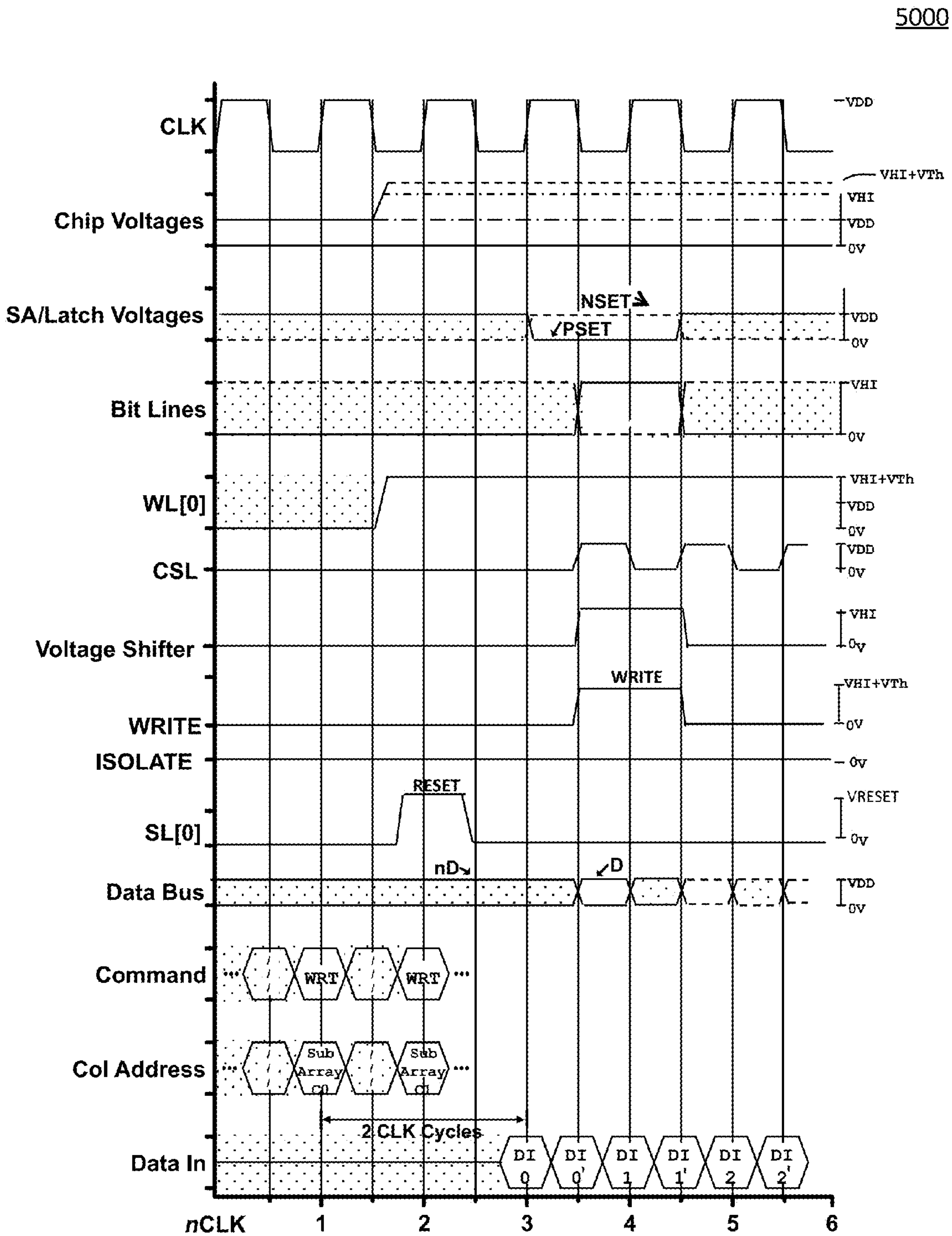
FIG. 50 is a waveform timing diagram illustrating an exemplary WRITE operation performed on a cell with a resistive change element within an open resistive change memory array architecture of the eighth open architecture.

Referring now to FIG. 50, WRITE timing diagram 5000 illustrates a RESET-before-WRITE operation. In this example, bit line BL[0], bit line BL[1], and other bit lines intersecting word line WL[0] are held at zero volts at the beginning of the WRITE cycle as described with respect to FIG. 48 further below. Isolation and equilibration section 1120 devices are in an OFF state. WRITE select section 1115 devices are in an OFF state during the RESET operation described further below. Selected word line WL[0] is activated and remains activated until completion of WRITE operations. Corresponding select line SL[0] is pulsed as soon as WL[0] is activated as shown in WRITE timing diagram 5000 illustrated in FIG. 50 and as described with respect to FIG. 48 further below. With select line SL[0] transitioning to $V_{RESET}$ voltage, all nonvolatile resistive change elements (NV CNT switches, for example) connected to select line SL[0] are RESET from a low to a high resistance state, or remain in a high resistance state. While a single $V_{RESET}$ pulse is shown in FIG. 50, multiple SELECT pulses may be used. Referring to FIG. 47, nonvolatile resistive change elements SWx0 and SWx1 are in a high resistance state $R_{HI}$ after the RESET operation.

While described with respect to selected word line WL[0] and corresponding select line SL[0], WRITE timing diagram 5000 illustrated in FIG. 50 also applies to word line WL[1] and corresponding select line SL[1]; word line WL[2] and corresponding select line SL[2]; and word line WL[3] and corresponding select line SL[3].

Assuming word line WL[0] remains selected and corresponding select line SL[0] has transitioned to zero volts, then after the completion of the RESET-before-WRITE operation at the beginning of the WRITE cycle, the WRITE select line shown in WRITE select section 1115 is pulsed, FET $T_{WR0}$ and FET $T_{WR1}$ are turned ON. Voltage shifter 1125-0 output $O_{VS}$ transmits WRITE data through FET $T_{WR0}$ to bit line BL[0] and nonvolatile resistive change element SWx0 to select line SL[0], which is at zero Volts. Also, voltage shifter 1125-1 output $O_{VS}$ transmits WRITE data through FET $T_{WR1}$ to bit line BL[1] and nonvolatile change element SWx1 to select line SL[0], which is at zero Volts. Because of the RESET-before-WRITE operation described further above, nonvolatile resistive change elements SWx0 and SWx1 are already both in a RESET high resistance state, and the WRITE operation is a SET operation. Referring now to table 2700 illustrated in FIG. 27, SET pulses are in the range of 1-1.5 volts.

Assuming $V_{SET}$=1.25 V., and assuming that switch SWx0 connected to BL[0] is to be switched to a low resistance $R_{LO}$ state and that switch SWx1 connected to BL[1] is to remain in a high resistance $R_{HI}$ state, then voltage shifter 1125-0 output $O_{VS}$ transmits a $V_{SET}$ voltage of 1.25 volts to bit line BL[0] causing switch SWx0 to transition from $R_{HI}$ to $R_{LO}$, and voltage shifter 1125-1 $O_{VS}$ transmits zero volts to bit line BL[1] causing switch SWx1 to remain in a high resistance state $R_{HI}$ as illustrated in FIG. 50.

All other functions in WRITE timing diagram 5000 illustrated in FIG. 50 are as described further above with respect to WRITE timing diagram 1400 illustrated in FIG. 14.

Figure 48:
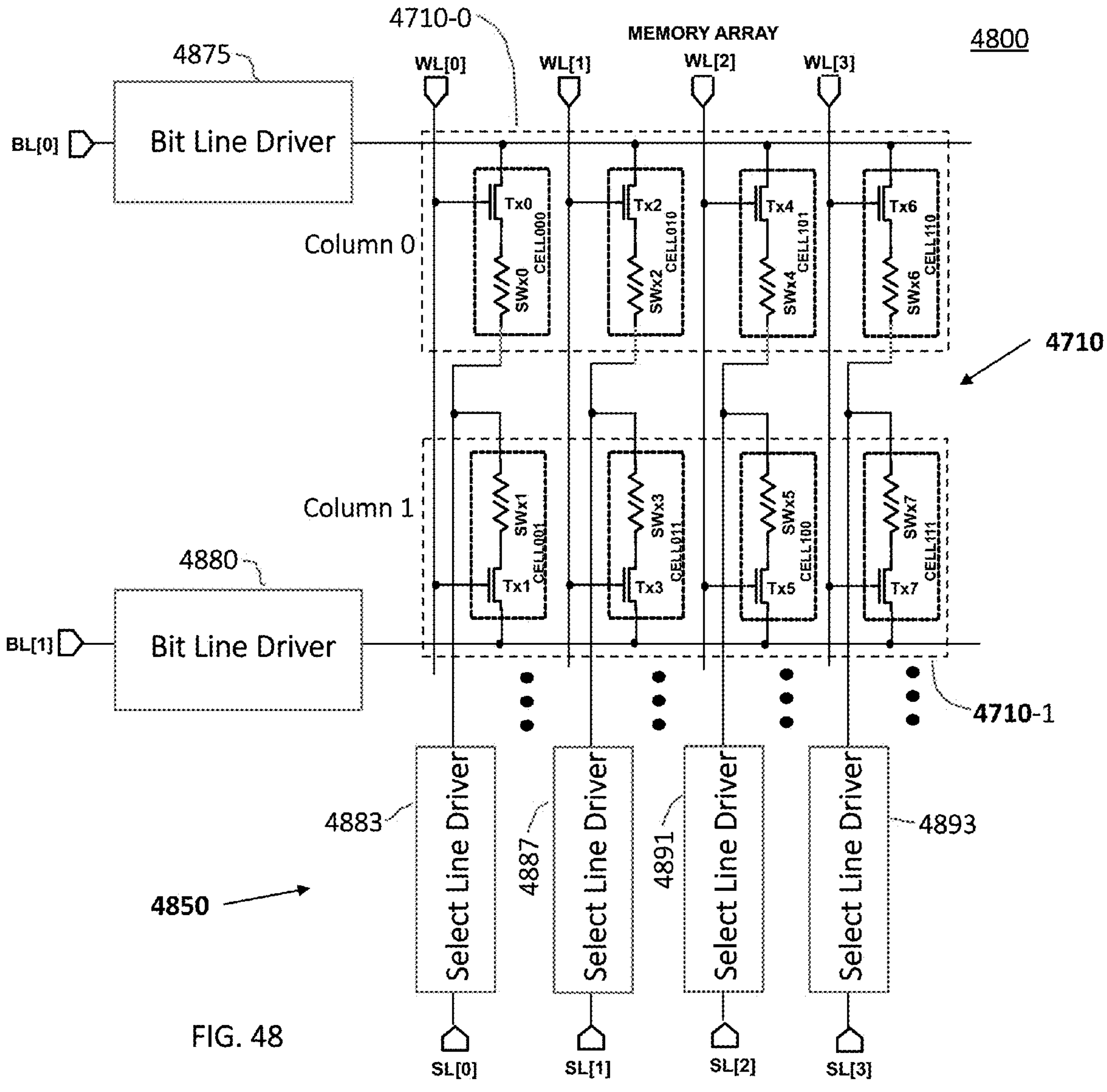
FIG. 48 is a simplified schematic of a RESET circuit with word lines, bit line drivers, and select line drivers.

Referring now to RESET circuit 4800 illustrated in FIG. 48 and comparing with eighth (version 1) open architecture schematic 4700 illustrated in FIG. 47 and storage array section 4710 storage subarrays 4710-0 and 4710-1, bit line drivers 4875 and 4880 are added to bit lines BL[0] and BL[1], respectively, and select line drivers 4850 which include select line drivers 4783, 4887, 4891, and 4893 are added to select lines SL[0], SL[1], SL[2], and SL[3], respectively. The output of each of these drivers may be in tristate, at zero volts, or performing a WRITE operation, in this example, a RESET operation.

In this example, if word line WL[0] is high, cell select transistors Tx0 and Tx1 are ON, if select line driver 4883 applies $V_{RESET}$ voltage to select line SL[0], and bit line drivers 4875 and 4880 are set to zero volts, then nonvolatile resist change elements SWx0 and SWx1 switch from low resistance $R_{LO}$ to high resistance $R_{HI}$ or remain in a high resistance state $R_{HI}$. Select line drivers 4887, 4891, and 4893 may be at zero volts or tristated.

In this example, if word line WL[1] is high, cell select transistors Tx2 and Tx3 are ON, if select line driver 4887 applies $V_{RESET}$ voltage to select line SL[1], and bit line drivers 4875 and 4880 are set to zero volts, then nonvolatile resist change elements SWx2 and SWx3 switch from low resistance $R_{LO}$ to high resistance $R_{HI}$ or remain in a high resistance state $R_{HI}$. Select line drivers 4883, 4891, and 4893 may be at zero volts or tristated.

In this example, if word line WL[2] is high, cell select transistors Tx4 and Tx5 are ON, if select line driver 4891 applies $V_{RESET}$ voltage to select line SL[2], and bit line drivers 4875 and 4880 are set to zero volts, then nonvolatile resist change elements SWx4 and SWx5 switch from low resistance $R_{LO}$ to high resistance $R_{HI}$ or remain in a high resistance state $R_{HI}$. Select line drivers 4883, 4887, and 4893 may be at zero volts or tristated.

In this example, if word line WL[3] is high, cell select transistors Tx6 and Tx7 are ON, if select line driver 4893 applies $V_{RESET}$ voltage to select line SL[3], and bit line drivers 4875 and 4880 are set to zero volts, then nonvolatile resist change elements SWx6 and SWx7 switch from low resistance $R_{LO}$ to high resistance $R_{HI}$ or remain in a high resistance state $R_{HI}$. Select line drivers 4883, 4887, and 4891 may be at zero volts or tristated.

Figure 51:
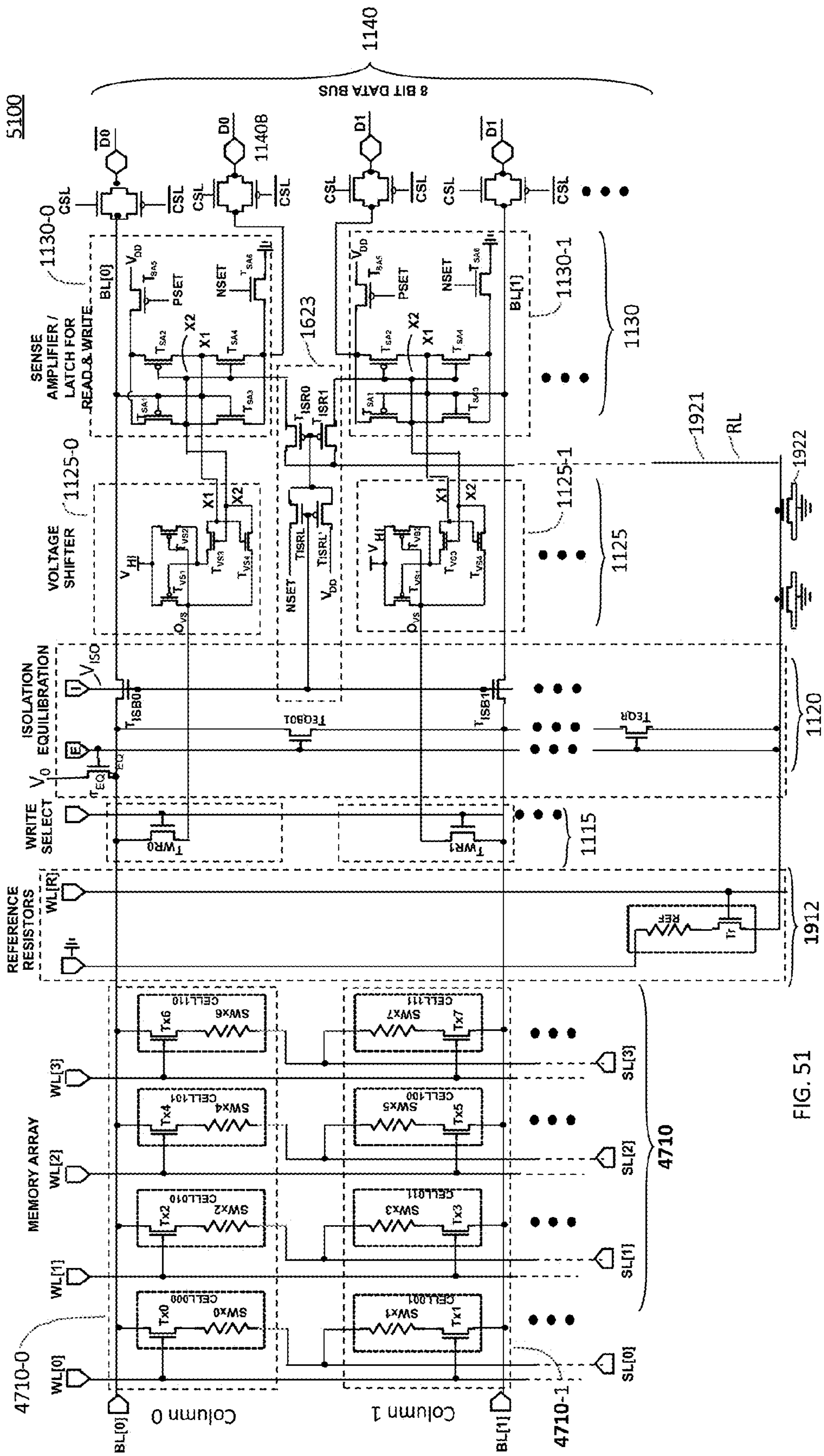
FIG. 51 is a simplified schematic of a DDR NRAM compatible eighth, v3 open architecture with an open resistive change memory array architecture, corresponding to the FIG. 32 cell, that includes a single reference resistor for all word lines connected to a single reference line (note that bit line columns are drawn horizontally to accommodate a subset of two independent bit lines, isolation devices, voltage shift circuits, and sense amplifier details) operating in a RESET before WRITE mode.

Referring now to eighth (version 3) open architecture schematic 5100 shown in FIG. 51, corresponding to a plan view of cell and array layout 3200 shown in FIG. 32, and to sixth (version 3) open architecture schematic 3800 shown in FIG. 38, storage array section 4710 replaces storage array section 3510. Storage subarrays 4710-0 and 4710-1 replace storage subarrays 3510-0 and 3510-1, respectively.

Referring now to sixth (version 3) open architecture schematic 3800 with a one reference resistor and sixth (version 2) open architecture schematic 3700 with one reference resistor per word line, versions 3 and 2 have the same operating characteristics. Hence, only a seventh (version 3) open architecture schematic 5100 is shown.

Nonvolatile 1T,1R memory cell 2625 illustrated in FIG. 26 shows select line SL in contact with the top electrode TE of CNT block 2615, which forms a portion of NV CNT switch 2610. Hence, select line SL[0] is in contact with the top electrode TE of NV CNT switches SWx0 and SWx1 shown in storage subarray 4710-0 and 4710-1, respectively. Select line SL[1] is in contact with the top electrode TE of NV CNT switches SWx2 and SWx3 shown in storage subarray 4710-0 and 4710-1, respectively. Select line SL[2] is in contact with the top electrode TE of NV CNT switches SWx4 and SWx5 shown in storage subarray 4710-0 and 4710-1, respectively. Select line SL[3] is in contact with the top electrode TE of NV CNT switches SWx6 and SWx7 shown in storage subarray 4710-0 and 4710-1, respectively.

READ operations are performed with select lines SL, corresponding to selected word lines WL, at zero volts. Referring to eighth (version 3) open architecture schematic 5100 illustrated in FIG. 51, if word line WL[0] is selected, then cell select devices $T_{X0}$, and $T_{X1}$, connected to bit lines BL[0] and BL[1], respectively, are ON. Select line SL[0], corresponding to word line WL[0], is at zero volts. Hence, pre-charged bit lines BL[0] and BL[1] discharge through nonvolatile resistive change elements (corresponding to NV CNT switches, in this example) SWx0 and SWx1, respectively, to SL[0], which is at zero volts. A low or high resistance state, $R_{LO}$ or $R_{HI}$, respectively, of each nonvolatile resistive change element is sensed by SA/latches 1130-0 and 1130-1, respectively, and temporarily stored as a corresponding logic state as described further above.

Whenever a row address selects a word line, a corresponding select line can also be activated. In a READ operation, if word line WL[1] is selected, cell select devices $T_{X2}$ and $T_{X3}$ are turned ON, select line SL[1] is grounded (zero volts), and pre-charged bit lines BL[0] and BL[1] are discharged through nonvolatile resistive change elements SWx2 and SWx3, respectively, and the resistance state of SWx2 and SWx3 are temporarily stored as corresponding logic states by SA/latches 1130-0 and 1130-1, respectively, as described further above.

In a READ operation, if word line WL[2] is selected, cell select devices $T_{X4}$ and $T_{X5}$ are turned ON, select line SL[2] is grounded (zero volts), and pre-charged bit lines BL[0] and BL[1] are discharged through nonvolatile resistive change elements SWx4 and SWx5, respectively, and the resistance state of SWx4 and SWx5 are temporarily stored as corresponding logic states by SA/latches 1130-0 and 1130-1, respectively, as described further above.

In a READ operation, if word line WL[3] is selected, cell select devices $T_{X6}$ and $T_{X7}$ are turned ON, select line SL[3] is grounded (zero volts), and pre-charged bit lines BL[0] and BL[1] are discharged through nonvolatile resistive change elements SWx6 and SWx7, respectively, and the resistance state of SWx6 and SWx7 are temporarily stored as corresponding logic states by SA/latches 1130-0 and 1130-1, respectively, as described further above.

Figure 52A:
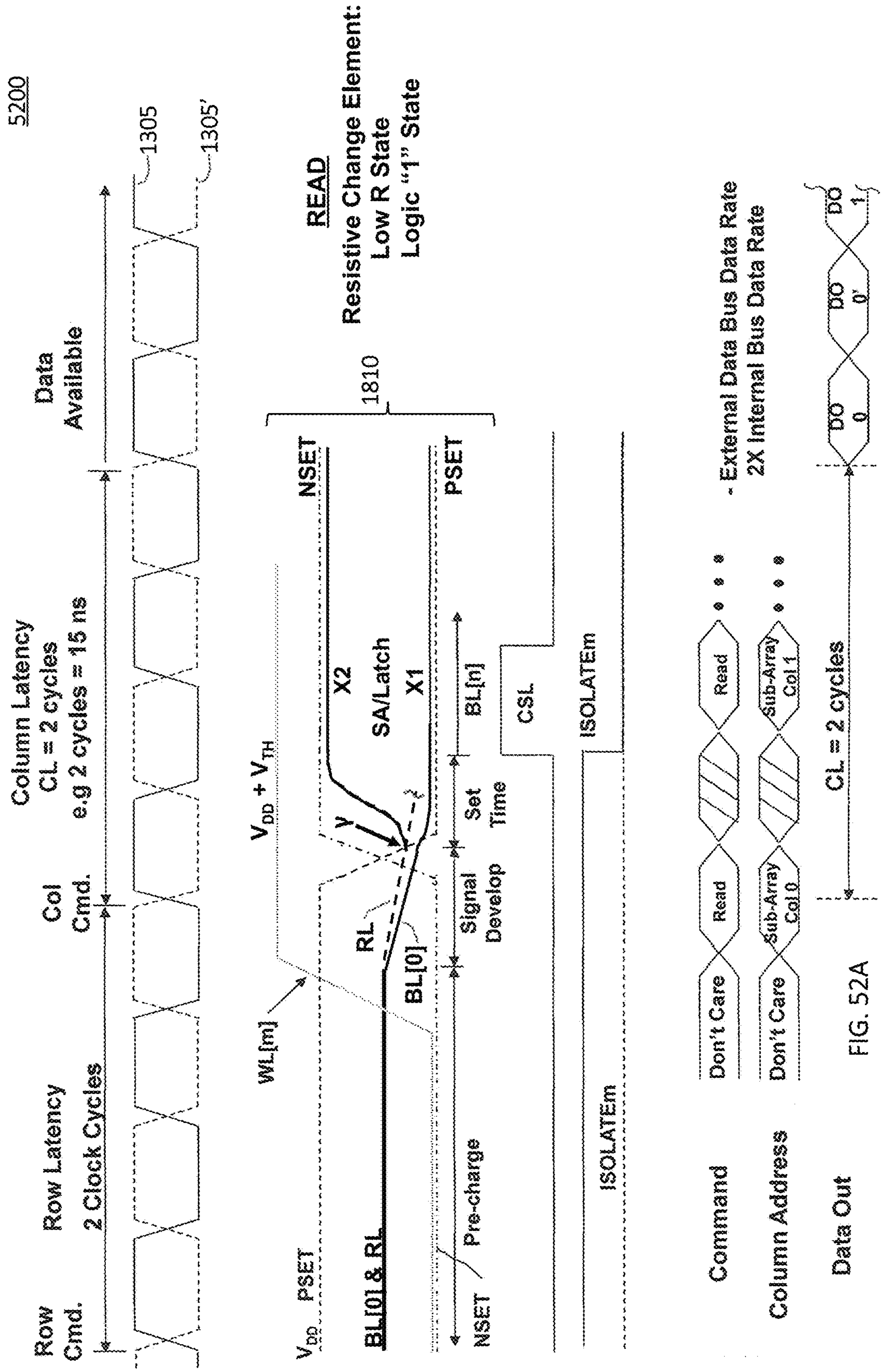
FIG. 52A is a waveform timing diagram illustrating an exemplary READ operation performed on a cell with a resistive change element in a low resistance state within an open resistive change memory array architecture of the eighth, v3 open architecture.

Referring now to FIG. 52A, READ timing diagram 5200 shows a READ operation for bit line BL[0], with word line WL[0] activated and corresponding select line SL[0] at zero volts as described further above. READ timing diagram 5200 operations are the same as those described further above with respect to READ timing diagram 1300 illustrated in FIG. 13A, except that the waveform SL RESET is omitted because eighth (version 3) open architecture schematic 5100 is operated in a RESET-before-WRITE mode.

Figure 52B:
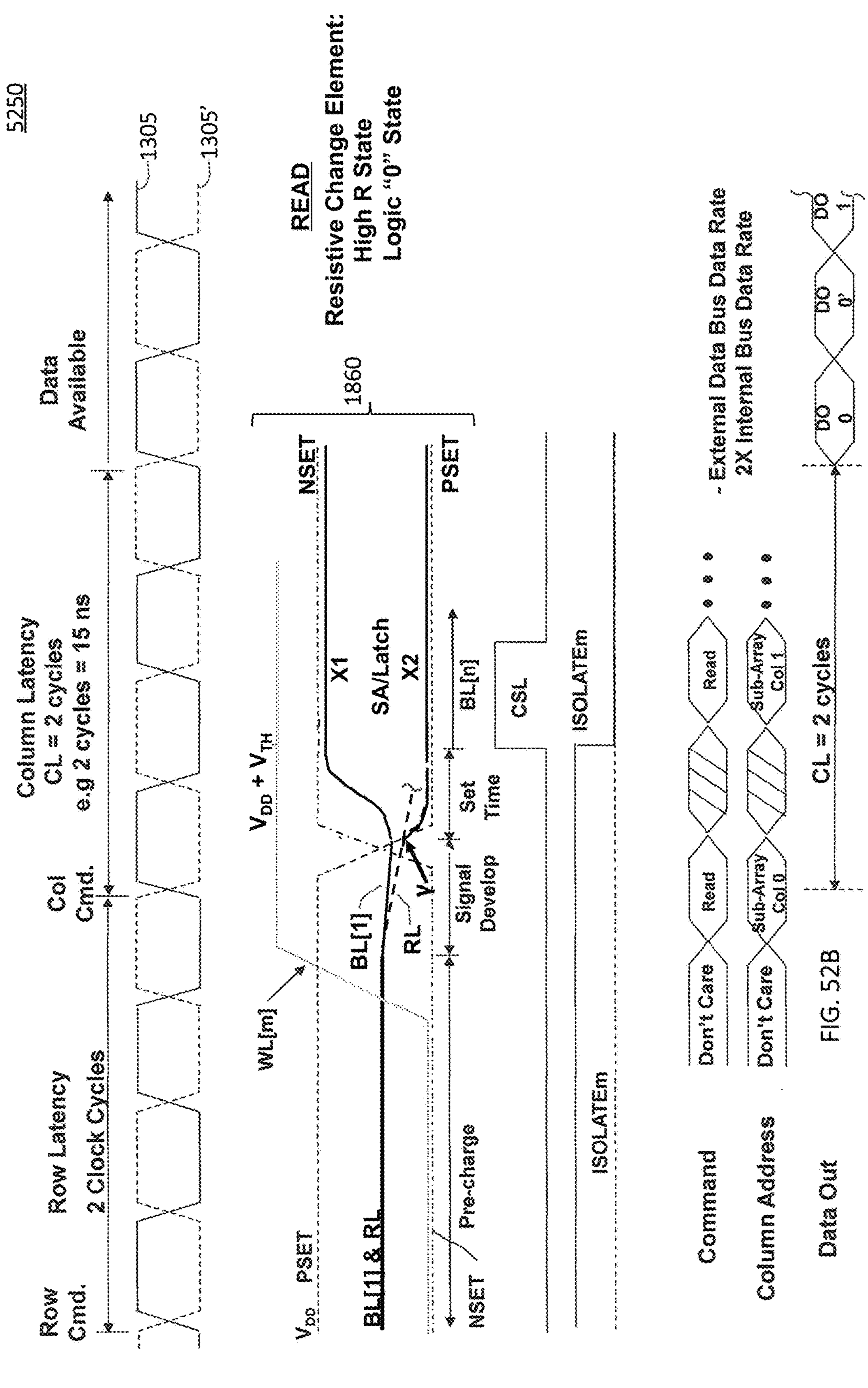
FIG. 52B is a waveform timing diagram illustrating an exemplary READ operation performed on a cell with a resistive change element in a high resistance state within an open resistive change memory array architecture of the eight, v3 open architecture.

Referring now to FIG. 52B, READ timing diagram 5250 shows a READ operation for bit line BL[1], with word line WL[0] activated and corresponding select line SL[0] at zero volts as described further above. READ timing diagram 5250 operations are the same as those described further above with respect to READ timing diagram 1350 illustrated in FIG. 13B, except that the waveform SL RESET is omitted because eighth (version 3) open architecture schematic 5100 is operated in a RESET-before-WRITE mode.

Referring now to eighth (version 3) open architecture schematic 5100 illustrated in FIG. 51, storage array section 4710 and storage subarrays 4710-0 and 4710-1, READ operations for BL[0] with word line WL[1] activated and SL[1] grounded; READ operations for BL[0] with WL[2] activated and SL[2] grounded; and READ operations for BL[0] with WL[3] activated and SL[3] grounded, have the same timing diagram as READ timing diagram 5200 illustrated in FIG. 52A.

Referring now to eighth (version 3) open architecture schematic 5100 illustrated in FIG. 51, storage array section 4710 and storage subarrays 4710-0 and 4710-1, READ operations for BL[1] with word line WL[1] activated and SL[1] grounded; READ operations for BL[1] with WL[2] activated and SL[2] grounded; and READ operations for BL[1] with WL[3] activated and SL[3] grounded, have the same timing diagram as READ timing diagram 5250 illustrated in FIG. 52B.

Eighth (version 3) open architecture schematic 5100 has the same WRITE timing diagram 5000 illustrated in FIG. 50. Referring now to FIG. 50, WRITE timing diagram 5000 illustrates a RESET-before-WRITE operation. In this example, bit line BL[0], bit line BL[1], and other bit lines intersecting word line WL[0] are held at zero volts at the beginning of the WRITE cycle as described with respect to FIG. 48 further below. Isolation and equilibration section 1120 devices are in an OFF state. WRITE select section 1115 devices are in an OFF state during the RESET operation described further below. Selected word line WL[0] is activated and remains activated until completion of WRITE operations. Corresponding select line SL[0] is pulsed as soon as WL[0] is activated as shown in WRITE timing diagram 5000 illustrated in FIG. 50 and as described with respect to FIG. 48 further below. With select line SL[0] transitioning to $V_{RESET}$ voltage, all nonvolatile resistive change elements (NV CNT switches, for example) connected to select line SL[0] are RESET from a low to a high resistance state, or remain in a high resistance state. While a single $V_{RESET}$ pulse is shown in FIG. 50, multiple SELECT pulses may be used. Referring to FIG. 51, nonvolatile resistive change elements SWx0 and SWx1 are in a high resistance state $R_{HI}$ after the RESET operation.

While described with respect to selected word line WL[0] and corresponding select line SL[0], WRITE timing diagram 5000 illustrated in FIG. 50 also applies to word line WL[1] and corresponding select line SL[1]; word line WL[2] and corresponding select line SL[2]; and word line WL[3] and corresponding select line SL[3].

Assuming word line WL[0] remains selected and corresponding select line SL[0] has transitioned to zero volts, then after the completion of the RESET-before-WRITE operation at the beginning of the WRITE cycle, the WRITE select line shown in WRITE select section 1115 is pulsed, FET $T_{WR0}$ and FET $T_{WR1}$ are turned ON. Voltage shifter 1125-0 output $O_{VS}$ transmits WRITE data through FET $T_{WR0}$ to bit line BL[0] and nonvolatile resistive change element SWx0 to select line SL[0], which is at zero Volts. Also, voltage shifter 1125-1 output $O_{VS}$ transmits WRITE data through FET $T_{WR1}$ to bit line BL[1] and nonvolatile change element SWx1 to select line SL[0], which is at zero Volts. Because of the RESET-before-WRITE operation described further above, nonvolatile resistive change elements SWx0 and SWx1 are both in a RESET high resistance state. Referring now to table 2700 illustrated in FIG. 27, SET pulses are in the range of 1-1.5 volts.

Assuming $V_{SET}$=1.25 V., and assuming that switch SWx0 connected to BL[0] is to be switched to a low resistance $R_{LO}$ state and that switch SWx1 connected to BL[1] is to remain in a high resistance $R_{HI}$ state, then voltage shifter 1125-0 output $O_{VS}$ transmits a $V_{SET}$ voltage of 1.25 volts to bit line BL[0] causing switch SWx0 to transition from $R_{HI}$ to $R_{LO}$, and voltage shifter 1125-1 $O_{VS}$ transmits zero volts to bit line BL[1] causing switch SWx1 to remain in a high resistance state $R_{HI}$ as illustrated in FIG. 50.

All other functions in WRITE timing diagram 5000 illustrated in FIG. 50 are as described further above with respect to WRITE timing diagram 1400 illustrated in FIG. 14.

Figure 53:
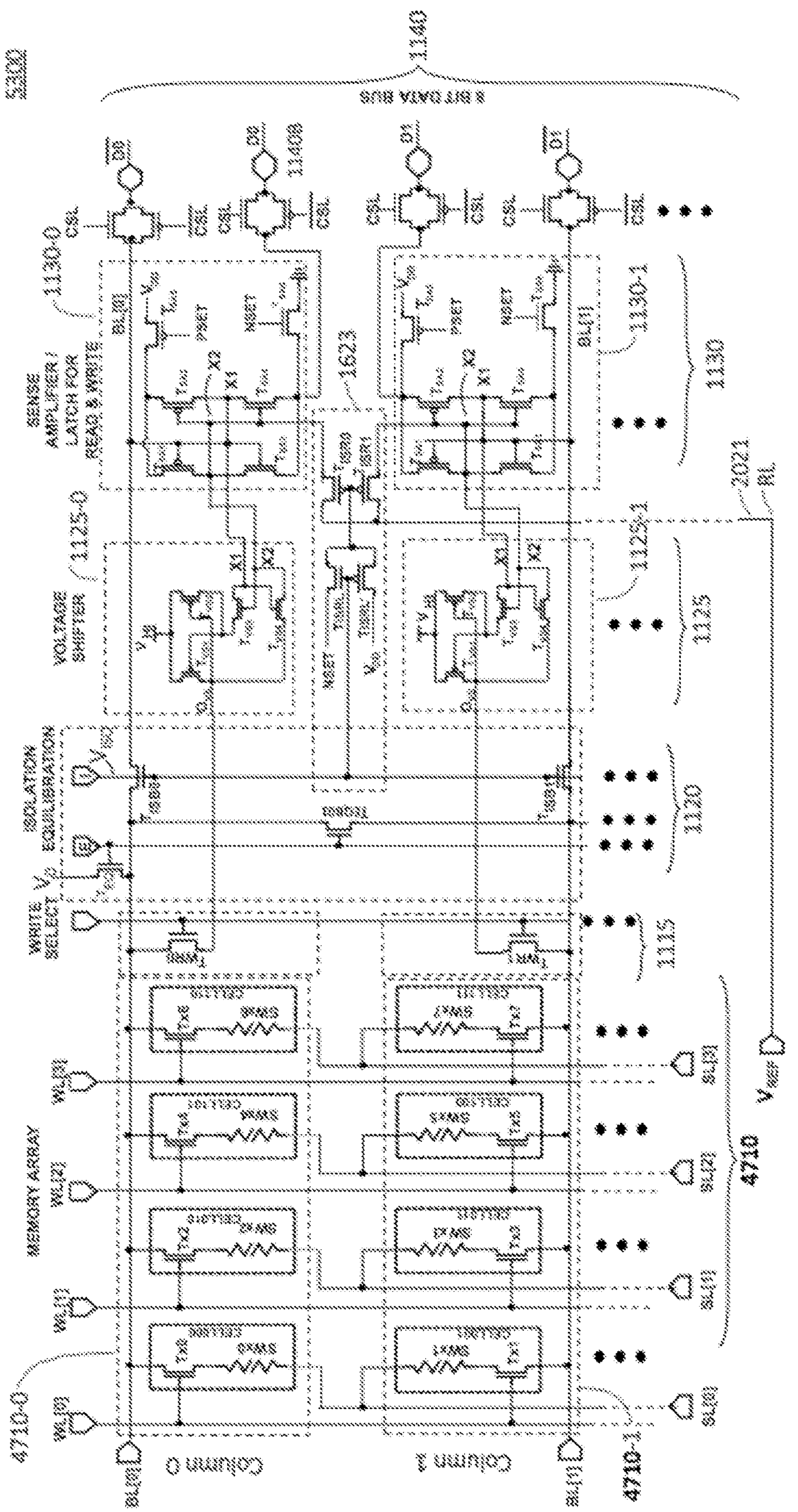
FIG. 53 is a simplified schematic of a DDR NRAM compatible eighth, v4 open architecture with an open resistive change memory array architecture, corresponding to the FIG. 32 cell, and no reference resistors. A reference voltage is connected to a single reference line (note that bit line columns are drawn horizontally to accommodate a subset of two independent bit lines, isolation devices, voltage shift circuits, and sense amplifier details) operating in a RESET before WRITE mode.

Referring now to eighth (version 4) open architecture schematic 5300 shown in FIG. 53, corresponding to a plan view of cell and array layout 3200 shown in FIG. 32, and to sixth (version 4) open architecture schematic 3900 shown in FIG. 39, storage array section 4710 replaces storage array section 3510. Storage subarrays 4710-0 and 4710-1 replace storage subarrays 3510-0 and 3510-1, respectively.

Nonvolatile 1T,1R memory cell 2625 illustrated in FIG. 26 shows select line SL in contact with the top electrode TE of CNT block 2615, which forms a portion of NV CNT switch 2610. Hence, select line SL[0] is in contact with the top electrode TE of NV CNT switches SWx0 and SWx1 shown in storage subarray 4710-0 and 4710-1, respectively. Select line SL[1] is in contact with the top electrode TE of NV CNT switches SWx2 and SWx3 shown in storage subarray 4710-0 and 4710-1, respectively. Select line SL[2] is in contact with the top electrode TE of NV CNT switches SWx4 and SWx5 shown in storage subarray 4710-0 and 4710-1, respectively. Select line SL[3] is in contact with the top electrode TE of NV CNT switches SWx6 and SWx7 shown in storage subarray 4710-0 and 4710-1, respectively.

READ operations are performed with select lines SL, corresponding to selected word lines WL, at zero volts. Referring to eighth (version 4) open architecture schematic 5300 illustrated in FIG. 53, if word line WL[0] is selected, then cell select devices $T_{X0}$, and $T_{X1}$, connected to bit lines BL[0] and BL[1], respectively, are ON. Select line SL[0], corresponding to word line WL[0], is at zero volts. Hence, pre-charged bit lines BL[0] and BL[1] discharge through nonvolatile resistive change elements (corresponding to NV CNT switches, in this example) SWx0 and SWx1, respectively, to SL[0], which is at zero volts. A low or high resistance state, $R_{LO}$ or $R_{HI}$, respectively, of each nonvolatile resistive change element is sensed by SA/latches 1130-0 and 1130-1, respectively, and temporarily stored as a corresponding logic state as described further above.

Whenever a row address selects a word line, a corresponding select line can also be activated. In a READ operation, if word line WL[1] is selected, cell select devices $T_{X2}$ and $T_{X3}$ are turned ON, select line SL[1] is grounded (zero volts), and pre-charged bit lines BL[0] and BL[1] are discharged through nonvolatile resistive change elements SWx2 and SWx3, respectively, and the resistance state of SWx2 and SWx3 are temporarily stored as corresponding logic states by SA/latches 1130-0 and 1130-1, respectively, as described further above.

In a READ operation, if word line WL[2] is selected, cell select devices $T_{X4}$ and $T_{X5}$ are turned ON, select line SL[2] is grounded (zero volts), and pre-charged bit lines BL[0] and BL[1] are discharged through nonvolatile resistive change elements SWx4 and SWx5, respectively, and the resistance state of SWx4 and SWx5 are temporarily stored as corresponding logic states by SA/latches 1130-0 and 1130-1, respectively, as described further above.

In a READ operation, if word line WL[3] is selected, cell select devices $T_{X6}$ and $T_{X7}$ are turned ON, select line SL[3] is grounded (zero volts), and pre-charged bit lines BL[0] and BL[1] are discharged through nonvolatile resistive change elements SWx6 and SWx7, respectively, and the resistance state of SWx6 and SWx7 are temporarily stored as corresponding logic states by SA/latches 1130-0 and 1130-1, respectively, as described further above.

Figure 54A:
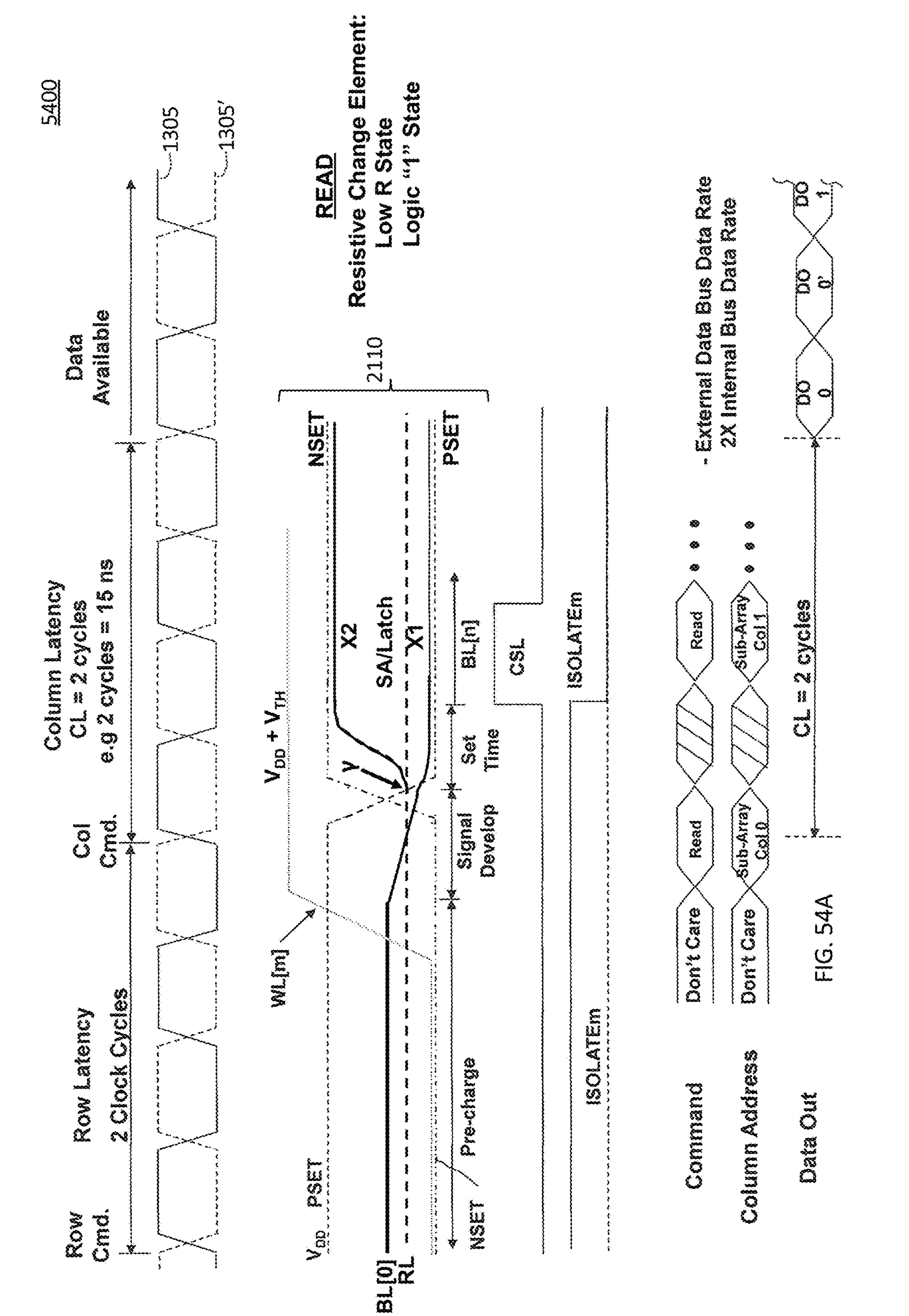
FIG. 54A is a waveform timing diagram illustrating an exemplary READ operation performed on a cell with a resistive change element in a low resistance state within an open resistive change memory array architecture of the eighth, v4 open architecture.

Referring now to FIG. 54A, READ timing diagram 5400 shows a READ operation for bit line BL[0], with word line WL[0] activated and corresponding select line SL[0] at zero volts as described further above. READ timing diagram 5400 operations are the same as those described further above with respect to READ timing diagram 1300 illustrated in FIG. 13A, except that the waveform SL RESET is omitted because eighth (version 4) open architecture schematic 5300 is operated in a RESET-before-WRITE mode.

Figure 54B:
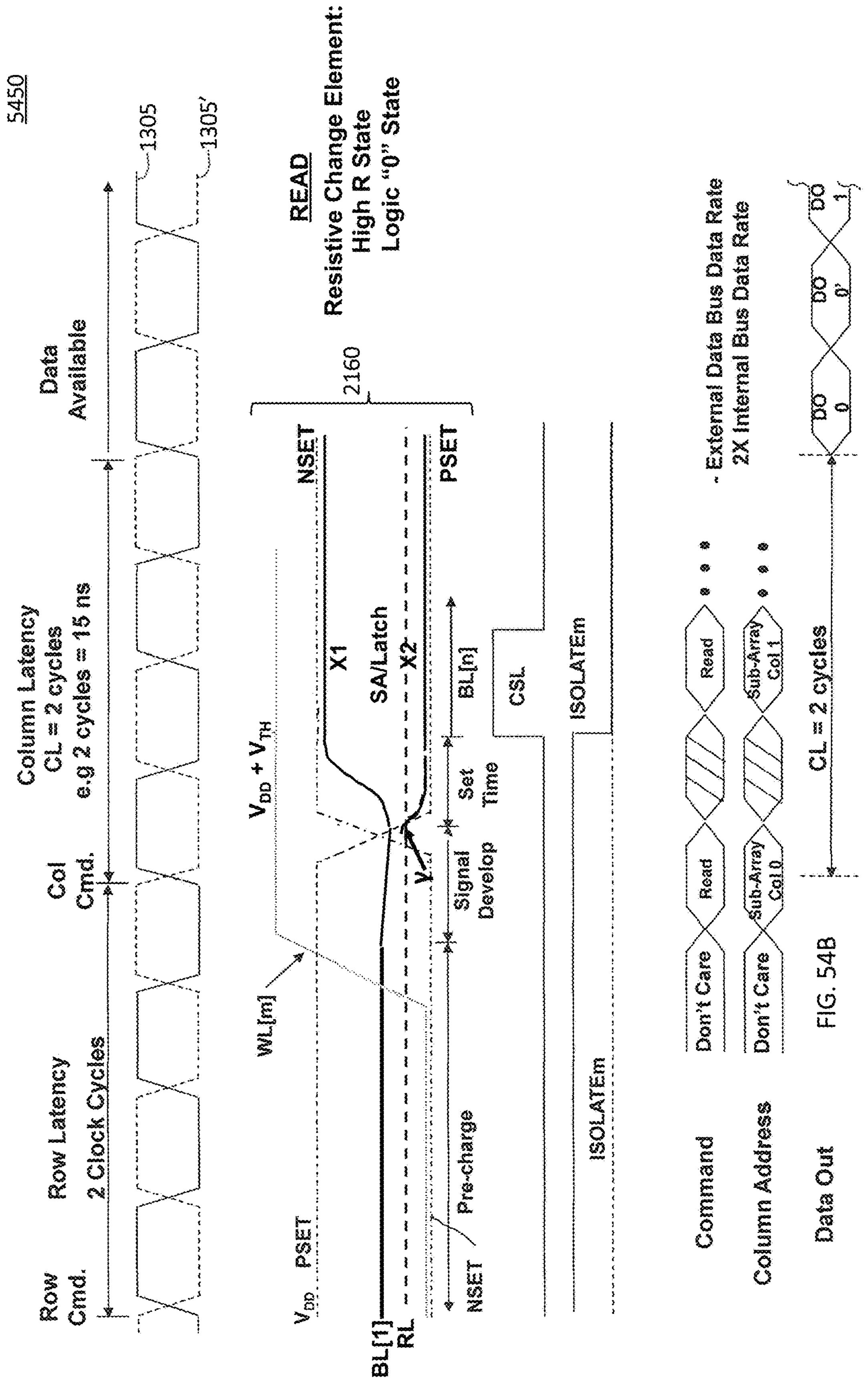
FIG. 54B is a waveform timing diagram illustrating an exemplary READ operation performed on a cell with a resistive change element in a high resistance state within an open resistive change memory array architecture of the eight, v4 open architecture.

Referring now to FIG. 54B, READ timing diagram 5450 shows a READ operation for bit line BL[1], with word line WL[0] activated and corresponding select line SL[0] at zero volts as described further above. READ timing diagram 5450 operations are the same as those described further above with respect to READ timing diagram 1350 illustrated in FIG. 13B, except that the waveform SL RESET is omitted because eighth (version 4) open architecture schematic 5300 is operated in a RESET-before-WRITE mode.

Referring now to eighth (version 4) open architecture schematic 5300 illustrated in FIG. 53, storage array section 4710 and storage subarrays 4710-0 and 4710-1, READ operations for BL[0] with word line WL[1] activated and SL[1] grounded; READ operations for BL[0] with WL[2] activated and SL[2] grounded; and READ operations for BL[0] with WL[3] activated and SL[3] grounded, have the same timing diagram as READ timing diagram 5400 illustrated in FIG. 54A.

Referring now to eighth (version 4) open architecture schematic 5300 illustrated in FIG. 53, storage array section 4710 and storage subarrays 4710-0 and 4710-1, READ operations for BL[1] with word line WL[1] activated and SL[1] grounded; READ operations for BL[1] with WL[2] activated and SL[2] grounded; and READ operations for BL[1] with WL[3] activated and SL[3] grounded, have the same timing diagram as READ timing diagram 5450 illustrated in FIG. 54B.

Eighth (version 4) open architecture schematic 5300 has the same WRITE timing diagram 5000 illustrated in FIG. 50. Referring now to FIG. 50, WRITE timing diagram 5000 illustrates a RESET-before-WRITE operation. In this example, bit line BL[0], bit line BL[1], and other bit lines intersecting word line WL[0] are held at zero volts at the beginning of the WRITE cycle as described with respect to FIG. 48 further below. Isolation and equilibration section 1120 devices are in an OFF state. WRITE select section 1115 devices are in an OFF state during the RESET operation described further below. Selected word line WL[0] is activated and remains activated until completion of WRITE operations. Corresponding select line SL[0] is pulsed as soon as WL[0] is activated as shown in WRITE timing diagram 5000 illustrated in FIG. 50 and as described with respect to FIG. 48 further below. With select line SL[0] transitioning to $V_{RESET}$ voltage, all nonvolatile resistive change elements (NV CNT switches, for example) connected to select line SL[0] are RESET from a low to a high resistance state, or remain in a high resistance state. While a single $V_{RESET}$ pulse is shown in FIG. 50, multiple SELECT pulses may be used. Referring to FIG. 53, nonvolatile resistive change elements SWx0 and SWx1 are in a high resistance state $R_{HI}$ after the RESET operation.

While described with respect to selected word line WL[0] and corresponding select line SL[0], WRITE timing diagram 5000 illustrated in FIG. 50 also applies to word line WL[1] and corresponding select line SL[1]; word line WL[2] and corresponding select line SL[2]; and word line WL[3] and corresponding select line SL[3].

Assuming word line WL[0] remains selected and corresponding select line SL[0] has transitioned to zero volts, then after the completion of the RESET-before-WRITE operation at the beginning of the WRITE cycle, the WRITE select line shown in WRITE select section 1115 is pulsed, FET $T_{WR0}$ and FET $T_{WR1}$ are turned ON. Voltage shifter 1125-0 output $O_{VS}$ transmits WRITE data through FET $T_{WR0}$ to bit line BL[0] and nonvolatile resistive change element SWx0 to select line SL[0], which is at zero Volts. Also, voltage shifter 1125-1 output $O_{VS}$ transmits WRITE data through FET $T_{WR1}$ to bit line BL[1] and nonvolatile change element SWx1 to select line SL[0], which is at zero Volts. Because of the RESET-before-WRITE operation described further above, nonvolatile resistive change elements SWx0 and SWx1 are both in a RESET high resistance state. Referring now to table 2700 illustrated in FIG. 27, SET pulses are in the range of 1-1.5 volts.

Assuming $V_{SET}$=1.25 V., and assuming that switch SWx0 connected to BL[0] is to be switched to a low resistance $R_{LO}$ state and that switch SWx1 connected to BL[1] is to remain in a high resistance $R_{HI}$ state, then voltage shifter 1125-0 output $O_{VS}$ transmits a $V_{SET}$ voltage of 1.25 volts to bit line BL[0] causing switch SWx0 to transition from $R_{HI}$ to $R_{LO}$), and voltage shifter 1125-1 $O_{VS}$ transmits zero volts to bit line BL[1] causing switch SWx1 to remain in a high resistance state $R_{HI}$ as illustrated in FIG. 50.

All other functions in WRITE timing diagram 5000 illustrated in FIG. 50 are as described further above with respect to WRITE timing diagram 1400 illustrated in FIG. 14.

Referring now to eighth (version 5), the open architecture schematic is the same as open architecture schematic 5300 shown in FIG. 53. READ operations are essentially the same as READ timing diagrams 5400 and 5450 illustrated in FIGS. 54A and 54B, respectively. WRITE operations are essentially the same as timing diagram 5000 illustrated in FIG. 50. However, eighth (version 5) open architecture includes on-chip programmable regulated voltage generator 2300 illustrated in FIG. 23 and programmable SA/latch timing control circuit 2500 illustrated in FIG. 25, which also includes CNT switch-controlled latch circuits 2400 and 2450 shown in FIGS. 24A and 24B, respectively. Hence, eighth (version 5) open architecture schematic adds on-chip programmable reference voltage control and signal development time control to the eight (version 4) open architecture described further above.

Referring now to a plan view of cell and array layout 3200 in FIG. 32, FIG. 32 shows a 1T, 1R NRAM memory cell with an open array architecture, referred to as eighth open array architecture schematic that is different from all other open array architectures described further above. This is because a different cell and array layout 3200 select lines SL are parallel to word lines WL. Only bit lines BL are orthogonal to word lines WL as in all open array architectures. The array wiring widths are minimum widths F as indicated in FIG. 32 (cell #5). However, array wires are drawn as lines, with cell contacts, for ease of visualization.

Cell and array layout 3200, described further above, is shown schematically as storage array section 4710 in open architecture schematics 4700, 5100, and 5300 as illustrated in FIGS. 47, 51, and 53, respectively, and are referred to collectively as the eighth open architecture schematic representations, and individually as different versions of this open architecture. The eighth open architecture schematics are all based on a RESET-before-WRITE operation during WRITE at the beginning of a WRITE cycle using RESET circuit 4800 shown in FIG. 48 to apply a $V_{RESET}$ pulse to select lines SL with corresponding bit lines BL at a low voltage such as zero volts, for example, and as described further above. Hence all nonvolatile resistive change elements (NV CNT switches, for example) in storage array section 4700 are RESET to a high resistance state (value) $R_{HI}$. $R_{HI}$ may be 1 MΩ or higher resistance, for example, as described further above. Hence during a WRITE operation, it is only necessary to provide a SET pulse to bit lines BL, with corresponding select lines SL at a reference voltage such as zero Volts. As described further above, if a SET pulse $V_{SET}$ is applied to a bit line, the nonvolatile resistive change element switches from a high resistance state $R_{HI}$ to a low resistance state $R_{LO}$, 100 kΩ for example. However, if $V_{SET}$ is zero volts, then $R_{HI}$ remains unchanged.

Summary of Resistive Change Element Open Array Architectures as a Function of Cell Areas (Footprint Size)

At this point in the specification, table 5500 illustrated in FIG. 55 summarized various memory open array characteristics. These include: cell areas in various array layout configurations, open array architecture schematics, and memory modes of operation described further above. In these examples, nonvolatile change elements are formed with nonvolatile carbon nanotube (NV CNT) switches 2610 illustrated in FIG. 26B. The array architectures summarized in table 5500 and described further above, operate NV CNT switches 2610 in a bipolar (bidirectional) operating mode with RESET pulses applied to a top electrode (TE) and SET pulses applied to a bottom electrode (BE) of NV CNT switch 2610 for reasons of high performance as illustrated in table 2700 illustrated in FIG. 27 and described further above. The various memory open array characteristics summarized in table 5500 are organized by decreasing cell area, where cell area is expressed in terms of minimum technology feature F.

Cell #2 has largest cell area at $12F^2$. However, cell #2 has the most memory mode operating flexibility as shown in table 5500. For smaller NRAM memory sizes, such as embedded memories with tens, hundred, thousands, or even millions of bits, for example, or stand-alone chips in the tens or hundreds of megabits, flexibility may be more important than cell and corresponding array area.

Cell #3, with a cell area of $9F^2$, is substantially smaller in area. The smaller array area enables substantially smaller NRAM chips in the gigabit range. However, as shown in table 5500, there is less memory mode operating flexibility than with cell #2.

Cell #5, with a cell area $6F^2$, has the smallest area cell and corresponding array area by a substantially large margin. The small area size is a result of orienting select lines SL parallel to word lines WL instead of having select lines SL parallel to bit lines BL as in all other architectures described further above. The small $6F^2$ cell and corresponding array size results in the most area efficient implementation of large gigabit NRAM memories. However, as shown in table 5500, there is less memory mode operating flexibility than with cell #2. Also, the memory operating mode of RESET before WRITE is different from the operating mode of all the other array architectures.

The open array memory architectures described further above and summarized in table 5500 and illustrated in FIG. 55, are representative architectures. Variations of these architectures or other new architectures may provide additional advantages to those described further above.

Voltage Scaling

Referring now to plan view of cell and array layout 3200 illustrated in FIG. 32, and corresponding nonvolatile 1T, 1R memory cell 2625 illustrated in FIG. 26B, minimum feature size F, cell #5 with an area of $6F^2$ is achievable if minimum feature size F is compatible with cell operating voltages and currents. In this example, referring to table 2700 illustrated in FIG. 27, cell and array layout 3200 must be compatible with a SET voltage in the 1-1.5 voltage range, a RESET voltage of 2-2.5 volts, and current no higher than 20 uA. READ voltages are 1V. Cell and array layout 3200 is chosen to evaluate voltage scaling compatibility because it has the smallest cell area as illustrated in table 3400 illustrated in FIG. 34.

Referring now to FIG. 56, table 5600 shows the growth in of cell #5 area, shown in cell and array layout, if dimensions larger than F are needed to accommodate higher voltages, higher currents, or a combination of higher voltage and higher current.

The top row of table 5600 shows a cell select FET with a length L=F and a width W=F and corresponds to the minimum cell area of $6F^2$. If the voltage requirements are met but current is insufficient, then increasing the current by 50% requires an FET device width W=1.5F, and the cell area grows by 25% to $7.5F^2$. It a 100% increase in current is needed, then W=2F and the cell area increases by 50% to $9F^2$.

The left column of table 5600 shows an FET length of 1F corresponding to the minimum cell area of $6F^2$. However, if a higher voltage FET is required, and FET length L increases by 50% to L=1.5 W, then the width also increases by 50% to maintain the same current and the cell area grows by 46% to 8.75 $F^2$. If an FET device of !00% more voltage is required, then L=2F, and the width increases to W=2F to maintain the same current and the cell area increase by 100% to $12F^2$.

If both voltage current increases are required, then cell areas increase even more as illustrated in table 5600 illustrated in FIG. 56.

At this point in the specification, it is necessary to assume advanced industry FET device characteristics for the cell select FET to determine if a cell #5 area of $6F^2$ can be maintained, while meeting the voltage and current requirements of table 2700 illustrated in FIG. 27. In this example, a technology node with minimum feature size F=20 nm and an FET device of 1-1.2 V. with a saturation current of 3,000 uA/um is assumed. It is also assumed that the FET device can accept a voltage of up to 1.5 volts without excessive leakage. Assuming a W/L=1 device, with L and W equal to F=20 nm, the highest current through the FET device can be calculated as: $I_{MAX}$=(3,000 uA/um)×20×$10^{-3}$ um; $I_{MAX}$=60 uA.

Referring now to table 2700 illustrated in FIG. 27, the cell select FET device can meet the SET voltage and current cell requirements. This is because, as described further above, during SET operation, a voltage of 1-1.5 volts is applied to selected bit line BL, select lines are at ground, and a word line WL voltage of 1-1.5 volts turns cell FET devices ON, which connects bit lines to select lines through a NV CNT switch. However, RESET voltage of 2-2.5 volts requirements cannot be met with minimum size cell select FET devices. Referring now to table 5600 illustrated in FIG. 56, left column, the cell select FET device would have to increase in both length L and width W, and the corresponding cell area would therefore increase by 46% to 100%, depending on whether L and W need to increase to 1.5F to 2F, respectively. Cell #5 can only remain at $6F^2$ if the RESET-before-WRITE architecture prevents a voltage greater than 1.5 volts across the cell select FET devices.

RESET voltages of 2-2.5 volts do not appear across the terminals of cell select FETs in a RESET-before-WRITE mode as illustrated further below. Referring now to subarrays 4710-0 and 4710-1 of storage array section 4710 shown in eighth (version 1) open architecture schematic 4700 illustrated in FIG. 47; and eighth (version 3) open architecture schematic 5100 illustrated in FIG. 51; and eighth (version 4) open architecture schematic 5300 illustrated in FIG. 53, corresponding RESET circuit 4800 illustrated in FIG. 48, all described further above, and RESET voltage distribution 5700 illustrated in FIG. 57 superimposed on cell and layout 3200 schematic illustrated in FIG. 32, RESET voltages of 2-2.5 volts do not appear across the terminals of cell select FET devices FET1, FET2, FET3, and FET4.

Figure 57:
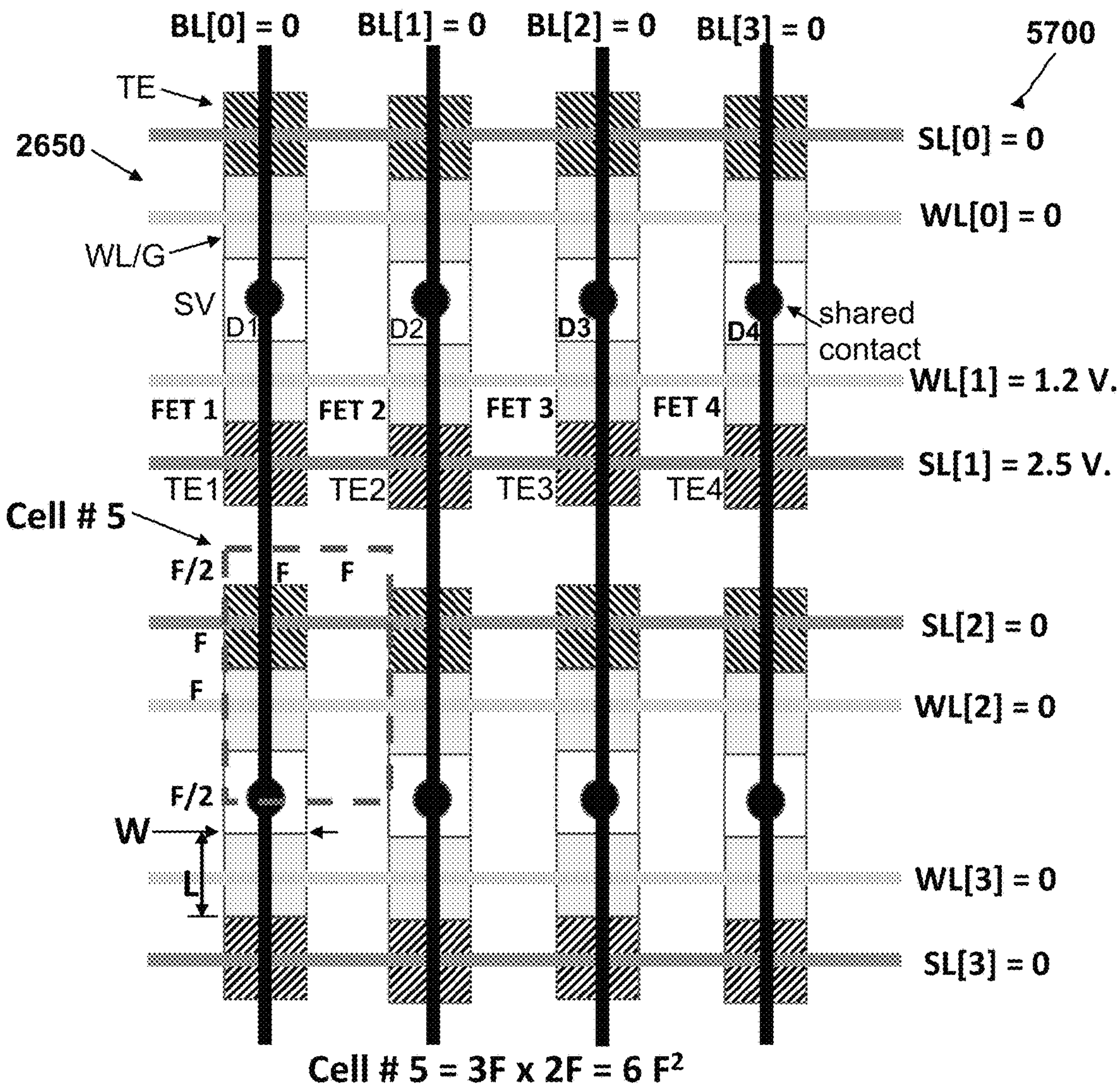
FIG. 57 is a cell and array layout with a superimposed RESET voltage distribution during a RESET operation.

Referring now to nonvolatile 1T, 1R memory cell 2625 illustrated in FIG. 26B, RESET voltage distribution 5700 illustrated in FIG. 57, and RESET circuit 4800 illustrated in FIG. 48, bit lines are at zero volts during a RESET operation. Select lines SL apply a $V_{RESET}$ voltage to a select line corresponding to a selected (activated) word line WL as described further above. Referring now to RESET voltage distribution 5700 illustrated in FIG. 57, bit lines BL[0], BL[1], BL[2], and BL[3] are all at zero Volts. Word line WL[1] and corresponding select line SL[1] are both selected. Word line WL[1] applies a voltage of 1-1.5 V., for example, to the gates of FET select devices FET1, FET2, FET3, and FET4 connecting source and drain terminals. Drain terminals, connected to bit lines BL[0], BL[1], BL[2], and BL[3] are all at zero volts and so are corresponding source terminals S since the selected FETS are ON. As illustrated in FIG. 26B, source terminals S are connected to the bottom electrode BE of the NV CNT switches 2610. As shown in RESET voltage distributions 5700 in FIG. 57, select line S[1] apples $V_{RESET}$ of up to 2.5 volts to top electrode TE1, TE2, TE3, and TE4 of all NV CNT switches connected to SL[1]. Therefore, $V_{RESET}$ voltage appears across the terminals of all the selected NV CNT switches, but does not appear across the terminals of selected FET devices.

All other FETs shown in FIG. 57 are in an OFF state, all have drain terminals connected to ground by the bit lines BL and source terminals connected to ground because all unselected select lines SL, which are connected to the top electrode TE of NV CNT switches, are at zero volts.

Referring now to RESET circuit 4800 and illustrated in FIG. 48 and RESET voltage distribution 5700 illustrated in FIG. 57, bit line drivers 4875 and 4880 correspond to bit lines BL[0] and BL[1], respectively. Bit line drivers for bit lines BL[2] and BL[3], not shown in FIG. 48, are essentially the same as bit line drivers 4875 and 4880. The bit line driver outputs are at zero volts during RESET. Word line drivers (not shown) drive word line WL[1] shown in FIGS. 48 and 57. Select line driver 4887 drives select line SL[1], corresponding to word line WL[1], to $V_{RESET}$ voltages of 2-2.5 V., which requires 2.5 volt-capable FETs. These are larger than the cell select FET devices, but they are not part of the cell, and do not affect cell area. Instead, they are part of the peripheral on-pitch select line drivers.

Referring now to RESET circuit 4800, select line driver 4887 applies a voltage of $V_{RESET}$ of 2-2.5 volts to top electrodes TE of NV CNT switches SWx2 connected to the source S of cell select FET device $T_{X2}$, and SWx3 connected to the source S of cell select FET device $T_{X3}$. Cell select FET devices $T_{X2}$ and $T_{X3}$ shown in FIG. 48 correspond to cell select FET devices FET1 and FET2 shown in FIG. 57. The drain terminals D of $T_{X2}$ and $T_{X3}$ at zero volts, hold the corresponding source terminals S at zero volts. The voltage drop $V_{RESET}$ appears across both NV CNT switches SWx2 and SWx3, switching them from a low resistance state $R_{LO}$ to a high resistance state $R_{HI}$ or leaving them in high resistance state $R_{HI}$.

Bit line drivers 4875 and 4880 are used only for the RESET operation. During SET operations, these drivers are in a tristate or OFF state as described further above. SET operations are performed when bit lines BL[0] and BL[1] are driven by outputs $O_{VS}$ of voltages shifters 1125-0 and 1125-1, respectively, through WRITE select transistors $T_{WR0}$ and $T_{WR1}$, respectively, as described further above. READ operations are performed when bit lines BL[0] and BL[1] are pre-charged, and then allowed to discharge through selected NV CNT switches to select lines SL at zero volts. A logic state corresponding to a low resistance state $R_{LO}$ or a high resistance state $R_{HI}$ is stored temporarily in SA/latches 1130-0 and 1130-1, respectively, as described further above.

Select line drivers 4883, 4887, 4891, and 4893 are used during the RESET-before-WRITE operation. Otherwise they are at zero volts during SET and READ operations.

Nonvolatile Carbon Nanotube (NV CNT) Switch Initialization

Electrical test site data on NV CNT switches, such as NV CNT switch 2610 illustrated in FIG. 26B, have shown that switch initialization may be used to reduce SET and RESET voltages during WRITE operations, and is especially useful for RESET voltages. Referring now to Table 2700 illustrated in FIG. 27, initialization operations described further below resulted in a decrease in RESET voltage from 2-2.5 V. to 1-1.5 V for both unipolar (unidirectional) operation and bipolar (bidirectional operation. Switch initialization is also needed for some NV CNT switches to ensure the NV CNT switch bipolar (bidirectional) SET/RESET operation described further above. Bipolar operation is desirable because the SET operation is orders of magnitude faster for a unipolar (unidirectional) SET operations as shown in table 2700 illustrated in FIG. 27.

Measurements of as-fabricated (virgin) NV CNT switches show that some switches do not display the desired bipolar SET/RESET switching operation without including electrical initialization steps after fabrication. NV CNT switches 2610 are exposed to a DC I-V scan, cell resistance is calculated, and a plot of cell resistance as a function of applied voltage is generated as shown by NV CNT switch initialization scan 5800 illustrated in FIG. 58. In this example, a voltage is applied to the top electrode TE of a NV CNT switch and the bottom electrode TE is connected to the source S of an FET in an ON state, with a drain voltage of zero volts.

Figure 58:
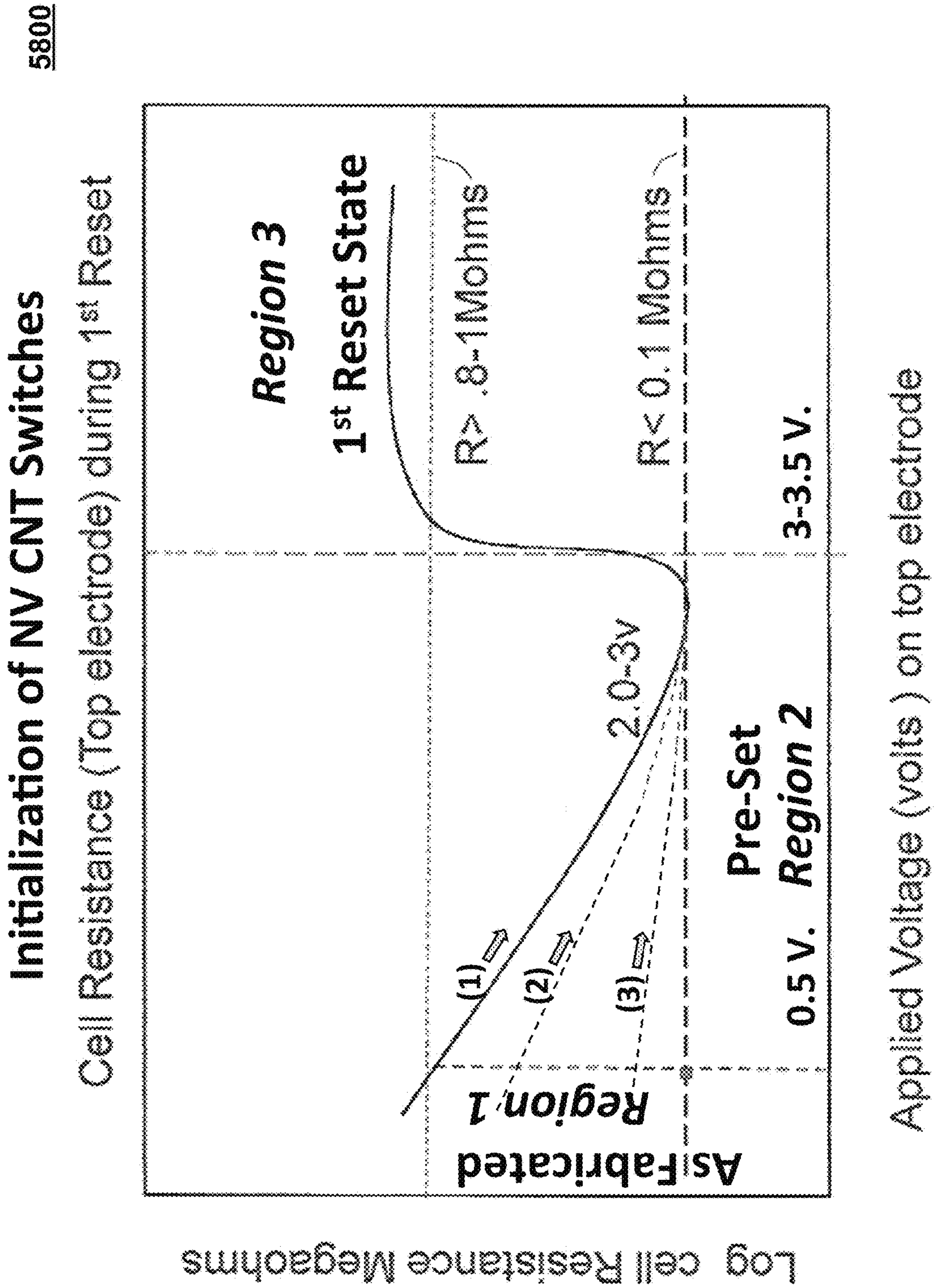
FIG. 58 is a graphical representation of a resistance as a function of voltage during an initialization of nonvolatile carbon nanotube switches.

Referring now to initialization scan 5800 illustrated in FIG. 58, region 1 represents the cell resistance of the as-fabricated switch. Three traces are shown. Trace (1) corresponds to an as fabricated resistance of at least 1 MΩ, trace (2) corresponds to an as-fabricated resistance of less than 800 kΩ, and trace (3) corresponds to an as-fabricated resistance of greater than 100 kn. The variation in as-fabricated resistance may be caused by CNT fabric exposure to plasma etching steps during fabrication, which may cause some CNT-to-CNT attraction in the CNT fabric forming CNT block 2615 (FIG. 26) to come into contact. Typically, as-fabricated NV CNT switches are not in either a SET or RESET state, that is, not less than 100 kΩ or greater than 1 MΩ, respectively.

A scanning voltage is applied to the top electrode TE and results in a gradual lowering of the resistance below the as-fabricated resistance value, as shown in region 2 of FIG. 58, that results in a minimum resistance value of approximately 100 kΩ in the 2-3 Volt range of the voltage applied to top electrode TE. Continuing the scan, an abrupt transition to a high resistance value of approximately 1 MΩ occurs at 3-3.5 V. This resistance may be referred to as the first ($1^{st}$) RESET. The initialization operation results in switching between at least two non-volatile resistance values with a first resistance corresponding to a first lower resistance state and a second resistance value corresponding to a second higher resistance state, which may be referred to as a first RESET.

Once first RESET has been achieved, NV CNT switches operate in a bipolar mode between a low resistance $R_{LO}$ SET state and a high resistance $R_{HI}$ RESET state. However, subsequent RESET states, that is second, third, etc. RESET states switch at lower voltage. So initialized bipolar NV CNT switches operate in a $V_{RESET}$ voltage range of 2.0-2.5 Volts and a $V_{SET}$ voltage range of 1-1.5 Volts as shown in table 2700 illustrated in FIG. 27. Therefore, after the completion of an initialization operation, at least two information states (logic states) exist corresponding to at least one low resistance ($R_{LO}$) state and one high resistance ($R_{HI}$) state.

After completion of an initiation operation, the existence of at least two information states (logic states) may be verified with a WRITE then a READ operation. For example, a RESET operation may be performed resulting in a high resistance ($R_{HI}$) state in a cell location. Then, a READ operation, such as described further above, confirms an informational state of a logic "0". Next, a SET operation may be performed resulting in a low resistance ($R_{LO}$) state in a cell location. Then a READ operation, such as described further above, confirms an informational state of a logic "1" state.

By way of example, after completion of an initialization operation, informational states for eighth open array architecture schematic designations summarized in table 5500 illustrated in FIG. 55, corresponding to plan view of cell and array layout 3200 illustrated in FIG. 32, may be verified as illustrated further above with respect to corresponding WRITE and READ operations. WRITE timing diagram 5000 illustrated in FIG. 50 shows waveforms for RESET and SET operations for all eighth open array architecture schematic options. Corresponding READ timing diagrams 4900 and 4950 illustrated in FIGS. 49A and 49B, respectively, READ timing diagrams 5200 and 5250 illustrated in FIGS. 52A and 52B, respectively; and READ timing diagrams 5400 and 5450 illustrated in FIGS. 54A and 54B, respectively, may be used for the various schematics of the eighth open schematic array architectural variations.

Informational states for all other open array architecture schematic designations shown in table 5500 shown in FIG. 55 may also be verified by performing WRITE and READ operations described further above.

If READ operations fail to confirm initialization operation for some cells in the array, initialization may be repeated followed by WRITE and READ operations described further above. If some cells do not function as desired, redundancy may be used to select other array line segments using CNT switch-controlled latches such as described further above with respect to FIGS. 24A and 24B.

NV CNT switch 2610 (FIG. 26) initialization may be performed with pulses instead of DC IV scans. Multiple pulses may be used. Multiple pulses may be at the same amplitude or varying amplitudes, typically in the range of 1-to-3 or 3.5 volts, for example. Pulse widths may be varied from 5 ns to 200 ns, and other variations may be used. After applying the various pulses, a first RESET state is achieved, and subsequent cycles of $V_{SET}$ and $V_{RESET}$ are in the typical ranges described further above and as shown in table 2700 illustrated in FIG. 27.

Figure 59:
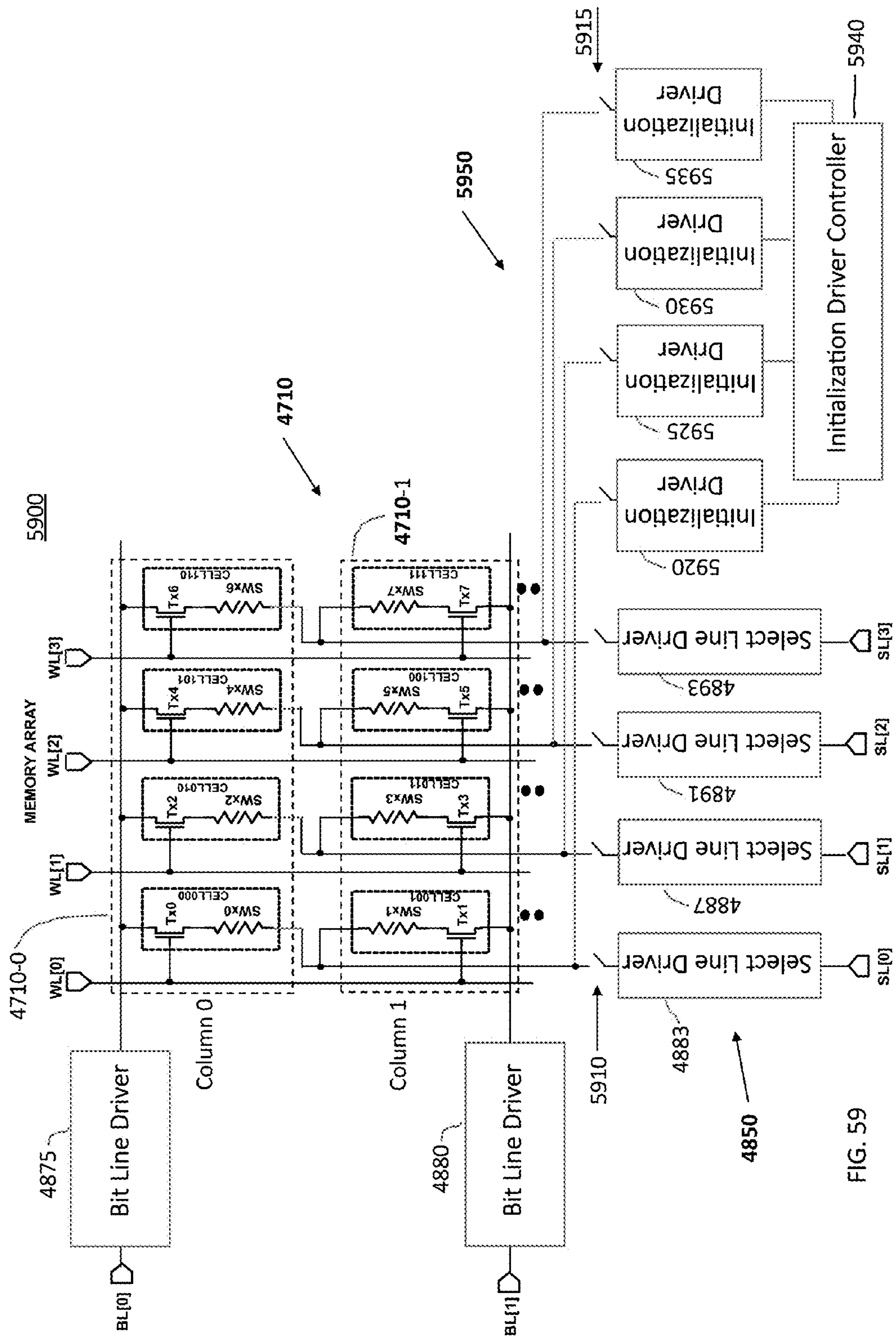
FIG. 59 is a simplified schematic of a nonvolatile resistive change memory array with initialization circuits and RESET circuits.

At this point in the specification, circuits, architectures, and methods of performing initialization of NV CNT switches, such as NV CNT switch 2610 illustrated in FIG. 26B, in a product such as an NRAM are described further below. Referring now to FIG. 59, initialization and RESET circuits 5900 shows a modification of RESET circuit 4800 by which both RESET and initialization operations may be performed on storage array section 4710. RESET operations on storage subarrays 4710-0 and 4710-1 using select line drivers 4850 have been described further above with respect to FIG. 48. Corresponding RESET voltage distributions 5700 are illustrated in FIG. 57 are shown superimposed on cell and array layout 3200 illustrated in FIG. 32.

Referring now to FIG. 59, initialization drivers 5950 and initialization driver controller 5940 may be used to initialize the NV CNT switches in storage array section 4710. FIG. 59 shows optional select line driver switches 5910 to connect and disconnect select line drivers to select lines. However, when not required, select line driver outputs can be switched to a tristate mode, and therefore remain connected to select lines as shown in RESET circuit 4800 illustrated in FIG. 48.

Referring now to FIG. 58, NV CNT switch initialization scan 5800 shows a maximum voltage requirement of 3 to 3.5 Volts. On chip, programmable, initialization driver controller 5940 in combination with initialization drivers 5950 provide a predetermined set of pulses of constant or variable voltage amplitudes, of various pulse widths, and other pulse characteristics designed to achieve initialization of all NV CNT switches in storage array section 4710 to ensure bipolar (bidirectional) SET/RESET operations as described further above. Initialization drivers 5950 include initialization drivers 5920, 5925, 5930, and 5935. An optional set of initialization driver switches 5950 may be used to connect to or disconnect from select lines SL[0], SL[1], SL[2], and SL[3], respectively. However, initialization drivers 5950 outputs may be switched to a tristate mode, and therefore remain connected to select lines.

Figure 60:
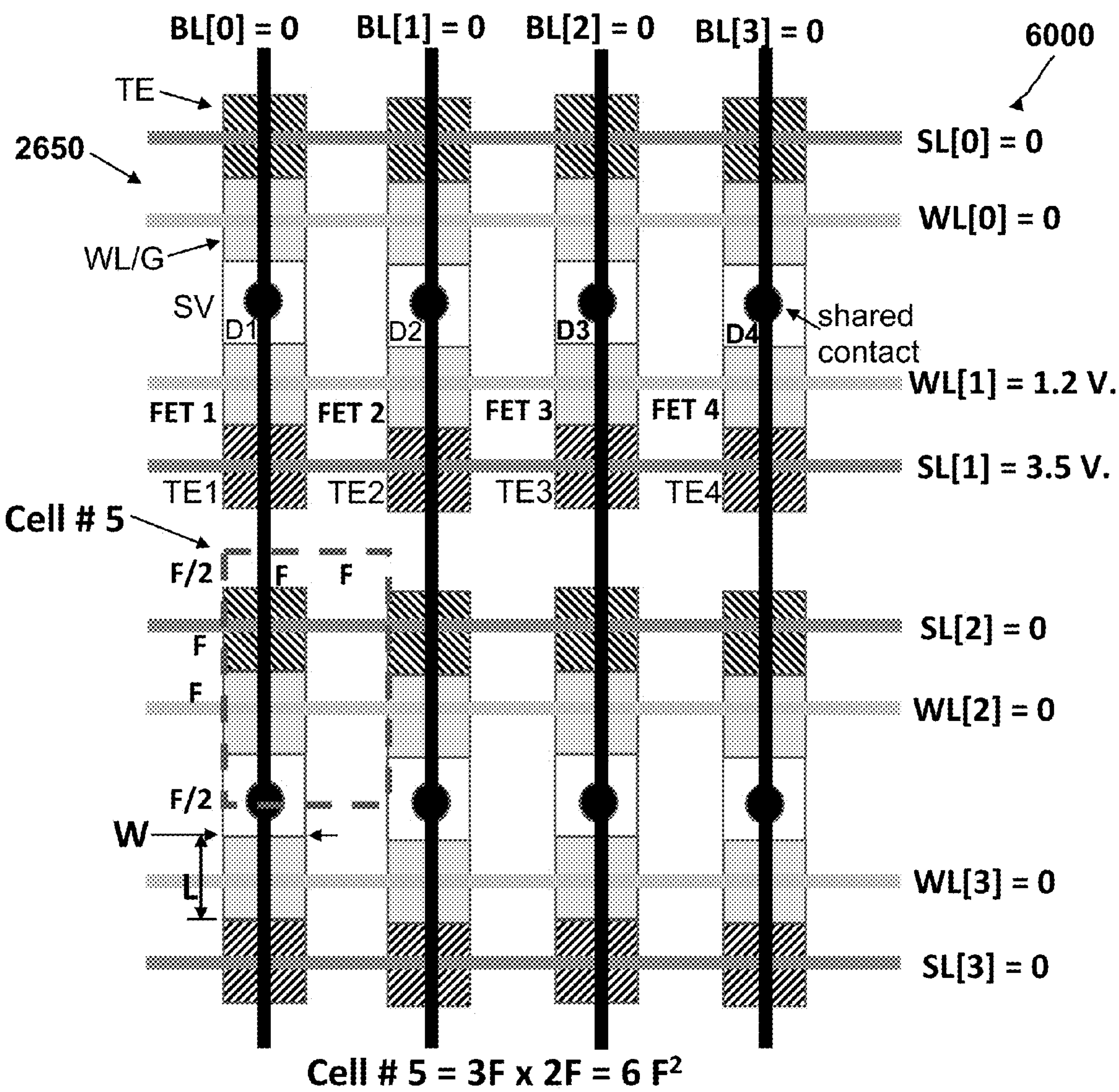
FIG. 60 is a cell and array layout with a superimposed initialization voltage distribution during an initialization operation.

Referring now to nonvolatile 1T, 1R memory cell 2625 illustrated in FIG. 26B, initialization voltage distribution 6000 illustrated in FIG. 60, and initialization and RESET circuit 5900 illustrated in FIG. 59, bit lines are at zero volts during an initialization operation. Select lines SL apply initialization voltage pulses to a select line corresponding to a selected (activated) word line WL. Referring now to initialization voltage pulses voltage distribution 6000 illustrated in FIG. 60, bit lines BL[0], BL[1], BL[2], and BL[3] are all at zero Volts. Word line WL[1] and corresponding select line SL[1] are both selected. Word line WL[1] applies a voltage of 1-1.5 V., for example, to the gates of FET select devices FET1, FET2, FET3, and FET4 connecting source and drain terminals. Drain terminals, connected to bit lines BL[0], BL[1], BL[2], and BL[3] are all at zero volts and so are corresponding source terminals S since the selected FETS are ON. As illustrated in FIG. 26B, source terminals S are connected to the bottom electrode BE of the NV CNT switches 2610. As shown in initialization voltage distributions 6000 illustrated in FIG. 60, select line SL[1] applies initialization voltage pulses of up to 3.5 volts to top electrode TE1, TE2, TE3, and TE4 of all NV CNT switches connected to SL[1]. Therefore, initialization voltage pulses appear across the terminals of the selected NV CNT switches, but do not appear across the terminals of selected FET devices.

All other FETs shown in FIG. 60 are in an OFF state, all have drain terminals connected to ground by the bit lines BL and source terminals connected to ground because all unselected select lines SL, which are connected to the top electrode TE of NV CNT switches, are at zero volts.

Referring now to initialization and RESET circuit 5900 and illustrated in FIG. 59 and RESET voltage distribution 6000 illustrated in FIG. 60, bit line drivers 4875 and 4880 correspond to bit lines BL[0] and BL[1], respectively. Bit line drivers for bit lines BL[2] and BL[3], not shown in FIG. 59, are essentially the same as bit line drivers 4875 and 4880. The bit line driver outputs are at zero volts during initialization. Word line drivers (not shown) drive word line WL[1] shown in FIGS. 59 and 60. Initialization driver 5920 drives select line SL[1], corresponding to word line WL[1], to initialization voltage pulses of up to 3.5 volts, which requires 3.5 volt-capable FETs. These are substantially larger than the cell select FET devices, but they are not part of the cell, and do not affect cell area. Instead, they are part of the peripheral on-pitch select line drivers.

Referring now to initialization and RESET circuit 5900, initialization driver 5925 applies a voltage of $V_{RESET}$ of up to 3.5 volts to top electrodes TE of NV CNT switches SWx2 connected to the source S of cell select FET device $T_{X2}$, and SWx3 connected to the source S of cell select FET device $T_{X3}$. Cell select FET devices $T_{X2}$ and $T_{X3}$ shown in FIG. 59 correspond to cell select FET devices FET1 and FET2 shown in FIG. 60. The drain terminals D of $T_{X2}$ and $T_{X3}$ at zero volts, hold the corresponding source terminals S at zero volts. The voltage drop of initialization voltage pulses of up to 3.5 volts appears across both NV CNT switches SWx2 and SWx3, switching them to a low resistance state $R_{LO}$ to a high resistance state $R_{HI}$ or leaving them in high resistance state $R_{HI}$.

Initialization at the wafer level would simplify initialization by eliminating the additional circuits and test methods described further above. One method would be to irradiate each wafer with radiation corresponding in energy and frequency and capture cross section requirements of CNTs in contact. This radiation would supply the energy to overcome van der Waals forces holding CNTs in contact. The NV CNT switches would be in an as-fabricated high resistance RESET state, such as first RESET state illustrated in FIG. 58

Another wafer level initialization method would be to flood wafers with electrons at one or more steps of the process. In this case, voltage differences between CNTs would produce an attractive force forming CNT-to-CNT contacts such that the as-fabricated NV CNT switches would be in a low resistance first SET state.

Open Architecture Schematic Simplification

Figure 61:
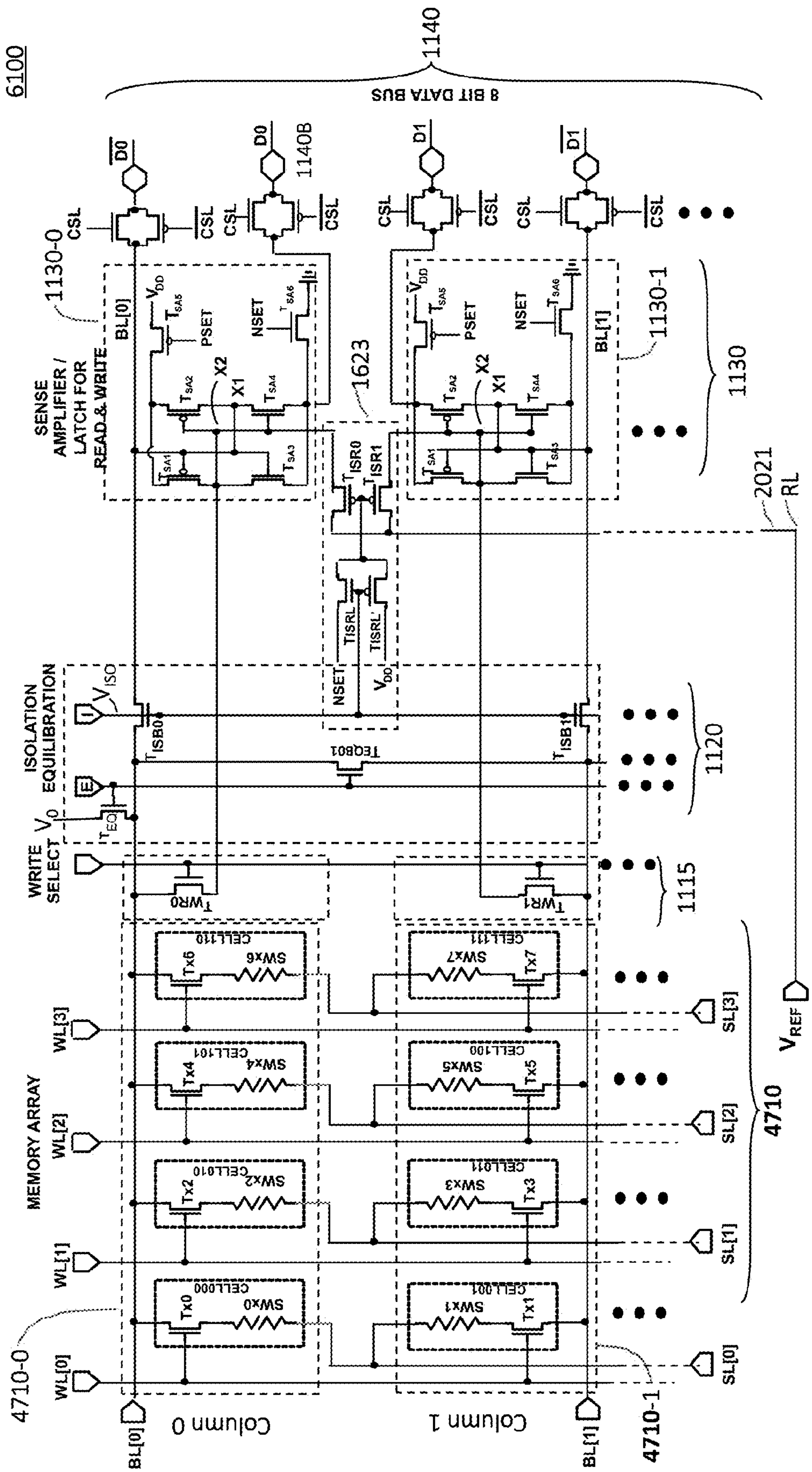
FIG. 61 is the same schematic as FIG. 53 with voltage shifter circuits removed.

Referring now to FIG. 61, eighth (version 4') open architecture schematic 6100 corresponds to eighth (version 4) open architecture schematic 5300 illustrated in FIG. 53, except that voltage shifter section 1125 has been removed. Instead, input/output terminal X2 from SA/latch 1130-0 is connected directly to FET $T_{WR0}$ and input/output terminal X2 (or input/output terminal X1) from SA/latch 1130-1 is connected directly to FET $T_{WR1}$. FETs $T_{WR0}$ and $T_{WR1}$ are activated during a SET operation as discussed further above with respect to FIG. 53. Referring now to table 2700 illustrated in FIG. 27, the SET voltage is in the range of 1-1.5 volts and does not require a $V_{HI}$ voltage shifter circuits. All READ, SET, and RESET operations described further above with respect to FIG. 53 are essentially the same for eighth (version 4') open architecture schematic 6100 illustrated in FIG. 61.

Figure 62:
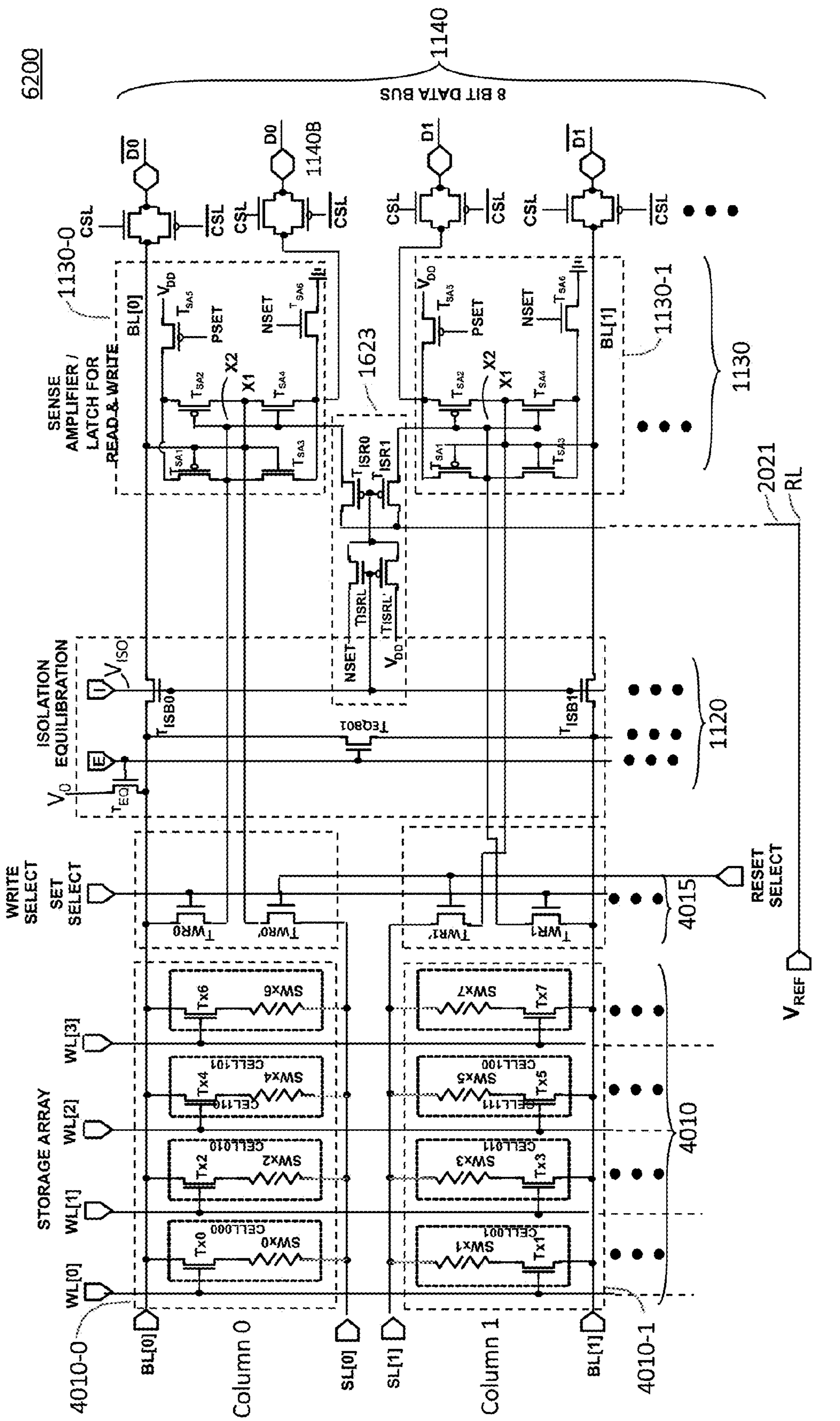
FIG. 62 is the same schematic as FIG. 45 with voltage circuits removed.

Referring now to FIG. 62, seventh (version 4') open architecture schematic 6200 corresponds to seventh (version 4) open architecture schematic 4500 illustrated in FIG. 45, except that voltage shifter section 4025 has been removed. Instead, input/output terminal X2 from SA/latch 1130-0 is connected directly to FET $T_{WR0}$ and input/output terminal X2 from SA/latch 1130-1 is connected directly to FET $T_{WR1}$. Also, input/output terminal X1 from SA/latch 1130-0 is connected directly to FET $T_{WR0'}$ and input/output terminal X1 from SA/latch 1130-1 is connected directly to FET $T_{WR1'}$. FETs $T_{WR0}$ and $T_{WR1}$ are activated during a SET operation and FETs $T_{WR0'}$ and $T_{WR1'}$ are activated during a RESET operation as discussed further above with respect to FIG. 45. Referring now to table 2700 illustrated in FIG. 27, the SET voltage is in the range of 1-1.5 volts and does not require a $V_{HI}$ voltage shifter circuits. However, the RESET voltage is in the range of 2-2.5 V. which requires a voltage shifter circuit, unless the cell and SA/latch operate at the higher voltage during a RESET operation. In this example, a larger FET cell device is required to accommodate the 2-2.5 V. RESET voltage. Also, SA/latch devices operate at the higher 2.5 volts during RESET. All READ, SET, and RESET operations described further above with respect to FIG. 45 are essentially the same for seventh (version 4') open architecture schematic 6200 illustrated in FIG. 62.

Other open array architectures described further above with respect to corresponding schematics may operate without voltage shifter circuits. For example, RESET before end of READ and RESET before WRITE architectures summarized in table 5500 illustrated in FIG. 55. READ/WRITE architectures summarized in table 5500 illustrated in FIG. 55 may also operate without voltage shifter circuits if higher RESET voltages FET select devices are used in the array and SA/latches operate at higher voltages during RESET as described further above with respect to FIG. 62.

High Bandwidth Compatible Nonvolatile Resistive Change Element Open Array Memory Architecture High bandwidth memory with high I/O architecture can achieve substantially greater speed than DDR-type architectures. This is especially true for a high I/O memory 3-dimensional (3D) integration on the surface of an underlying high-performance device, such as a high performance central processing unit (CPU), a high-performance graphics processing unit (GPU), or other high-performance logic chip. This high-performance interface can be customized for best functional integration and high performance.

A 3D integration of a high bandwidth, high I/O memory on the surface of a CPU, for example, requires memory array devices and memory circuits formed at relatively low processing temperatures. In the examples discussed further below, nonvolatile resistive change storage elements, NV CNT switches, can be formed at relatively low temperatures, typically at room temperature. An annealing step of 300-400 deg.-C. may be used after processing is complete. Rapid thermal annealing (RTA) may be used to reduce the time spend at the annealing temperatures.

Logic devices also need to be formed at low temperatures. In the examples described further below, carbon nanotube field effect transistors (devices), CNTFET devices, may also be formed at relatively low temperatures and annealed at 300-400 deg.-C. These logic devices are used to perform the memory functions and interface with the CPU as described further below.

Figure 63:
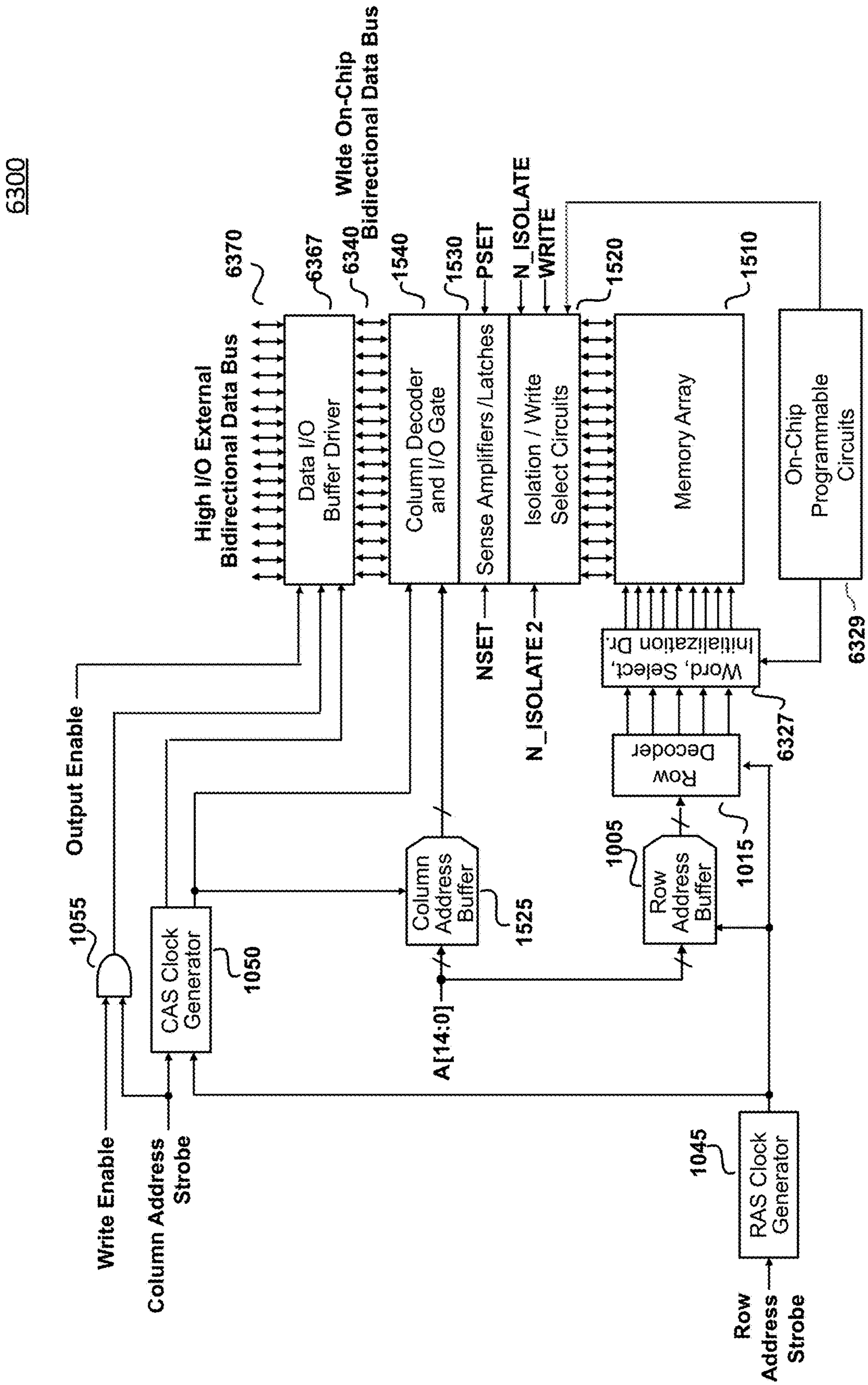
FIG. 63 is a system level block diagram illustrating an exemplary 6 Gb NRAM with a high I/O open architecture.

Referring now to FIG. 63, block diagram of high I/O open architecture resistive change memory 6300 is a modification of block diagram open architecture resistive change memory 1500 illustrated in FIG. 15 in which a high I/O bus operation replaces DDR bus operation. High I/O open architecture resistive change memory 6300 incorporates the smallest nonvolatile resistive change cell. In addition to the smallest cell area (footprint), high I/O open architecture resistive change memory 6300 also uses open architectures that enable low nonvolatile resistive cell voltages, while accommodating RESET voltages of up to 2.5 volts and initialization voltages of up to 3.5 volts as described further above.

With respect to smallest cell size, referring now to Table 3400 illustrated in FIG. 34, the smallest resistive change memory cell is $6F^2$ (cell #5), corresponding to plan view of cell and array layout 3200 illustrated in FIG. 32 and cross section 3300 illustrated in FIG. 33.

Referring now to low voltage cell array voltages, cell and array layout 3200 may be used with various eighth open architecture schematics 4700, 5100, 5300, and 6100 illustrated in FIGS. 47, 51, 53, and 61, respectively.

Block diagram of high I/O open architecture resistive change memory 6300 is a modification of block diagram of open architecture resistive change memory 1500 illustrated in FIG. 15 and incorporates the following changes in operation. Word line, select line, RESET, and initialization drivers 6327 are added between row decoder 1015 and memory array 1510. These drivers and their operation are described further above with respect to initialization and RESET circuits 5900 illustrated in FIG. 59. On-chip programmable circuits 6329 have been added and provide voltage and timing control as described further above with respect to programmable regulated voltage generator 2300 illustrated in prior circuit FIG. 23, CNT switch-controlled latch circuit 2400 and 2450 illustrated in FIGS. 24A and 24B, respectively, and programmable SA/latch timing control circuit 2500 illustrated in FIG. 25. Data path architecture was modified from a DDR architecture to a high I/O architecture. Wide I/O on-chip bidirectional data bus 6340, which may be as wide as 1024, 2048, and 4096 bus lines replaces on-chip bidirectional data bus 1140, and data I/O buffer driver 6367 replaces data I/O buffer/driver 1567. High I/O external bidirectional data bus 6370 replaces external bidirectional data bus 1570. High I/O open array architecture is described further below.

Figure 64:
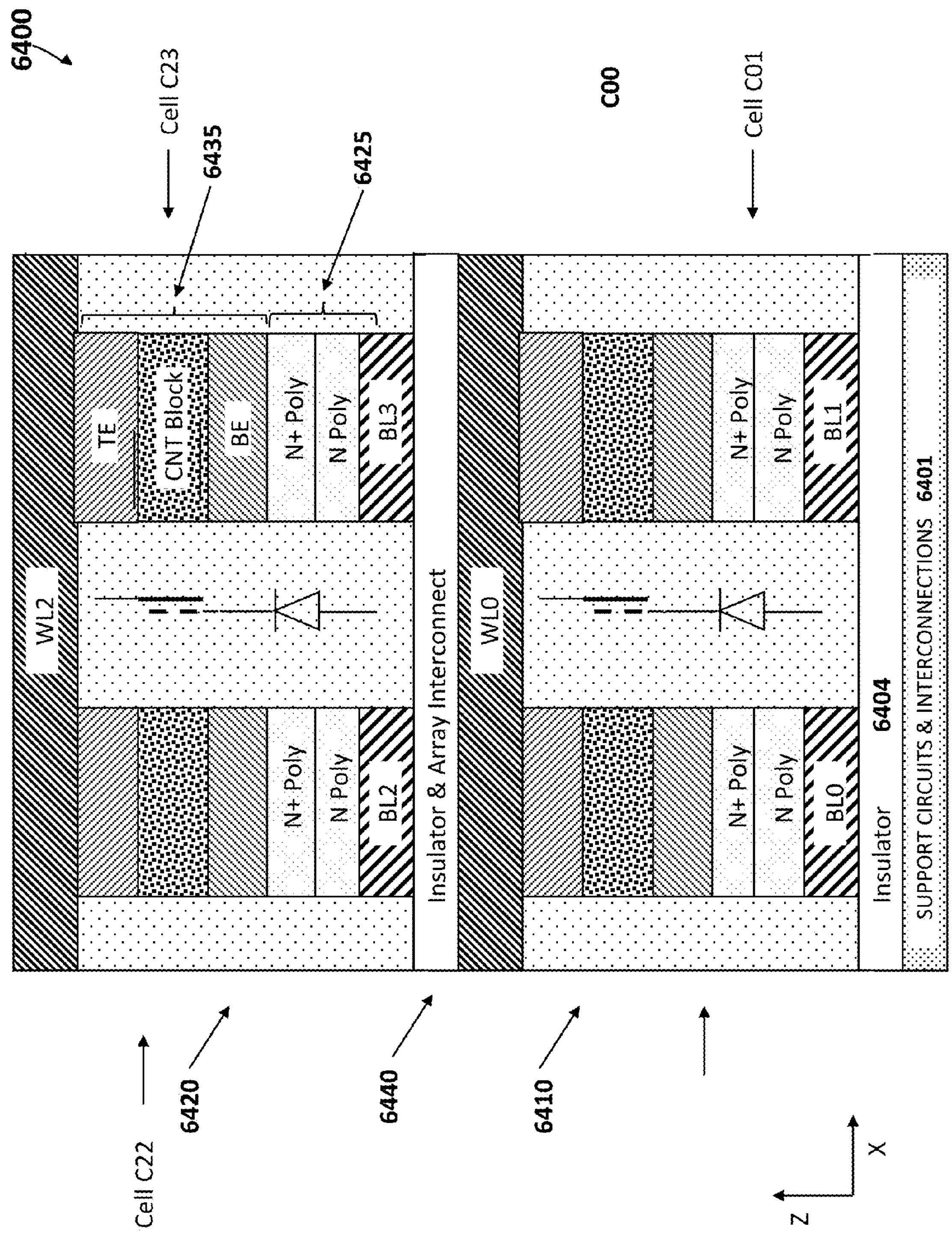
FIG. 64 is a cross section of a two-high stacked nonvolatile CNT diode cell memory.

Referring now to FIG. 64, cross section 6400 illustrates a first memory array 6410 that includes cells C00 and C01, bit lines BL0 and BL1, and word line WL0, and second memory array 6420 that includes cells C22 and C23, bit lines BL2 and BL3, and word line WL2. Lower array 6410 and upper array 6420 are separated by insulator and interconnect region 6440 and do not share word lines. Representative memory cell C23 is a nonvolatile CNT diode (NV CNT diode) that includes NV CNT switch 6435 in series with cell select diode 6425, forming 1D, 1R memory cells C00, C01, C22, and C23. Referring now to NV CNT switch 6435, top electrode TE is in contact word line WL2 and the top of the CNT block and bottom electrode BE is in contact with the bottom of the CNT block. NV CNT switch 6435 is similar to NV CNT switch 2610 shown in FIG. 26 and described further above. Cell select diode 6425 is formed between the top surface of bit line BL3 and the bottom surface of N Poly. N+ Poly between N Poly and bottom electrode BE forms an approximately Ohmic contact. Bit line B3 is an array line that forms a cell select diode where in contact with the bottom surface of N Poly.

Support circuits and interconnections 6401 provide circuits that operate the upper and lower arrays 6420 and 6410, respectively. Insulators 6404 and 6440 provide insulation and interconnect wiring regions between arrays and underlying circuits.

Cross section 6400 illustrated in FIG. 64 shows stacked first memory array 6410 and second memory array 6420 in the word line, or X direction, with word lines WL0 and WL2, four bit lines BL0, BL1, BL2, and BL3, and corresponding cells C00, C01, C22, and C23. The array periodicity in the X direction is 2F, where F is a minimum dimension for a technology node (generation). A cross section in the Y direction corresponding to X direction cross section 6400 is not shown. However, the NV CNT diode cells are symmetrical in both X and Y direction, hence the NV CNT diode cells look the same. Only the orientation of bit lines and word lines change due to a rotation by 90 degrees The memory array cell area of 1 bit for array 6410 is $4F^2$ because of the 2F periodicity in the X and Y directions. The memory array cell area of 1 bit for array 6420 is 4 $F^2$ because of the 2F periodicity in the X and Y directions. Because memory arrays 6420 and 6410 are stacked, the memory array cell area per bit is $2F^2$. If four memory arrays (not shown) are stacked, then the memory array cell area per bit is $1F^2$. Further cell and layout structures and integration details are included in U.S. Pat. No. 8,513,768 to Bertin et al., hereby incorporated by reference in its entirety.

Referring now to Table 27 illustrated in FIG. 27 and described further above, unipolar (unidirectional) CNT switches have substantially slower SET times than bipolar (bidirectional) CNT switches. While there are applications that support a 10 um SET operation, for this specification, SET times of 5-10 ns is required.

Figure 65:
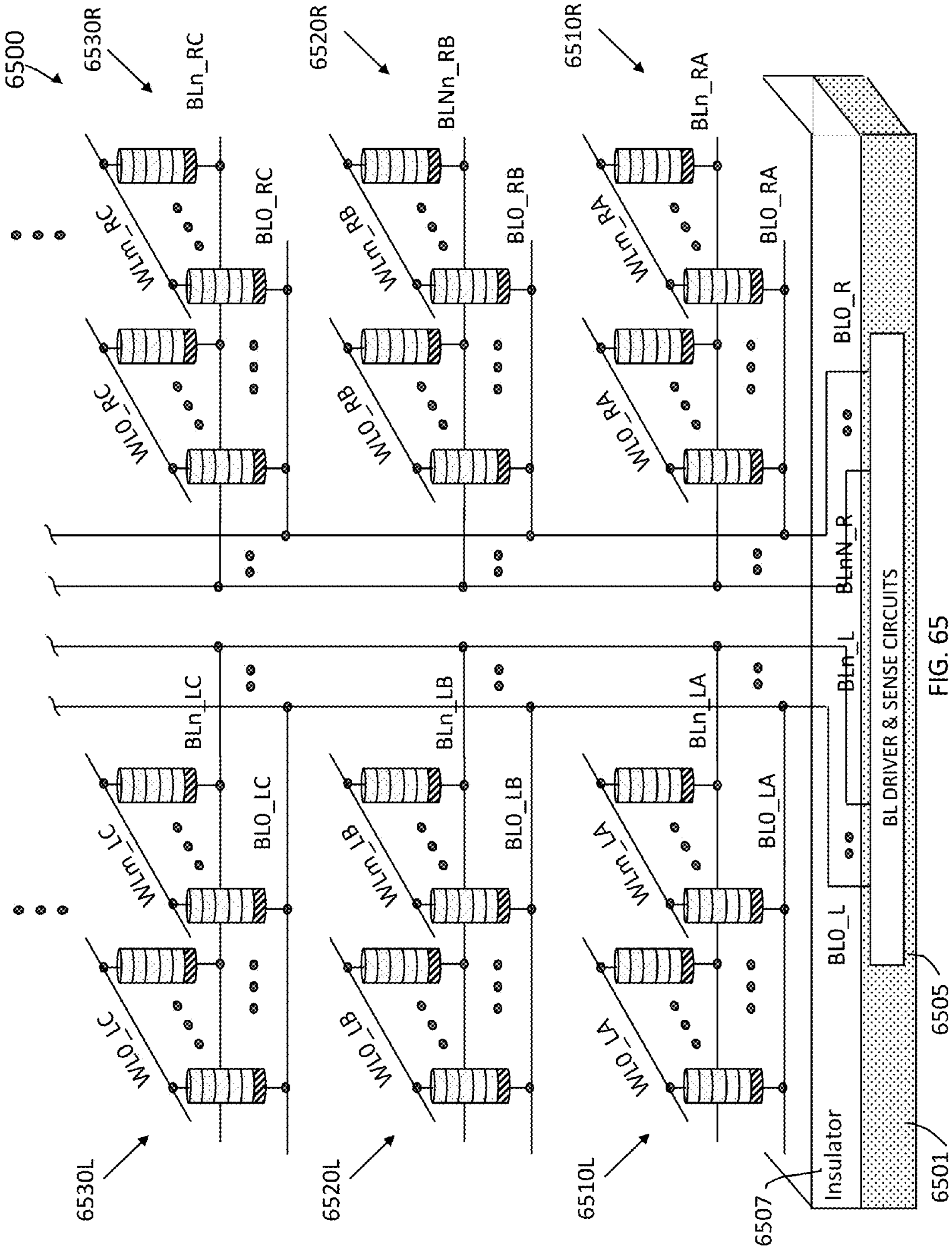
FIG. 65 is a perspective representation of a multi-stacked nonvolatile memory array and underlying memory circuits using the FIG. 64 stacked array type.

Referring now to FIG. 65, cross section 6500 illustrates a schematic of stacked nonvolatile memory array cells, such as C00, C01, C22, and C23, based on nonvolatile memory array cross section 6400 illustrated in FIG. 64. Support circuits & interconnections 6501 illustrated in stacked nonvolatile memory array 6500 illustrated in FIG. 65 corresponds to support circuits and interconnections 6401 shown in cross section 6400 illustrated in FIG. 64. BL driver and sense circuits 6505, a subset of support circuits and interconnections 6501, are used to interface to bit lines in stacked nonvolatile memory array 6500.

Planarized insulator 6507 illustrated in FIG. 65 corresponds to planarize insulator 6404 illustrated in FIG. 64. Interconnect means through planar insulator 6507 (not visible in stacked nonvolatile memory array 6500) may be used to connect metal array lines in 3-D arrays, bit lines in this example, to corresponding BL driver and sense circuits 6505 and other circuits (not shown). By way of example, bit line drivers in BL driver and sense circuits 6505 may be connected to bit lines BL0_L to BLn_L and BL0_R to BLn_R as illustrated in stacked nonvolatile memory array 6500 illustrated in FIG. 65.

Three stacking levels with left and right-side 3-D subarrays corresponding to nonvolatile memory array cross section 6400 shown in FIG. 64 are illustrated, with additional memory stacks (not shown) above. Memories of 8, 16, 32, and 64 and more nonvolatile memory stacks may be formed. In this example, a first stacked memory level is formed comprising nonvolatile memory array 6510L consisting of m×n NV CNT diode cells interconnected by m word lines WL0_LA to WLm_LA and n bit lines BL0_LA to BLn_LA, and nonvolatile memory array 6510R consisting of m×n NV CNT diode cells interconnected by m word lines WL0_RA to WLm_RA and n bit lines BL0_RA to BLn_LA. Next, a second stacked memory level is formed comprising nonvolatile memory array 6520L consisting of m×n NV CNT diode cells interconnected by m word lines WL0_LB to WLm_LB and n bit lines BL0_LB to BLN_LB, and nonvolatile memory array 6520R consisting of m×n NV CNT diode cells interconnected by m word lines WL0_RB to WLm_RB and n bit lines BL0_RB to BLn_RB. Next, a third stacked memory level is formed comprising nonvolatile memory array 6530L consisting of m×n NV CNT diode cells interconnected by m word lines WL0_LC to WLm_LC and n bit lines BL0_LC to BLn_LC, and nonvolatile memory array 6530R consisting of m×n NV CNT diode cells interconnected by m word lines WL0_RC to WLm_RC and n bit lines BL0_RC to BLn_RC. Additional stacks of nonvolatile memory arrays are included (but not shown) in FIG. 65.

Sub-array bit line segments are interconnected by vertical interconnections and then fanned out to BL driver and sense circuits 6505 as illustrated in stacked nonvolatile memory arrays 6500 in FIG. 65. For example, BL0_L interconnects bit line BL0-LA, BL0_LB, BL0-LC segments, and other bit line segments (not shown), and connect these bit line segments to BL driver and sense circuits 6505. Also, BLn_L interconnects bit line BLn-LA, BLn_LB, BLn-LC segments, and other bit line segments (not shown), and connect these bit line segments to BL driver and sense circuits 6505. Also, BL0_R interconnects bit line BL0-RA, BL0_RB, BL0-RC segments, and other bit line segments (not shown), and connect these bit line segments to BL driver and sense circuits 6505. Also, BLn_R interconnects bit line BLn-RA, BLn_RB, BLn-RC segments, and other bit line segments (not shown), and connect these bit line segments to BL driver and sense circuits 6505.

BL driver and sense circuits 6505 may be used to read or write to bit locations on any of the stacked levels in stacked nonvolatile memory array 6500 illustrated in FIG. 65. Word lines may also be selected by support circuits & interconnections 6501 (not shown in this example). Further cell and layout structures and integration details are included in U.S. Pat. No. 8,513,768 to Bertin et al., hereby incorporated by reference in its entirety.

As described further above with respect to table 2700 illustrated in FIG. 27, a bipolar (bidirectional) NV CNT switch operation is required for a high-performance SET WRITE operation. Hence, unidirectional cell select diode 6425 illustrated in FIG. 64 may be replaced with a bidirectional FET cell select device, such as cell select FET 2605 illustrated in FIG. 26. However, cell select FET 2605 is fabricated in a silicon (Si) substrate and is not compatible with multiple stacked layers of memory because of high temperature processing requirements greater than 400 deg.-C. as well as fabrication complexity. What is needed for dense, high performance, 3D stacked arrays is a cell select FET compatible with low temperature processing, typically not more than 200 deg.-C. with annealing temperatures in the 300-400 deg.-C. A CNTFET formed on an insulator surface may be used to replace FET 2605 as described further below.

Figure 66:
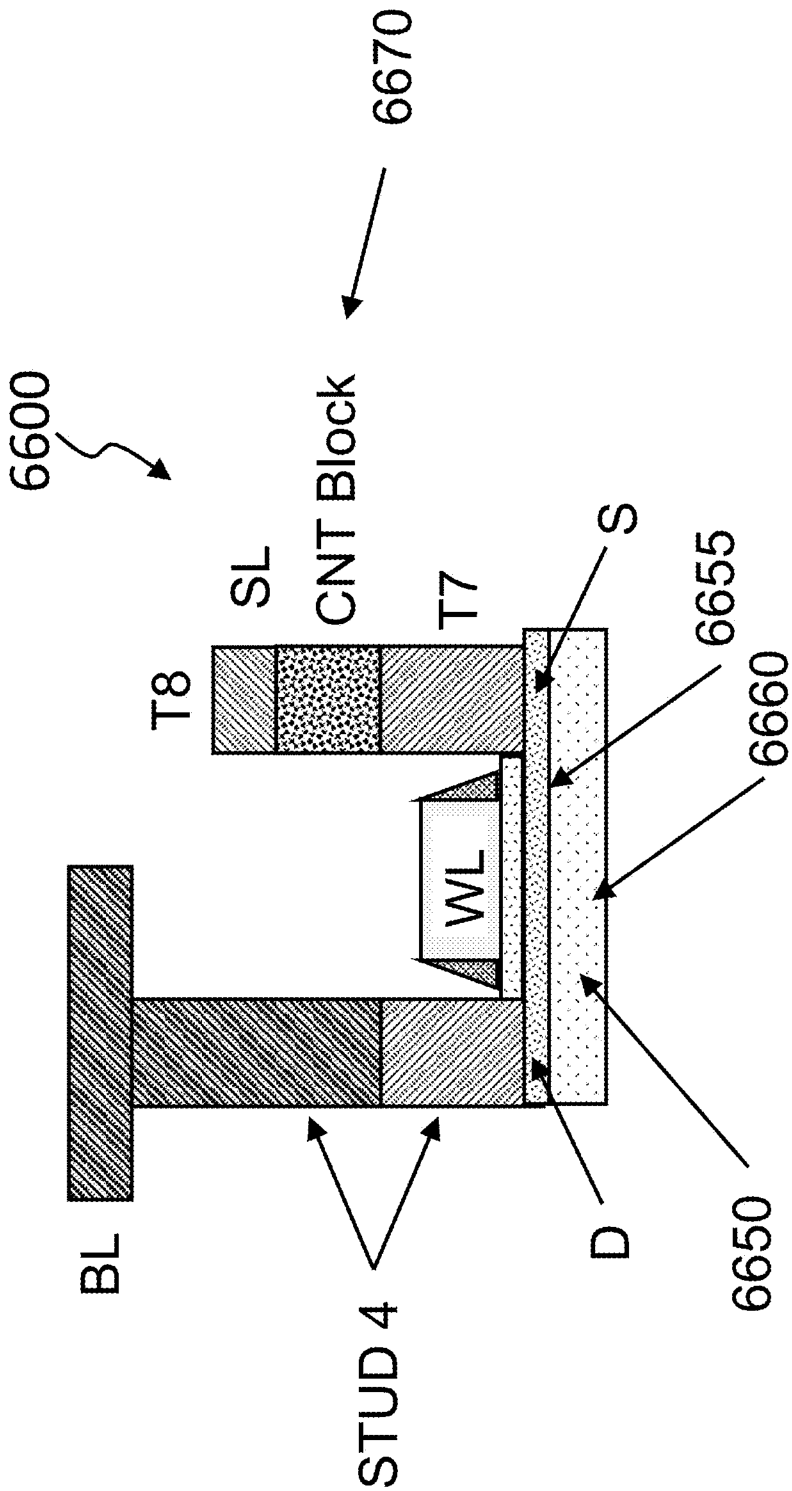
FIG. 66 is a cross section of a nonvolatile carbon nanotube switch memory cell with a carbon nanotube field effect (CNTFET) cell select device.

Referring now to FIG. 66, NV CNT-CNTFET cell 6600 includes cell select device CNTFET 6650 with drain region D in the patterned semiconductor nanotube fabric 6655 connected to bit line BL by STUD 4, word line WL, approximately orthogonal to bit line BL, that forms an array interconnect word line and the gate of CNTFET 6650, and source region S in patterned semiconductor nanotube fabric 6655. Patterned semiconductor nanotube fabric 6655 is formed on underlying insulator 6660. NV CNT switch 6670 includes a CNT block, with terminal T7 that also forms a contact to source region S, and terminal T8 which may be in contact with a select line SL or a portion of select line SL may form terminal T8 (select line SL is sometimes also referred to as reference line REF). NV CNT switch 6670 is similar to NV CNT switch 2610 illustrated in FIG. 26 and described further above. CNTFET 6650 may be an n channel CNTFET (nCNTFET) or a p channel CNTFET (pCNTFET). NV CNT-CNTFET cell 6600 illustrated in FIG. 66 electrical operating modes such as SET, RESET, and READ operations are similar in operation to nonvolatile 1T, 1R memory cell 2625 illustrated FIG. 26 as described further above. Further cell and layout structures and integration details are included in U.S. Pat. No. 7,852,114 to Bertin et al., hereby incorporated by reference in its entirety.

Referring now to Table 27 illustrated in FIG. 27 and described further above, unipolar (unidirectional) nonvolatile NV CNT diode cells described further above with respect cross section 6400 illustrated in FIG. 64 with 10 microsecond SET times have been replaced with bipolar (bidirectional) NV CNT switches 6670 illustrated in FIG. 66 with 5 nanosecond SET times. While there are applications that support a 10 um SET time operation, for this specification, SET time operation of 5 ns is needed.

Figure 67:
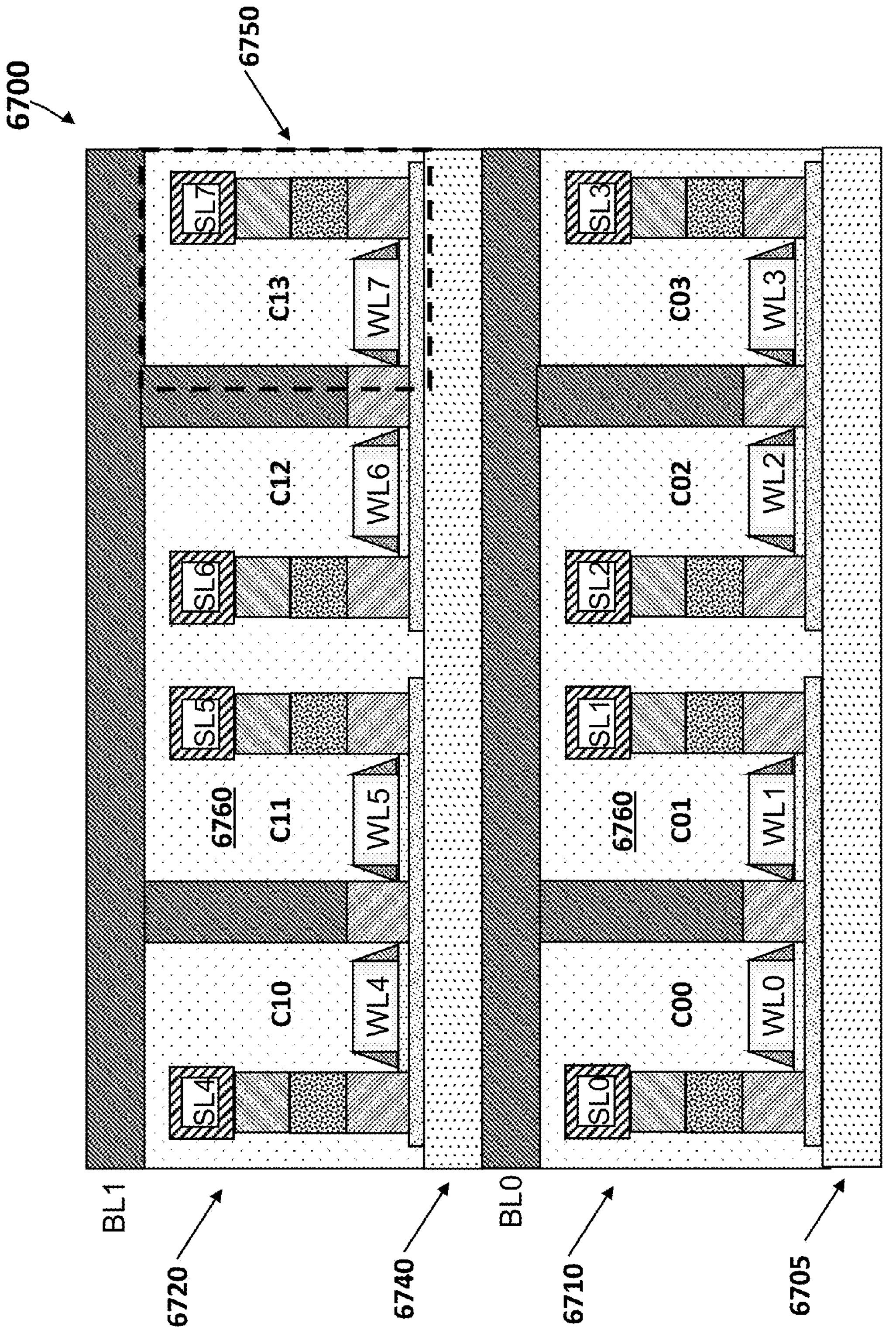
FIG. 67 is a cross section of a two-high stacked nonvolatile memory formed with carbon nanotube field effect (CNTFET) devices and nonvolatile carbon nanotube switches.

Referring now to FIG. 67, cross section 6700 cell and array line configurations correspond to cell and array layout 3200 illustrated in FIG. 32 and eighth open architecture schematics 4700, 5100, 5300, and 6100 illustrated in FIGS. 47, 51, 53, and 61, respectively, described further above. Comparable cell 3200, also referred to as cell #5, was selected because it results in a cell with smallest area (footprint) as illustrated by cell area comparison in table 3400 illustrated in FIG. 34. NV CNT-CNTFET cell 6600 illustrated in FIG. 66, in which CNTFET 6650 replaces FET 2605 in FIG. 26, has approximately the same $6F^2$ cell area (footprint).

Referring now to FIG. 67, cross section 6700 illustrates a first (lower) memory array 6710 that includes cells C00, C01, C02, and C03, bit lines BL0, word lines WL0, WL1, WL2, and WL3, and select lines SL0, SL1, SL2, and SL3. Second (upper) memory array 6720 that includes cells C10, C11, C12, and C13, bit line BL1, word lines WL4, WL5, WL6, and WL7, and select lines SL4, SL5, SL6, and SL7. Lower array 6710 is formed on insulator 6705, which also includes array interconnect lines (not shown). Upper array 6720 and lower array 6710 are separated by insulator 6740, which includes interconnect lines (not shown). Upper array 6720 is formed on insulator 6740 which also includes array interconnect lines (not shown). Insulator 6760 fills the regions between devices and array lines.

Representative memory NV CNT-CNTFET cell 6750, corresponding to cell C13 illustrated in FIG. 67, is a nonvolatile 1T, 1R cell that corresponds to NV CNT-CNTFET cell 6600 illustrated in FIG. 66 and described further above, with word line WL, bit line BL, and select line SL corresponding to bit lines, word lines, and select lines described further above with respect to cross section 6700 illustrated in FIG. 67. Representative cell C13 is the same as cells C00, C01, C02, C03, C10, C11, and C12.

Cross section 6700 illustrated in FIG. 67 shows stacked first (lower) memory array 6710 and second (upper) memory array 6720 in the bit line direction. With respect to lower memory array 6710, bit line BL0 with word lines WL0, WL1, WL2, and WL3, corresponding select lines SL0, SL1, SL2, and SL3, respectively, correspond to cells C00, C01, C02, and C03, respectively. With respect to upper memory array 6720, bit line BL1 with word lines WL4, WL5, WL6, and WL7, corresponding select lines SL4, SL5, SL6, and SL7, respectively, correspond to cells C10, C11, C12, and C13, respectively. The array periodicity in the bit line direction is 3F, where F is a minimum dimension for a technology node (generation). A cross section in the word line direction, orthogonal to the bit line direction, is not shown. However, the array periodicity in the word line direction is 2F. Bit line and word line direction periodicity correspond to those shown in cell and array layout 3200 illustrated in FIG. 32.

The memory array cell area of 1 bit for lower array 6710 is $6F^2$ because of the 3F periodicity in the bit line direction and the 2F periodicity in the word line direction. Because memory arrays 6720 and 6710 are stacked, the memory array cell area per bit is $3F^2$. If four memory arrays (not shown) are stacked, then the memory array cell area per bit is $1.5F^2$.

Figure 68:
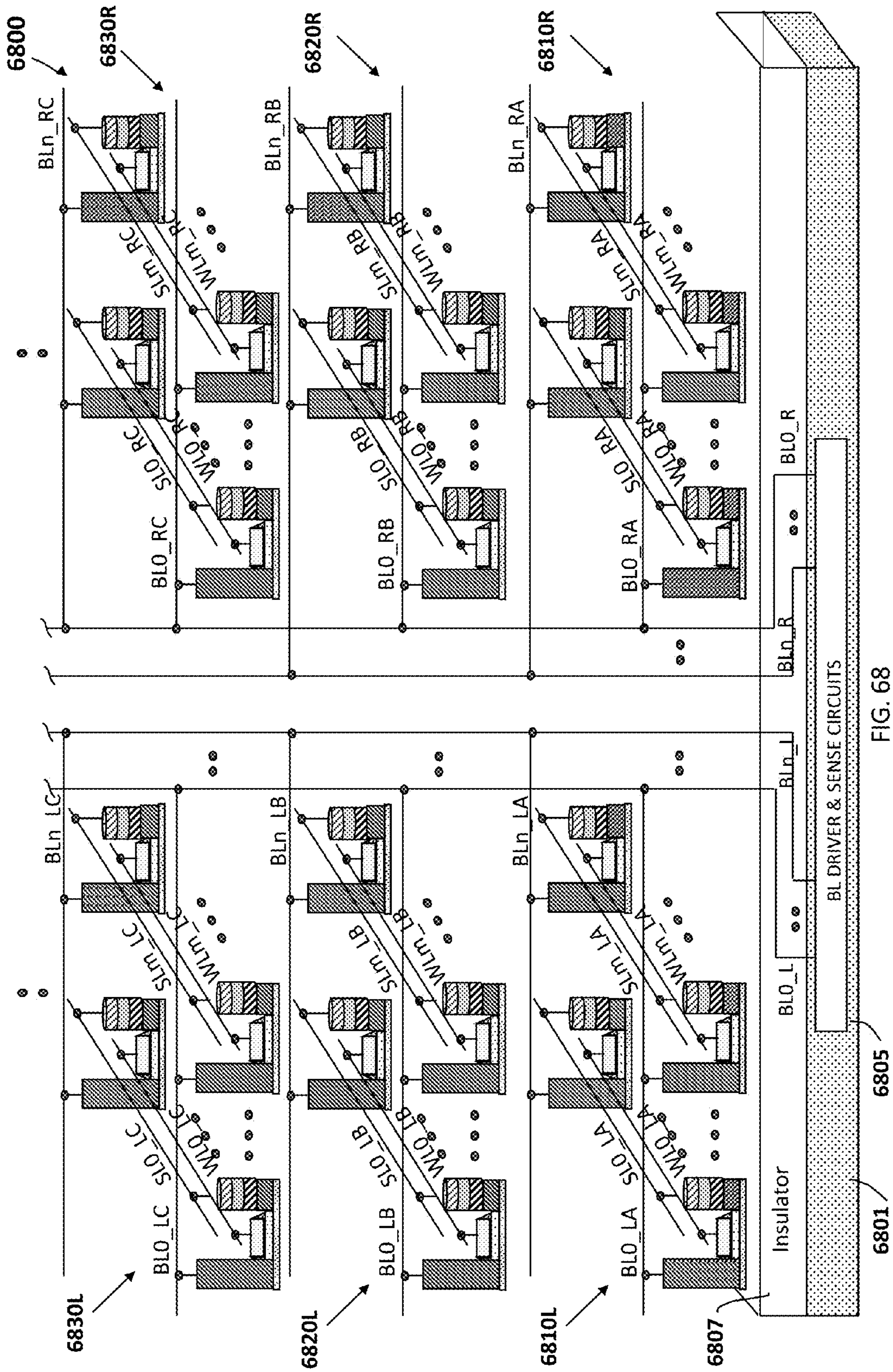
FIG. 68 is a perspective representation of a multi-stacked nonvolatile memory array and underlying memory circuits using the FIG. 67 stacked array type.

Referring now to FIG. 68, stacked nonvolatile memory array 6800 illustrates a schematic of stacked nonvolatile memory array cells, such as C00, C01, C02, C03, C10, C11, C12, and C13, based on nonvolatile memory array cross section 6700 illustrated in FIG. 67. Each cell, such as representative cell C13, comprises 1 CNTFET cell select device and 1 NV CNT switch in series, thereby forming NV CNT-CNTFET cell 6750 illustrated in FIG. 67. Support circuits & interconnections 6801 illustrated in stacked nonvolatile memory array 6800 illustrated in FIG. 68 and BL driver and sense circuits 6805, a subset of support circuits and interconnections 6801, are used to interface to bit lines in stacked nonvolatile memory array 6800.

Planarized insulator 6807 illustrated in FIG. 68 corresponds to planarize insulator 6705 illustrated in FIG. 67. Interconnect means through planar insulator 6807 may be used to connect metal array lines in 3-D arrays, bit lines in this example, to corresponding BL driver and sense circuits 6805 and other circuits (not shown). By way of example, bit line drivers in BL driver and sense circuits 6805 may be connected to bit lines BL0_L to BLn_L and BL0_R to BLn_R as illustrated in stacked nonvolatile memory array 6800 illustrated in FIG. 68.

Three stacking levels with left and right-side 3-D subarrays corresponding to nonvolatile memory array cross section 6700 shown in FIG. 67 are illustrated, with additional memory stacks (not shown) above. Memories of 8, 16, 32, and 64 and more nonvolatile memory stacks may be formed. In this example, a first stacked memory level is formed comprising nonvolatile memory array 6810L consisting of m×n NV CNT-CNTFET cells 6750 interconnected by m word lines WL0_LA to WLm_LA and n bit lines BL0_LA to BLn_LA, and nonvolatile memory array 6810R consisting of m×n NV CNT-CNTFETs cell 6750 interconnected by m word lines WL0_RA to WLm_RA and n bit lines BL0_RA to BLn_RA. Next, a second stacked memory level is formed comprising nonvolatile memory array 6820L consisting of m×n NV CNT-CNTFET cells 6750 interconnected by m word lines WL0_LB to WLm_LB and n bit lines BL0_LB to BLn_LB, and nonvolatile memory array 6820R consisting of m×n NV CNT-CNTFET cells 6750 interconnected by m word lines WL0_RB to WLm_RB and n bit lines BL0_RB to BLn_RB. Next, a third stacked memory level is formed comprising nonvolatile memory array 6830L consisting of m×n NV CNT-CNTFET cells 6750 interconnected by m word lines WL0_LC to WLm_LC and n bit lines BL0_LC to BLn_LC, and nonvolatile memory array 6530R consisting of m×n NV CNT-CNTFET cells 6750 interconnected by m word lines WL0_RC to WLm_RC and n bit lines BL0_RC to BLn_RC. Additional stacks of nonvolatile memory arrays are included (but not shown) in FIG. 68.

Sub-array bit line segments are interconnected by vertical interconnections and then fanned out to BL driver and sense circuits 6805 as illustrated in stacked nonvolatile memory arrays 6800 illustrated in FIG. 68. For example, BL0_L interconnects bit line BL0-LA, BL0_LB, BL0-LC segments, and other bit line segments (not shown), and connect these bit line segments to BL driver and sense circuits 6805. Also, BLn_L interconnects bit line BLn-LA, BLn_LB, BLn-LC segments, and other bit line segments (not shown), and connect these bit line segments to BL driver and sense circuits 6805. Also, BL0_R interconnects bit line BL0-RA, BL0_RB, BL0-RC segments, and other bit line segments (not shown), and connect these bit line segments to BL driver and sense circuits 6805. Also, BLn_R interconnects bit line BLn-RA, BLn_RB, BLn-RC segments, and other bit line segments (not shown), and connect these bit line segments to BL driver and sense circuits 6805.

BL driver and sense circuits 6805 may be used to read or write to bit locations on any of the stacked levels in stacked nonvolatile memory array 6800 illustrated in FIG. 68. Word lines may also be selected by support circuits & interconnections 6801 (not shown in this example.

At this point in the specification, stacked nonvolatile memory array 6800 illustrated in FIG. 68 is a 3-D memory formed with multiple, in this example at least 3, stacked nonvolatile arrays 6810L and 6810R, 6820L and 6820R, and 6830 L and 6830R of NV CNT-CNTFET cells 6750 interconnected with horizontal bit lines, word lines, and select lines, with bit lines approximately orthogonal to word lines and select lines. Multiple horizontal bit lines in the nonvolatile memory arrays connect to vertical bit line segments BL0_L to BLn_L and bit line segments BL0_R and BLn_R, which are in turn connected to bit line driver and sense circuits 6805 in a semiconductor substrate. Horizontal word lines and reference lines are also connected to support circuits and interconnections 6801 (not shown) in the semiconductor substrate.

An alternative to vertical bit line segments interconnecting horizontal bit lines forming stacked vertical arrays as in stacked nonvolatile memory array 6800 illustrated in FIG. 68 is to have vertical bit lines interconnecting directly to underlying BL driver and sense circuits 6805. Vertical bit lines are also orthogonal to word lines and select lines.

Figure 69:
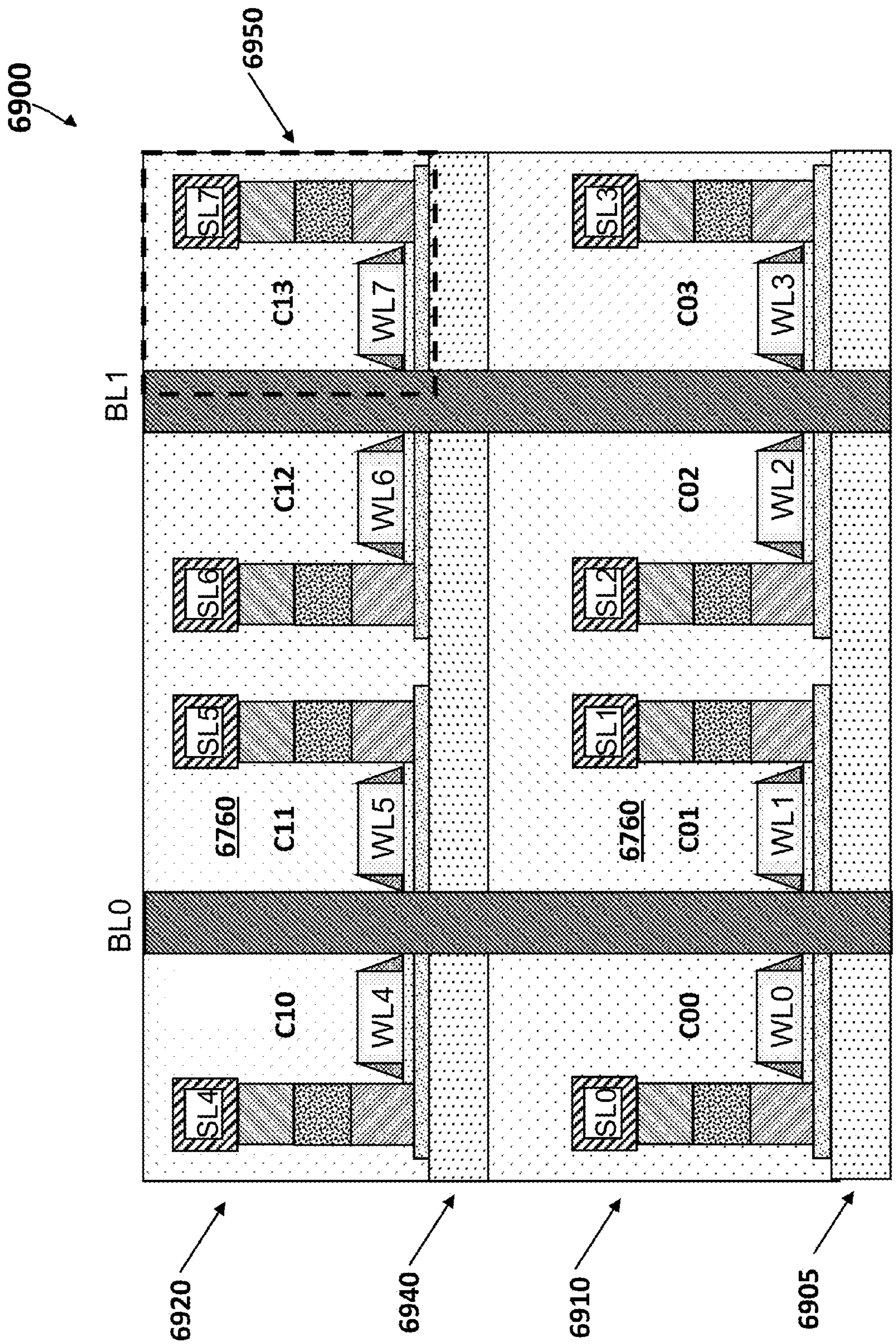
FIG. 69 is a cross section of two-high stacked nonvolatile memory of FIG. 67, but with vertical instead of horizontal bit lines.

Referring now to FIG. 69, cross section 6900 shows alternative bit line wiring in which all bit lines are vertically oriented and can connect directly to underlying BL drivers and sense circuits 6805. The two-high stack shown in cross section 6900 can be extended to many more stacks forming an alternative architecture. Vertical bit lines are orthogonal to both word lines and select lines. NV CNT-CNTFET cell 6750 illustrated in FIG. 67 operation is essentially unchanged, and cell size remains $6F^2$.

Cross section 6900 illustrated in FIG. 69 shows stacked first (lower) memory array 6910 and second (upper) memory array 6920. NV CNT-CNTFET cell 6950 corresponds to NV CNT-CNTFET cell 6750 illustrated in FIG. 67. With respect to both lower memory array 6910 and upper memory array 6920, bit line BL0 with word lines WL0, WL1, WL4, and WL5, corresponding select lines SL0, SL1, SL4, and SL5, respectively, correspond to cells C00, C01, C10, and C11, respectively and bit line BL1 with word lines WL2, WL3, WL6, and WL7, corresponding select lines SL2, SL3, SL6, and SL7, respectively, correspond to cells C02, C03, C12, and C13, respectively. Lower array 6910 is formed on insulator 6905, which also includes array interconnect lines (not shown). Upper array 6920 and lower array 6910 are separated by insulator 6940, which includes interconnect lines (not shown). Upper array 6920 is formed on insulator 6940 which also includes array interconnect lines (not shown). Insulator 6760 fills the regions between devices and array lines.

The array periodicity in the horizontal direction is 3F, where F is a minimum dimension for a technology node (generation). A cross section in the word line direction, is not shown. However, the array periodicity in the word line direction is 2F. The cell area of NV CNT-CNTFET cell 6950 is $6F^2$, the same area cell area as NV CNT-CNTFET cell 6750 illustrated in FIG. 67.

As this point in the specification, a 3D NRAM has been formed with multiple stacked nonvolatile memory arrays as described further above with respect to nonvolatile memory array 6800 illustrated in FIG. 68. The nonvolatile memory arrays were formed using interconnected nonvolatile 1T, 1R cells with a CNTFET cell select transistor and a NV CNT switch storage device, such as NV CNT-CNTFET cell 6750 or NV CNT-CNTFET cell 6950 illustrated in FIGS. 67 and 69, respectively. CNTFET devices are described further below with respect to FIG. 70.

For high performance applications, it is desirable to form a high bandwidth nonvolatile resistive change element open array architecture 3D NRAM memory directly on the surface of an underlying high-performance processor, such as a CPU, GPU, or other high-performance function. In addition to the CNTFET cell select device described further above, all memory circuits need to be made with CNTFET devices. CNTFET devices and circuits are described further below.

Figure 70:
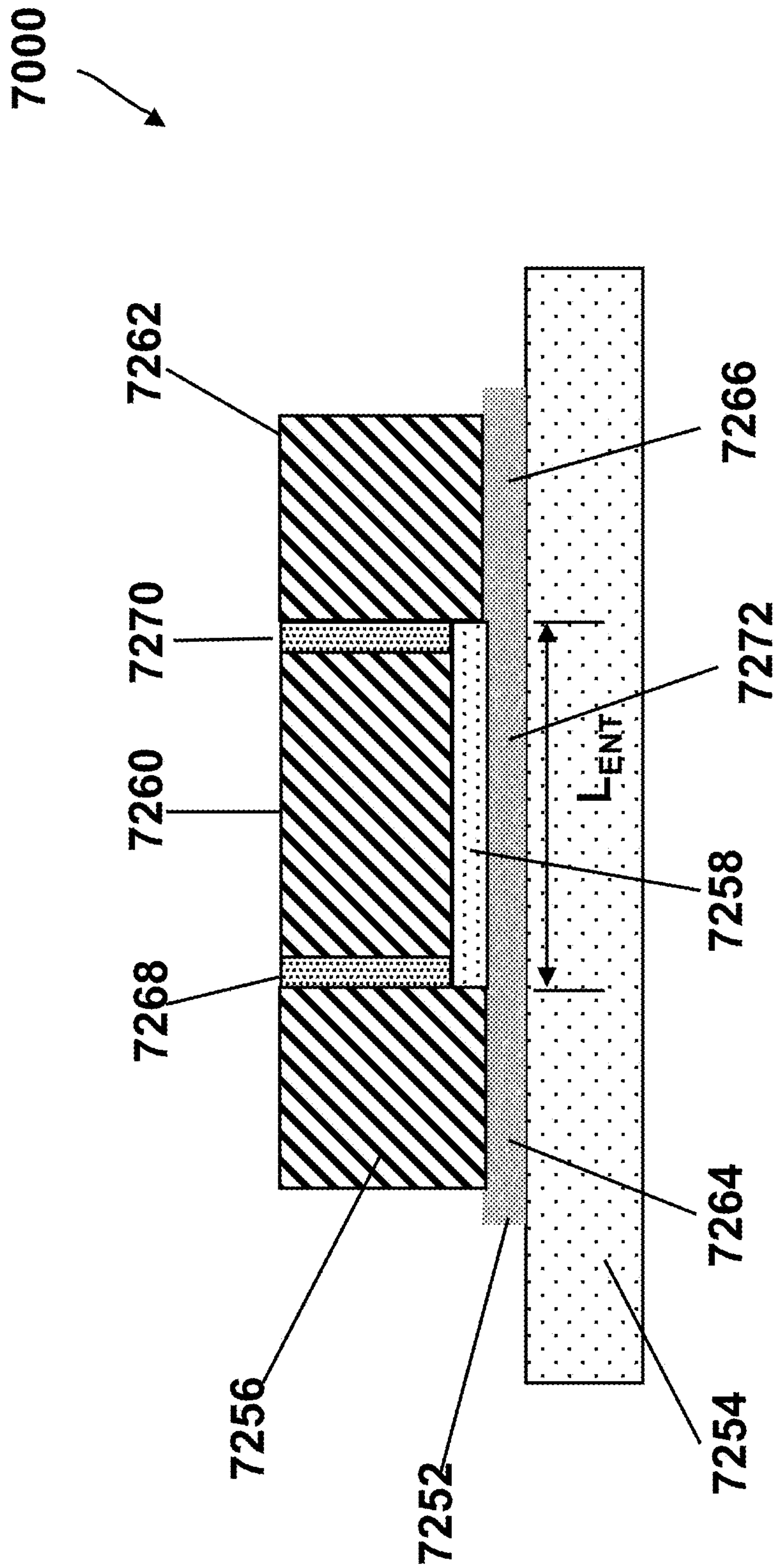
FIG. 70 is a cross section of an exemplary carbon nanotube field effect (CNTFET) device.

FIG. 70 illustrates a cross section of an exemplary CNTFET 7000 having a CNT fabric 7252 deposited on an insulator 7254. The CNT fabric 7252 is a fabric comprising semiconducting carbon nanotubes, e.g., a non-woven fabric of semiconducting carbon nanotubes. The CNTFET 7000 has a source conductor 7256, a gate insulator 7258, a gate conductor 7260, and a drain conductor 7262 fabricated above the CNT fabric 7252. A source region 7264 of the CNT fabric corresponds to the CNT fabric below the source conductor 7256 and a drain region 7266 of the CNT fabric corresponds to the CNT fabric below the drain conductor 7262. A channel region 7272 of the CNT fabric corresponds to the CNT fabric below the gate insulator 7258 and gate conductor 7260 and a length $L_{CH}$. The channel width is determined by current per unit width capability (uA/uM) of the CNTFET device and the circuit requirements. The CNTFET 7000 has a spacer 7268 separating the source conductor 7256 and the gate conductor and a spacer 7270 separating the gate conductor 7260 and the drain conductor 7262. Gate conductor 7260 may be doped polysilicon or a metal. Gate insulator 7258 may be $SiO_2$, and for higher performance devices, $HfO/SiO_2$ may be used. Exemplary CNTFET 7000 is fabricated on insulator 7254, and along with spacers 7268 and 7270 can be any suitable insulator material. The source and drain conductors 7256 and 7262 can be any suitable conductor; transition metals such as Ti, Pd, and Co and TiN may be used as conductors to form relatively low resistance contacts after annealing with semiconducting nanotubes in the CNT fabric. In the exemplary CNTFET 7000 device, conductors were formed using Ti/Pd and annealed to approximately 400 deg. C. Ion implantation, or other process methods, may be used to adjust channel region threshold voltage values by controlling the position of the Fermi level in the band gap between conduction and valence bands, thereby facilitating the use of a broad range of conductive materials. The position of the Fermi level in the conductor-to-CNT fabric contact regions may also be adjusted by ion implantation or other process methods thereby favoring hole injection in the case of pCNTFET devices and electron injection in the case of nCNTFET devices. Further CNTFET structures, integration details, and CNTFET-based NOT (inverter), NOR, and NAND and other circuit descriptions are included in U.S. Pat. Nos. 7,852,114 and 9,362,390 both to Bertin et al. and hereby incorporated by reference in their entirety.

An important aspect of carbon nanotube technology formed using patterned nanotube fabric and patterned semiconductor nanotube fabric is the enablement of system-level solutions using memory and logic functions that do not require a semiconductor substrate. The availability of integrated optimized complementary CNFET devices (pCNFET and nCNFET), such as exemplary CNTFET 7000 illustrated in FIG. 70, enables the implementation of memory and logic functions integrated at any level (layer) of the process; integrated with wiring layers in stacked three-dimensional layers for the most efficient placement and wiring of system functions. Such three-dimensional system implementations result in shorter and lower capacitive interconnections for higher performance and lower power dissipation. Complementary CNFET-based logic, memory, and analog circuit functions typically use multiple pCNTFET device and nCNTFET device dimensions to achieve high performance while limiting power dissipation.

No semiconductor substrate is required for fabricating CNTFET devices and NV CNT switches. However, NV CNT switches and CNFET devices are formed using semiconductor process tools and are compatible with semiconductor fabricators, therefore three-dimensional systems may also be formed on a semiconductor substrate which includes memory, logic, and analog functions as well. CNTFET devices and NV CNT switches are deposited at relatively low temperatures, the highest temperature is typically an annealing temperature of 300-400 deg.-C., for example, to activate ion implant species that may be used to optimized CNTFET characteristics as described further above with respect to exemplary CNTFET 7000 illustrated in prior FIG. 70.

Figure 71:
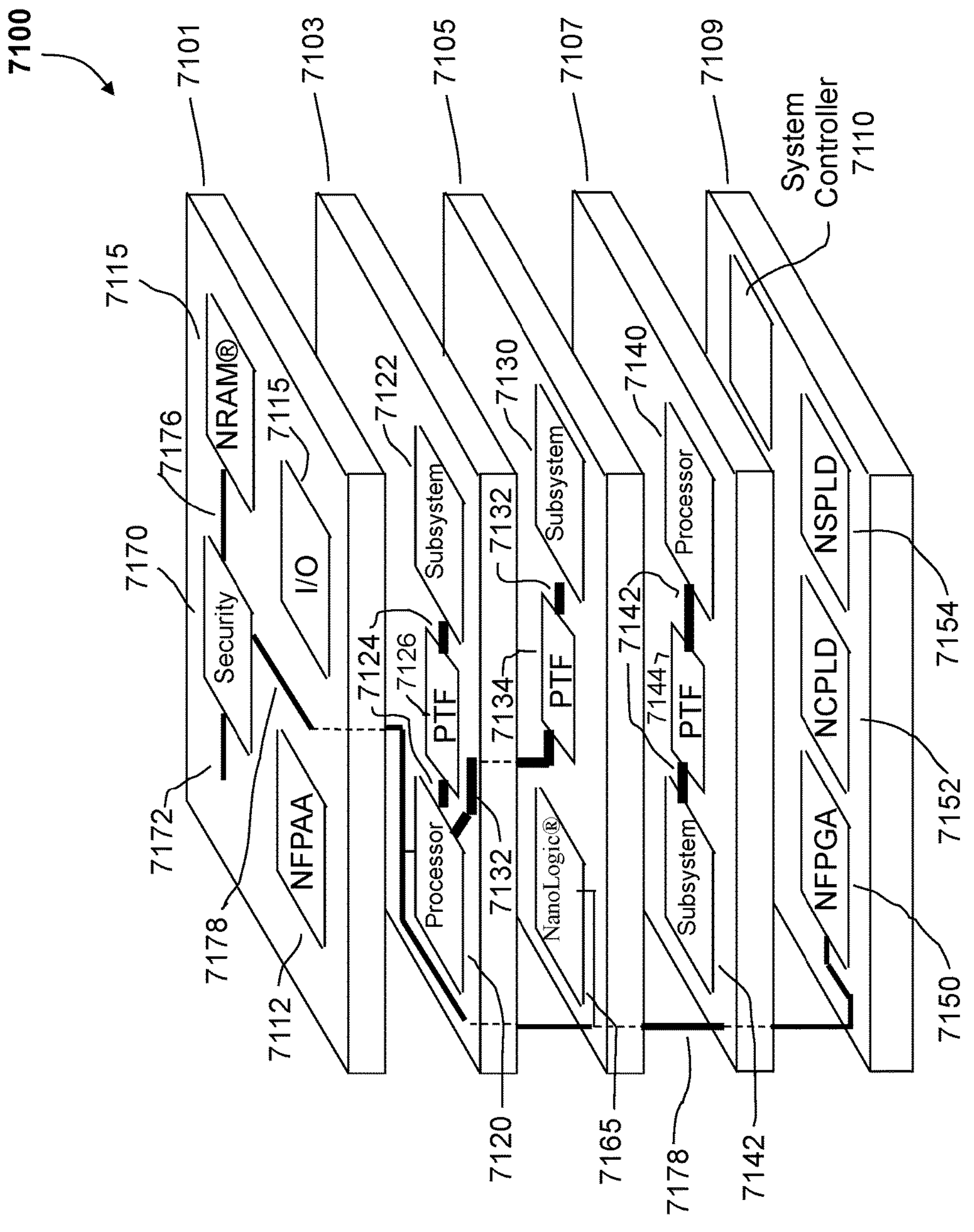
FIG. 71 is a perspective view of a three-dimensional system with carbon nanotube field effect (CNTFET) device-based circuits and nonvolatile resistive change elements.

Referring now to FIG. 71, three-dimensional system 7100 includes five levels (layers). Three-dimensional system 7100 does not implement a predetermined function. Instead, each of the five levels illustrates various CNTFET-based logic, analog, and memory functions as well as horizontal and vertical interconnections available to form three-dimensional systems. The concepts taught in FIG. 71 are used to generate a 3D high I/O NRAM-on-CPU subsystem 7200 illustrated in FIG. 72 and described further below.

Referring now to FIG. 71, each level (layers) may include multiple contacts and interconnect layers as well NRAM® memory, CNTFET-based logic, processors, other electronic digital or analog functions, and other I/O functions. I/O functions may include, for example, electrical, optical, or any other coupling method. In this example, level 7101 includes a nanotube field-programmable analog array (NF-PAA) 7112, I/O function 7115, NRAM® 7117, and security function 7170. Level (layer) 7103 includes processor 7120 and subsystem 7122 interconnected by BUS 7124 and includes precision timing function PTF 7126. Level (layer) 7105 includes subsystem 7130 interconnected with processor 7120 on level (layer) 7103 by BUS 7132 and includes PTF 7134. Precision timing functions are used to synchronize processor and subsystem operation. In this example, PTF 7126 that synchronizes processor 7120 and subsystem 7130 placed in the same level (layer) and PTF 7134 that synchronizes processor 7120 and subsystem 7130 placed on different levels and interconnected by a combination of horizontal and vertical three-dimensional wiring. Subsystems 7122 and 7130 may be high speed caches for example. Level (layer) 7105 also includes CNT logic (NanoLogic® 7165). Level (layer) 7107 includes processor 7140 and subsystem 7142 interconnected by BUS 7142 which includes PTF 7144. Level (layer) 7109 includes CNTFET logic functions NFPGA 7150, NCPLD 7152, and NSPLD 7154 as well as system controller 7110. The three-dimensional system 7100 further includes power and ground supplies which are not shown, as well as on-chip voltage regulation and other functions.

Only a few examples of two-dimensional wiring within levels (layers) and three-dimensional wiring between levels (layers) are shown in FIG. 71. BUS 7124 and BUS 7142 are examples of two-dimensional horizontal wiring. BUS 7132 is an example of three-dimensional wiring between functions in level (layer) 7103 and 7105. Security function 7170 wiring is two dimensional such as input wire 7172 and wire 7176 connected to NRAM® 7117. In this example, security function 7170 three-dimensional wire 7178 interconnects security function 7170 with at least one function in each of the levels (layers). For example, wire 7180 connects with processor 7120, NanoLogic® 7165, subsystem 7142, and NFPGA 7150. Wire 7180 may be one or more wires. BUS 7124, 7134, and 7142 may use multiple wires per bus. System controller 7110 is connected (not shown) to various functions in each of levels (layers) 7101, 7103, 7105, 7107, and 7109.

Three-dimensional system 7100 operation is enabled by CNTFET and NV CNT switch technology decoupled from semiconductor substrate requirements. Also, nonvolatile logic array functions such as NFPGA 7150, NCPLD 7152, NSPLD 7154 are enabled by NV CNT switches that can be programmed and reprogrammed so that 100% pretested and cycled for reliability (if needed) NV CNT switches are available for programming. Programmable and reprogrammable switches are also used as part of precision timing functions PTF 7126, 7134, and 7144 to manage power and data timing for three-dimensional system 7100 enabling various functions to be placed at various distances and stacked in various levels (layers) while maintaining data timing integrity. Security is ensured by security function 7170 which can rapidly reconfigure a system without leaving a trace.

Self-timed circuits enable the optimization of function, performance, and power dissipation. The function of this three-dimensional system may be modified remotely in an application, even in space for example, because of the NRAM® memory and NanoLogic® circuit functions such as NFPGAs and self-timed NanoLogic®-based precision timing functions that can readjust three-dimensional system 7100 timing. Further CNTFET structures, integration details, and CNTFET-based NOT (inverter), NOR, and NAND and other circuit descriptions are included in U.S. Pat. No. 7,852,114 to Bertin et al., hereby incorporated by reference in their entirety.

Figure 72:
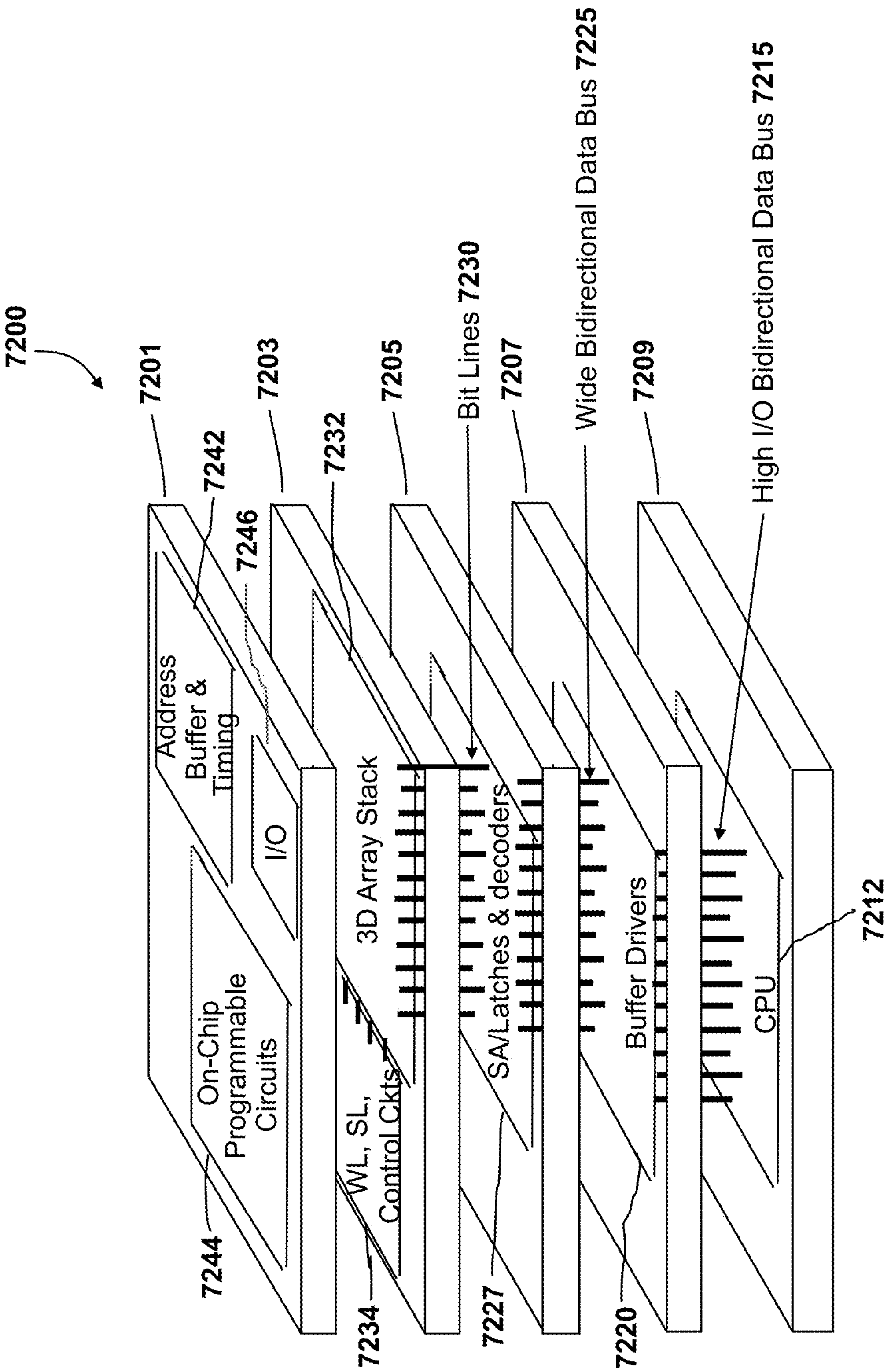
FIG. 72 is perspective view of a three-dimensional high I/O NRAM-on-CPU subsystem.

Referring now to FIG. 72, 3D high I/O NRAM-on-CPU subsystem 7200 is an integrated high I/O NRAM fabricated on a CPU wafer in a semiconductor fabricator. 3D high I/O NRAM-on-CPU subsystem 7200 is an adaptation of three-dimensional system 7100 illustrated in FIG. 71 described further above.

Level (layer) 7209, CPU 7212 is an integrated circuit fabricated in a semiconductor substrate as is well known in the industry. All other levels, 7207, 7205, 7203, and 7201 are formed with pCNTFET and nCNTFET devices and circuits, nonvolatile restive change memory storage device formed with NV CNT switches, for example, and horizontal and vertical wires. FIG. 72 wiring highlights vertically oriented high I/O bidirectional data bus 7215 between the NRAM memory buffer drivers 7220 and CPU 7212, with 1024, 2048, 4096 or even greater number of data lines, and corresponds to high I/O external bidirectional data bus 6370 illustrated in FIG. 63 described further above. Buffer drivers 7220 on level (layer) 7207 correspond to data I/O buffer driver 6367 illustrated in FIG. 63. The maximum number of data lines is determined by the physical area available and the bus line-to-line pitch in an area array. The maximum number of bus lines may also be limited by high I/O peak power limitations.

SA/latches and column decoder 7227 on level (layer) 7205, correspond to sense amplifier/latches 1530 and column decoder and I/O gate 1540 illustrated in FIG. 63, and wide bidirectional data bus 7225 connecting SA/latches and decoders 7227 and buffer drivers 7220, between level (layers) 7205 and 7207, respectively, corresponds to wide on-chip bidirectional data bus 6340. 3D array stack 7232 on level (layer) 7203 corresponds to stacked nonvolatile memory array 6800 illustrated in FIG. 68. Bit lines 7230 between 3D array stack 7232 on level (layer) 7203 and SA/latches and decoders 7227 on level (layer) 7205 correspond to bit lines BL0_L to BLn_L and BL0_R to BLn_R shown in FIG. 68. Alternatively, bit lines 7230 may correspond to bit lines BL0 and BL1 shown in cross section 6900 illustrated in FIG. 69. WL, SL, control circuits 7234, also on level (layer) 7203, are connected with 3D array stack 7232. WL, SL, control circuits 7234 correspond to word line, select line, RESET, and initialization drivers 6327 shown in high I/O architecture resistive change memory 6300 illustrated in FIG. 63.

Address, buffer, and timing circuits 7242 on top level (layer) 7201 illustrated in FIG. 72 corresponds to various control circuits in FIG. 63, such as row address buffer 1005, column address buffer 1525, RAS and CAS clock generators 1045 and 1050, respectively. On-chip programmable circuits 7244 also on top level (layer) 7201 corresponds to on-chip programmable circuits 6329 shown in FIG. 63.

I/O 7346 on top level (layer) 7201 provides interconnections to a system bus. CPU 7212 connections to I/O 7246 (not shown) interconnect CPU 7212 to the control bus, address bus, and data bus of a system bus (not shown).

Although the present invention has been described in relation to particular embodiments thereof, many other variations and modifications and other uses will become apparent to those skilled in the art. It is preferred, therefore, that the present invention not be limited by the specific disclosure herein.

What is claimed is:

1. A resistive change element memory array, comprising:

a plurality of word lines;

a plurality of bit lines;

a plurality of select lines;

a plurality of initialization driver circuits;

a plurality of memory cells, said memory cells comprising:

a resistive change element having a first terminal and a second terminal, said first terminal in electrical communication with a select line and an initialization driver circuit, wherein said resistive change element is capable of being switched between at least two non-volatile resistance values with a first resistance value corresponding to a first resistive state and a second resistance value corresponding to a second resistive state;

a selection device responsive to a control signal on a word line, said selection device selectively providing a conductive path between a bit line and said second terminal of said resistive change element;

wherein said plurality of initialization driver circuits are capable of applying initialization stimuli to said resistive change elements within said plurality of memory cells;

wherein said initialization stimuli enables operation of said plurality of memory cells within at least two informational states.

2. The resistive change element array of claim 1 wherein said initialization stimuli enables bipolar operation of said plurality of memory cells.

3. The resistive change element array of claim 1 wherein the at least two informational states are verifiable using a READ operation.

4. The resistive change element array of claim 1 wherein said first resistive state is lower than said second resistive state.

5. The resistive change element array of claim 1 wherein said plurality of select lines and said plurality of initialization driver circuits are electrically connected to said resistive change elements through a plurality of switching elements.

6. The resistive change element array of claim 5 wherein said plurality of switching elements selected provides electrical communication between said initialization driver circuits and said plurality of memory cells during an initialization operation and between said plurality of select lines and said plurality of memory cells during normal array operation.

7. The resistive change element array of claim 1 wherein said plurality of select lines and said plurality of initialization driver circuits are electrically connected directly to said resistive change elements.

8. The resistive change element array of claim 7 wherein said plurality of initialization driver circuits are capable of being tri-stated.

9. The resistive change element array of claim 8 said plurality of initialization driver circuits are tri-stated during normal array operation.

10. The resistive change element array of claim 1 wherein said plurality of initialization driver circuits are responsive to an initialization driver controller.

11. The resistive change element array of claim 10 wherein said initialization driver controller is an on-chip programmable circuit.

12. The resistive change element array of claim 10 wherein said initialization driver controller coordinates at least one of the timing, the amplitude, the pulse width, the number of pulses, and the connectivity of said plurality of initialization driver circuits.

13. The resistive change element array of claim 1 wherein said initialization driver circuits are capable of providing significantly higher voltages and currents during an initialization operation as compared to those required for read and programming operations with said array.

14. The resistive change element array of claim 13 wherein a programming operation of a memory cell within said array requires an electrical stimulus on the order of 2.5 Volts and an initialization operation on said memory cell requires an electrical stimulus on the order of 3.5 Volts.

15. The resistive change element array of claim 13 wherein elements used to drive electrical stimuli onto said plurality of word lines, said plurality of bit lines, and said plurality of select lines are protected from said higher voltages and currents during an initialization operation.

16. The resistive change element array of claim 1 wherein said initialization driver circuits provide a single initialization pulse during an initialization operation.

17. The resistive change element array of claim 1 wherein said initialization driver circuits provide a series of initialization pulses during an initialization operation.

18. The resistive change element array of claim 1 wherein said initialization driver circuits provide a pulse train during an initialization operation.

19. The resistive change element array of claim 1 wherein said plurality of word lines is arranged parallel to said plurality of select lines.

20. The resistive change memory array of claim 1 wherein said resistive change elements are selected from the group consisting of two-terminal nanotube switching elements, metal oxide memory elements, and phase change memory elements.

* * * * *